US012378469B2

(12) United States Patent
Oh et al.

(10) Patent No.: US 12,378,469 B2
(45) Date of Patent: Aug. 5, 2025

(54) LIGHT EMITTING DIODE AND CONDENSED POLYCYCLIC COMPOUND FOR THE SAME

(71) Applicant: Samsung Display Co., Ltd., Yongin-si (KR)

(72) Inventors: Chanseok Oh, Seoul (KR); Taeil Kim, Hwaseong-si (KR); Sun Young Pak, Suwon-si (KR); Junha Park, Gwacheon-si (KR); Jang Yeol Baek, Yongin-si (KR); Kyoung Sunwoo, Hwaseong-si (KR); Mun-Ki Sim, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 842 days.

(21) Appl. No.: 17/549,384

(22) Filed: Dec. 13, 2021

(65) Prior Publication Data

US 2022/0310922 A1 Sep. 29, 2022

(30) Foreign Application Priority Data

Mar. 16, 2021 (KR) ........................ 10-2021-0033817

(51) Int. Cl.
*H01L 51/00* (2006.01)
*C07F 5/02* (2006.01)
(Continued)

(52) U.S. Cl.
CPC ........... *H10K 85/322* (2023.02); *C07F 5/027* (2013.01); *C09K 11/06* (2013.01); *C09K 2211/1018* (2013.01); *H10K 50/155* (2023.02)

(58) Field of Classification Search
CPC ...... H10K 85/322; H10K 85/658; C07F 5/027
See application file for complete search history.

(56) References Cited

U.S. PATENT DOCUMENTS

| | | | |
|---|---|---|---|
| 10,374,166 | B2 | 8/2019 | Hatakeyama et al. |
| 2018/0301629 | A1 | 10/2018 | Hatakeyama et al. |

(Continued)

FOREIGN PATENT DOCUMENTS

| | | | |
|---|---|---|---|
| KR | 10-2016-0119683 | A | 10/2016 |
| KR | 10-2017-0130434 | A | 11/2017 |

(Continued)

OTHER PUBLICATIONS

Pershin, Anton et al., (2019) "Highly emissive excitons with reduced exchange energy in thermally activated delayed fluorescent molecules", *Nature Communications*, vol. 10: 597 (5 pages).

*Primary Examiner* — Alexander C Kollias

(74) *Attorney, Agent, or Firm* — Womble Bond Dickinson (US) LLP

(57) ABSTRACT

A light emitting diode includes a first electrode, a second electrode, and at least one functional layer disposed between the first electrode and containing a condensed polycyclic compound represented by Formula 1. The first electrode and the second electrode each independently contain at least one selected from Ag, Mg, Cu, Al, Pt, Pd, Au, Ni, Nd, Ir, Cr, Li, Ca, LiF, Mo, Ti, W, In, Sn, and Zn, compounds selected thereof, and mixtures thereof. The light emitting diode may achieve improved luminous efficiency:

(Continued)

Formula 1

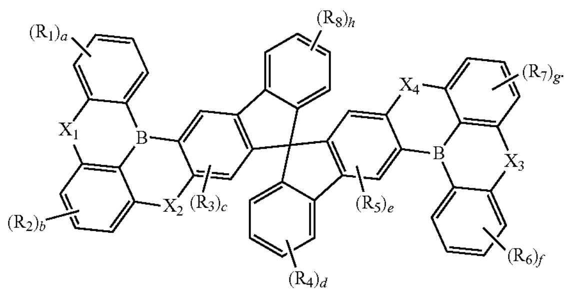

20 Claims, 6 Drawing Sheets

(51) Int. Cl.

| | |
|---|---|
| ***C09K 11/06*** | (2006.01) |
| ***H10K 85/30*** | (2023.01) |
| *H10K 50/155* | (2023.01) |

(56) References Cited

U.S. PATENT DOCUMENTS

| | | | | |
|---|---|---|---|---|
| 2020/0144513 | A1 | 5/2020 | Hatakeyama et al. | |
| 2020/0190115 | A1 | 6/2020 | Hatakeyama et al. | |
| 2021/0017196 | A1* | 1/2021 | Liu | H10K 30/353 |
| 2021/0309675 | A1* | 10/2021 | Gao | C07F 5/02 |
| 2024/0122070 | A1* | 4/2024 | Shin | H10K 85/658 |

FOREIGN PATENT DOCUMENTS

| | | | |
|---|---|---|---|
| KR | 10-1955647 | B1 | 3/2019 |
| KR | 10-2020-0006965 | A | 1/2020 |
| KR | 10-2020-0062329 | A | 6/2020 |
| WO | WO 2018/0212169 | A1 | 11/2018 |

* cited by examiner

LIGHT EMITTING DIODE AND CONDENSED POLYCYCLIC COMPOUND FOR THE SAME

CROSS-REFERENCE TO RELATED APPLICATION

This application claims priority to and the benefit of Korean Patent Application No. 10-2021-0033817, filed on Mar. 16, 2021, the entire content of which is hereby incorporated by reference.

BACKGROUND

One or more aspects of embodiments of the present disclosure herein relate to a light emitting diode and a condensed polycyclic compound used therein, and more particularly, to a condensed polycyclic compound used as an emission layer material, and a light emitting diode including the same.

As image display devices, organic electroluminescence display devices and the like have been actively researched lately. The organic electroluminescence display devices are display devices including self-luminescent light emitting diodes in which holes and electrons injected from a first electrode and a second electrode, respectively, recombine in an emission layer, and thus a luminescent material in the emission layer emits light to implement display of images.

In the application of light emitting diodes to display devices, there is a demand (or desire) for light emitting diodes with high efficiency, and development of materials, for light emitting diodes, capable of stably attaining such characteristics is being continuously required (or desired).

SUMMARY

One or more aspects of embodiments of the present disclosure are directed toward a light emitting diode with high efficiency.

One or more aspects of embodiments of the present disclosure are also directed toward a condensed polycyclic compound as a material for a light emitting diode having high efficiency characteristics.

In one or more embodiments of the present disclosure, a light emitting diode includes a first electrode, a second electrode on the first electrode, and at least one functional layer between the first electrode and the second electrode, the at least one functional layer containing a condensed polycyclic compound represented by Formula 1, wherein the first electrode and the second electrode each independently contain at least one selected from Ag, Mg, Cu, Al, Pt, Pd, Au, Ni, Nd, Ir, Cr, Li, Ca, LiF, Mo, Ti, W, In, Sn, Zn, compounds thereof, and mixtures thereof.

Formula 1

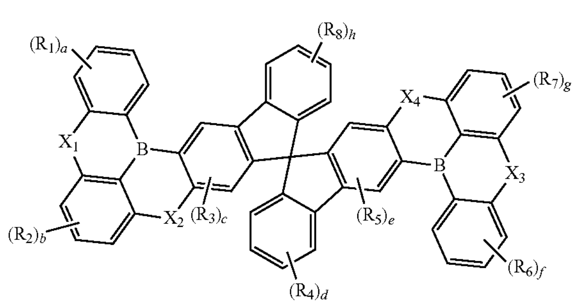

In Formula 1, $X_1$, $X_2$, $X_3$, and $X_4$ may be each independently $NR_x$, O, S, or Se, $R_x$, and $R_1$ to $R_8$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, a is an integer of 0 to 4, b is an integer of 0 to 3, c is an integer of 0 to 2, d is an integer of 0 to 4, e is an integer of 0 to 2, f is an integer of 0 to 4, g is an integer of 0 to 3, and h is an integer of 0 to 4.

In one or more embodiments, the at least one functional layer may include an emission layer, a hole transport region between the first electrode and the emission layer, and an electron transport region between the emission layer and the second electrode, wherein the emission layer may contain the condensed polycyclic compound.

In one or more embodiments, the emission layer may include a dopant and a host, wherein the dopant may contain the condensed polycyclic compound.

In one or more embodiments, the emission layer may emit blue light.

In one or more embodiments, the emission layer may emit thermally activated delayed fluorescence.

In one or more embodiments, the electron transport region may contain a compound G:

Compound G

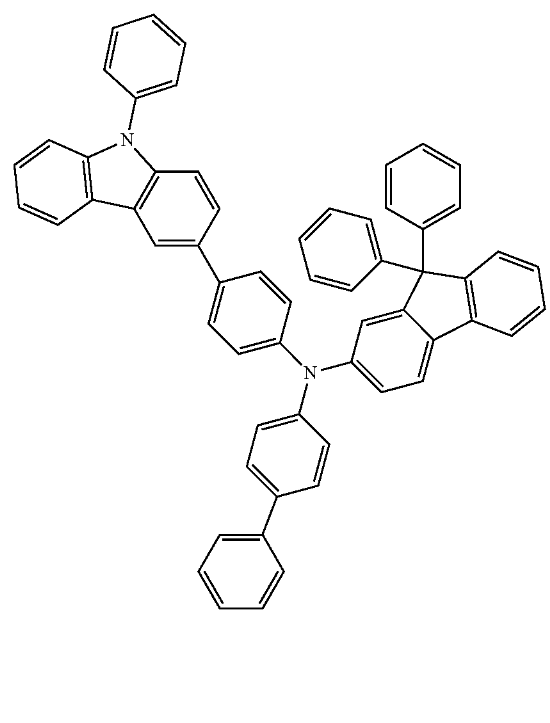

In one or more embodiments, $X_1$ may be the same as $X_3$, and $X_2$ may be the same as $X_4$.

In one or more embodiments, the condensed polycyclic compound represented by Formula 1 may be represented by any one of Formulae 2-1 to 2-3.

Formula 2-1

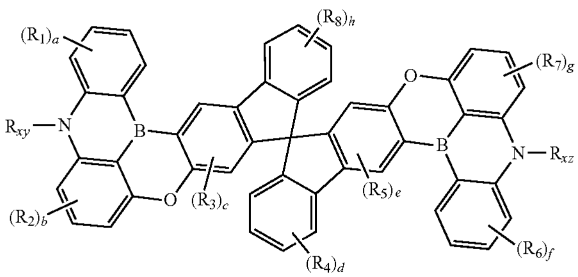

Formula 2-2

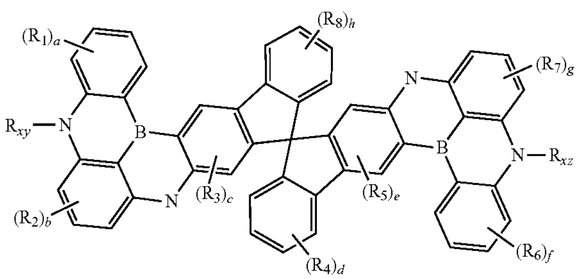

-continued

Formula 2-3

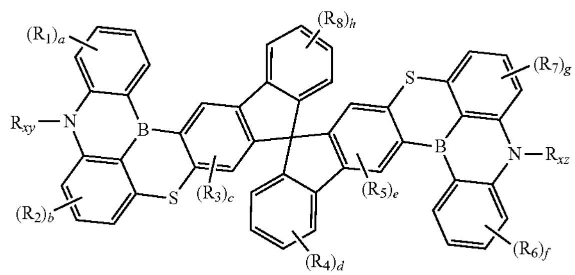

In Formulae 2-1 to 2-3, $R_{xy}$ and $R_{xz}$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, and $R_1$ to $R_8$, and a to h may be the same as defined in Formula 1.

In one or more embodiments, the condensed polycyclic compound represented by Formula 1 may be represented by Formula 3-1 or Formula 3-2.

Formula 3-1

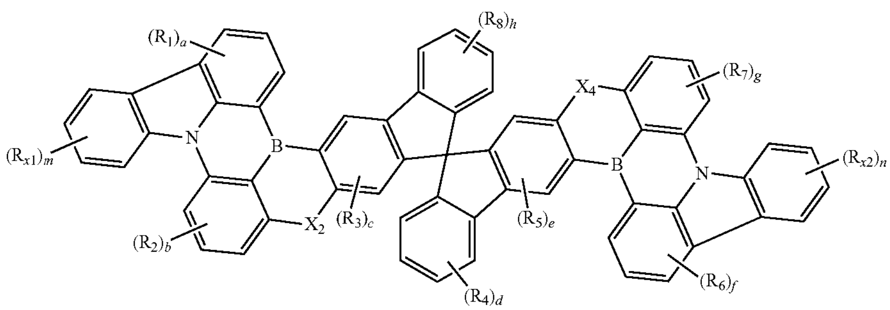

Formula 3-2

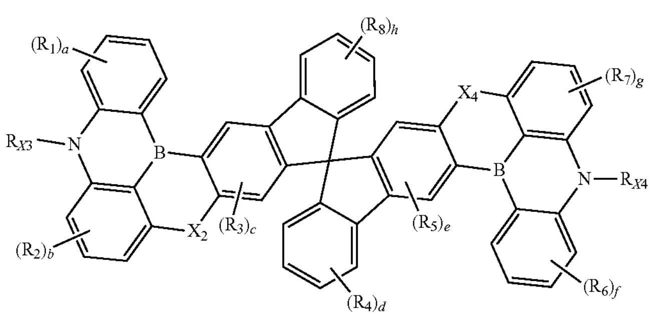

In Formulae 3-1 and 3-2, $R_{X1}$ and $R_{X2}$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, $R_{X3}$ and $R_{X4}$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, m and n may be each independently an integer of 0 to 4, and $X_2$, $X_4$, $R_1$ to $R_8$, and a to h may be the same as defined in Formula 1.

In one or more embodiments, the condensed polycyclic compound represented by Formula 1 may be represented by Formula 4-1.

Formula 4-1

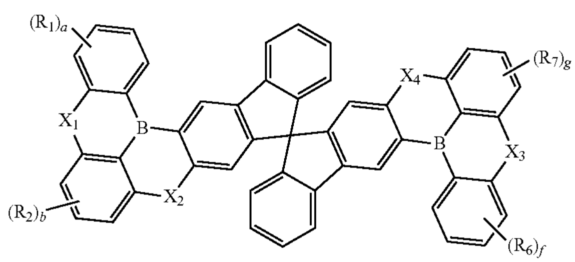

In Formula 4-1, $X_1$, $X_2$, $X_3$, $X_4$, $R_1$, $R_2$, $R_6$, $R_7$, a, b, f, and g are the same as defined in Formula 1.

In one or more embodiments, the condensed polycyclic compound represented by Formula 1 may be represented by Formula 5-1.

Formula 5-1

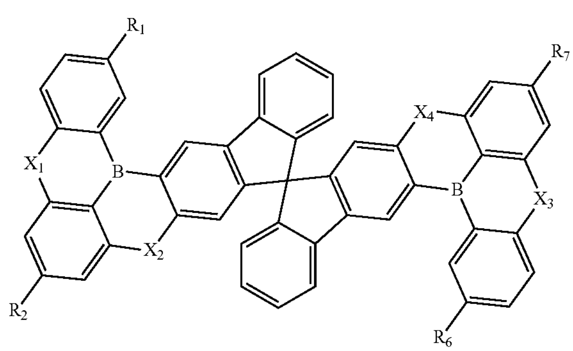

In Formula 5-1, $X_1$, $X_2$, $X_3$, $X_4$, $R_1$, $R_2$, and $R_6$ are the same as defined in Formula 1.

In one or more embodiments, $X_1$, $X_2$, $R_1$, $R_2$, $R_3$, $R_4$, a, b, c, and d may be the same as $X_3$, $X_4$, $R_6$, $R_7$, $R_5$, $R_8$, f, g, e, and h, respectively.

In one or more embodiments, $R_X$, and $R_1$ to $R_8$ may be each independently a hydrogen atom, a deuterium atom, a t-butyl group, a substituted or unsubstituted diphenylamine group, a substituted or unsubstituted phenyl group, a substituted or unsubstituted biphenyl group, a substituted or unsubstituted carbazole group, and/or bonded to an adjacent group to form a ring.

In one or more embodiments of the present disclosure, a light emitting diode includes a first electrode, a hole transport region on the first electrode and including a compound G, a second electrode on the first electrode, and at least one functional layer between the first electrode and the second electrode, wherein the at least one functional layer contains a condensed polycyclic compound represented by Formula 1 and a compound G.

Compound G

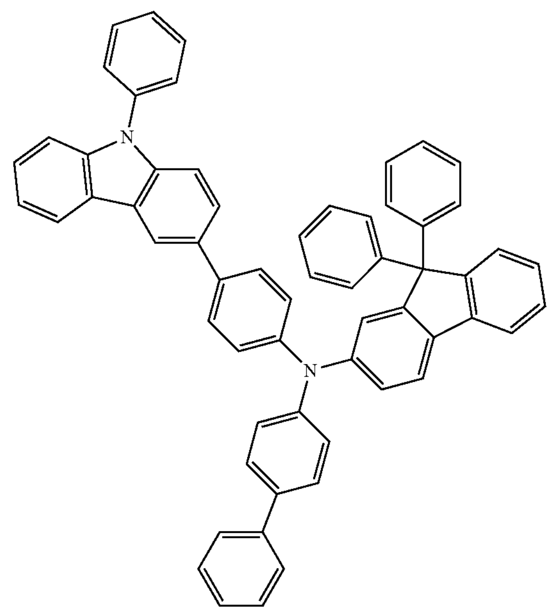

Formula 1

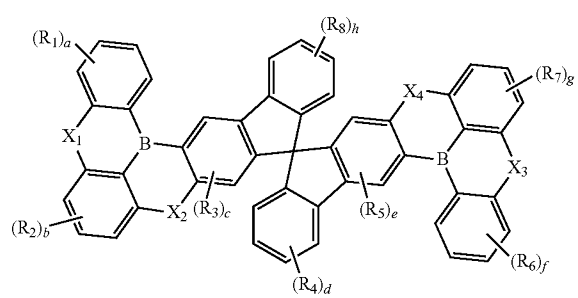

In Formula 1, $X_1$, $X_2$, $X_3$, and $X_4$ may be each independently $NR_X$, O, S, or Se, $R_x$, and $R_1$ to $R_8$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, a is an integer of 0 to 4, b is an integer of 0 to 3, c is an integer of 0 to 2, d is an integer of 0 to 4, e is an integer of 0 to 2, f is an integer of 0 to 4, g is an integer of 0 to 3, and h is an integer of 0 to 4.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
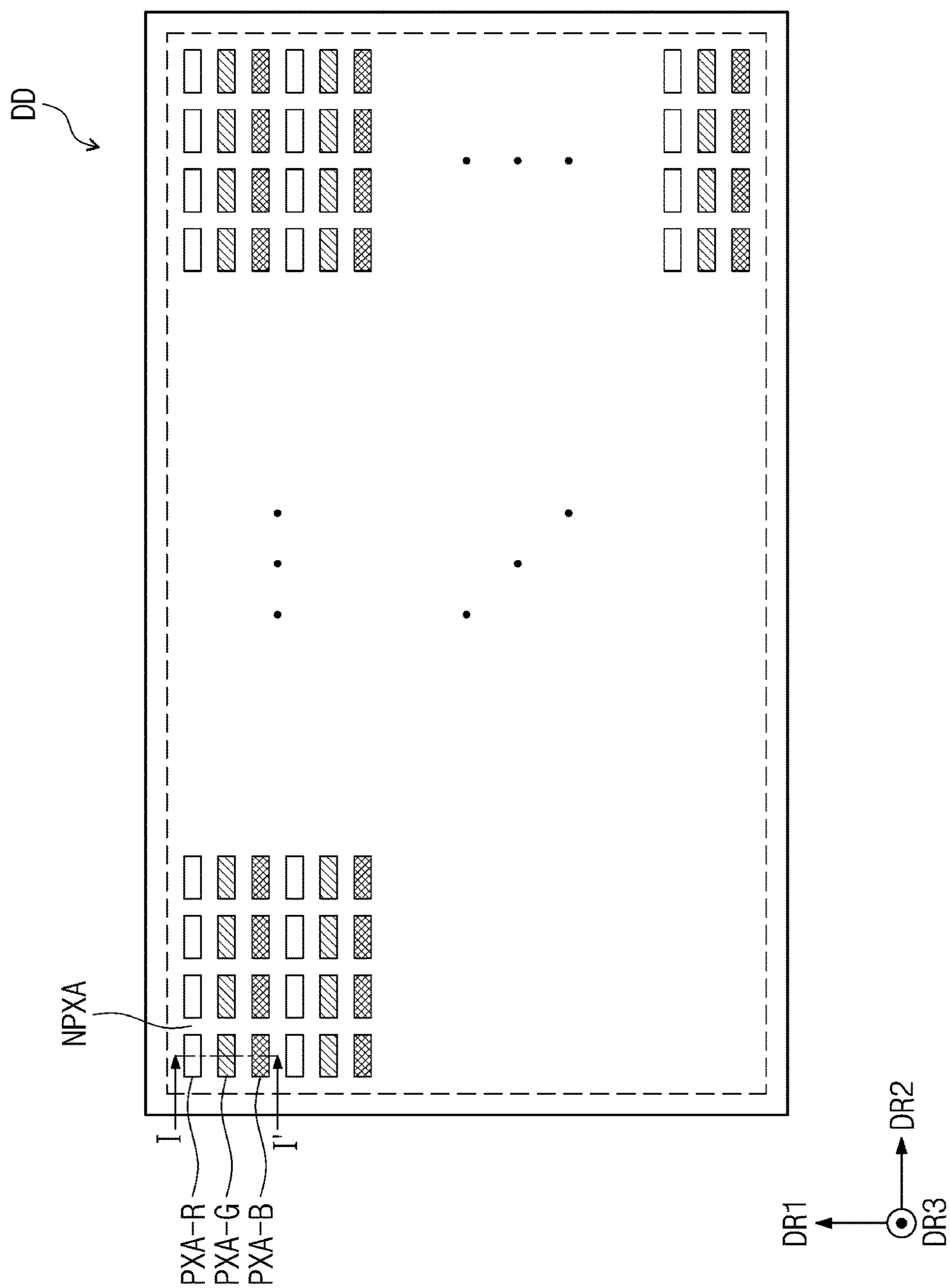
FIG. 1 is a plan view showing a display device according to one or more embodiments.

The present disclosure may be modified in many alternate forms, and thus embodiments will be exemplified in the drawings and described in more detail hereinbelow. It should be understood, however, that it is not intended to limit the present disclosure to the particular forms disclosed, but rather, is intended to cover all modifications, equivalents, and alternatives falling within the spirit and scope of the present disclosure.

In describing the drawings, like reference numerals are used for like elements. In the drawings, the sizes of elements may be exaggerated for clarity. It will be understood that, although the terms “first”, “second”, etc. may be used herein to describe various elements, these elements should not be limited by these terms.

These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In the present description, it should be understood that the terms “comprise,” “include,” or “have” are intended to specify the presence of stated features, integers, steps, operations, elements, components, or combinations thereof in the disclosure, but do not preclude the presence or addition of one or more other features, integers, steps, operations, elements, components, or combinations thereof.

In the present description, it should be understood that when an element such as a layer, a film, a region, or a substrate is referred to as being “on” or “above” another element, it may be “directly on” the other element (without any intervening elements therebetween) or intervening elements may also be present. Similarly, it should be understood that when an element such as a layer, a film, a region, or a substrate is referred to as being “beneath” or “under” another element, it may be “directly under” the other element or intervening elements may also be present. In addition, in the present description, it should be understood that when an element is referred to as being “on,” it may be “above” or “under” the other element.

In the present description, the term “substituted or unsubstituted” may refer to a group or substituent that is unsubstituted or that is substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents exemplified above may be substituted or unsubstituted. For example, a biphenyl group may be interpreted as an aryl group or as a phenyl group substituted with a phenyl group.

In the present description, the term “bonded to an adjacent group to form a ring” may refer to a group or substituent that is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may each independently be monocyclic or polycyclic. In addition, the rings formed by being bonded to each other may be connected to another ring to form a spiro structure.

In the present description, the term “an adjacent group” may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, two methyl groups in 1,2-dimethylbenzene may be interpreted as mutually “adjacent groups” and two ethyl groups in 1,1-diethylcyclopentane may be interpreted as mutually “adjacent groups”. In addition, two methyl groups in 4,5-dimethylphenanthrene may be interpreted as mutually “adjacent groups”.

In the present description, examples of a halogen atom may include a fluorine atom, a chlorine atom, a bromine atom, and an iodine atom.

In the present description, an alkyl group may be a linear, branched or cyclic alkyl group. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the present description, a hydrocarbon ring group refers to any functional group or substituent derived from an aliphatic hydrocarbon ring. The hydrocarbon ring group may be a saturated hydrocarbon ring group having 5 to 20 ring-forming carbon atoms.

In the present description, an aryl group refers to any functional group or substituent derived from an aromatic hydrocarbon ring. The aryl group may be a monocyclic aryl group or a polycyclic aryl group. The number of ring-forming carbon atoms in the aryl group may be 6 to 50, 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the present description, a fluorenyl group may be substituted, and two substituents may be bonded to each other to form a spiro structure. An example that the fluorenyl group is substituted is as follows. However, the embodiments of the present disclosure are not limited thereto:

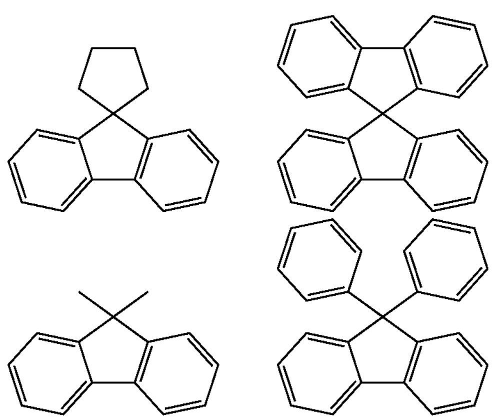

In the present description, a heterocyclic group refers to any functional group or substituent derived from a ring containing at least one of B, O, N, P, Si, S, and/or Se as a hetero atom. The heterocyclic group includes an aliphatic heterocyclic group and an aromatic heterocyclic group. The aromatic heterocyclic group may be a heteroaryl group. The aliphatic heterocycle (e.g., the aliphatic heterocyclic group) and the aromatic heterocycle (e.g., the aromatic heterocyclic group) may each independently be monocyclic or polycyclic.

In the present description, the heterocyclic group may contain at least one of B, O, N, P, Si, S, and/or Se as a hetero atom. When the heterocyclic group contains two or more hetero atoms, the two or more hetero atoms may be the same as or different from each other. The heterocyclic group may be a monocyclic heterocyclic group or a polycyclic heterocyclic group, and includes a heteroaryl group. The number of ring-forming carbon atoms in the heterocyclic group may be 2 to 50, 2 to 30, 2 to 20, or 2 to 10.

In the present description, the aliphatic heterocyclic group may contain at least one of B, O, N, P, Si, S, and/or Se as a hetero atom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto In the present description, the heteroaryl group may contain at least one of B, O, N, P, Si, S, and/or Se as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the present description, the above description of the aryl group may be applied to an arylene group, except that the arylene group is a divalent group. The above description of the heteroaryl group may be applied to a heteroarylene group, except that the heteroarylene group is a divalent group.

In the present description, a silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but are not limited thereto.

In the present description, the number of carbon atoms in an amino group is not particularly limited, but may be 1 to 30. The amino group may include an alkyl amino group, an aryl amino group, and/or a heteroaryl amino group. Examples of the amino group may include a methylamino group, a dimethylamino group, a phenylamino group, a diphenylamino group, a naphthylamino group, a 9-methyl-anthracenylamino group, a triphenylamino group, etc., but are not limited thereto.

In the present description, the number of carbon atoms in a carbonyl group is not particularly limited, but may be 1 to 40, 1 to 30, or 1 to 20. For example, the carbonyl group may have the following structure, but is not limited thereto.

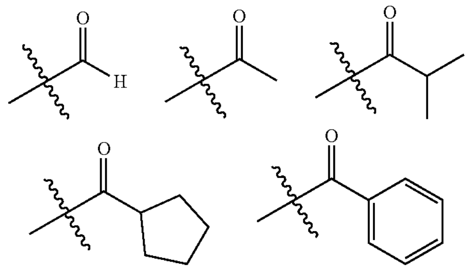

In the present description, the number of carbon atoms in a sulfinyl group and a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the present description, a thio group may include an alkyl thio group and an aryl thio group. The thio group may be a group in which a sulfur atom is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the present description, an oxy group may be a group in which an oxygen atom is bonded to an alkyl group or an aryl group as defined above. The oxy group may include an alkoxy group and an aryl oxy group. The alkoxy group may be linear, branched, or cyclic. The number of carbon atoms in the alkoxy group is not particularly limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the present description, a boron group may be a group in which a boron atom is bonded to an alkyl group or an aryl group as defined above. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., but are not limited thereto.

In the present description, an alkenyl group may be linear or branched. The number of carbon atoms is not particularly limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but are not limited thereto.

In the present description, the number of carbon atoms in an amine group is not particularly limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, etc., but are not limited thereto.

In the present description, examples of the alkyl group may include an alkylthio group, an alkyl sulfoxy group, an alkylaryl group, an alkylamino group, an alkyl boron group, an alkyl silyl group, and an alkyl amine group.

In the present description, examples of the aryl group may include an aryloxy group, an arylthio group, an aryl sulfoxy group, an arylamino group, an aryl boron group, an aryl silyl group, and an aryl amine group.

In the present description, a direct linkage may refer to a chemical bond (e.g., a single bond).

Hereinafter, embodiments of the present disclosure will be described with reference to the accompanying drawings.

Figure 2:
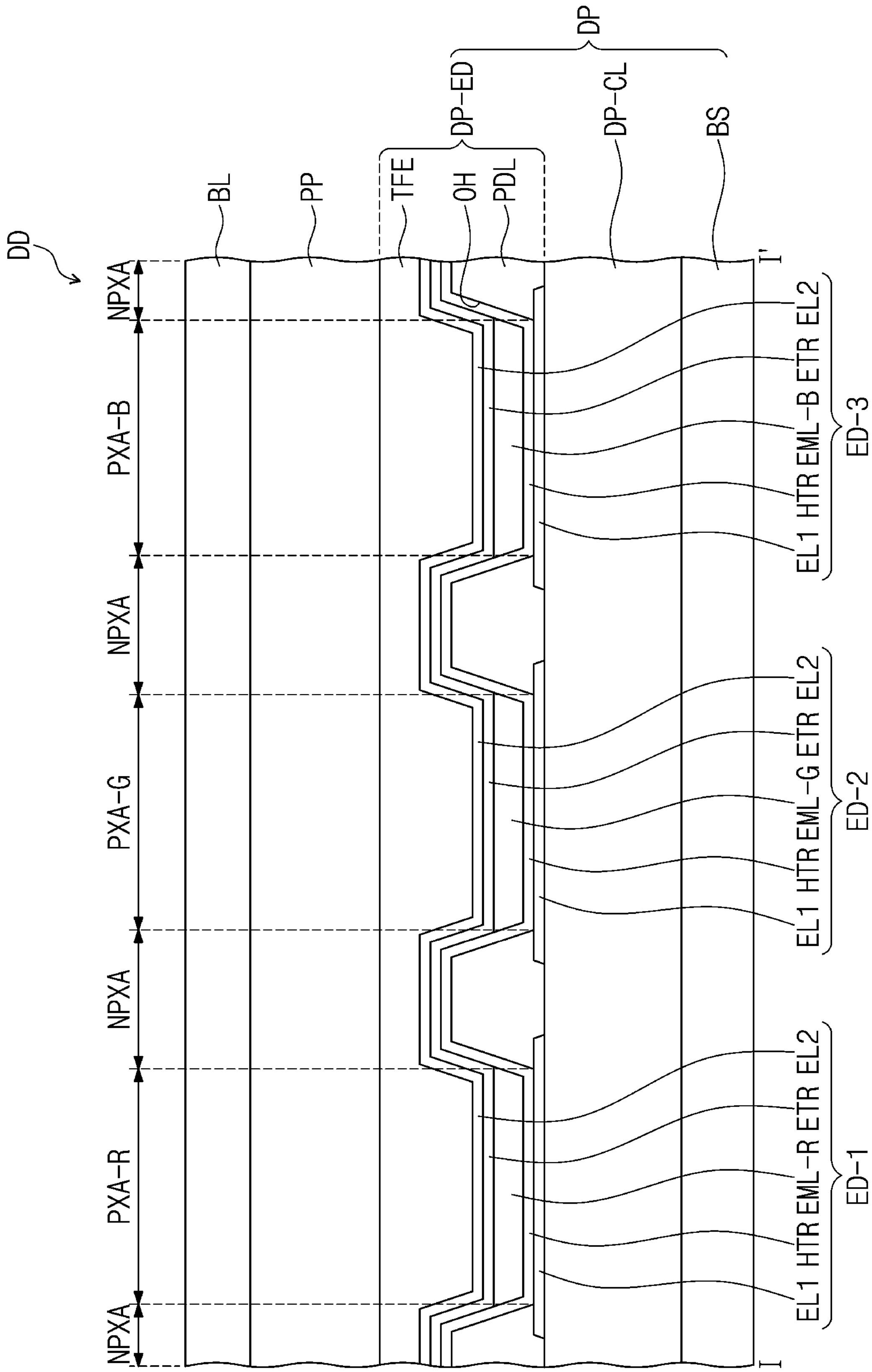
FIG. 2 is a cross-sectional view of a display device according to one or more embodiments.

FIG. 1 is a plan view of a display device DD according to one or more embodiments. FIG. 2 is a cross-sectional view of a display device DD of one or more embodiments. FIG. 2 is a cross-sectional view showing a portion corresponding to line I-I' of FIG. 1.

The display device DD may include a display panel DP and an optical layer PP disposed (e.g., positioned or provided) on the display panel DP. The display panel DP includes light emitting diodes ED-1, ED-2, and ED-3. The display device DD may include a plurality of light emitting diodes ED-1, ED-2, and ED-3. The optical layer PP may be disposed on the display panel DP to control reflected light in the display panel DP due to external light. The optical layer PP may include, for example, a polarizing layer and/or a color filter layer. In one or more embodiments, the optical layer PP may be omitted in the display device DD of one or more embodiments.

A base substrate BL may be disposed on the optical layer PP. The base substrate BL may be a member providing a base surface on which the optical layer PP is disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., including an organic material and an inorganic material). In one or more embodiments, the base substrate BL may be omitted.

The display device DD according to one or more embodiments may further include a filling layer. The filling layer may be disposed between a display element layer DP-ED and the base substrate BL. The filling layer may be an organic material layer. The filling layer may include at least one selected from among an acrylic resin, a silicone-based resin, and an epoxy-based resin.

The display panel DP may include a base layer BS, a circuit layer DP-CL provided on the base layer BS, and a display element layer DP-ED. The display element layer DP-ED may include pixel defining films PDL, a plurality of light emitting diodes ED-1, ED-2, and ED-3 disposed between (e.g., defined by) the pixel defining films PDL, and an encapsulation layer TFE disposed on the plurality of light emitting diodes ED-1, ED-2, and ED-3.

The base layer BS may be a member providing a base surface on which the display element layer DP-ED is disposed. The base layer BS may be a glass substrate, a metal substrate, a plastic substrate, etc. However, the embodiment of the present disclosure is not limited thereto, and the base layer BS may be an inorganic layer, an organic layer, or a composite material layer (e.g., including an organic material and an inorganic material).

In one or more embodiments, the circuit layer DP-CL may be disposed on the base layer BS, and the circuit layer DP-CL may include a plurality of transistors. The transistors may each include a control electrode, an input electrode, and an output electrode. For example, the circuit layer DP-CL may include a switching transistor and a driving transistor for driving a plurality of light emitting diodes ED-1, ED-2 and ED-3 of the display element layer DP-ED.

The light emitting diodes ED-1, ED-2, and ED-3 each may have a structure of a light emitting diode ED of one or more embodiments according to FIGS. 3 to 6, which will be described hereinbelow. The light emitting diodes ED-1, ED-2, and ED-3 each may include a first electrode EL1, a hole transport region HTR, emission layers EML-R, EML-G, and EML-B, an electron transport region ETR, and a second electrode EL2.

FIG. 2 illustrates one or more embodiments in which the emission layers EML-R, EML-G, and EML-B of the light emitting diodes ED-1, ED-2, and ED-3 are disposed in openings OH defined in the pixel defining films PDL, and the hole transport region HTR, the electron transport region ETR, and the second electrode EL2 are provided as a common layer throughout the light emitting diodes ED-1, ED-2, and ED-3. However, the embodiment of the present disclosure is not limited thereto, and in one or more embodiments, the hole transport region HTR and the electron transport region ETR may be patterned and provided inside the openings OH defined in the pixel defining films PDL. For example, in one or more embodiments, the hole transport region HTR, the emission layers EML-R, EML-G, and EML-B, and the electron transport region ETR, etc. of the light emitting diodes ED-1, ED-2, and ED-3 may be patterned through an inkjet printing method to be provided.

An encapsulation layer TFE may cover the light emitting diodes ED-1, ED-2 and ED-3. The encapsulation layer TFE may seal the display element layer DP-ED. The encapsulation layer TFE may be a thin film encapsulation layer. The encapsulation layer TFE may be a single layer or a laminated layer of a plurality of layers. The encapsulation layer TFE includes at least one insulating layer. The encapsulation layer TFE according to one or more embodiments may include at least one inorganic film (hereinafter, an encapsulation inorganic film). In addition, the encapsulation layer TFE according to one or more embodiments may include at least one organic film (hereinafter, an encapsulation organic film) and at least one encapsulation inorganic film.

The encapsulation inorganic film protects the display element layer DP-ED from moisture/oxygen, and the encapsulation organic film protects the display element layer DP-ED from foreign substances such as dust particles. The encapsulation inorganic film may include silicon nitride, silicon oxy nitride, silicon oxide, titanium oxide, aluminum oxide, etc., but is not particularly limited thereto. The encapsulation organic film may include an acrylic compound, an epoxy-based compound, etc. The encapsulation organic film may include a photopolymerizable organic material, and is not particularly limited.

The encapsulation layer TFE may be disposed on the second electrode EL2, and may be disposed to fill the openings OH.

Referring to FIGS. 1 and 2, the display device DD may include a non-light emitting area NPXA and light emitting areas PXA-R, PXA-G, and PXA-B. Each of the light emitting areas PXA-R, PXA-G, and PXA-B may be an area emitting (e.g., to emit) light generated from a corresponding one of the light emitting diodes ED-1, ED-2, and ED-3. The light emitting areas PXA-R, PXA-G, and PXA-B may be spaced apart from each other on a plane (e.g., in a plan view).

Each of the light emitting areas PXA-R, PXA-G, and PXA-B may be an area separated by the pixel defining films PDL. The non-light emitting areas NPXA may be an area between neighboring light emitting areas PXA-R, PXA-G, and PXA-B, and may correspond to (e.g., defined by) the pixel defining films PDL. In one or more embodiments of the present description, each of the light emitting areas PXA-R, PXA-G, and PXA-B may correspond to a pixel. The pixel defining films PDL may separate the light emitting diodes ED-1, ED-2 and ED-3. The emission layers EML-R, EML-G, and EML-B of the light emitting diodes ED-1, ED-2 and ED-3 may be disposed in and separated by the openings OH defined in the pixel defining films PDL.

The light emitting areas PXA-R, PXA-G, and PXA-B may be divided into a plurality of groups according to the color of light generated from the light emitting diodes ED-1, ED-2, and ED-3. In the display device DD of one or more embodiments shown in FIGS. 1 and 2, three light emitting areas PXA-R, PXA-G, and PXA-B which emit red light, green light, and blue light, are illustrated as an example. For example, the display device DD of one or more embodiments may include a red light emitting area PXA-R, a green light emitting area PXA-G, and a blue light emitting area PXA-B, which are distinct from one another.

In the display device DD according to one or more embodiments, the light emitting diodes ED-1, ED-2, and ED-3 may emit light having different wavelength ranges. For example, in one or more embodiments, the display device DD may include a first light emitting diode ED-1 emitting (e.g., configured to emit) red light, a second light emitting diode ED-2 emitting (e.g., configured to emit) green light, and a third light emitting diode ED-3 emitting (e.g., configured to emit) blue light. For example, the red light emitting area PXA-R, the green light emitting area PXA-G, and the blue light emitting area PXA-B of the display device DD may correspond to the first light emitting diode ED-1, the second light emitting diode ED-2, and the third light emitting diode ED-3, respectively.

However, the embodiment of the present disclosure is not limited thereto, and the first to third light emitting diodes ED-1, ED-2 and ED-3 may emit light in the same wavelength range or emit light in at least two different wavelength ranges. For example, the first to third light emitting diodes ED-1, ED-2, and ED-3 all may emit blue light.

The light emitting areas PXA-R, PXA-G, and PXA-B in the display device DD according to one or more embodiments may be arranged in the form of a stripe (e.g., in a stripe pattern). Referring to FIG. 1, a plurality of red light emitting areas PXA-R may be arranged along a second directional axis DR2, a plurality of green light emitting areas PXA-G may be arranged along the second directional axis DR2, and a plurality of blue light emitting areas PXA-B may be arranged along the second directional axis DR2. In one or more embodiments, the red light emitting area PXA-R, the green light emitting area PXA-G, and the blue light emitting area PXA-B may be arranged alternately with each other along a first directional axis DR1.

FIGS. 1 and 2 illustrate that the light emitting areas PXA-R, PXA-G, and PXA-B are all similar in size, but the embodiment of the present disclosure is not limited thereto, and the light emitting areas PXA-R, PXA-G and PXA-B may be different in size from each other according to wavelength range of emitted light. As used herein, the areas of the light emitting areas PXA-R, PXA-G, and PXA-B may refer to an area when viewed on a plane defined by the first directional axis DR1 and the second directional axis DR2.

In one or more embodiments, the arrangement of the light emitting areas PXA-R, PXA-G, and PXA-B is not limited to the one shown in FIG. 1, and the order in which the red light emitting area PXA-R, the green light emitting area PXA-G, and the blue light emitting area PXA-B are arranged comes with varied combination according to display quality characteristics required for the display device DD. For example, the light emitting areas PXA-R, PXA-G, and PXA-B may be arranged in a PenTile®/PENTILE® configuration (PENTILE® is a registered trademark owned by Samsung Display Co., Ltd.) or a diamond configuration.

In one or more embodiments, an area of each of the light emitting areas PXA-R, PXA-G, and PXA-B may be different in size from one another. For example, in one or more embodiments, the green light emitting area PXA-G may be smaller than the blue light emitting area PXA-B in size, but the embodiment of the present disclosure is not limited thereto.

Hereinafter, FIGS. 3 to 6 are cross-sectional views schematically showing a light emitting diode according to one or more embodiments of the present disclosure. The light emitting diode ED according to one or more embodiments may include a first electrode EL1, a second electrode EL2 facing the first electrode EL1, and at least one functional layer disposed between the first electrode EL1 and the second electrode EL2. The at least one functional layer may include a hole transport region HTR, an emission layer EML, and an electron transport region ETR, which are sequentially stacked. For example, the light emitting diode ED of one or more embodiments may include a first electrode EL1, a hole transport region HTR, an emission layer EML, an electron transport region ETR, and a second electrode EL2.

Figure 3:
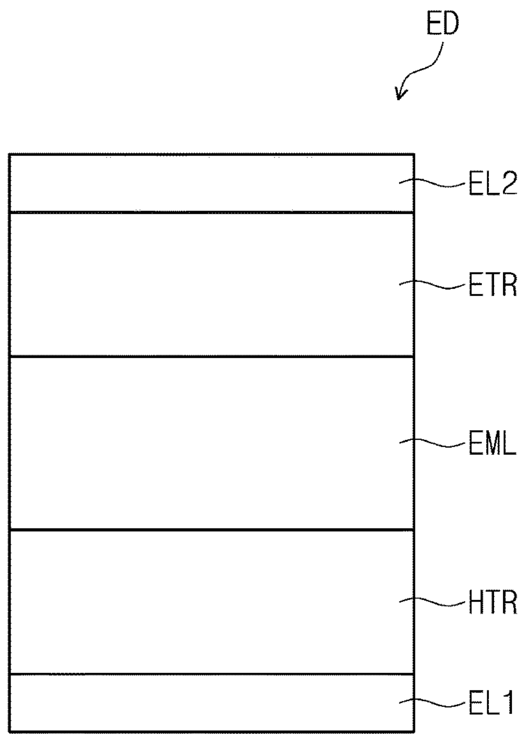
FIG. 3 is a cross-sectional view schematically showing a light emitting diode according to one or more embodiments.
Figure 4:
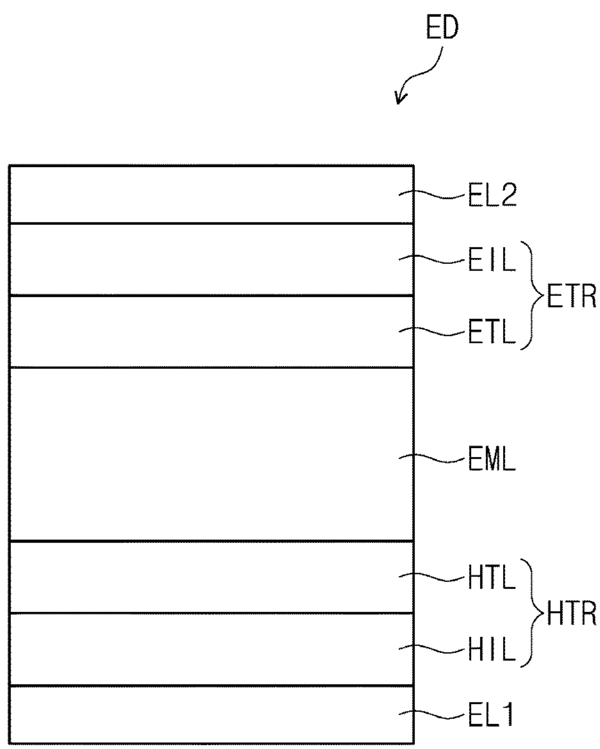
FIG. 4 is a cross-sectional view schematically showing a light emitting diode according to one or more embodiments.
Figure 5:
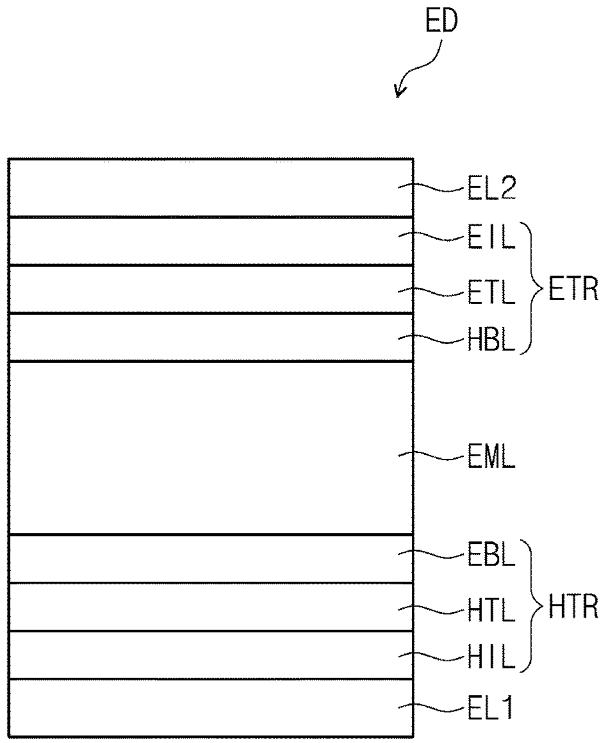
FIG. 5 is a cross-sectional view schematically showing a light emitting diode according to one or more embodiments.
Figure 6:
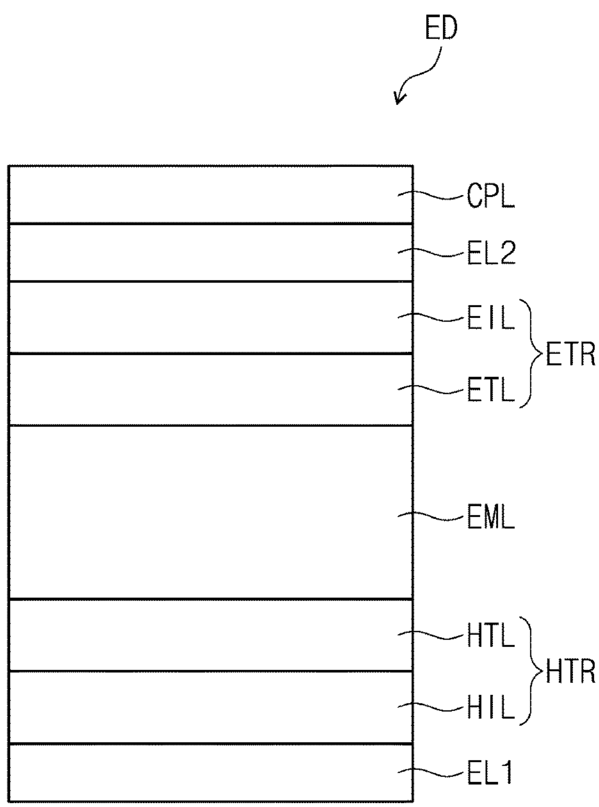
FIG. 6 is a cross-sectional view schematically showing a light emitting diode according to one or more embodiments.

FIG. 4 illustrates, compared with FIG. 3, a cross-sectional view of a light emitting diode ED of one or more embodiments in which the hole transport region HTR includes a hole injection layer HIL and a hole transport layer HTL, and the electron transport region ETR includes an electron injection layer EIL and an electron transport layer ETL. In addition, FIG. 5 illustrates, compared with FIG. 3, a cross-sectional view of a light emitting diode ED of one or more embodiments in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. FIG. 6 illustrates, compared with FIG. 4, a cross-sectional view of a light emitting diode ED of one or more embodiments in which a capping layer CPL disposed on the second electrode EL2 is provided.

The light emitting diode ED of one or more embodiments may include a condensed polycyclic compound of one or more embodiments, which will be described hereinbelow, in at least one functional layer such as a hole transport region HTR, an emission layer EML, and an electron transport region ETR.

In the light emitting diode ED according to one or more embodiments, the first electrode EL1 has conductivity. The first electrode EL1 may be formed of a metal material, a metal alloy, or any suitable conductive compound. The first electrode EL1 may be an anode or a cathode. However, the embodiment of the present disclosure is not limited thereto. In one or more embodiments, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF, Mo, Ti, W, a compound thereof, or a mixture thereof (e.g., a mixture of Ag and Mg, a mixture of LiF and Ca, a mixture of LiF and Al, etc.). In one or more embodiments, the first electrode EL1 may have a multilayer structure including a reflective film or a transflective film formed of any of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. In addition, the embodiment of the present disclosure is not limited thereto, and the first electrode EL1 may include any of the above-described metal materials, a combination of two or more metal materials selected from the above-described metal materials, and/or oxide(s) of the above-described metal materials. The first electrode EL1 may have a thickness of about 700 Å to about 10,000 Å. For example, the first electrode EL1 may have a thickness of 1000 Å to about 3000 Å.

The hole transport region HTR is provided on the first electrode EL1. The hole transport region HTR may include at least one selected from among a hole injection layer HIL, a hole transport layer HTL, a buffer layer, a light emitting auxiliary layer, and an electron blocking layer EBL. The hole transport region HTR may have, for example, a thickness of about 50 Å to about 15000 Å.

The hole transport region HTR may have a single layer formed of a single material, a single layer formed of a plurality of different materials, or a multilayer structure having a plurality of layers formed of a plurality of different materials.

For example, the hole transport region HTR may have a single-layer structure formed of the hole injection layer HIL or the hole transport layer HTL, or a single-layer structure formed of a hole injection material and/or a hole transport material. In some embodiments, the hole transport region HTR may have a single-layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in this order from the first electrode EL1, but the embodiment of the present disclosure is not limited thereto.

The hole transport region HTR may be formed using one or more suitable methods selected from a vacuum deposition method, a spin coating method, a cast method, a Langmuir-Blodgett (LB) method, an inkjet printing method, a laser printing method, and a laser induced thermal imaging (LITI) method.

In one or more embodiments, the hole transport region HTR may include a compound G:

Compound G

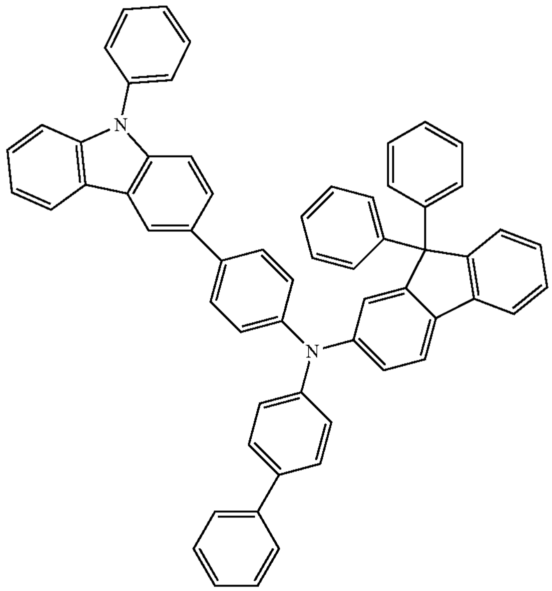

The hole transport region HTR may further include a compound represented by Formula H-1 below:

Formula H-1

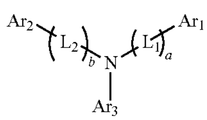

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms, or a substituted or unsubstituted heteroaryl group having 2 to 30 ring-forming carbon atoms.

The compound represented by Formula H-1 above may be a monoamine compound. In one or more embodiments, the compound represented by Formula H-1 may be a diamine compound in which at least one of $Ar_1$ to $Ar_3$ includes an amine group as a substituent. In some embodiments, the compound represented by Formula H-1 may be a carbazole-based compound including a substituted or unsubstituted carbazole group in at least one of $Ar_1$ and/or $Ar_2$, or a fluorene-based compound including a substituted or unsubstituted fluorenyl group in at least one of $Ar_1$ and/or $Ar_2$.

The compound represented by Formula H-1 may be represented by any one of compounds from Compound Group H below. However, the compounds listed in Compound Group H below are presented as an example, and the compound represented by Formula H-1 is not limited to those listed in Compound Group H below.

Compound Group H

H-1-1

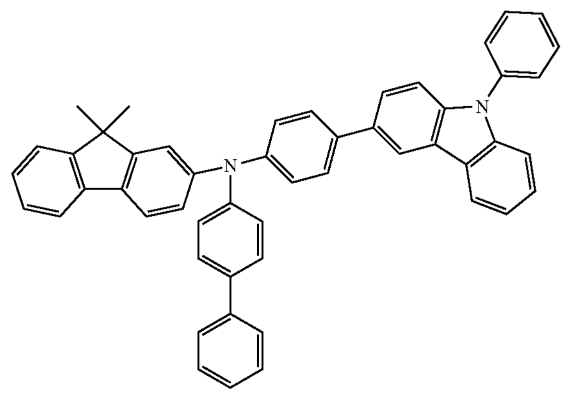

H-1-2

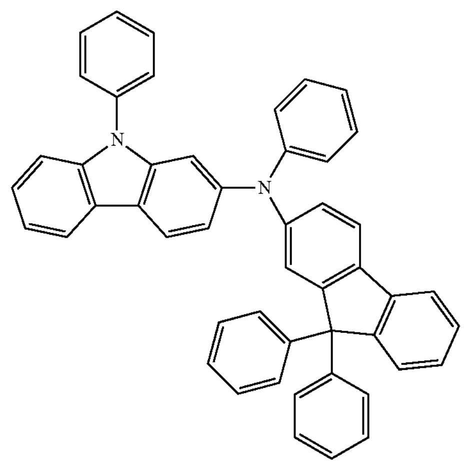

H-1-3

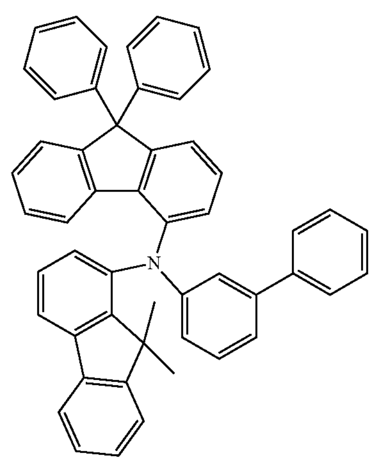

-continued
H-1-4
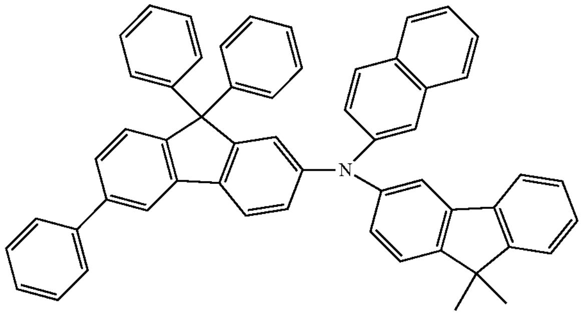
H-1-5
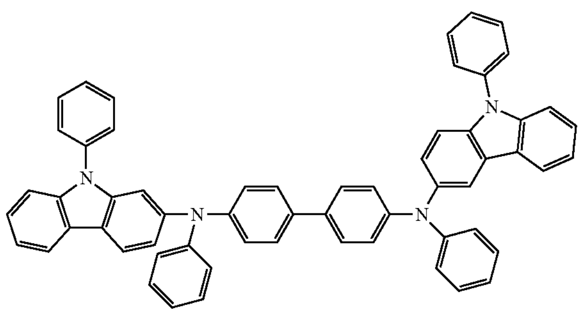
H-1-6
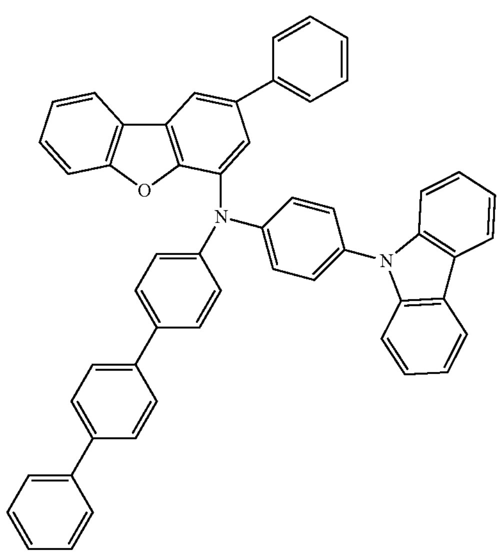
-continued
H-1-7
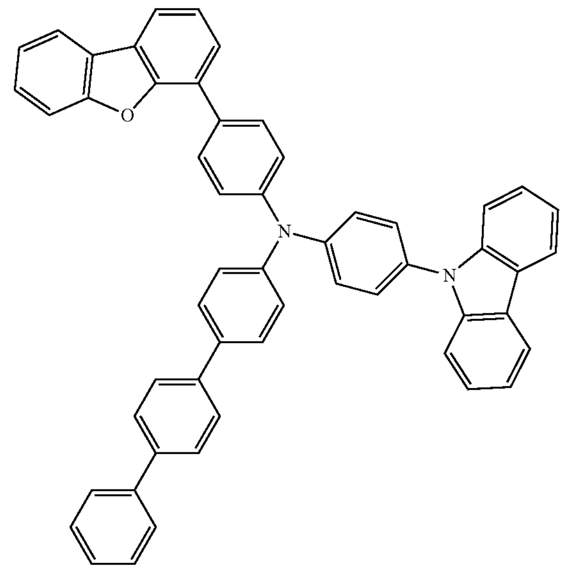
H-1-8
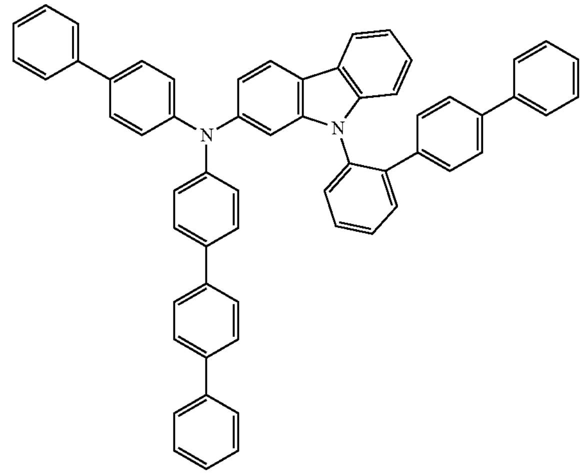
H-1-9
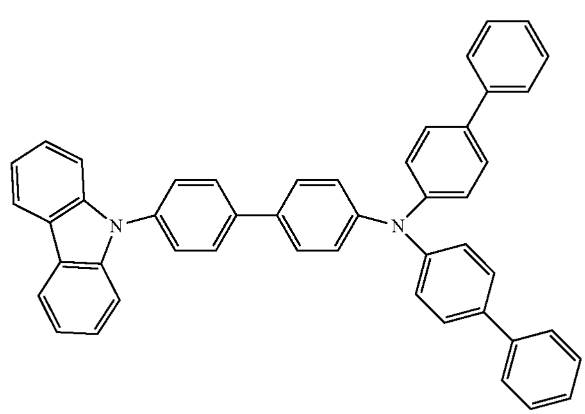

-continued
H-1-10
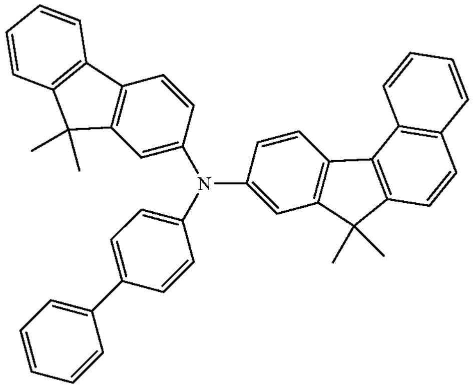
H-1-11
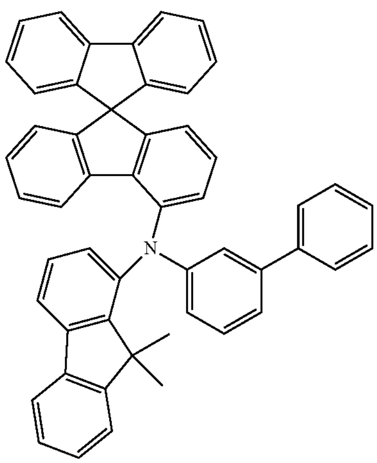
H-1-12
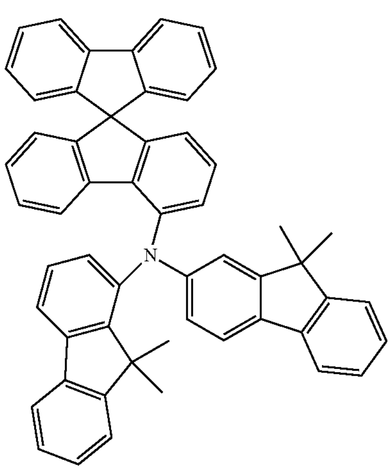
-continued
H-1-13
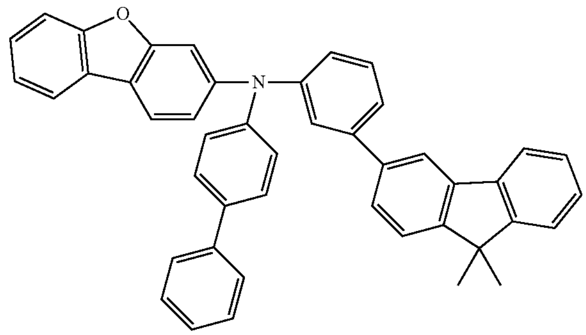
H-1-14
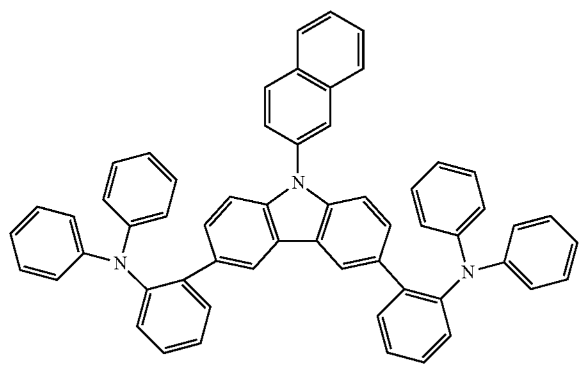
H-1-15
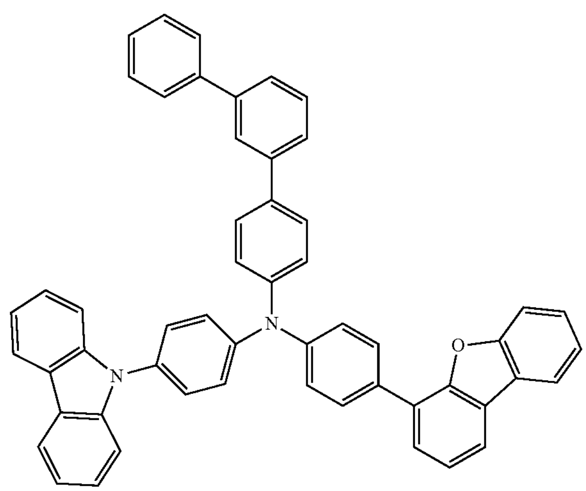

-continued

H-1-16

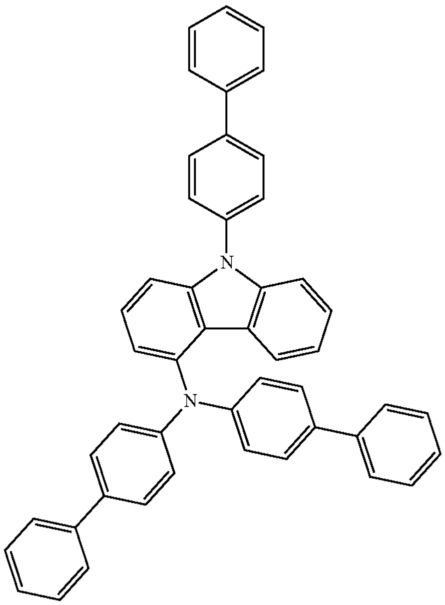

H-1-17

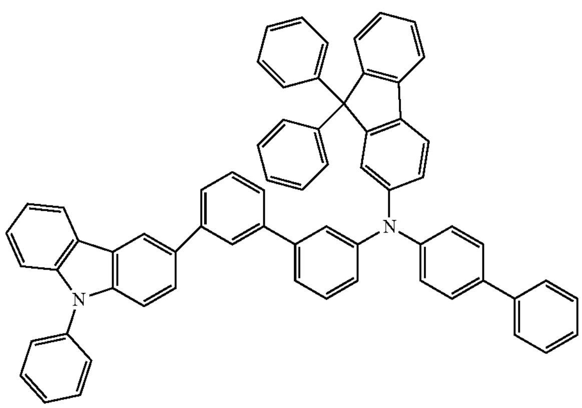

H-1-H18

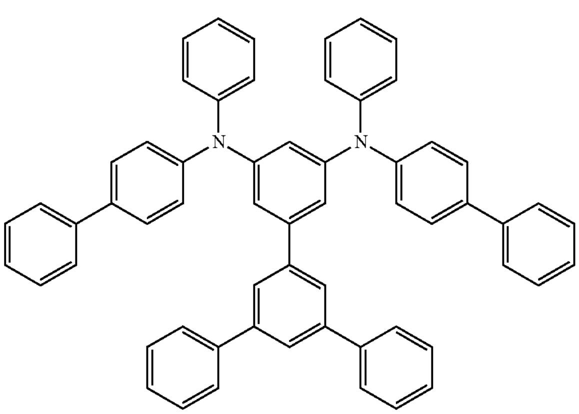

-continued

H-1-19

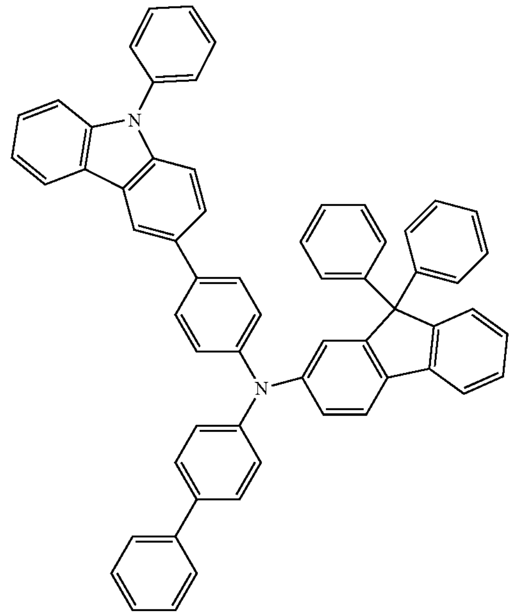

The hole transport region HTR may include a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine] (m-MTDATA), 4,4',4''-tris(N,N-diphenylamino)triphenylamine (TDATA), 4,4',4''-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HATCN), etc.

In one or more embodiments, the hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one selected from among the hole injection layer HIL, the hole transport layer HTL, and the electron blocking layer EBL.

The hole transport region HTR may have a thickness of about 100 Å to about 10,000 Å, for example, about 100 Å to about 5000 Å. When the hole transport region HTR includes the hole injection layer HIL, the hole injection layer HIL may have a thickness of, for example, about 30 Å to about 1000 Å. When the hole transport region HTR includes the hole transport layer HTL, the hole transport layer HTL may have a thickness of about 30 Å to about 1000 Å. For example, when the hole transport region HTR includes the electron blocking layer EBL, the electron blocking layer EBL may have a thickness of about 10 Å to about 1000 Å. When the thicknesses of the hole transport region HTR, the hole injection layer HIL, the hole transport layer HTL, and the electron blocking layer EBL satisfy the above-described respective ranges, satisfactory (or suitable) hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, and/or cyano group-containing compounds, but is not limited thereto. For example, the p-dopant may include halogenated metal compounds (such as CuI and/or RbI), quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), cyano group-containing compounds (such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9)), etc., but is not limited thereto.

As described above, the hole transport region HTR may further include at least one of a buffer layer and/or an electron blocking layer EBL, in addition to the hole injection layer HIL and the hole transport layer HTL. The buffer layer may compensate a resonance distance according to wavelengths of light emitted from an emission layer EML, and may thus increase luminous efficiency. Materials which may be included in the hole transport region HTR may be used as materials included in the buffer layer. The electron blocking layer EBL is a layer that serves to prevent or reduce the injection of electrons from the electron transport region ETR to the hole transport region HTR.

The emission layer EML is provided on the hole transport region HTR. The emission layer EML may have, for example, a thickness of about 100 Å to about 1000 Å, or about 100 Å to about 300 Å. The emission layer EML may have a single layer formed of a single material, a single layer formed of a plurality of different materials, or a multilayer structure having a plurality of layers formed of a plurality of different materials.

In the light emitting diode ED of one or more embodiments, the emission layer EML may include a condensed polycyclic compound of one or more embodiments represented by Formula 1:

Formula 1

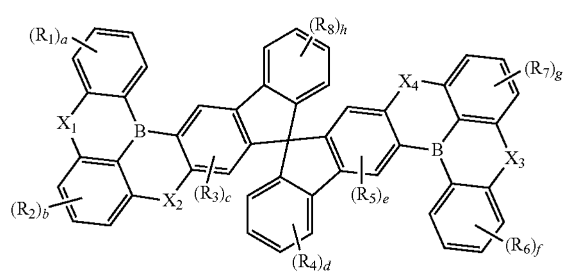

In Formula 1, $X_1$, $X_2$, $X_3$, and $X_4$ may be each independently $NR_X$, O, S, or Se. In one or more embodiments, $X_1=X_3$ and $X_2=X_4$ may be satisfied. For example, $X_1$ and $X_3$ may be $NR_X$, and $X_2$ and $X_4$ may be O. However, the embodiment of the present disclosure is not limited thereto.

$R_x$, and $R_1$ to $R_8$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring. In one or more embodiments, $R_X$, and $R_1$ to $R_8$ may be each independently a hydrogen atom, a deuterium atom, a t-butyl group, a substituted or unsubstituted diphenylamine group, a substituted or unsubstituted phenyl group, a substituted or unsubstituted biphenyl group, a substituted or unsubstituted carbazole group, and/or bonded to an adjacent group to form a ring. For example, $R_x$ may be a substituted or unsubstituted biphenyl group, and/or may be bonded to an adjacent group to form a substituted or unsubstituted carbazole ring. For example, $R_1$ to $R_8$ may be each independently a hydrogen atom, a deuterium atom, a t-butyl group, a substituted or unsubstituted diphenylamine group, a substituted or unsubstituted phenyl group, a substituted or unsubstituted biphenyl group, or a substituted or unsubstituted carbazole group.

However, the embodiment of the present disclosure is not limited thereto.

In one or more embodiments, a is an integer of 0 to 4, b is an integer of 0 to 3, c is an integer of 0 to 2, d is an integer of 0 to 4, e is an integer of 0 to 2, f is an integer of 0 to 4, g is an integer of 0 to 3, and h is an integer of 0 to 4. For example, a, b, f, and g each may be 0 or 1. A case where a to h are 0 may be the same as a case where $R_1$ to $R_8$ are hydrogen atoms, respectively.

The condensed polycyclic compound of the present disclosure may include a spiro compound, and for example, may include a 9,9'-spirobi[fluorene] skeleton. In one or more embodiments, the condensed polycyclic compound represented by Formula 1 may have a point-symmetric structure with respect to the 9-carbon atom of fluorene contained in 9,9'-spirobi[fluorene]. For example, $X_1=X_3$, $X_2=X_4$, $R_1=R_6$, $R_2=R_7$, $R_3=R_5$, $R_4=R_8$, a=f, b=g, c=e, and d=h may be satisfied. However, the embodiment of the present disclosure is not limited thereto.

The condensed polycyclic compound of the present disclosure may have a structure in which two condensed compounds, each containing a boron atom, are connected by the spiro compound. Accordingly, multiple resonance effects, molecular stability, and absorbance of molecules may be improved. The light emitting diode of the present disclosure includes the condensed polycyclic compound represented by Formula 1 in an emission layer, and may thus have improved luminous efficiency.

In one or more embodiments, the condensed polycyclic compound represented by Formula 1 may be represented by any one of Formulae 2-1 to 2-3:

Formula 2-1

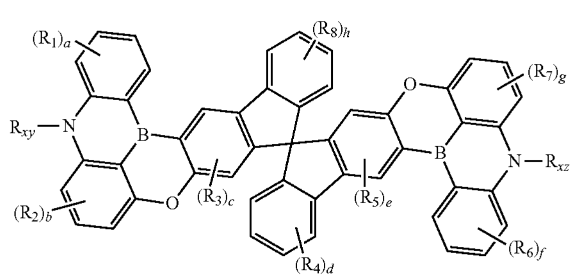

Formula 2-2

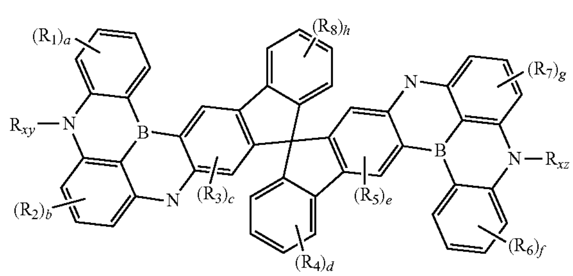

-continued

Formula 2-3

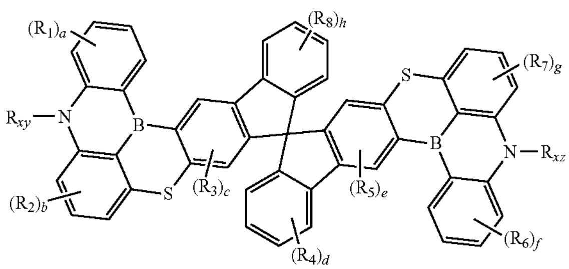

Formula 2-1 to Formula 2-3 are embodiments of $X_1$, $X_2$, $X_3$, and $X_4$ in Formula 1. For example, in Formulae 2-1 to 2-3, $X_1$ and $X_3$ are $NR_{xy}$ and $NR_{xz}$, respectively. In Formula 2-1, $X_2$ and $X_4$ are O. In Formula 2-2, $X_2$ and $X_4$ are N. In Formula 2-3, $X_2$ and $X_4$ are S.

In Formulae 2-1 to 2-3, $R_{xy}$ and $R_{xz}$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring. For example, $R_{xy}$ and $R_{xz}$ may be each independently a substituted or unsubstituted biphenyl group, and/or may be bonded to an adjacent group to form a substituted or unsubstituted carbazole ring.

$R_1$ to $R_8$, and a to h are the same as defined in Formula 1.

In one or more embodiments, the condensed polycyclic compound represented by Formula 1 may be represented by Formula 3-1 or Formula 3-2:

Formula 3-1 is an embodiment where $X_1$ and $X_4$ in Formula 1 are $NR_x$, and $NR_x$ forms a ring with an adjacent group. Formula 3-2 is an embodiment where $X_1$ and $X_4$ in Formula 1 are $NR_x$, and $NR_x$ do not form a ring with an adjacent group.

In Formula 3-1, $R_{X1}$ and $R_{X2}$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring. For example, $R_{X1}$ and $R_{X2}$ may be each independently a hydrogen atom, a deuterium atom, a t-butyl group, a substituted or unsubstituted phenyl group, or a substituted or unsubstituted carbazole group.

m and n are each independently an integer of 0 to 4. For example, m and n each may be 0 or 1.

In Formula 3-2, $R_{X3}$ and $R_{X4}$ may be each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms. For example, $R_{X3}$ and $R_{X4}$ may be each independently a hydrogen atom, a deuterium atom, or a substituted or unsubstituted biphenyl group. However, the embodiment of the present disclosure is not limited thereto.

In Formulae 3-1 and 3-2, $X_2$, $X_4$, $R_1$ to $R_8$, and a to h are the same as defined in Formula 1.

In one or more embodiments, the condensed polycyclic compound represented by Formula 1 may be represented by Formula 4-1:

Formula 3-1

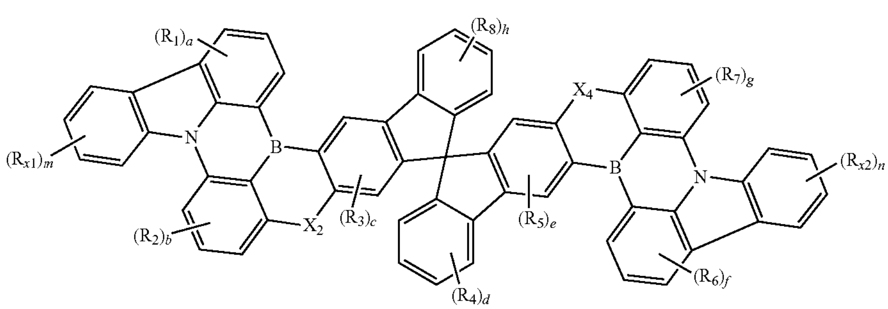

Formula 3-2

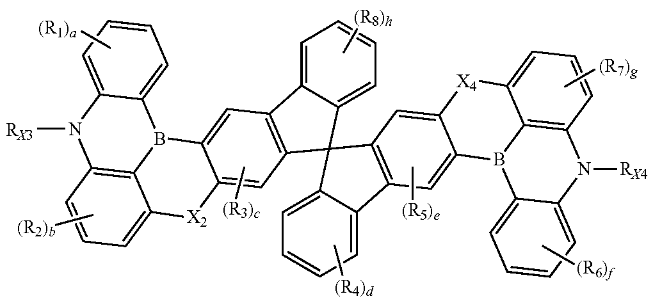

Formula 4-1

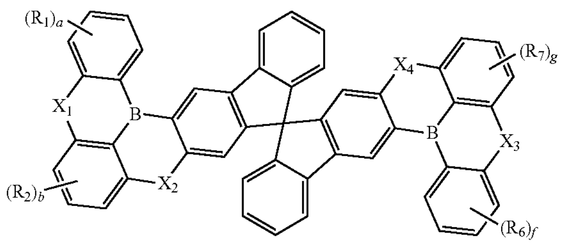

Formula 4-1 is an embodiment where, in Formula 1, $R_3$, $R_4$, $R_5$, and $R_8$ are hydrogen atoms and c, d, e, and h are 0. In one or more embodiments, a separate substituent may not be substituted on the 9,9'-spirobi[fluorene] skeleton, which is a spiro compound.

$X_1$, $X_2$, $X_3$, $X_4$, $R_1$, $R_2$, $R_6$, $R_7$, a, b, f, and g are the same as defined in Formula 1.

In one or more embodiments, the condensed polycyclic compound represented by Formula 1 may be represented by Formula 5-1:

Formula 5-1

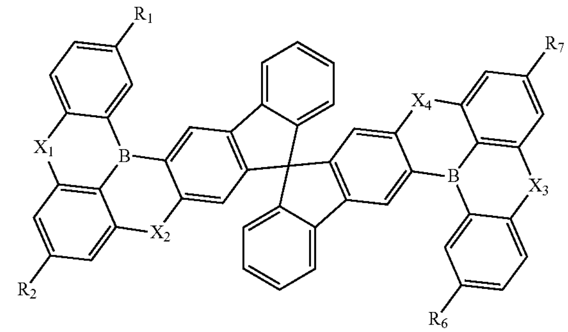

Formula 5-1 is an embodiment where, in Formula 1, $R_3$, $R_4$, $R_5$, and $R_8$ are hydrogen atoms, c, d, e, and h are 0, and a, b, f, and g are 1. In addition, the substitution positions of $R_1$, $R_2$, $R_6$, and $R_7$ according to one or more embodiments are detailed.

$X_1$, $X_2$, $X_3$, $X_4$, $R_1$, $R_2$, and $R_6$ are the same as defined in Formula 1.

In one or more embodiments, the condensed polycyclic compound represented by Formula 1 may include any one of compounds disclosed in Compound Group 1.

Compound Group 1

1

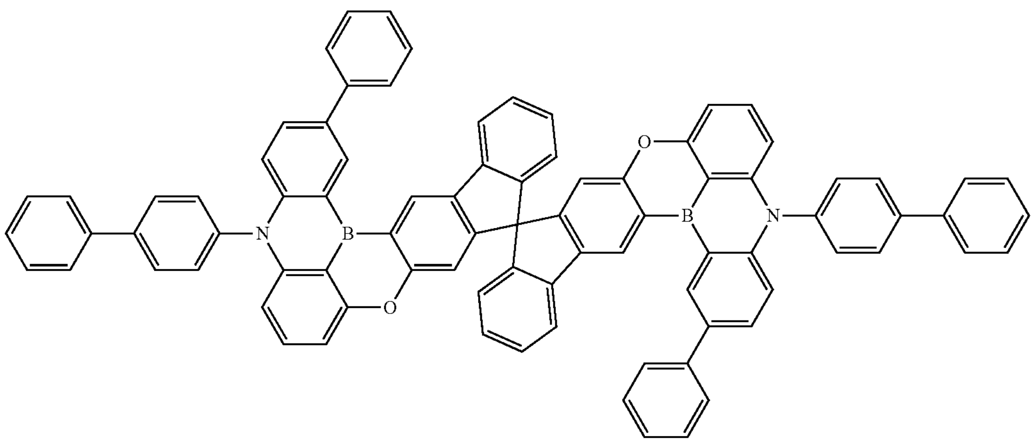

2

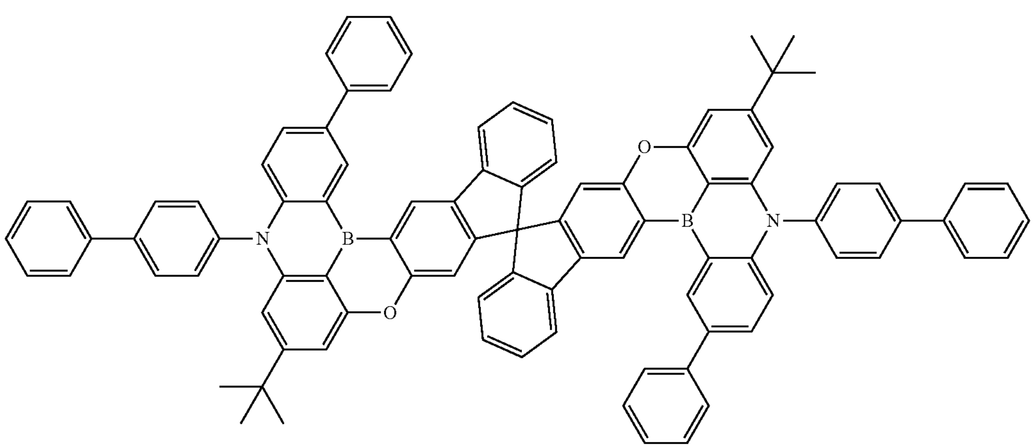

-continued
3
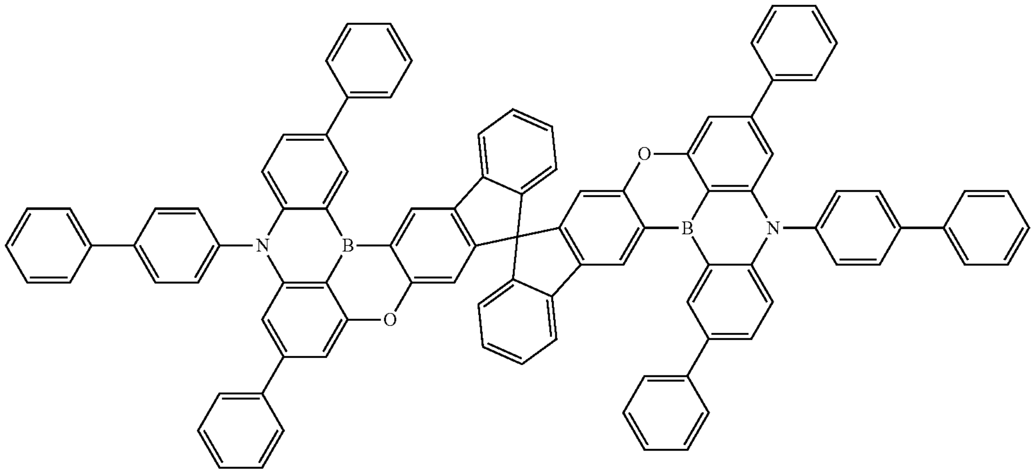
4
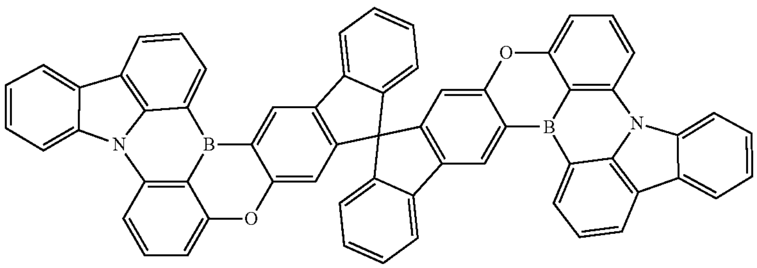
5
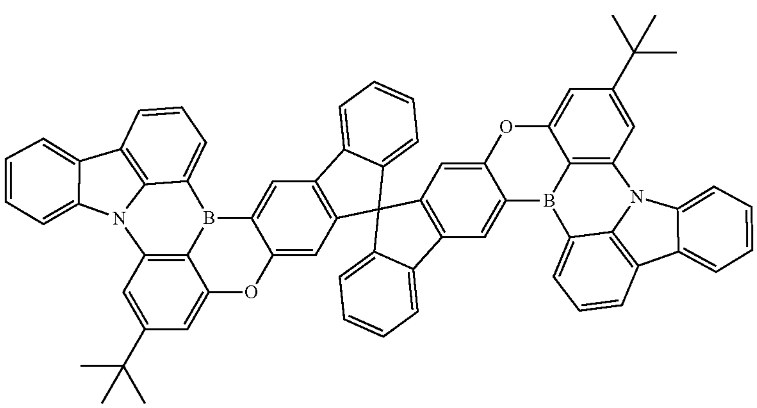
6
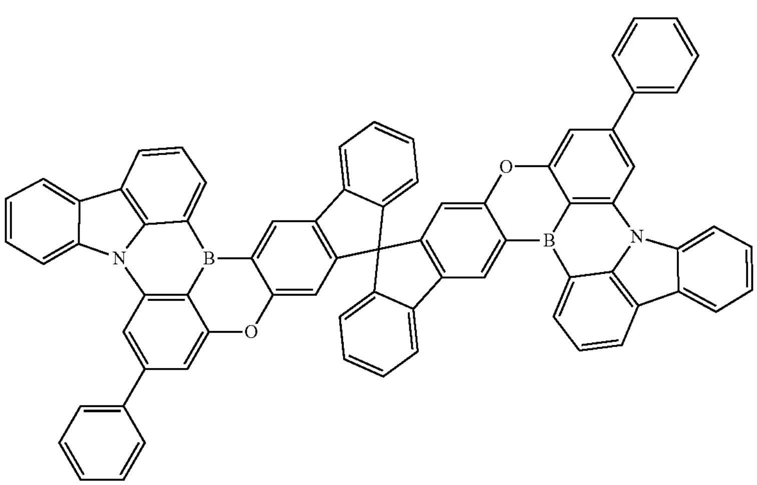

-continued
7
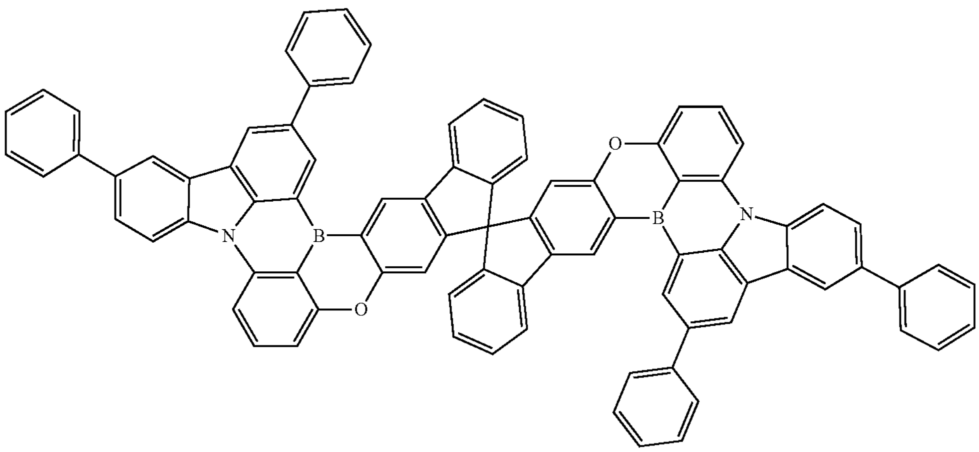
8
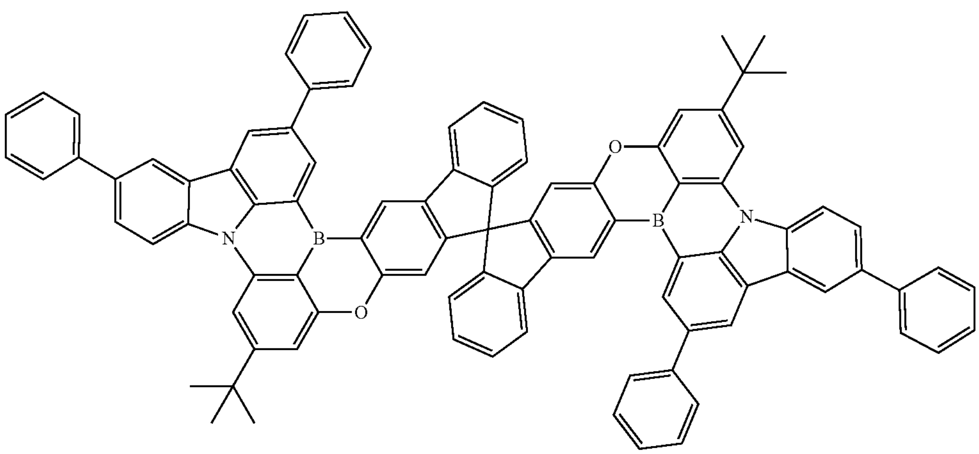
9
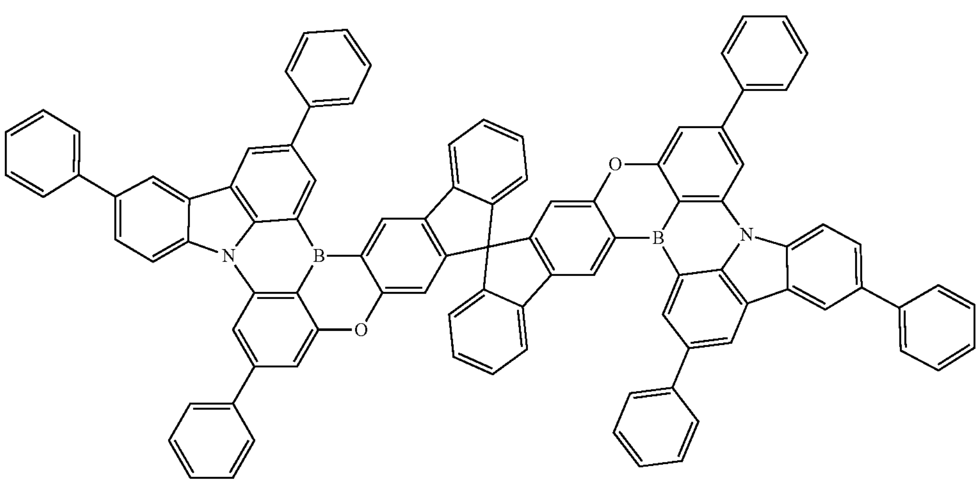

-continued
10
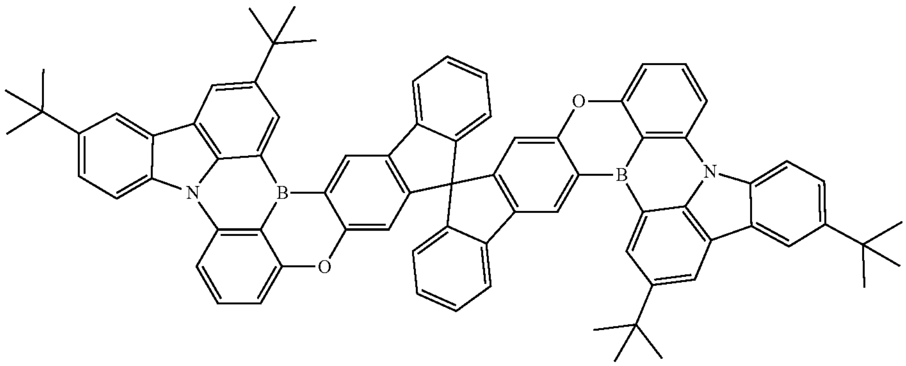
11
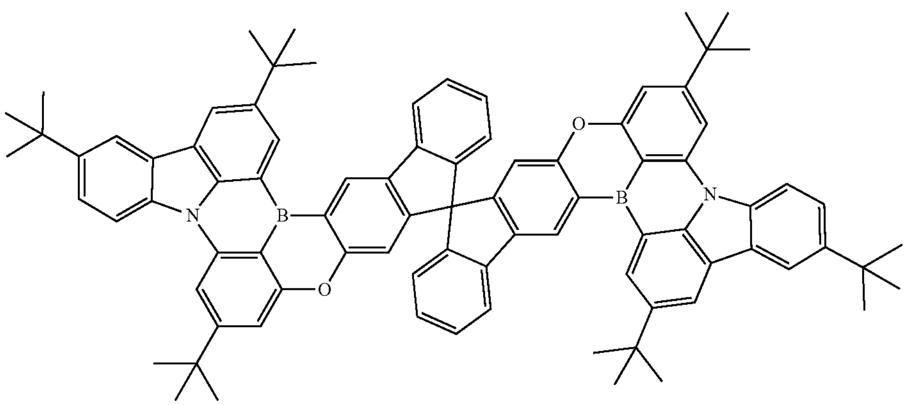
12
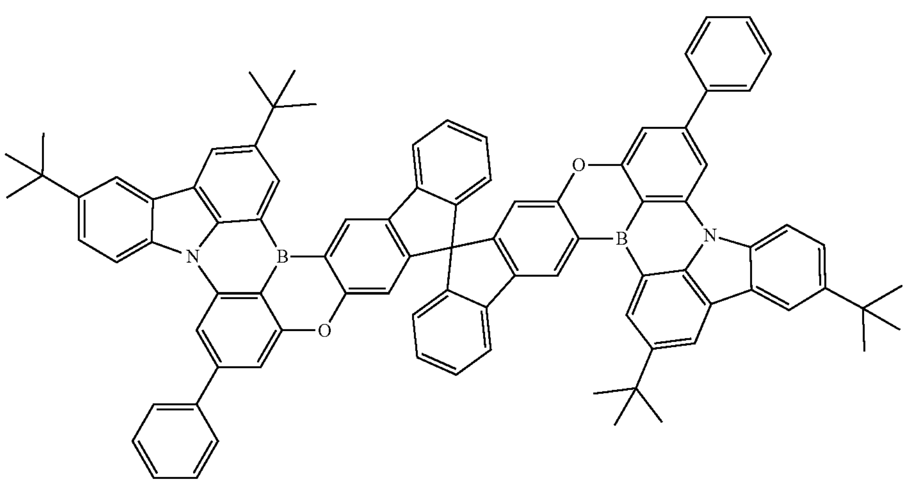

-continued
13
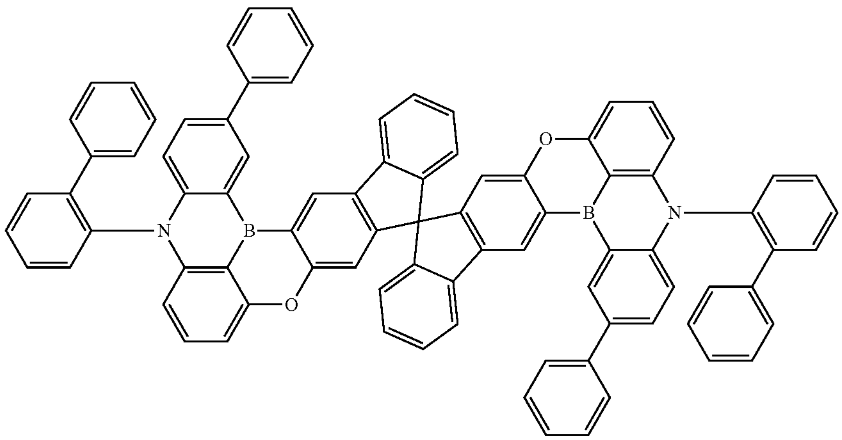
14
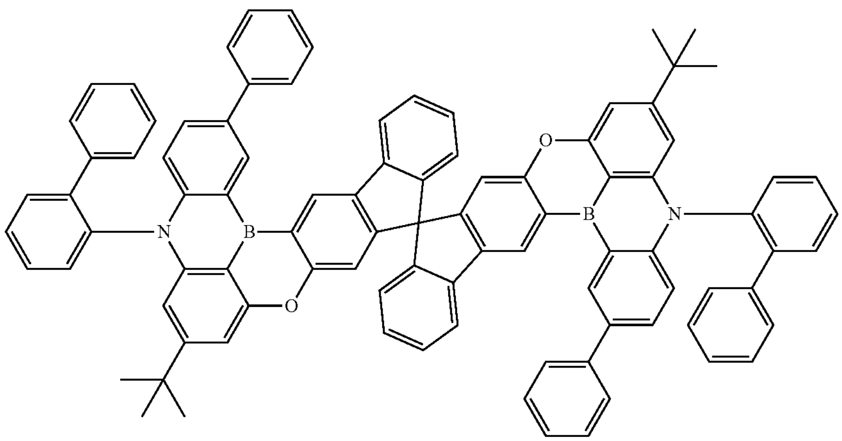
15
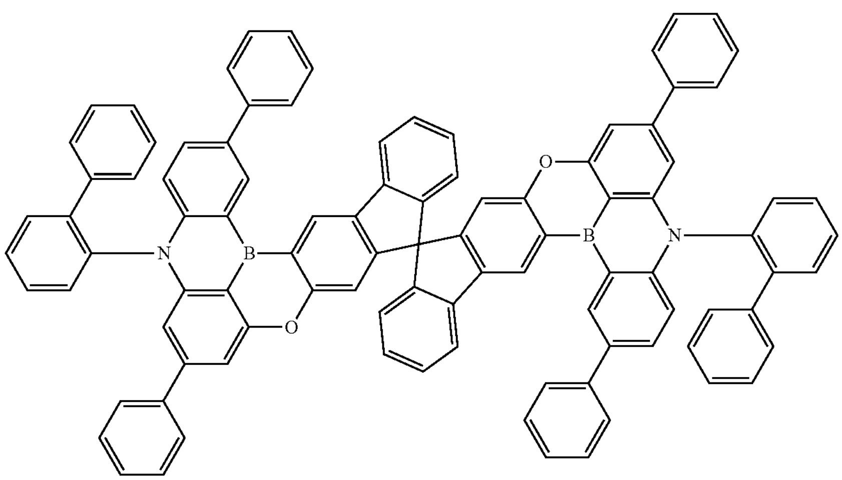
16
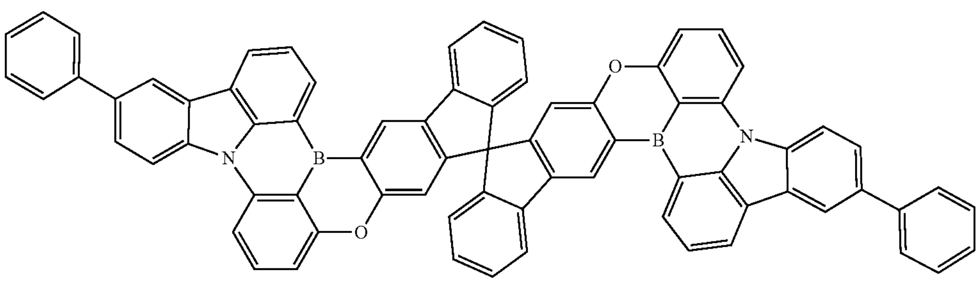

-continued
17
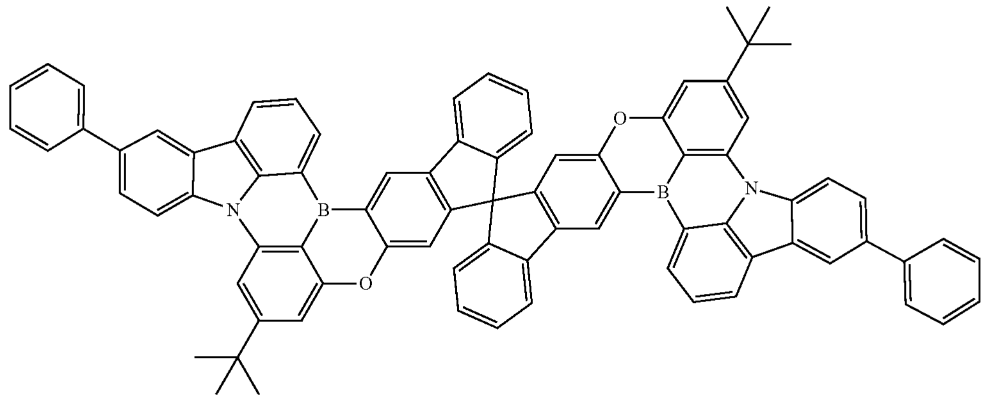
18
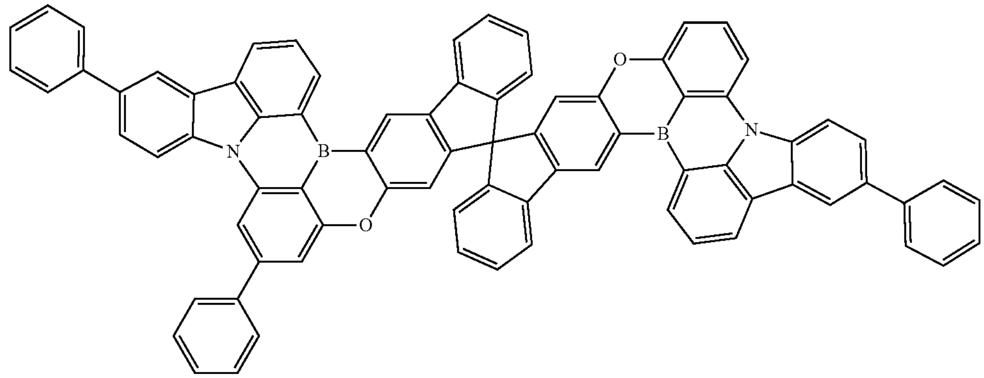
19
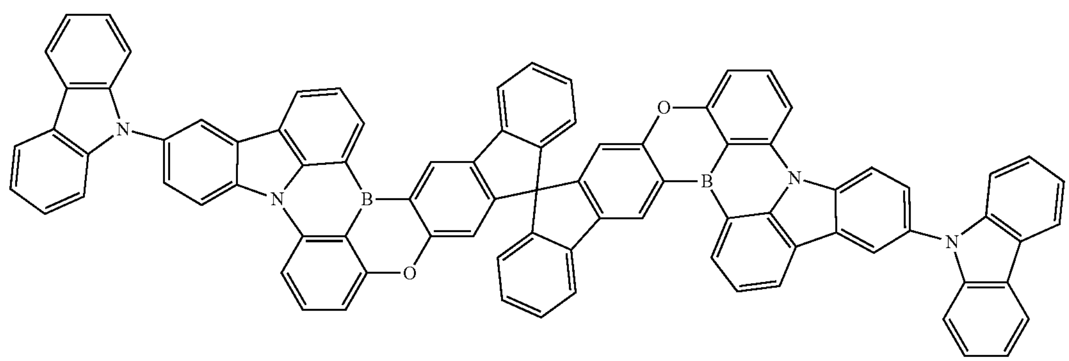
20
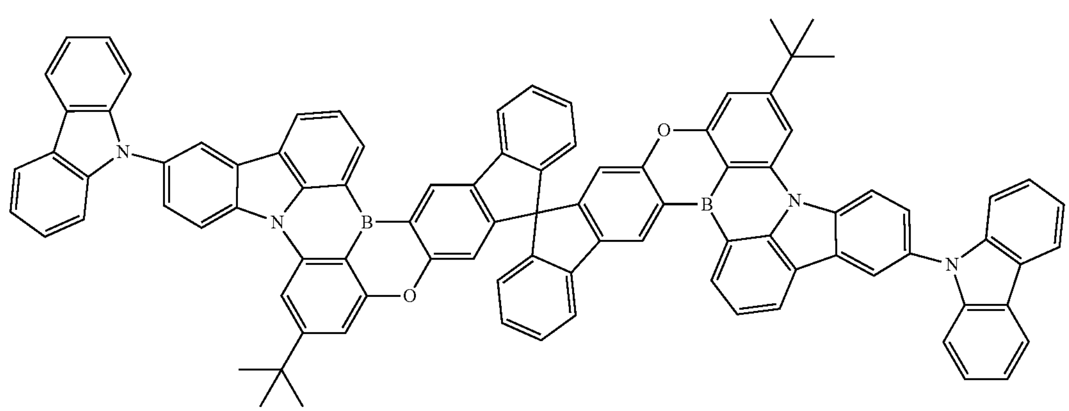

-continued
21
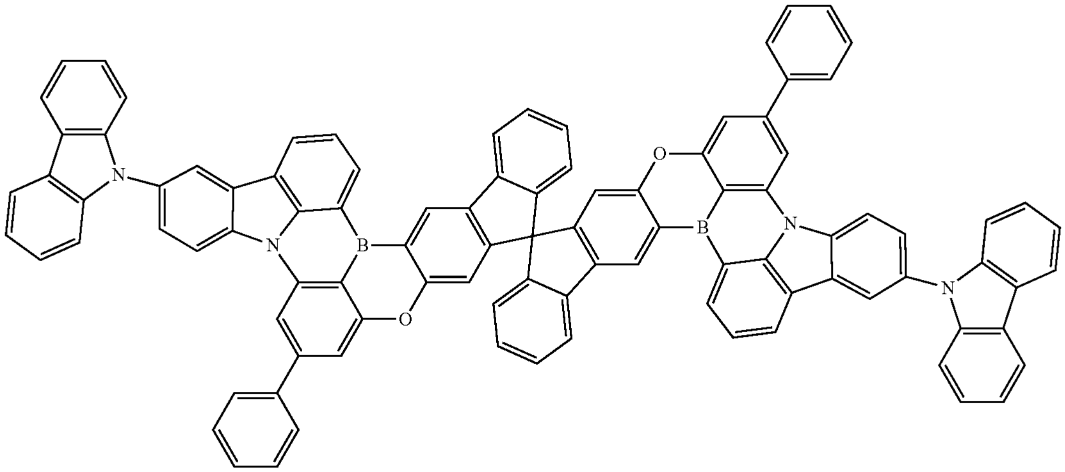
22
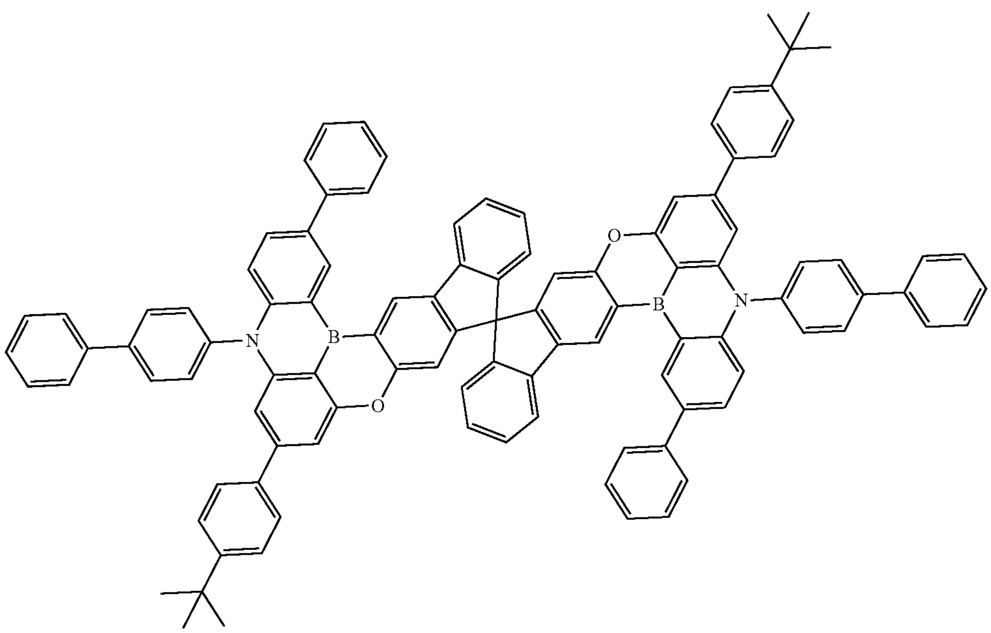

-continued
23
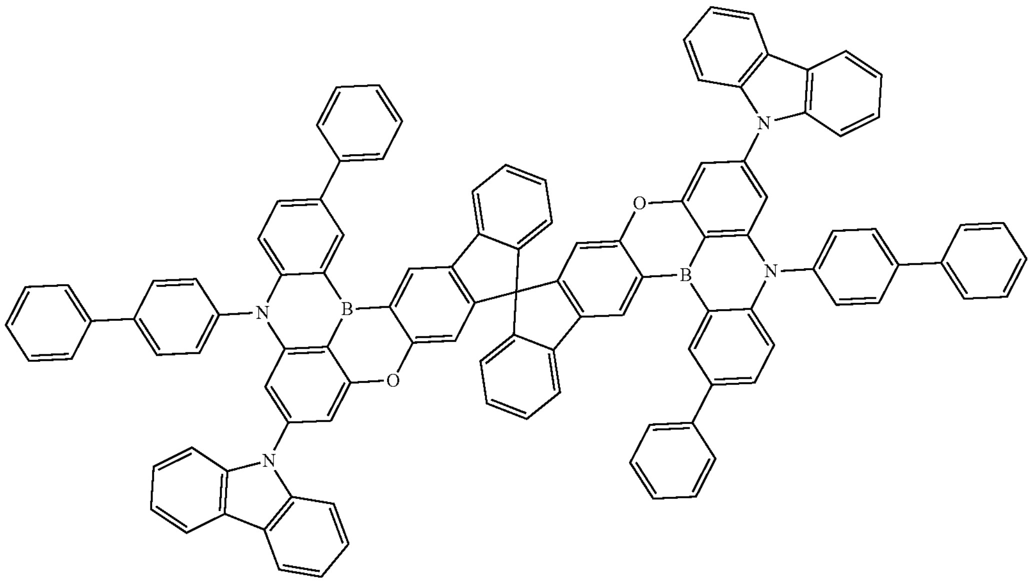
24
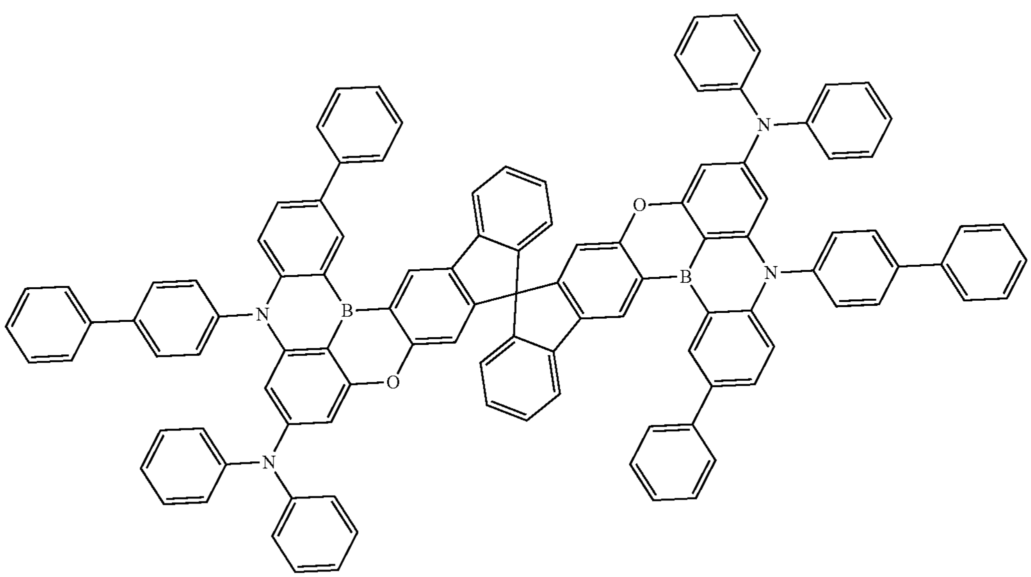

-continued
25
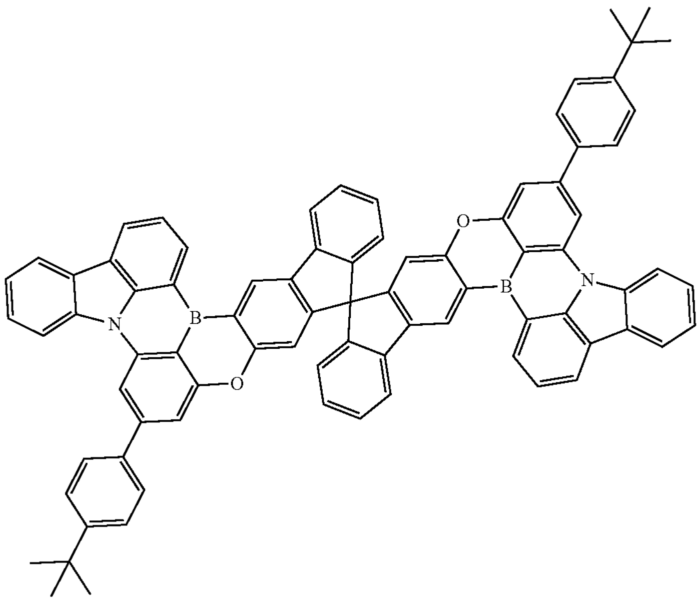
26
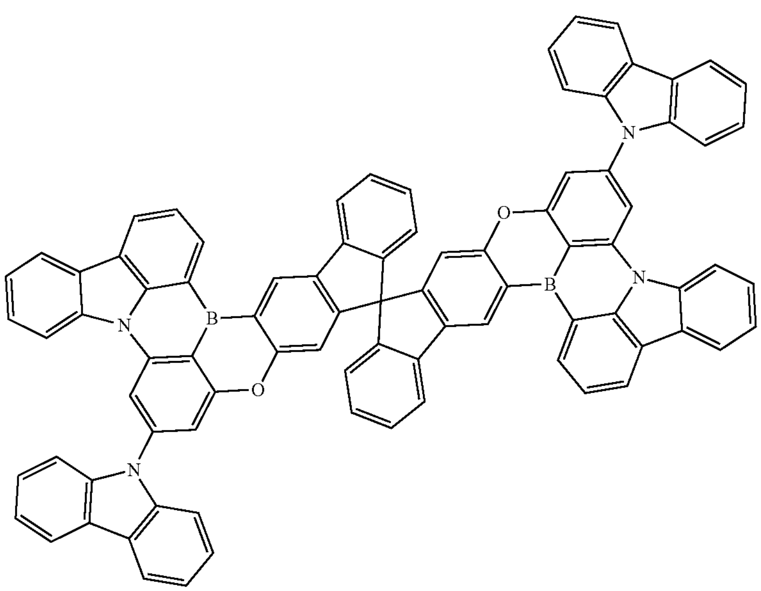

-continued
27
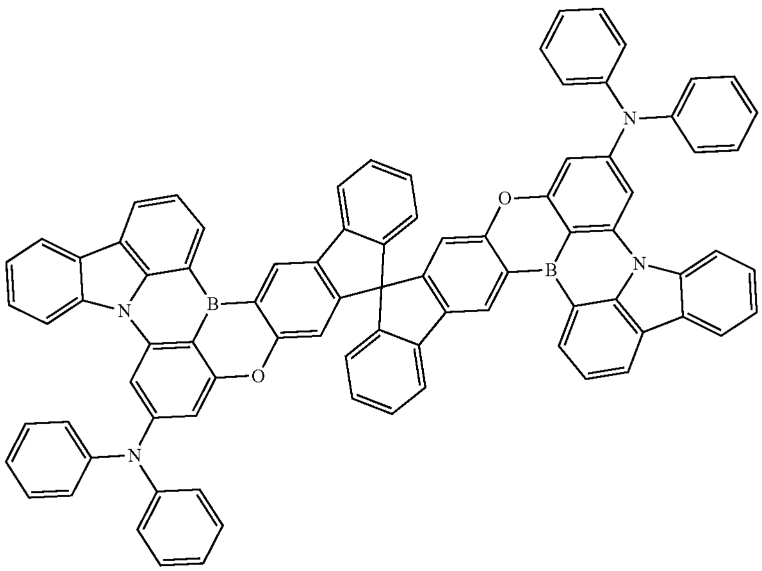
28
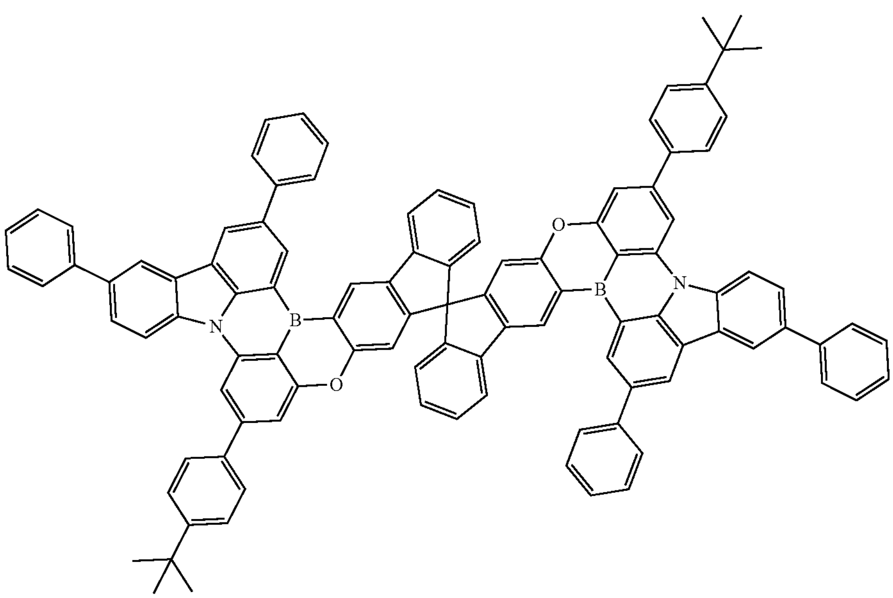

-continued
29
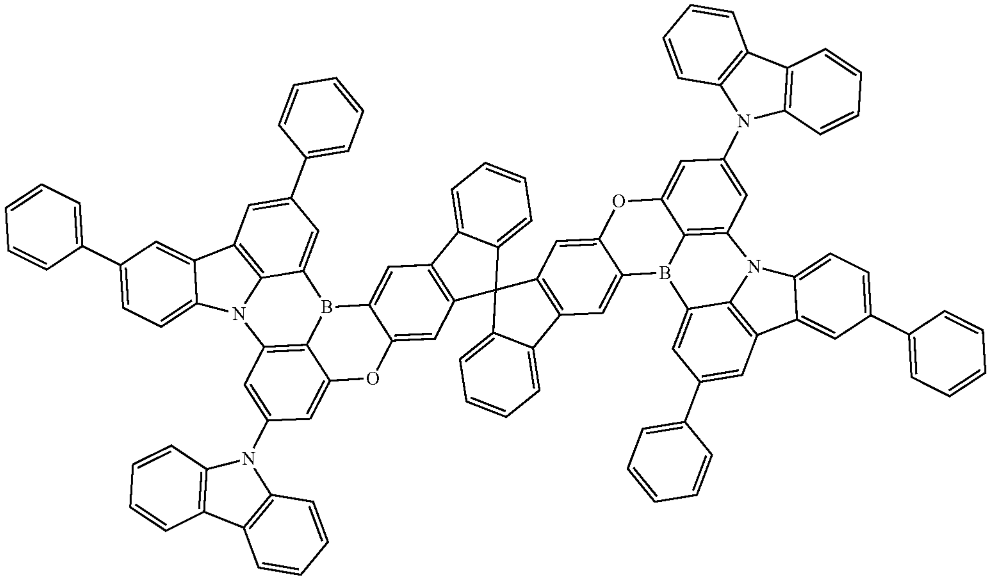
30
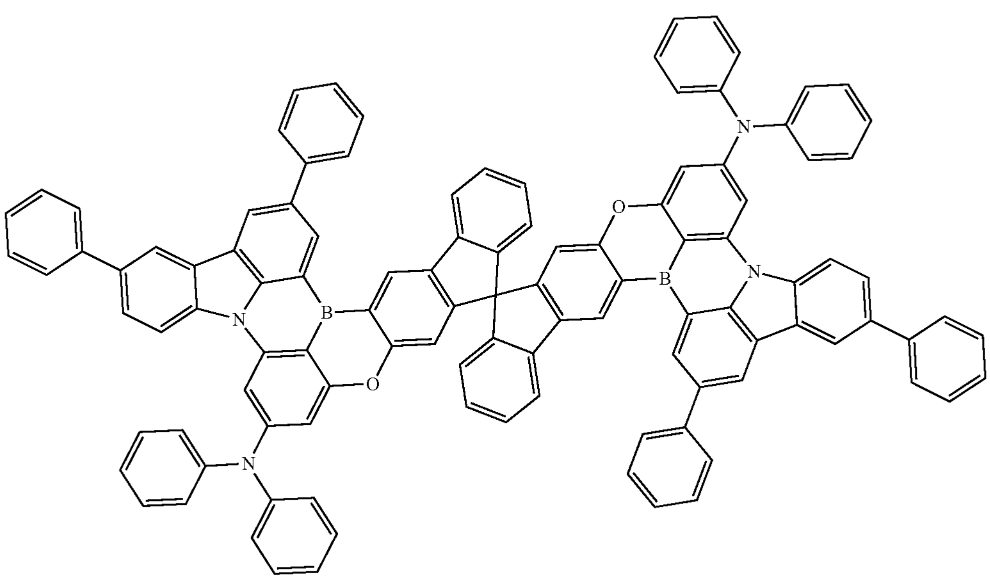

-continued
31
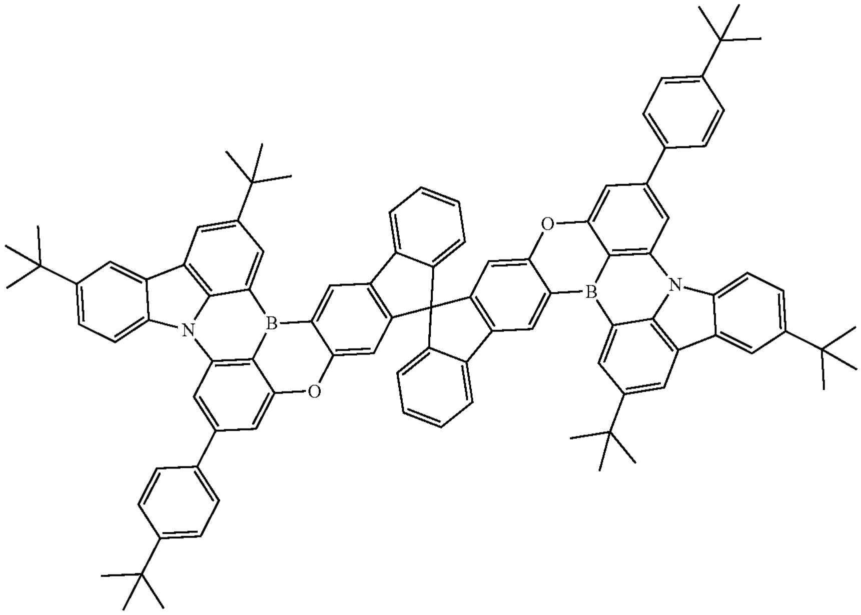
32
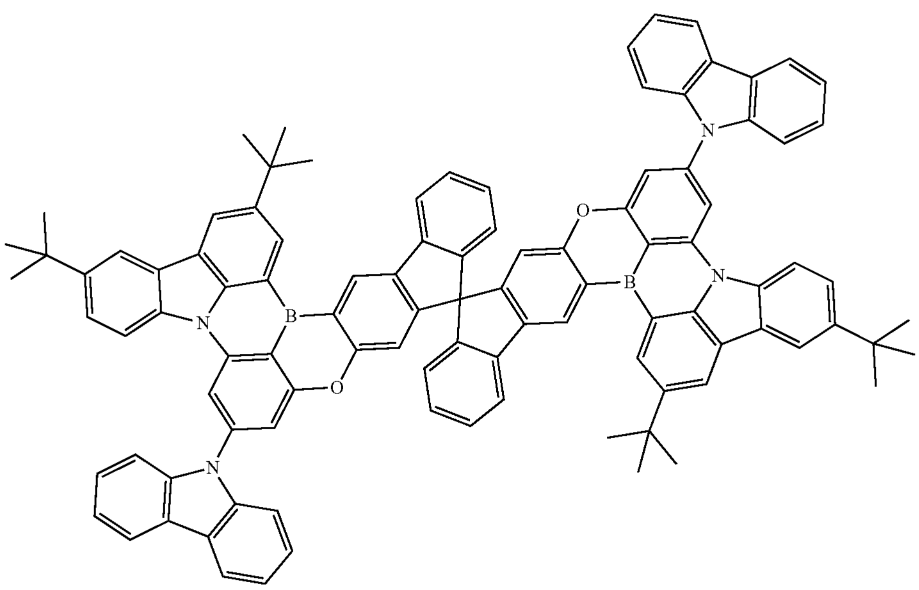

-continued
33
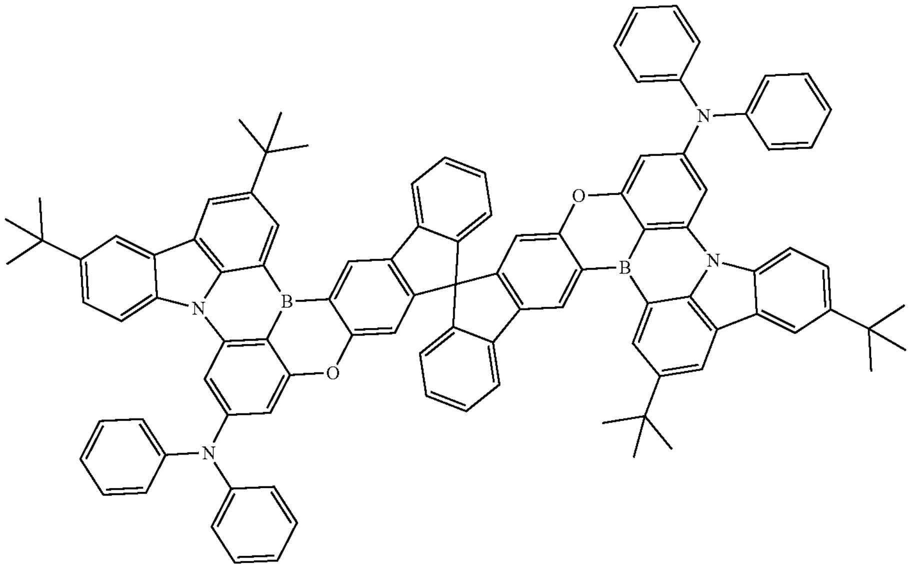
34
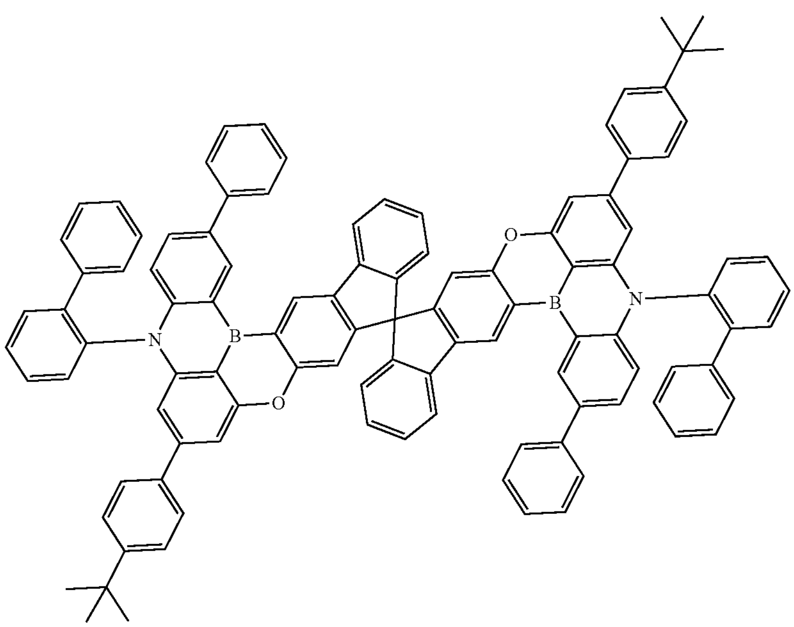

-continued
35
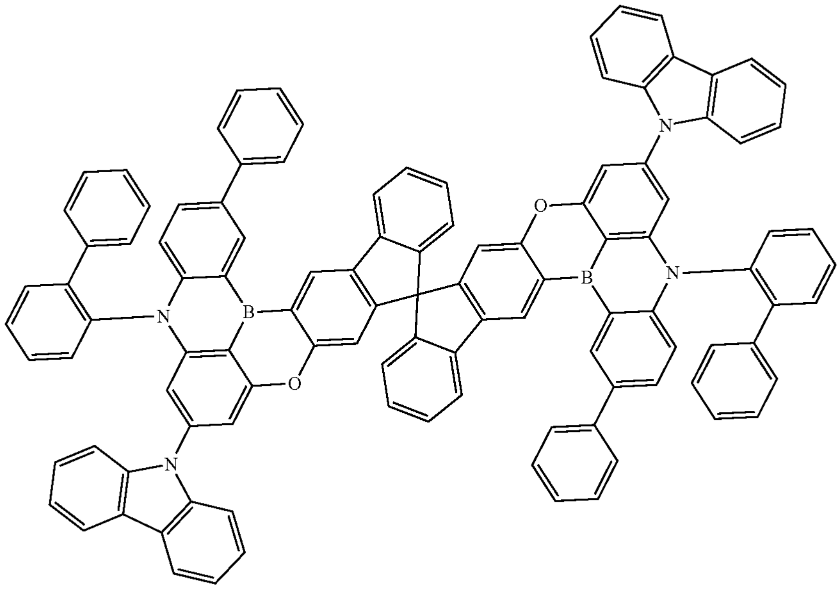
36
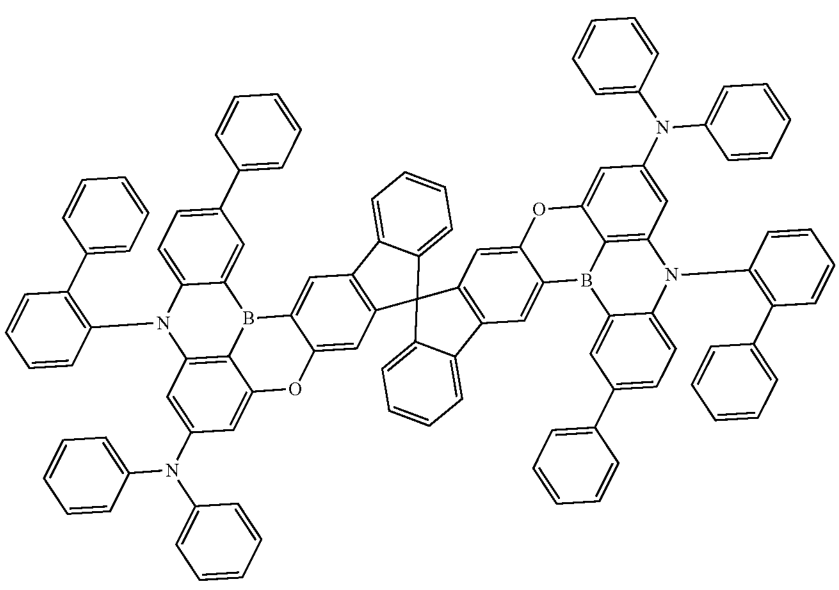

-continued
37
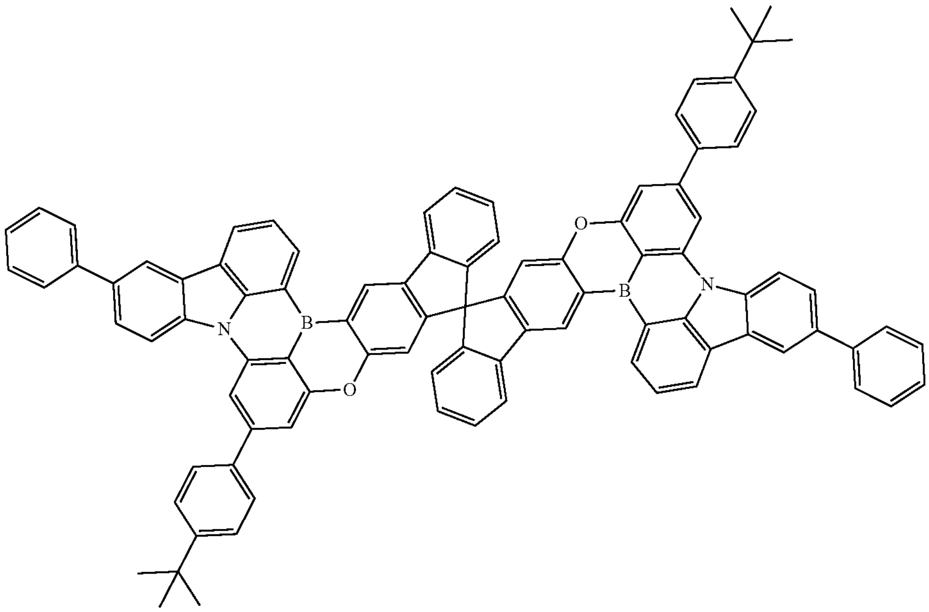
38
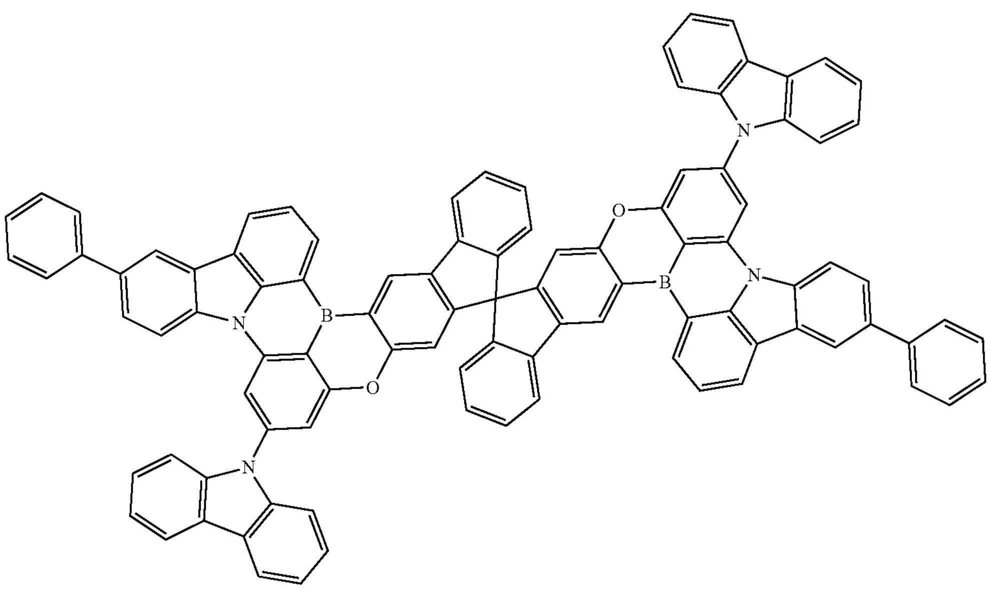

-continued
39
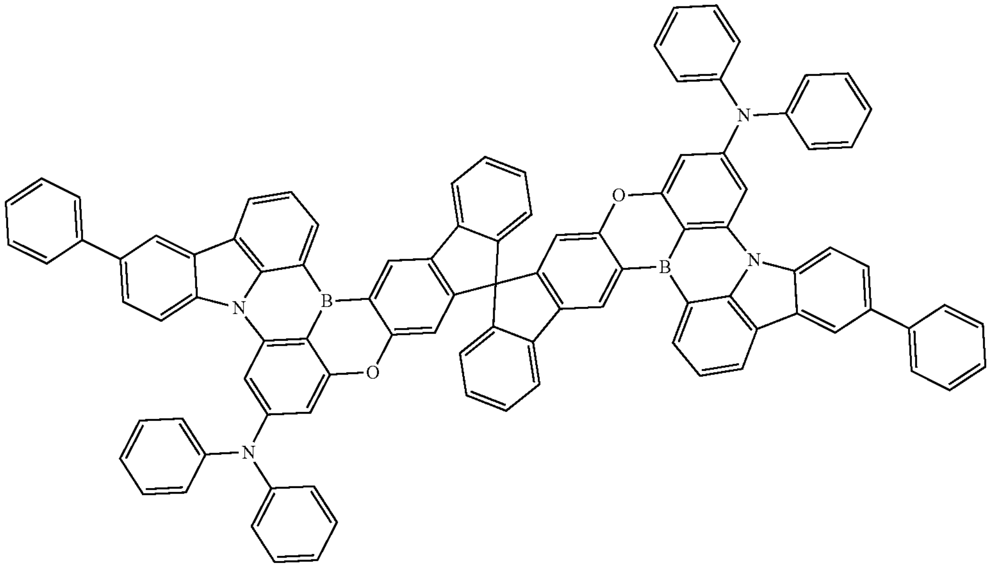
40
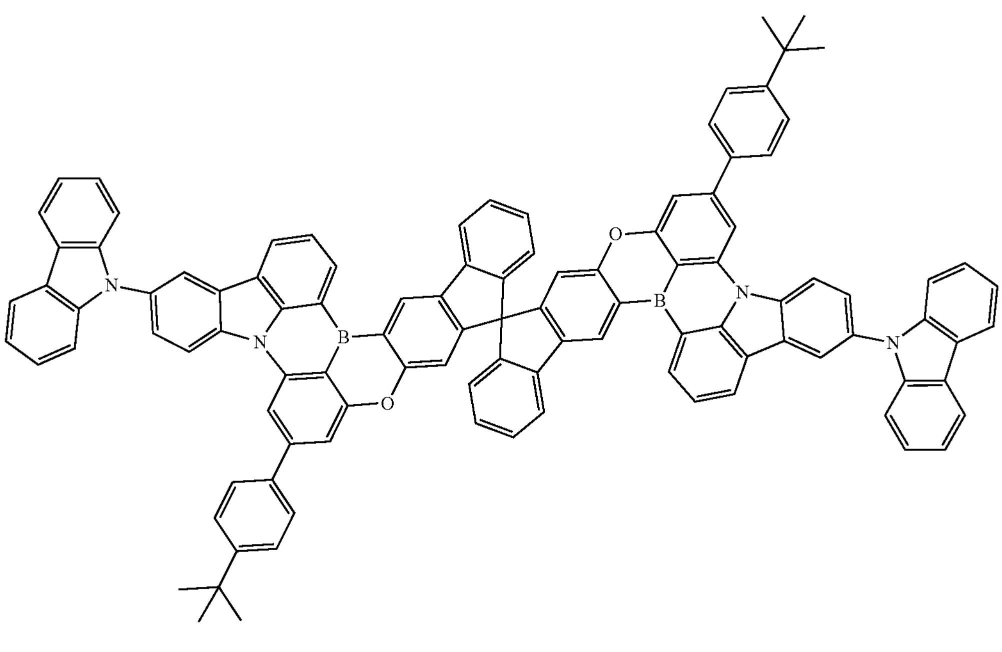

-continued
41
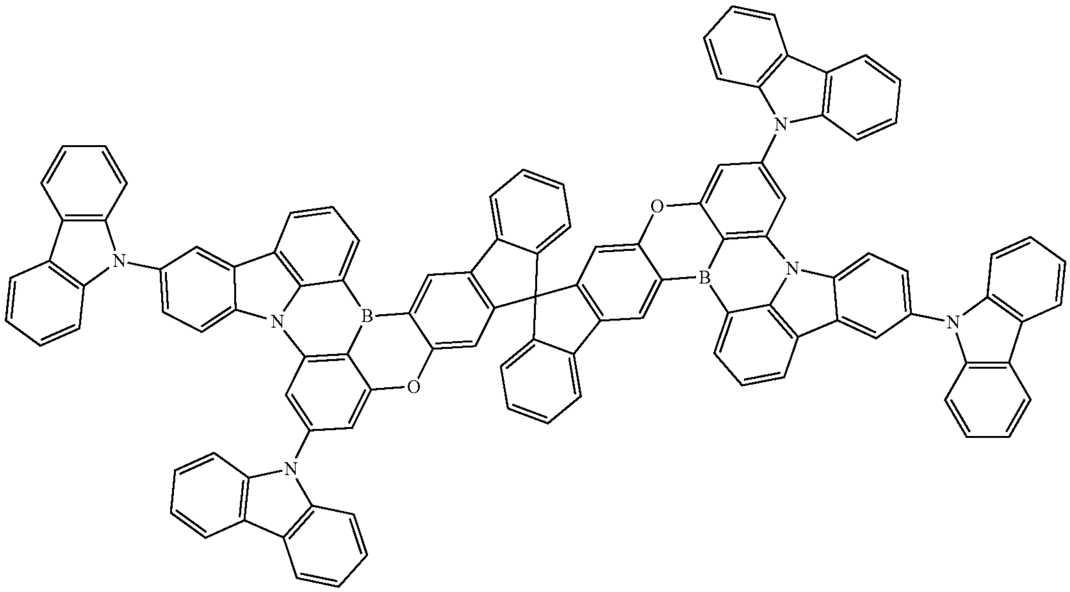
42
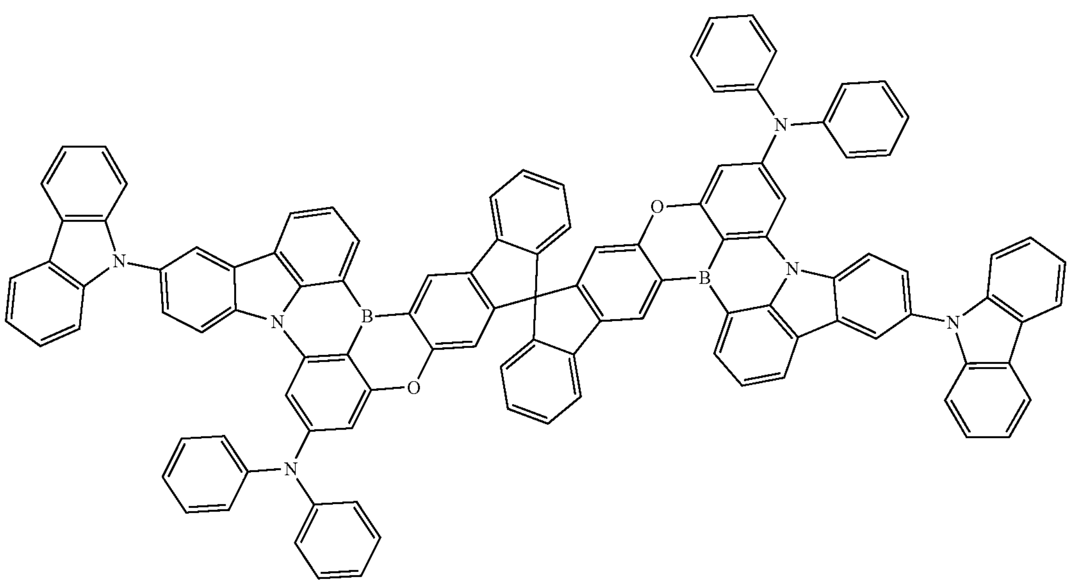

-continued
43
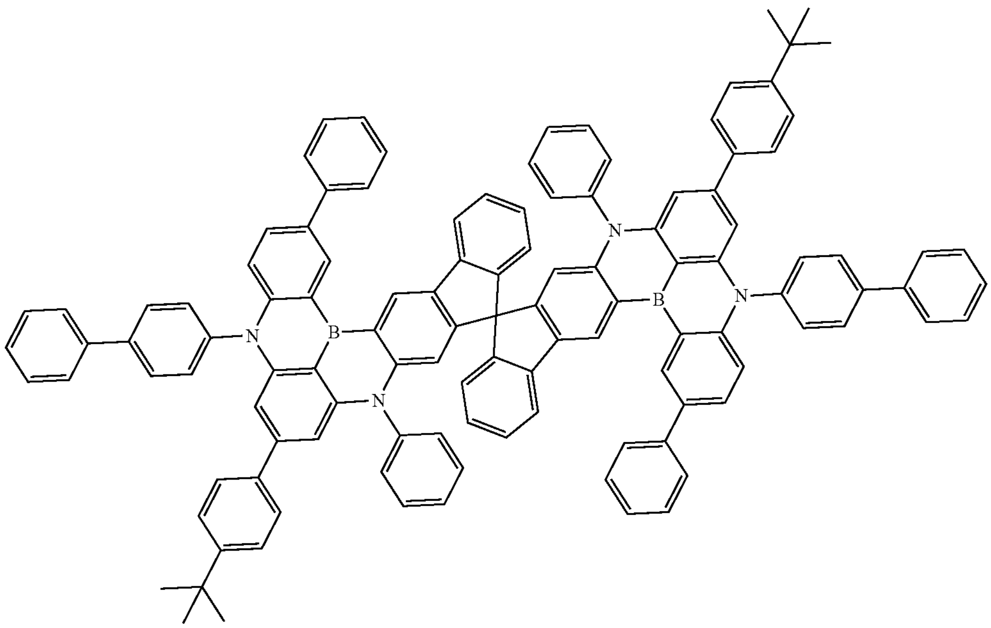
44
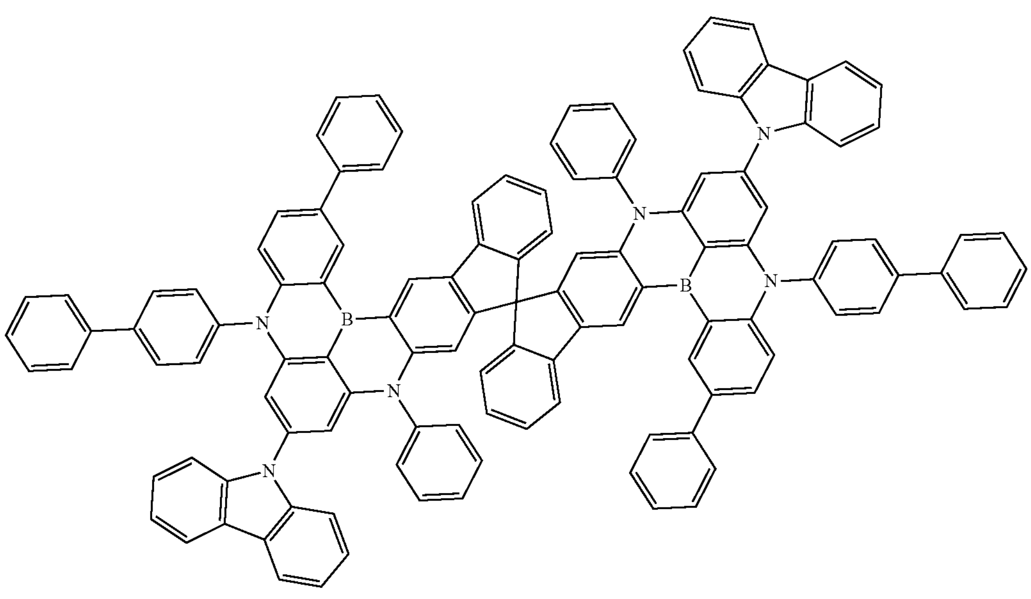

-continued
45
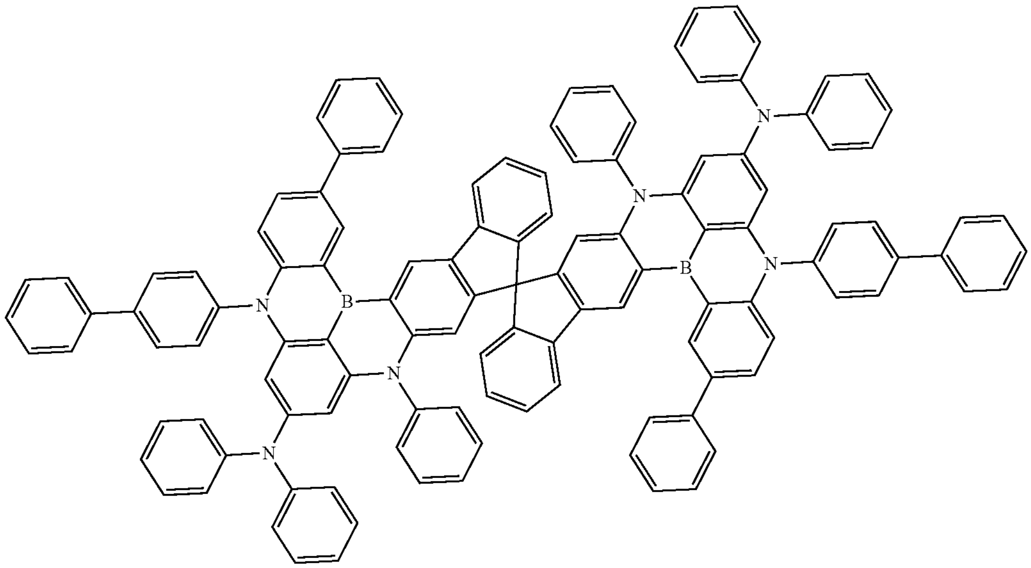
46
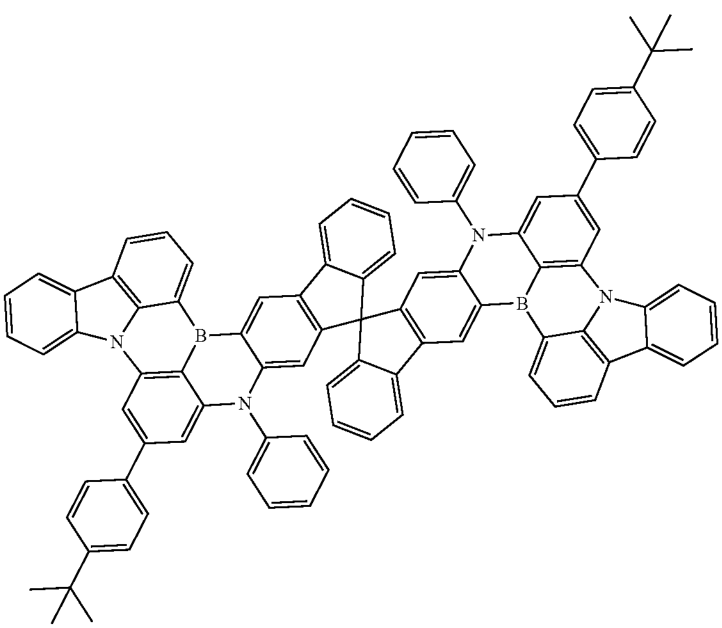

-continued
47
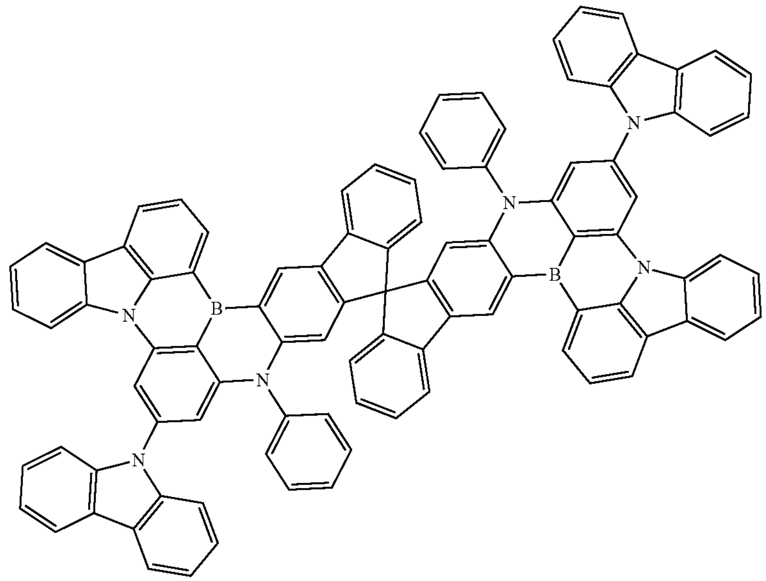
48
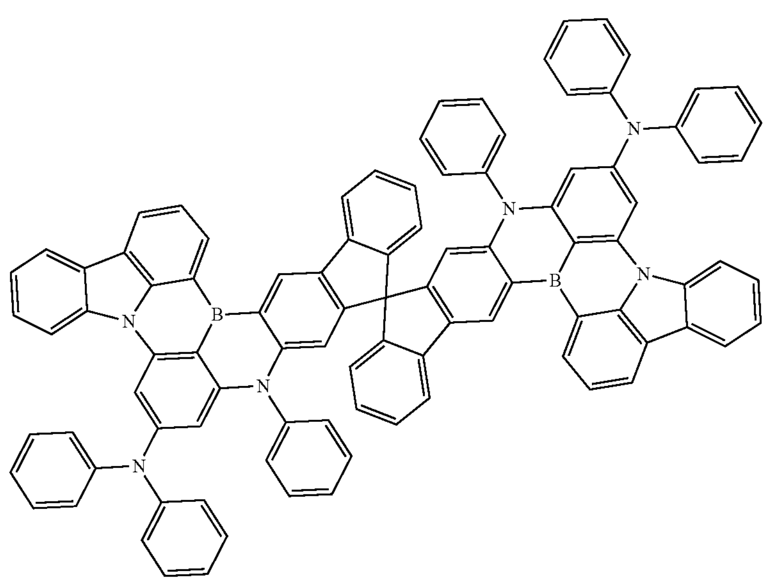

-continued
49
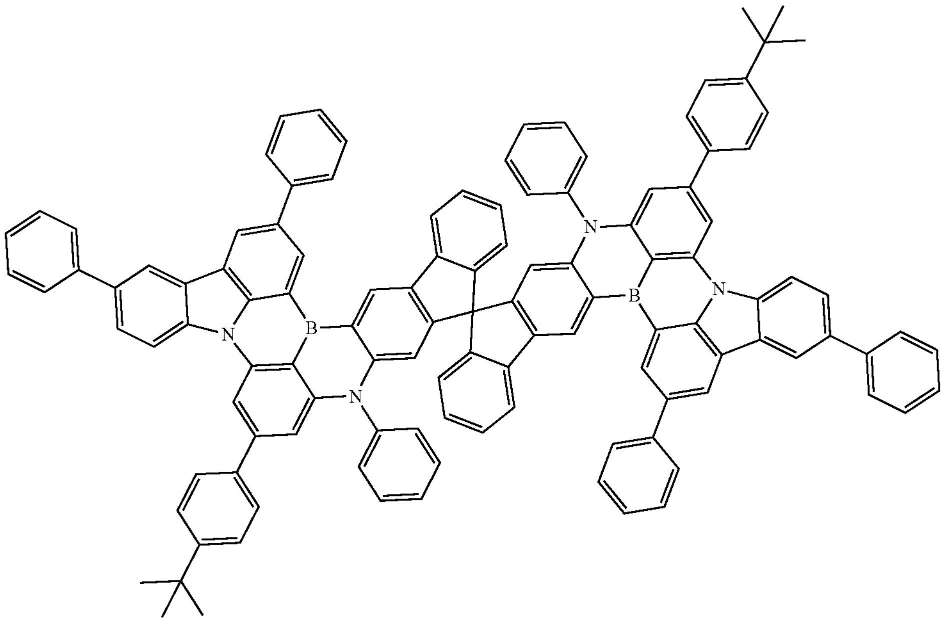
50
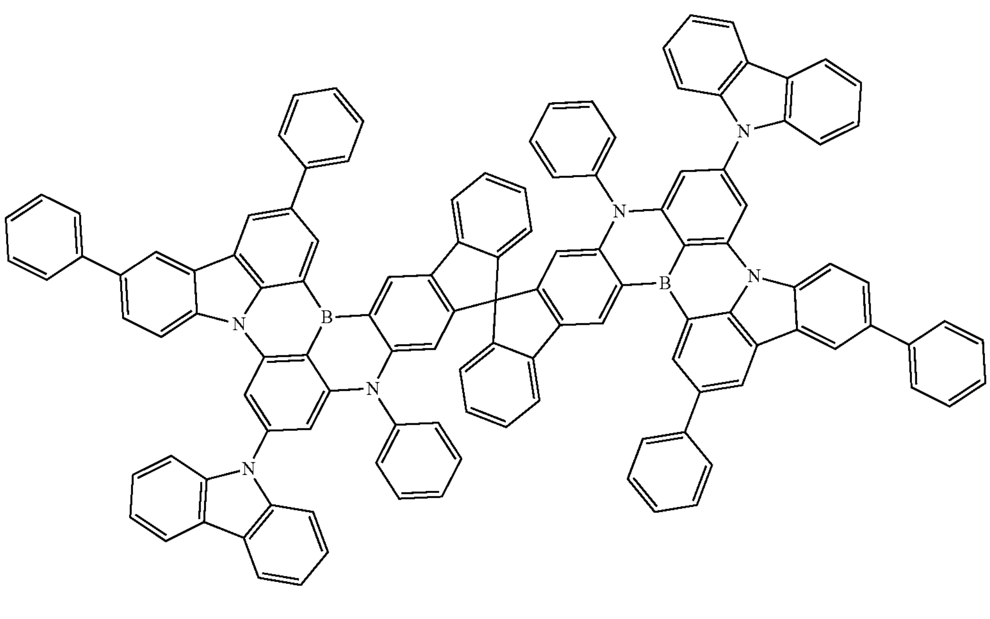

-continued
51
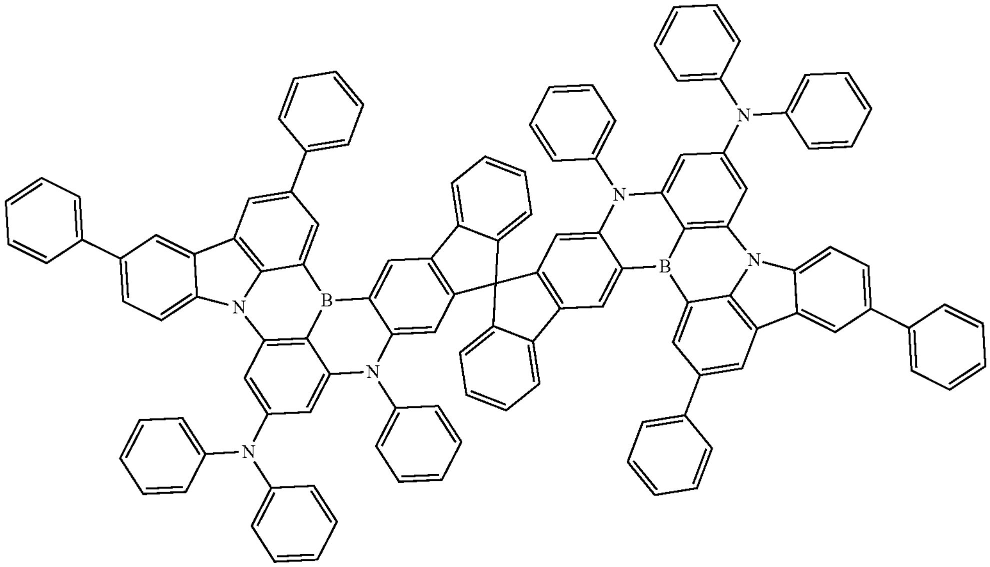
52
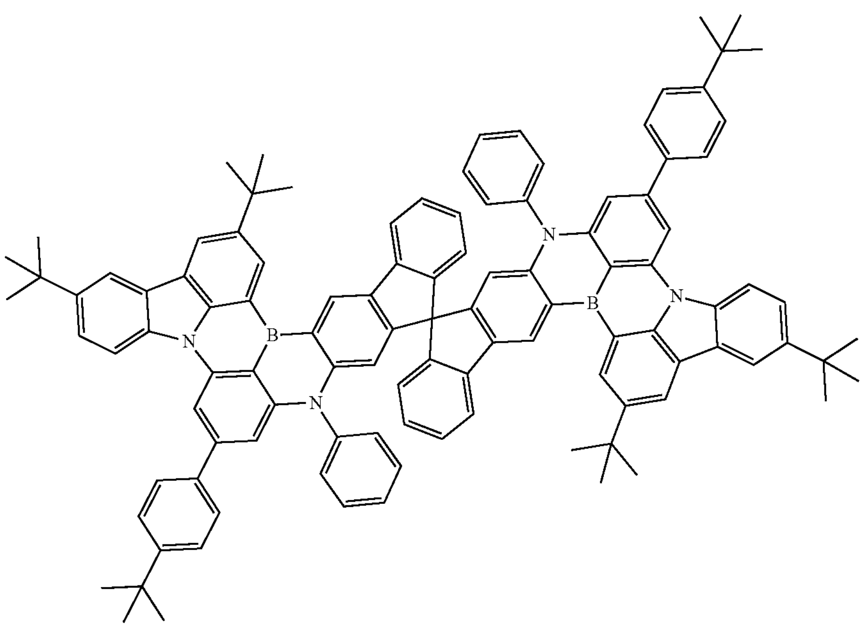

-continued
53
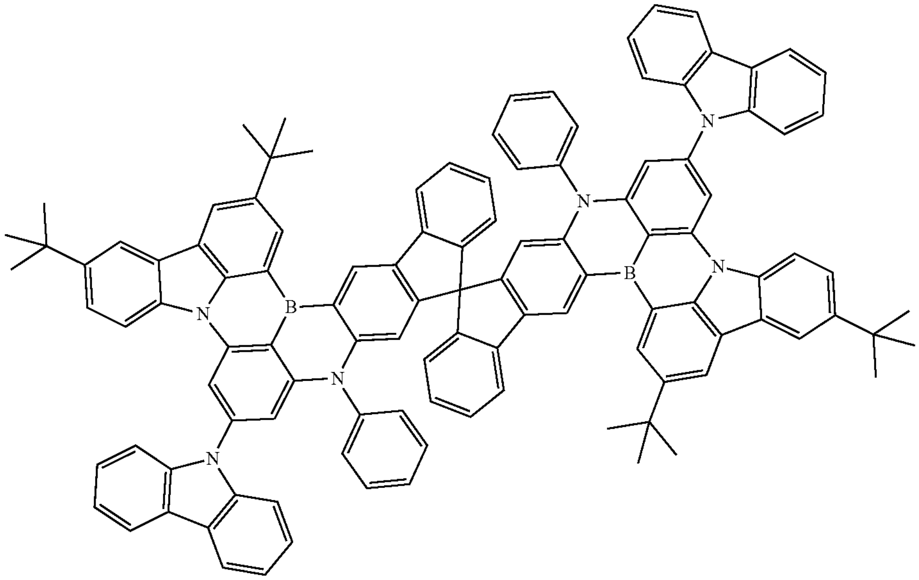
54
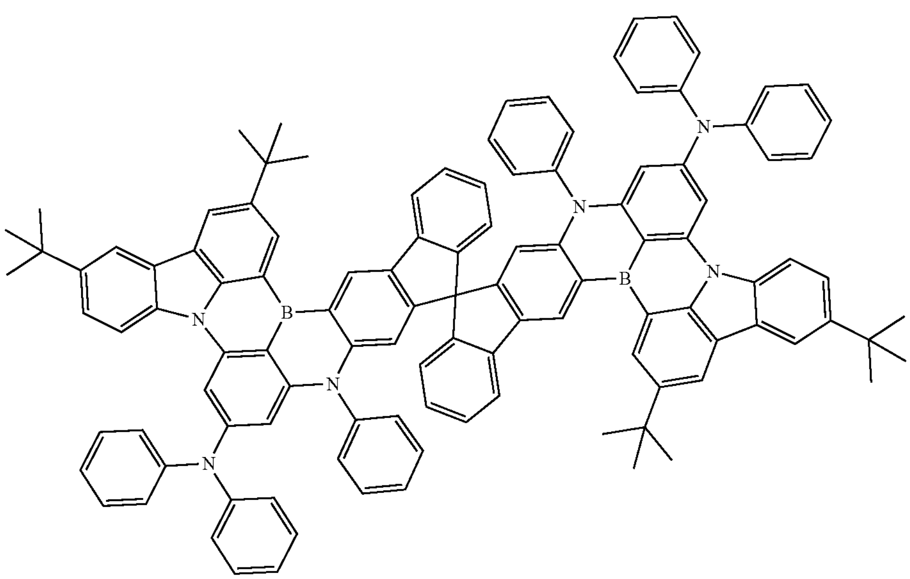

-continued
55
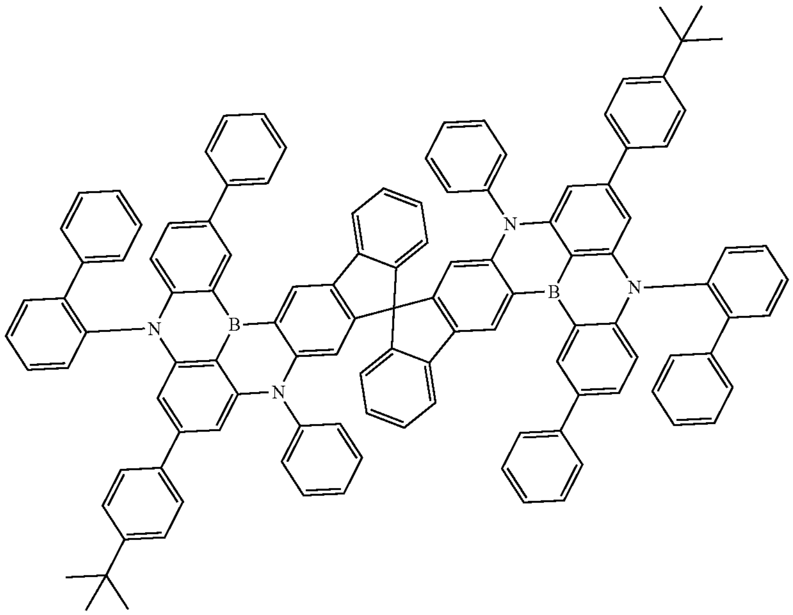
56
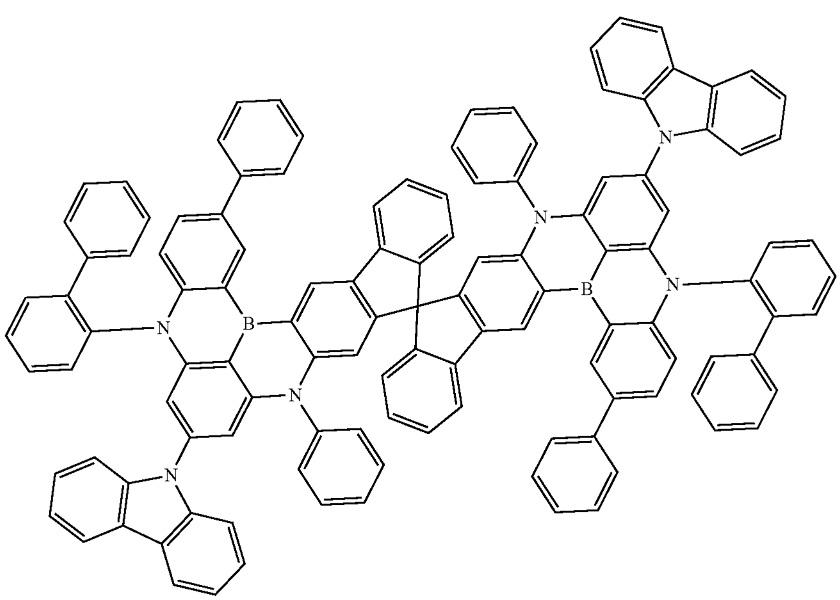

-continued
57
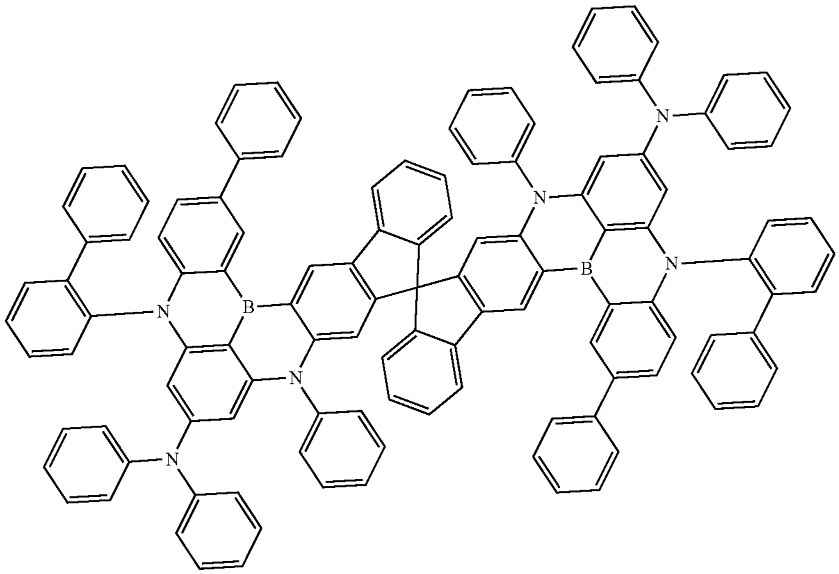
58
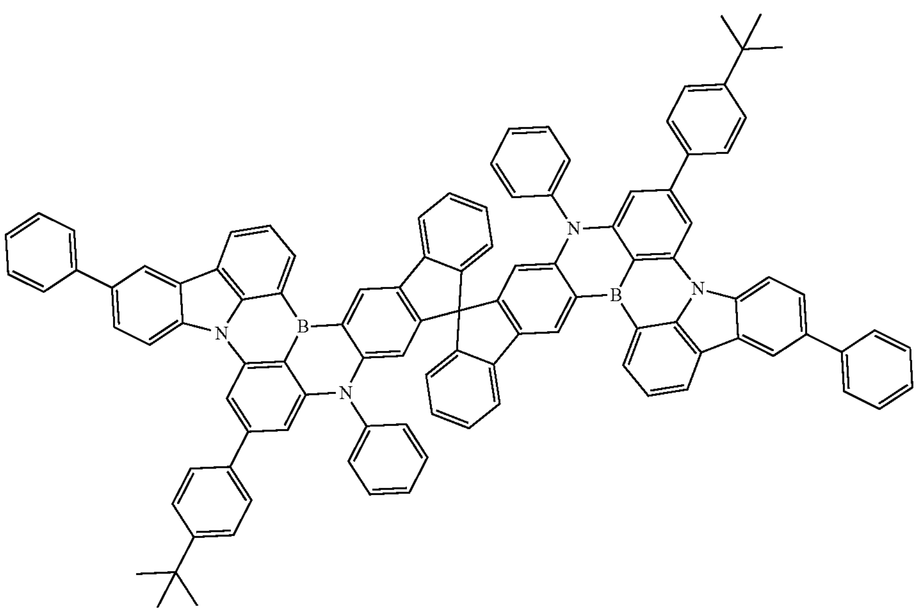

-continued
59
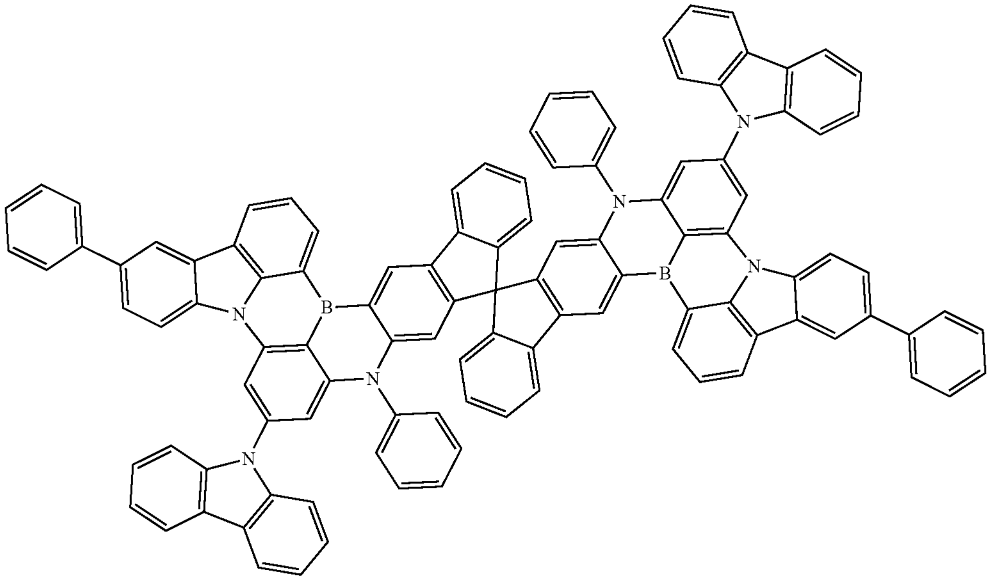
60
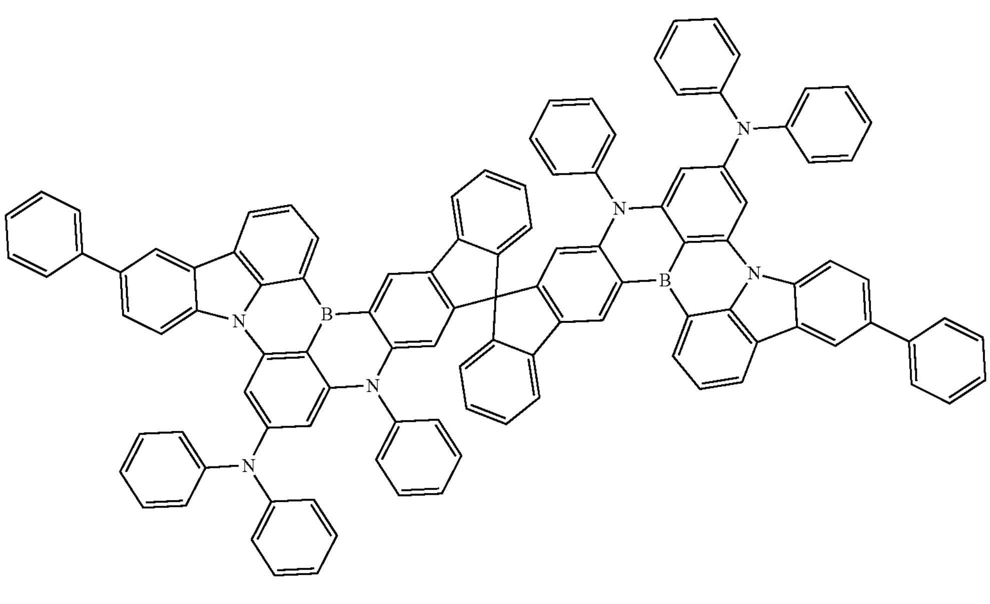

-continued
61
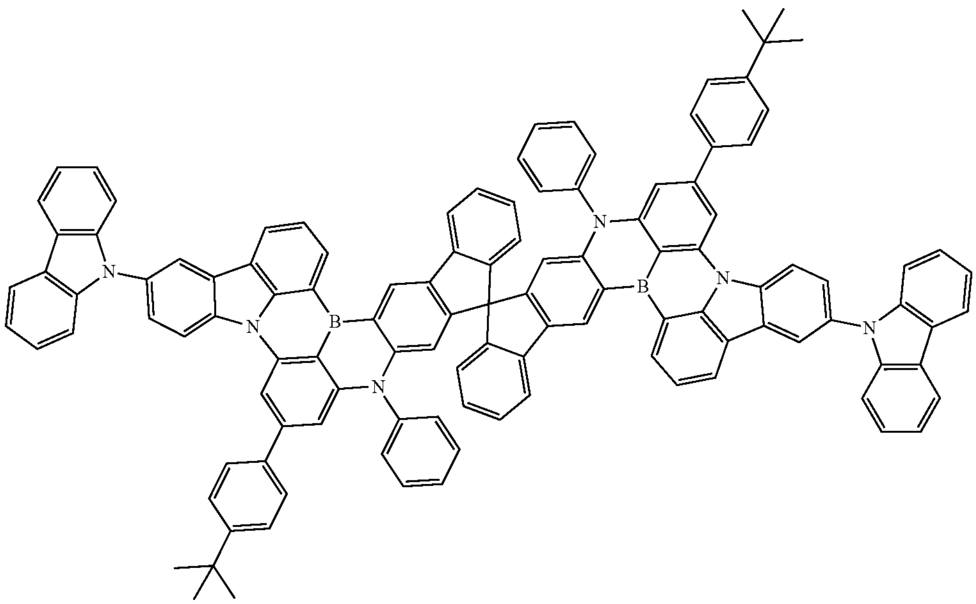
62
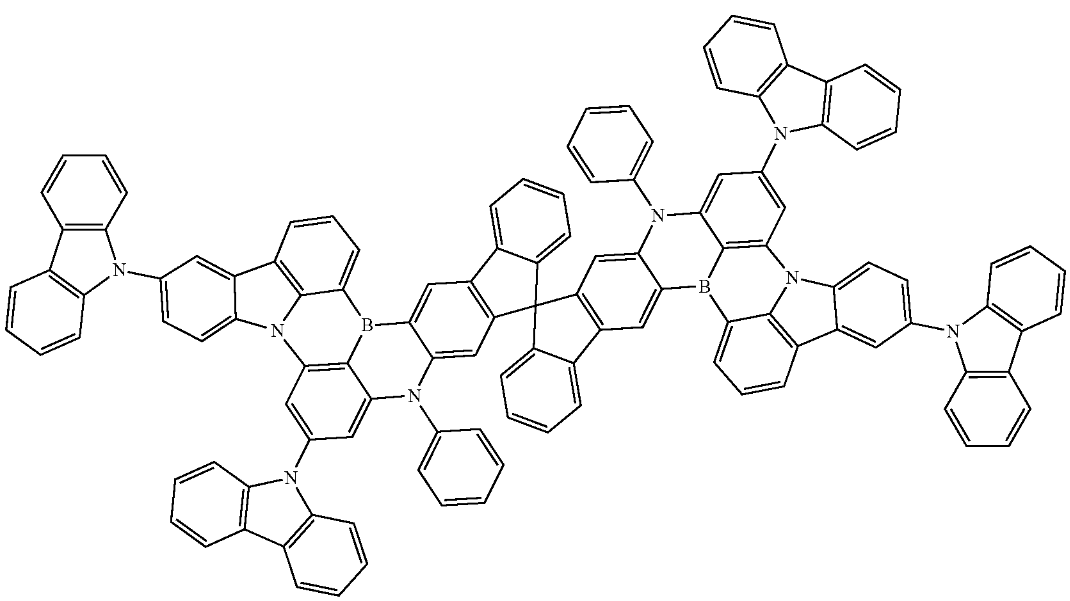

-continued
63
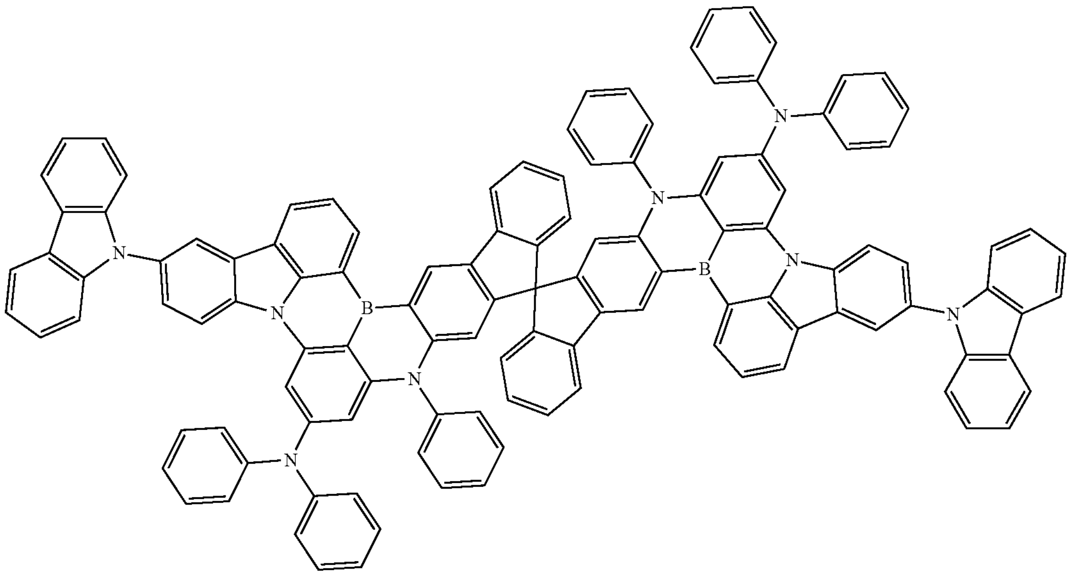
64
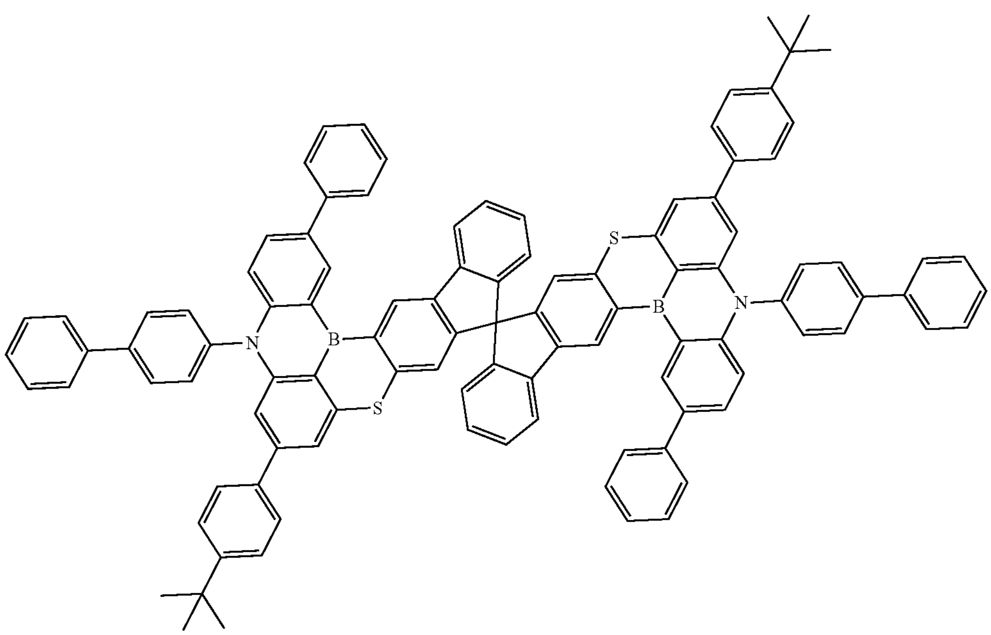

-continued
65
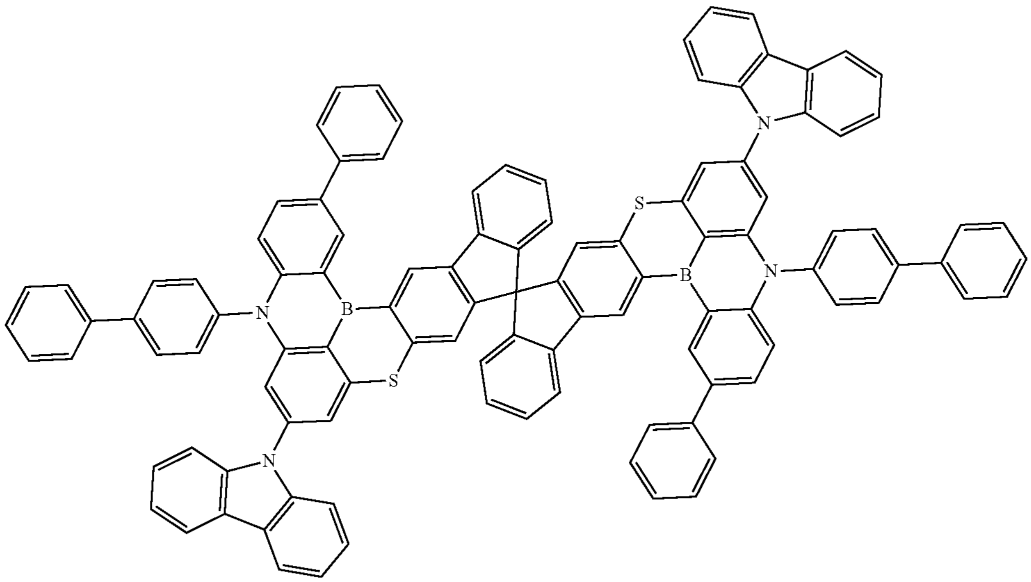
66
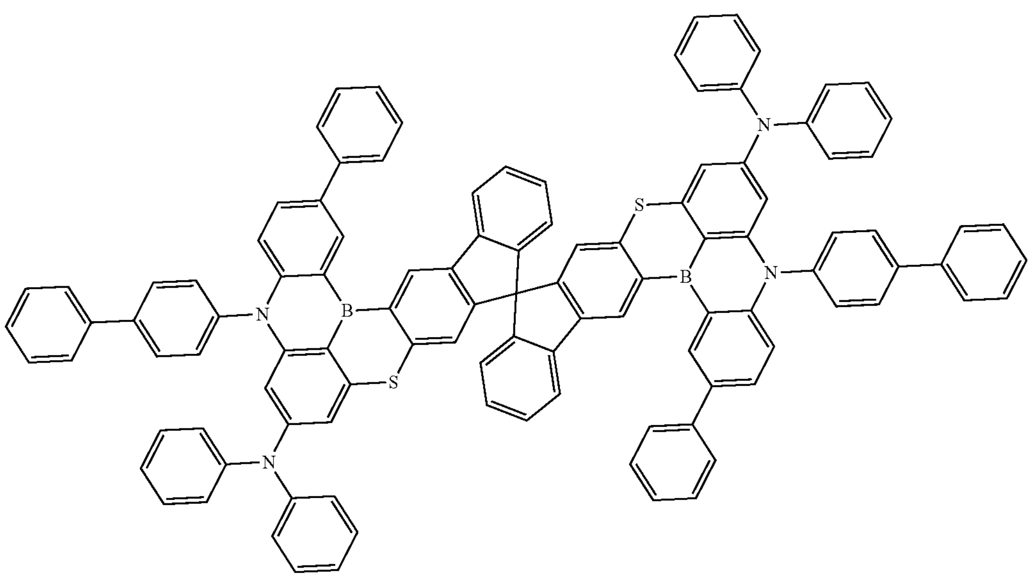

-continued
67
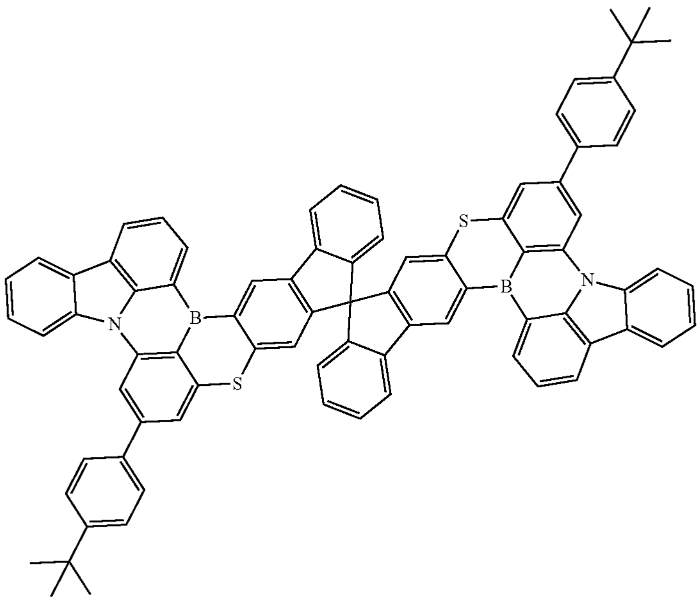
68
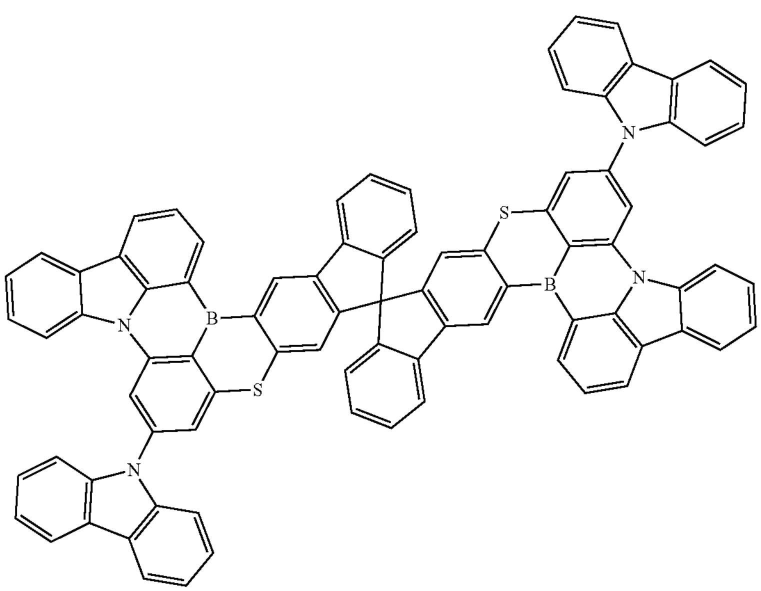

-continued
69
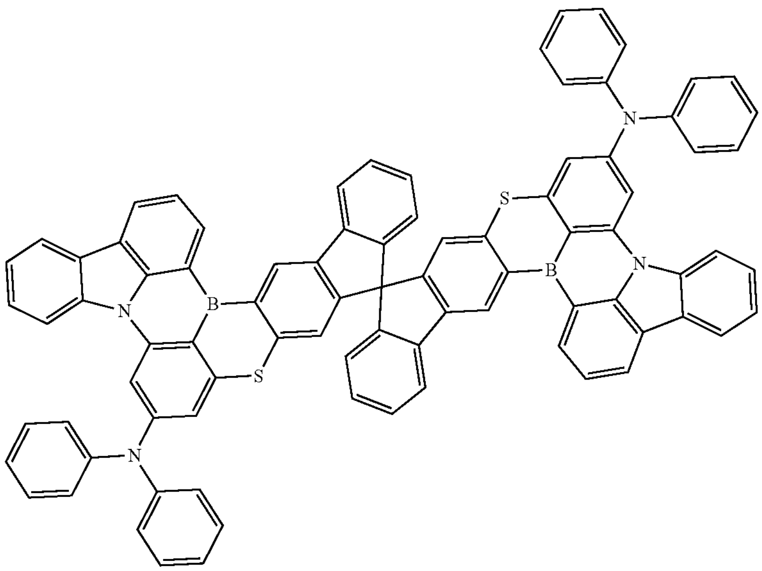
70
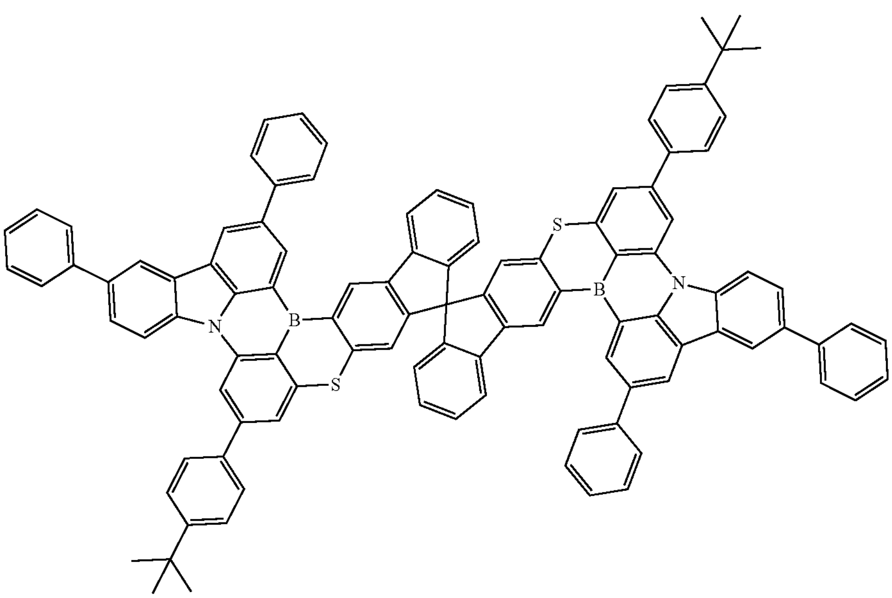

-continued
71
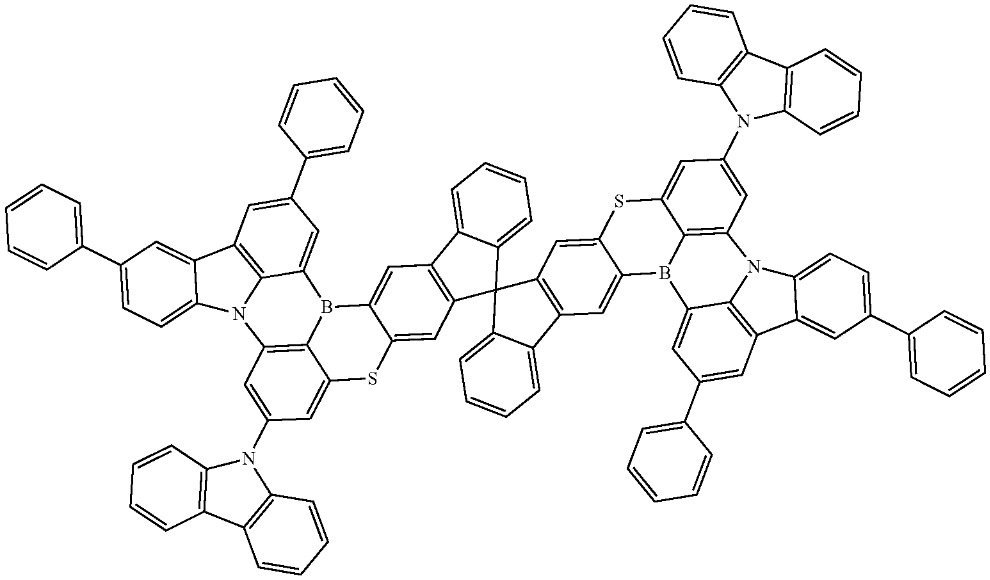
72
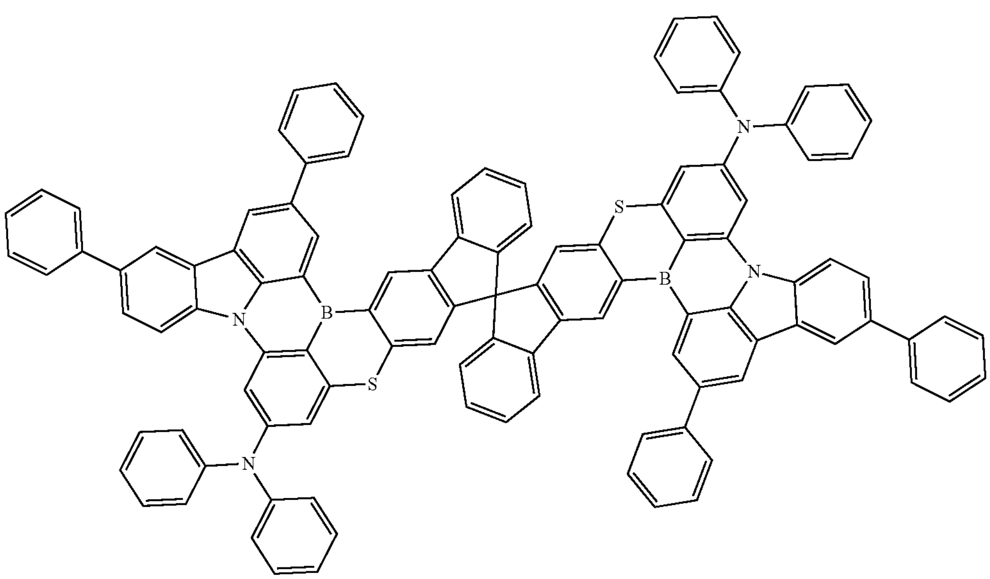

-continued
73
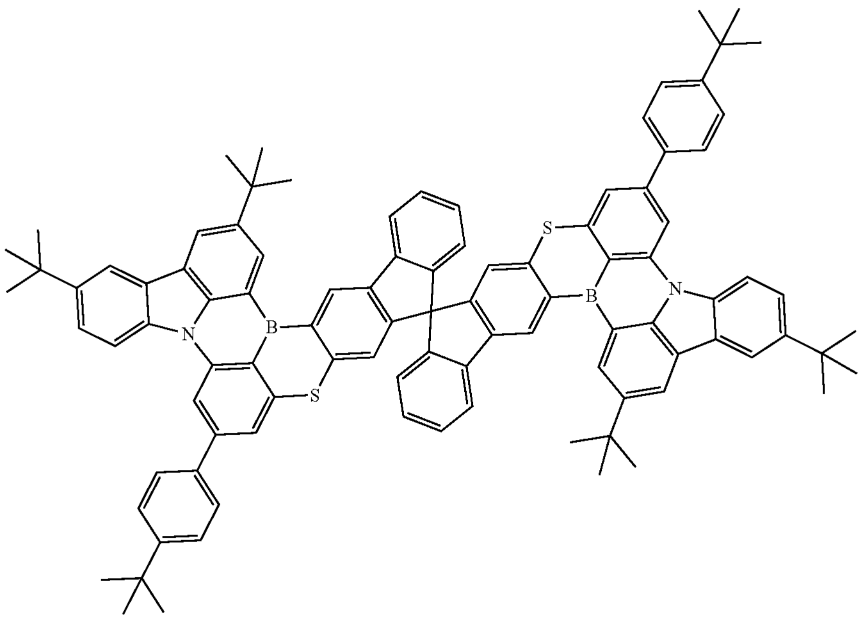
74
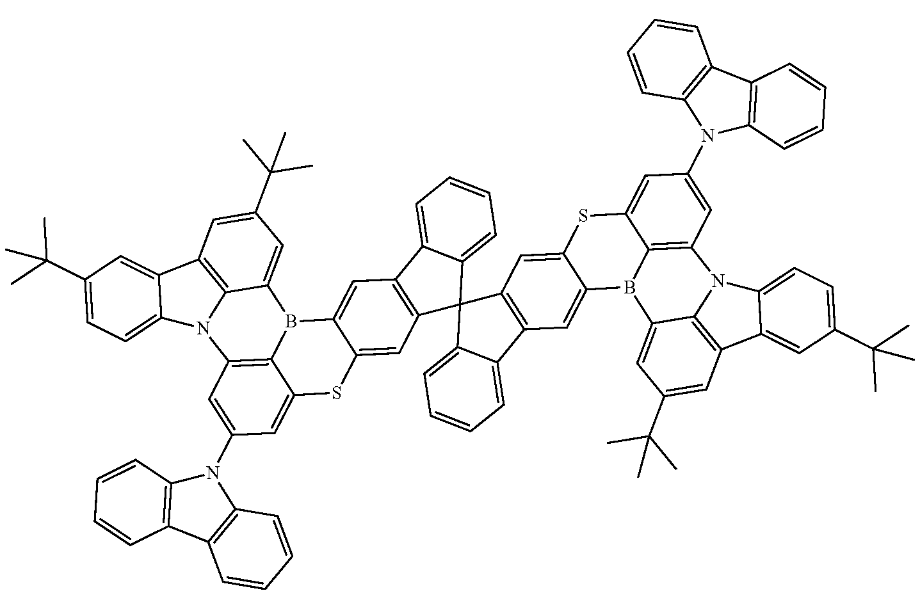

-continued
75
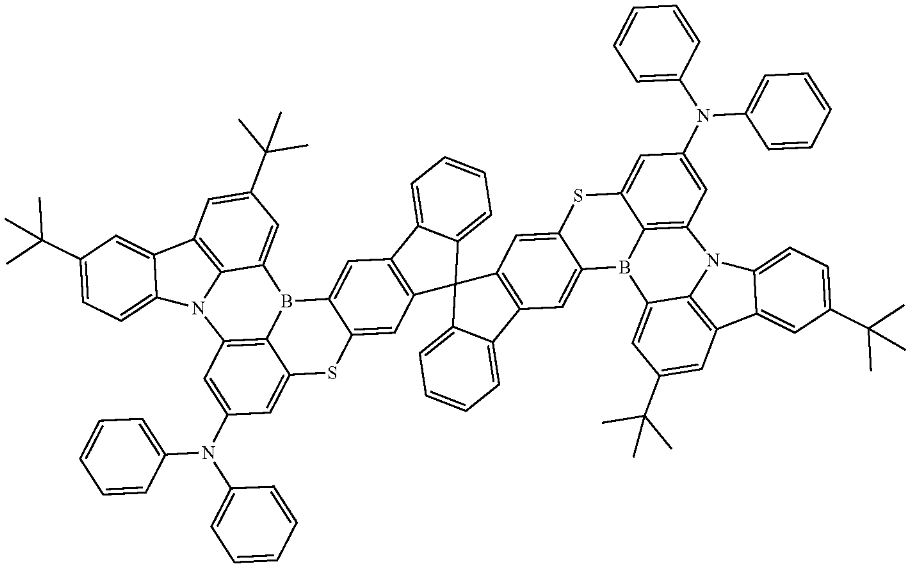
76
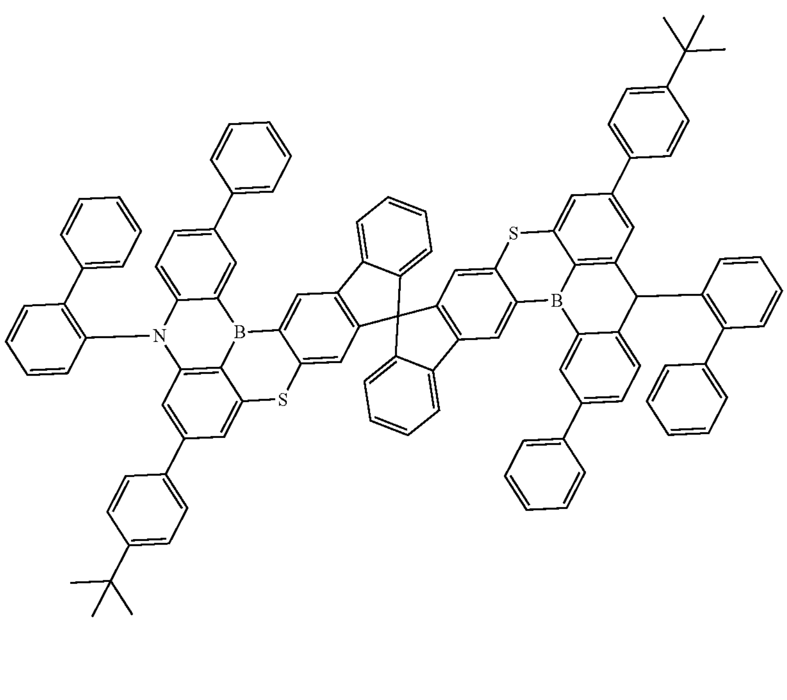

-continued
77
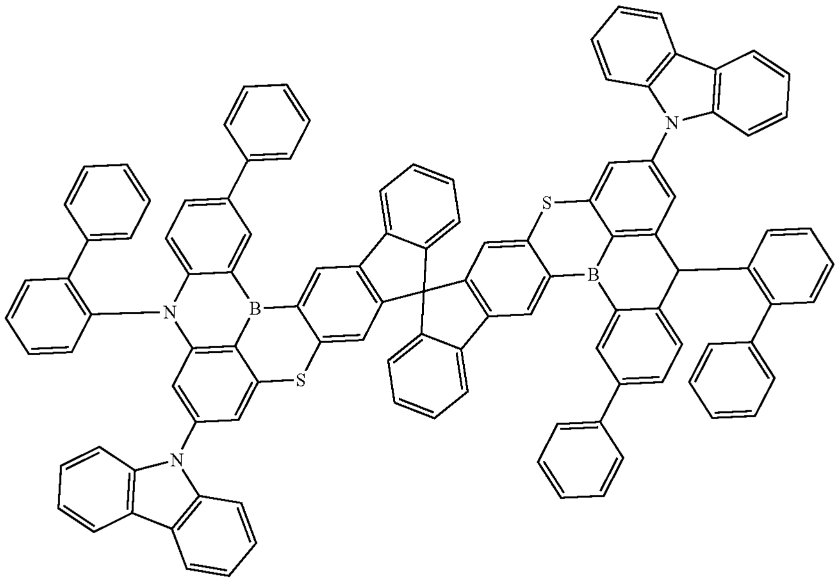
78
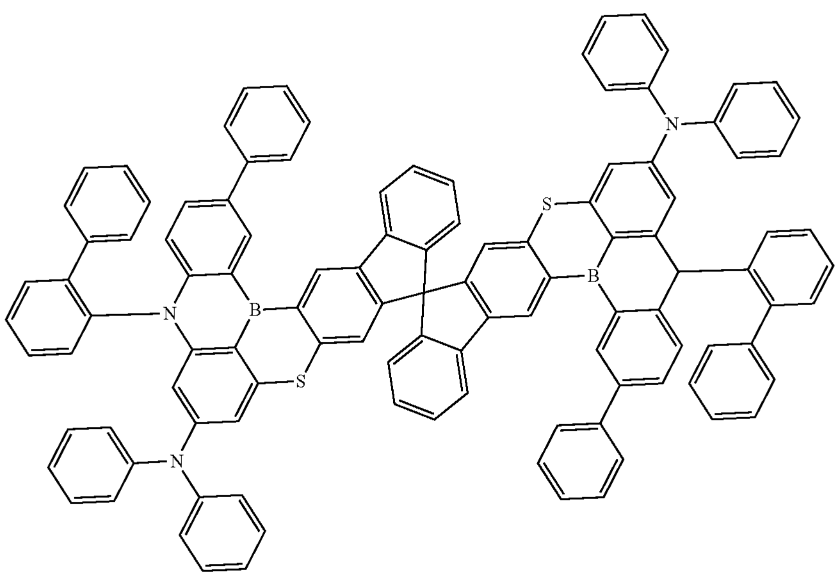

-continued
79
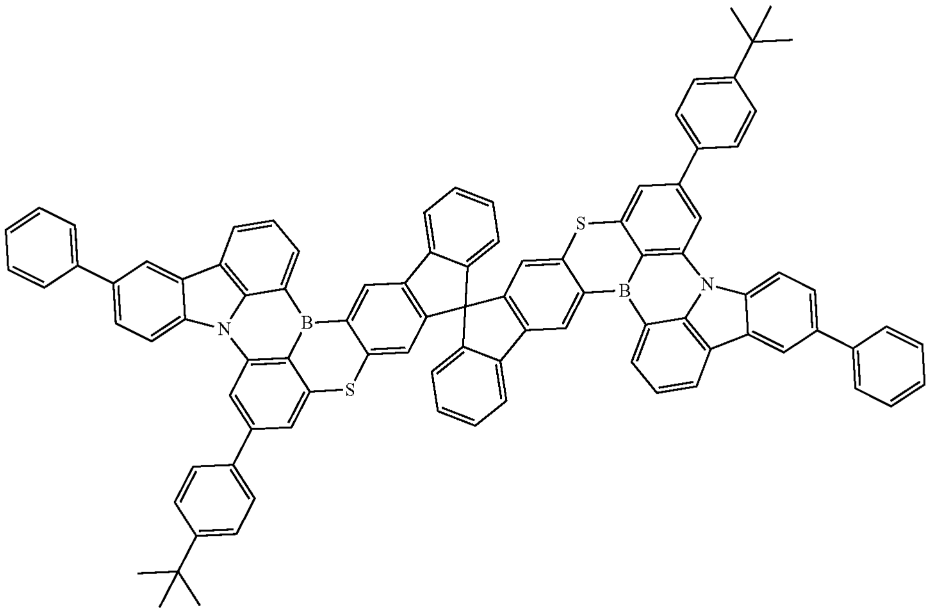
80
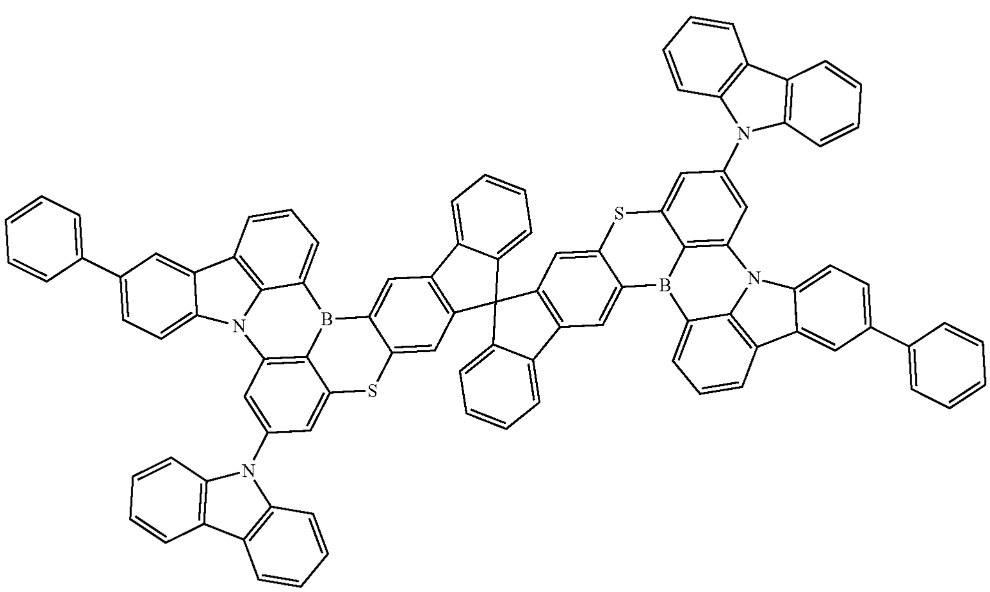

-continued
81
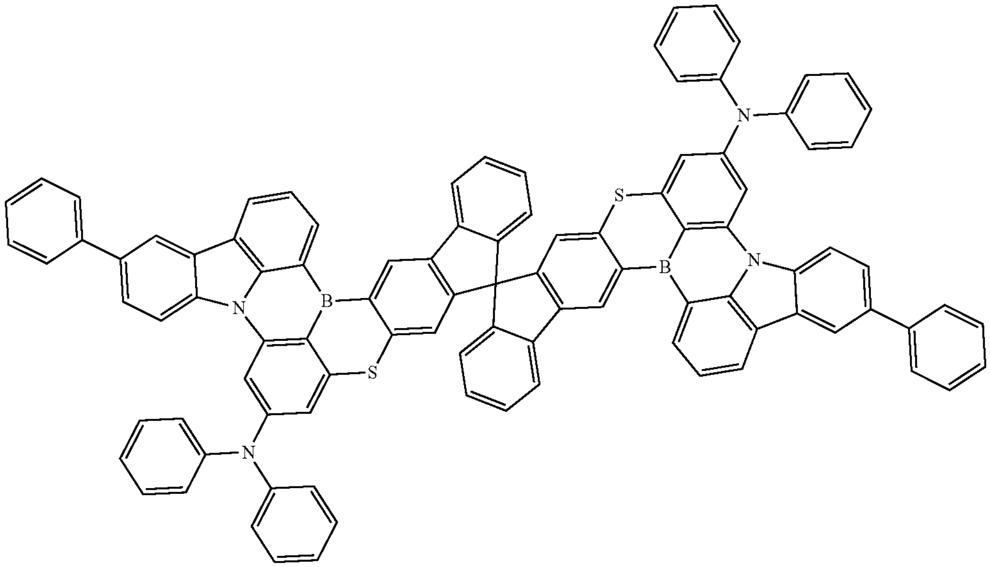
82
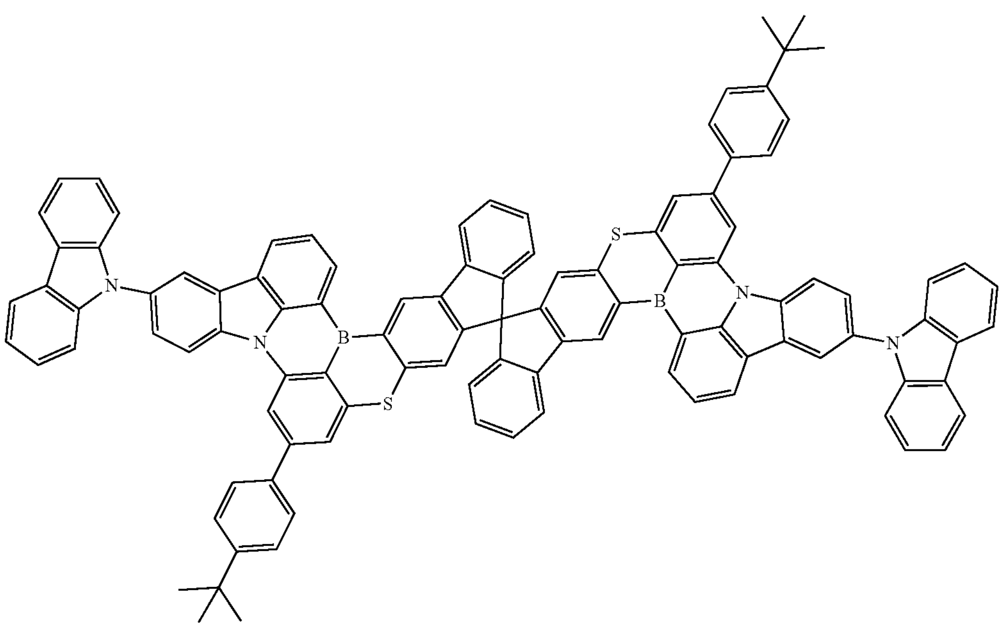

-continued

83

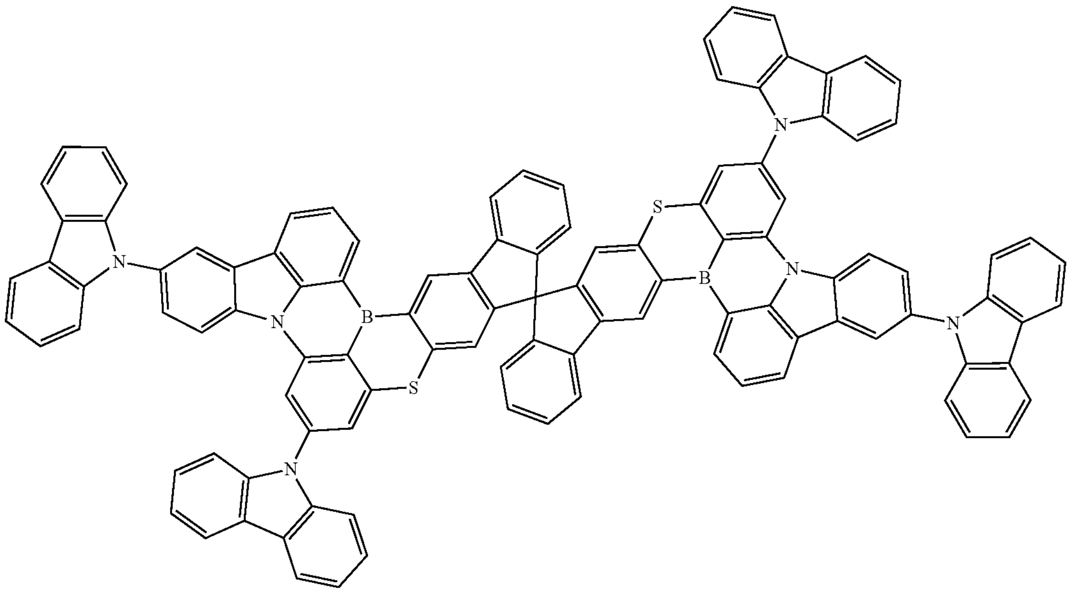

84

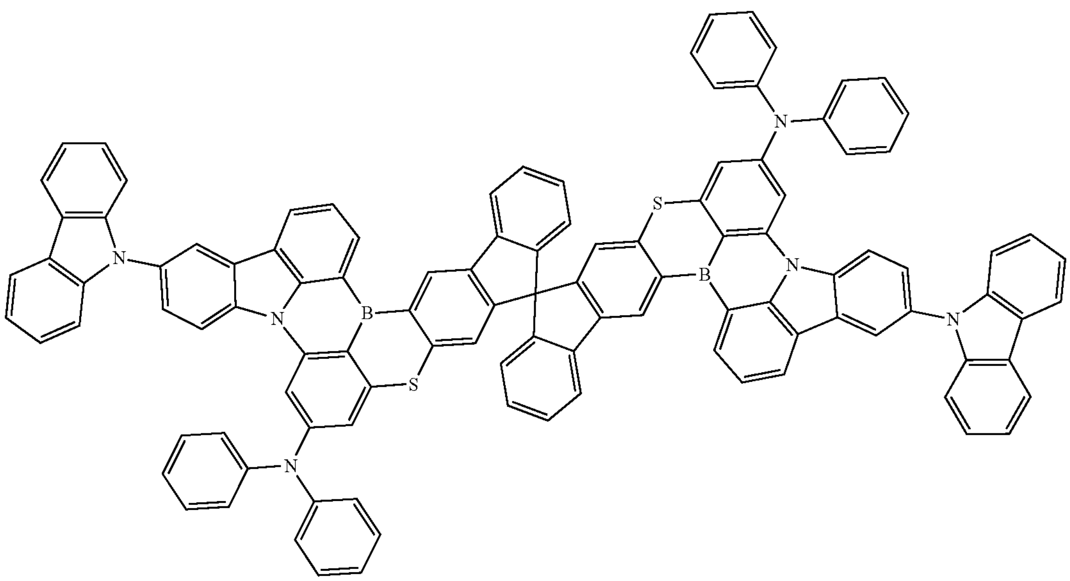

In the light emitting diode ED of one or more embodiments, the emission layer EML may emit fluorescence, phosphorescence, and/or delayed fluorescence. For example, the emission layer EML may emit thermally activated delayed fluorescence (TADF).

In the light emitting diode ED of one or more embodiments, the emission layer EML may emit blue light. For example, the emission layer EML may emit light having a central wavelength of about 430 nm to about 470 nm.

In the light emitting diode ED of one or more embodiments shown in FIGS. 3 to 6, the emission layer EML may include a host and a dopant. The emission layer EML of one or more embodiments may include the condensed polycyclic compound of one or more embodiments described above as a dopant.

In the light emitting diode ED of one or more embodiments, the emission layer EML may include any suitable host material. For example, the emission layer EML may include an anthracene derivative, a pyrene derivative, a fluoranthene derivative, a chrysene derivative, a dihydrobenzanthracene derivative, and/or a triphenylene derivative. In one or more embodiments, the emission layer EML may include an anthracene derivative and/or a pyrene derivative.

In the light emitting diode ED of the embodiments shown in FIGS. 3 to 6, the emission layer EML may include a host and a dopant, and the emission layer EML may include a compound represented by Formula E-1 below. The compound represented by Formula E-1 below may be used as a fluorescent host material.

Formula E-1

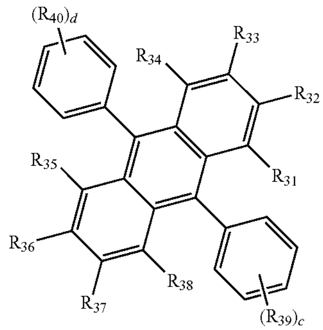

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring. In one or more embodiments, $R_{31}$ to $R_{40}$ may be bonded to an adjacent group to form a saturated hydrocarbon ring, an unsaturated hydrocarbon ring, a saturated heterocycle, and/or an unsaturated heterocycle.

In Formula E-1, c and d may be each independently an integer of 0 to 5.

Formula E-1 may be represented by any one selected from among compounds E1 to E19 below:

E1

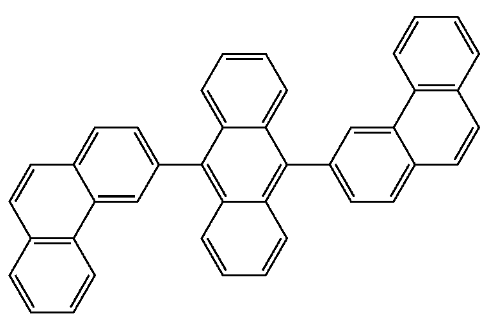

E2

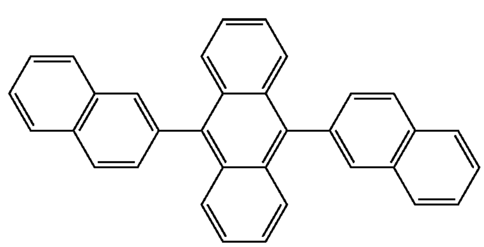

-continued

E3

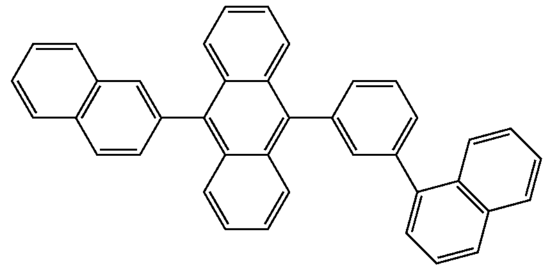

E4

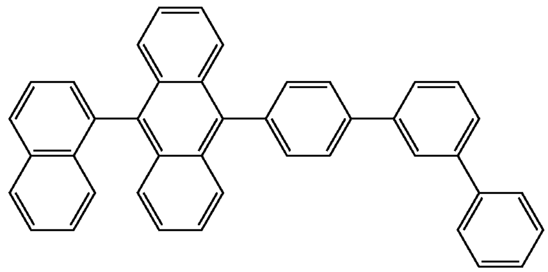

E5

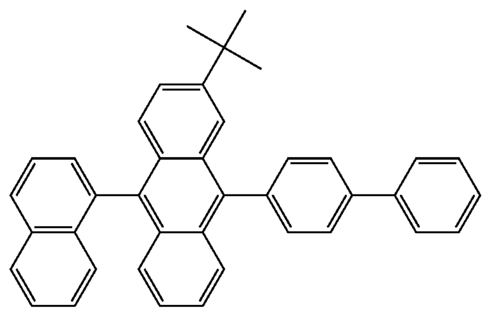

E6

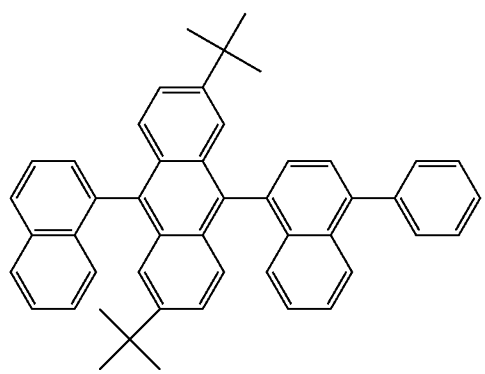

E7

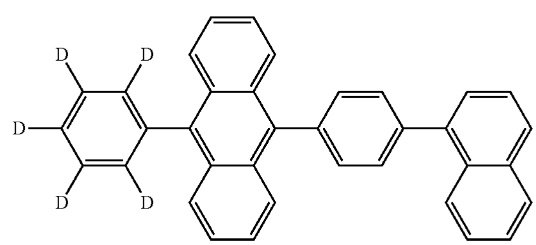

-continued
E8
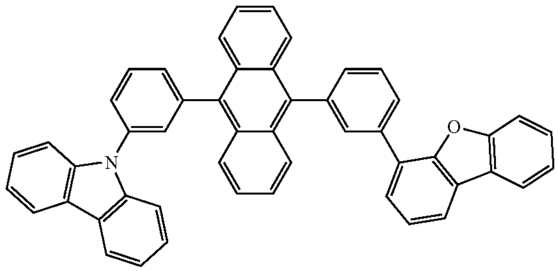
E9
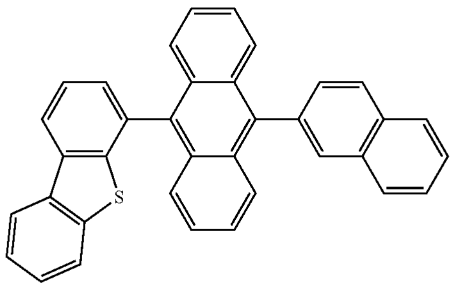
E10
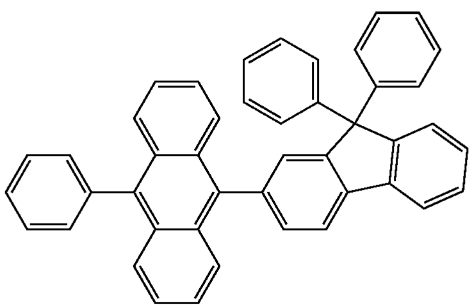
E11
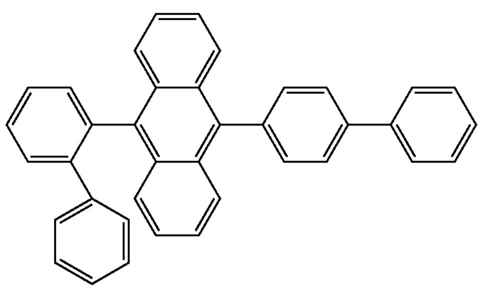
E12
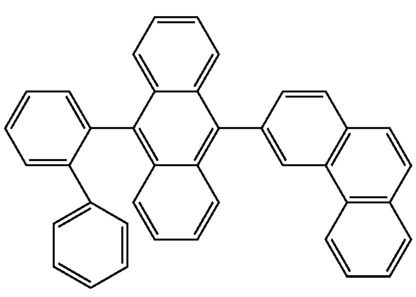
-continued
E13
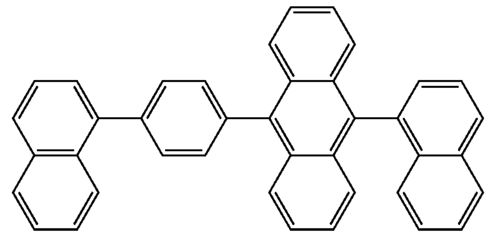
E14
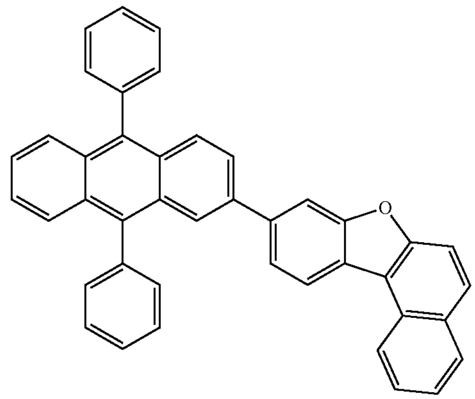
E15
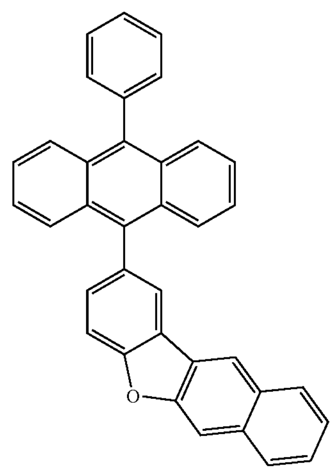
E16
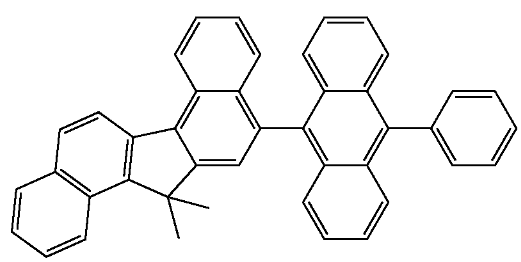

-continued

E17

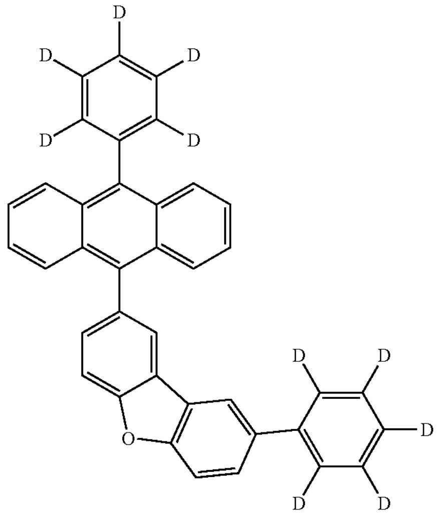

E18

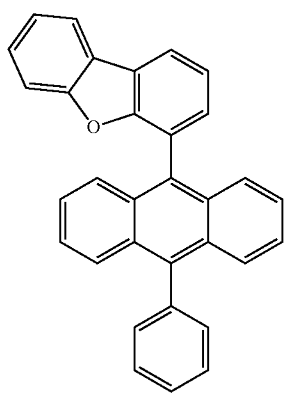

E19

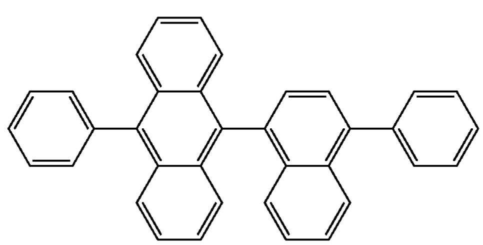

In one or more embodiments, the emission layer EML may include a compound represented by Formula E-2a or E-2b below. The compound represented by Formula E-2a or Formula E-2b may be used as a phosphorescent host material.

Formula E-2a

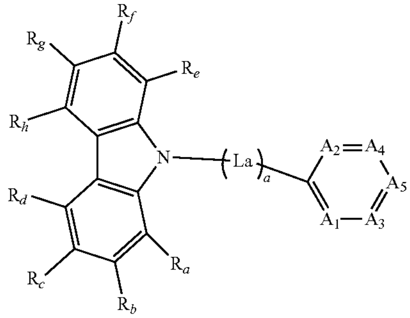

In Formula E-2a, a may be an integer of 0 to 10, and La may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of La's may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring. $R_a$ to $R_i$ may be bonded to an adjacent group to form a hydrocarbon ring and/or a heterocycle containing N, O, S, Se, etc. as a ring-forming atom.

In one or more embodiments, in Formula E-2a, two or three selected from $A_1$ to $A_5$ may be N, and the rest may be $CR_i$.

Formula E-2b $$(\mathrm{Cbz1})\!-\!(L_b)_b\!-\!(\mathrm{Cbz2})$$

In Formula E-2b, Cbz1 and Cbz2 may be each independently an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms, b may be an integer of 0 to 10, and when b is an integer of 2 or greater, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one of compounds selected from Compound Group E-2 below. However, the compounds listed in Compound Group E-2 below are presented as an example, and the compound represented by Formula E-2a or Formula E-2b is not limited to those listed in Compound Group E-2 below.

Compound Group E-2

E-2-1

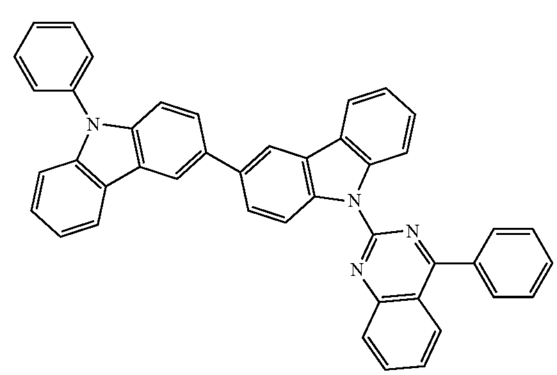

-continued
E-2-2
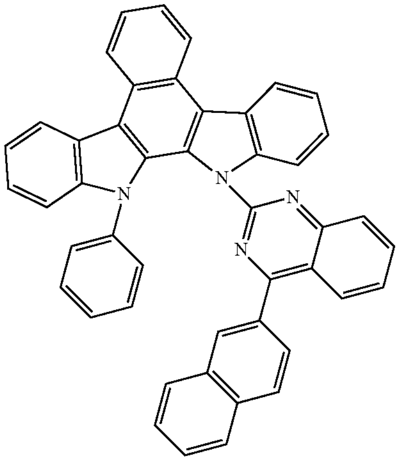
E-2-3
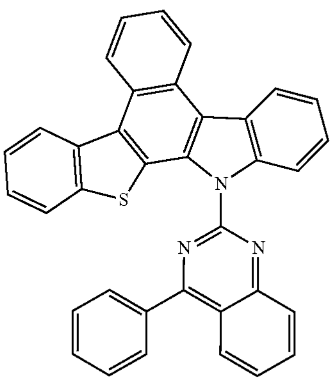
E-2-4
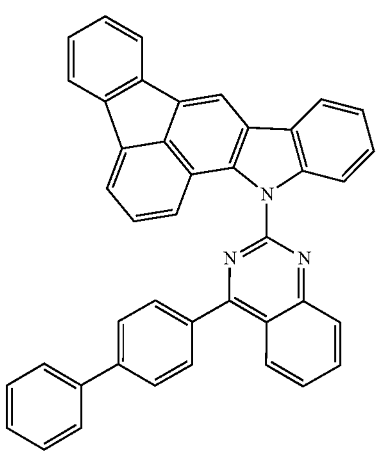
E-2-5
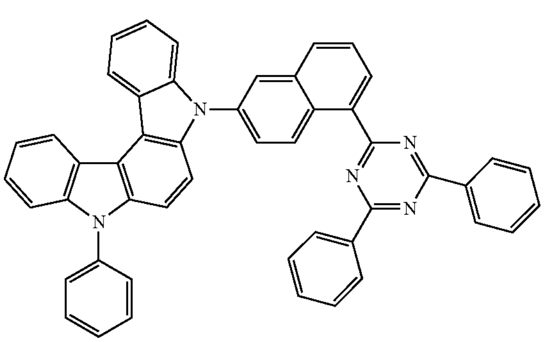
-continued
E-2-6
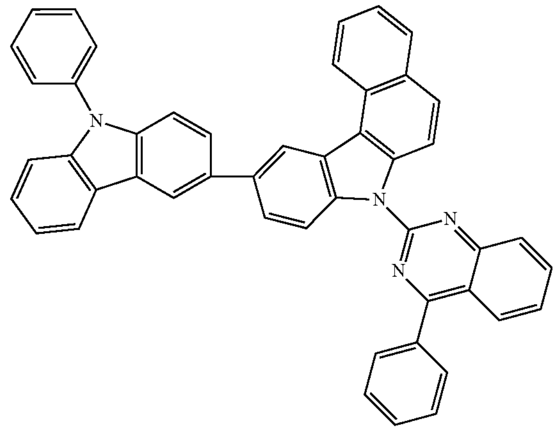
E-2-7
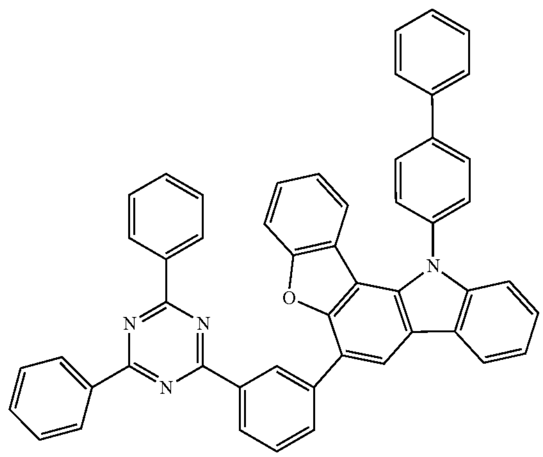
E-2-8
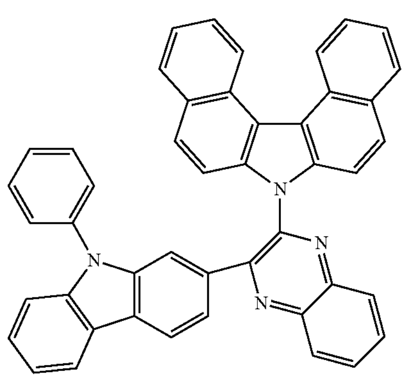

-continued
E-2-9
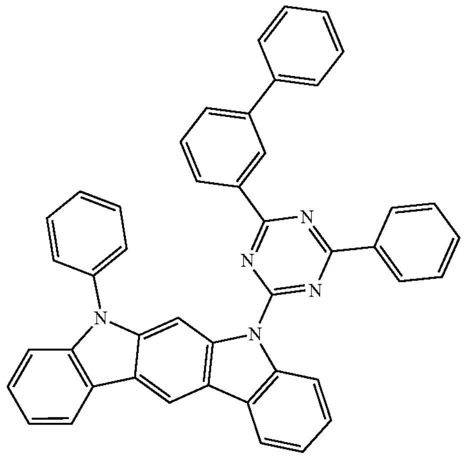
E-2-10
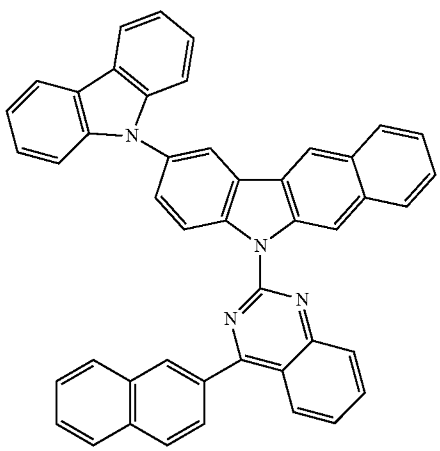
E-2-11
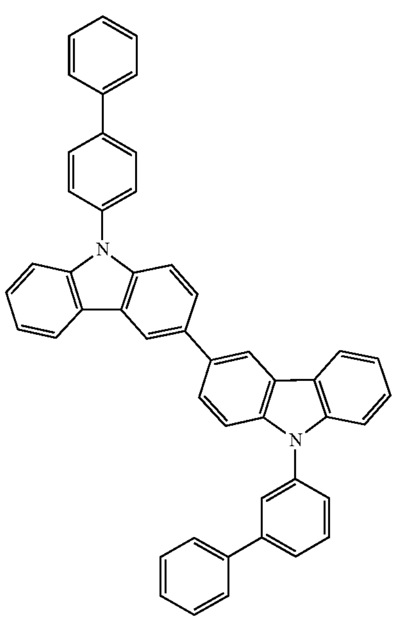
-continued
E-2-12
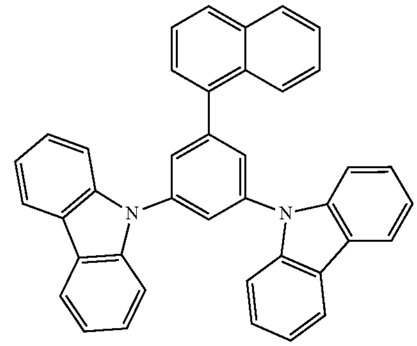
E-2-13
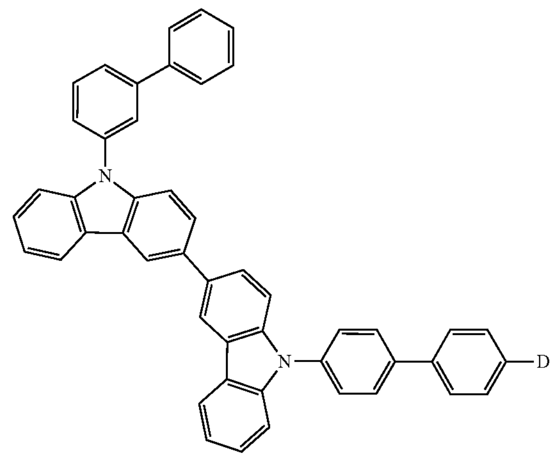
E-2-14
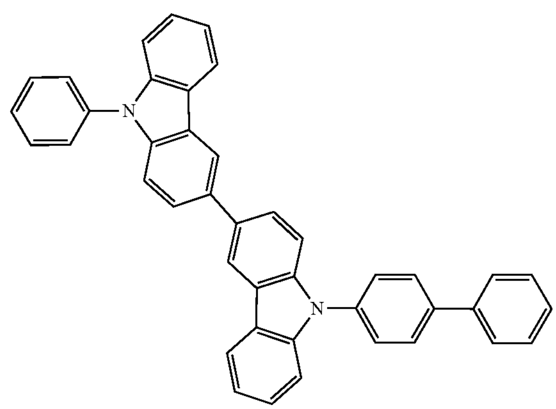
E-2-15
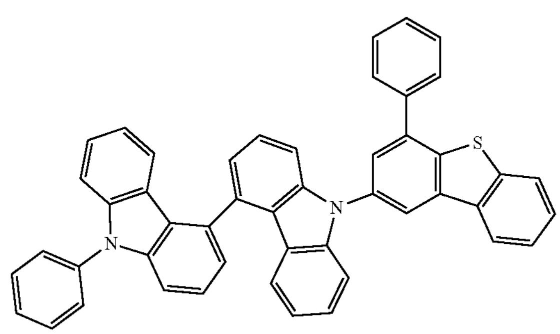

-continued
E-2-16
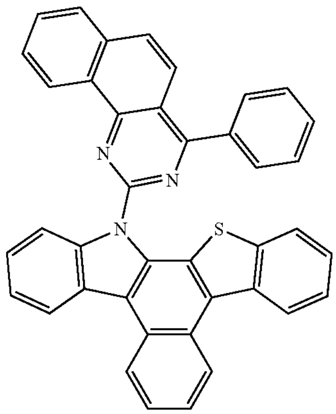
E-2-17
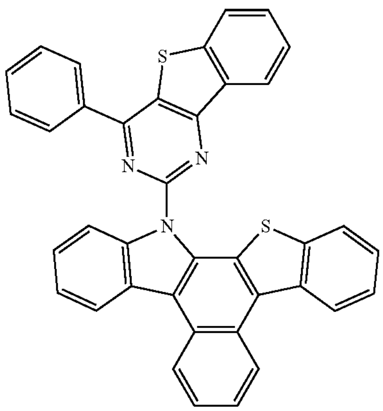
E-2-18
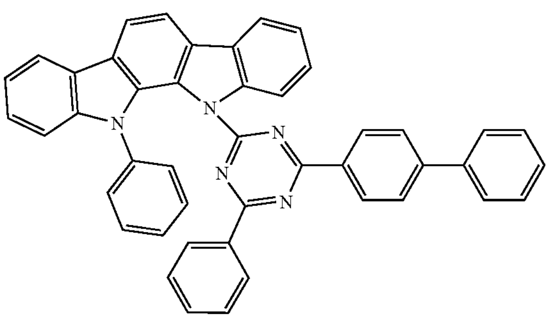
E-2-19
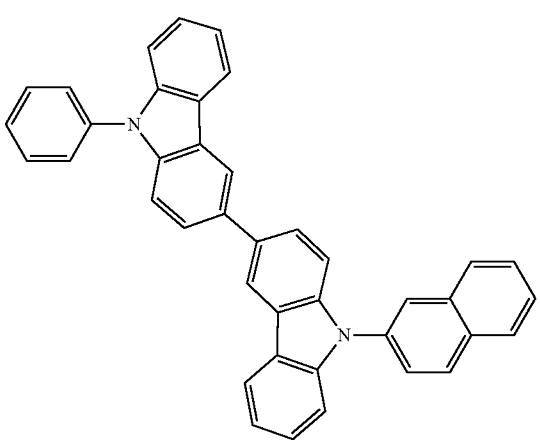
-continued
E-2-20
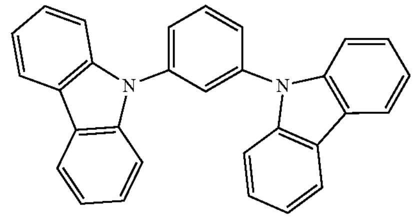
E-2-21
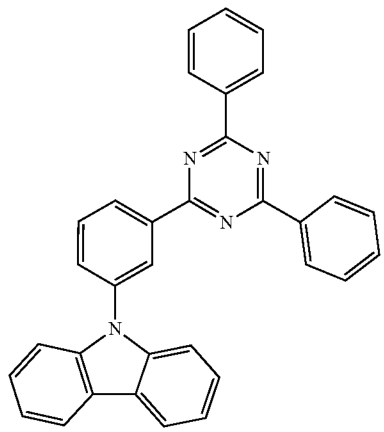
E-2-22
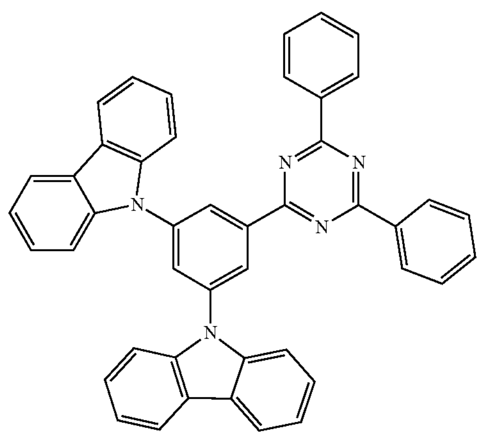
E-2-23
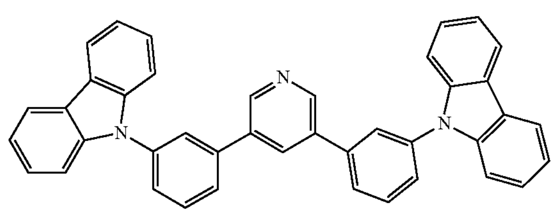

-continued

E-2-24

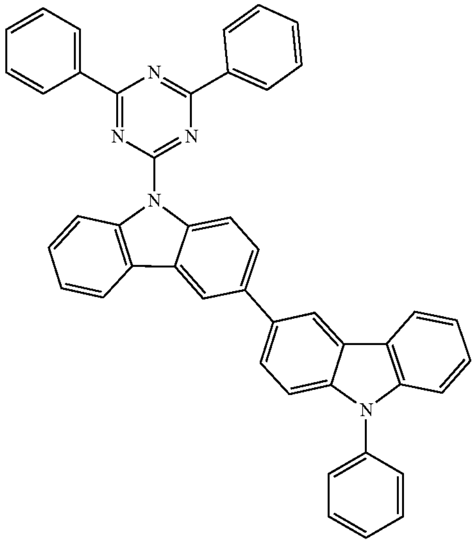

The emission layer EML may further include a suitable host material. For example, the emission layer EML may include, as a host material, at least one selected from among bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl) dibenzofuran (PPF), 4,4',4"-tris(carbazol-9-yl)-triphenylamine (TCTA), and 1,3,5-tris(1-phenyl-1H-benzo[d]imidazol-2-yl) benzene (TPBi). However, the embodiment of the present disclosure is not limited thereto, and for example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include a compound represented by Formula M-a or Formula M-b below. The compound represented by the Formula M-a or M-b below may be used as a phosphorescent dopant material.

Formula M-a

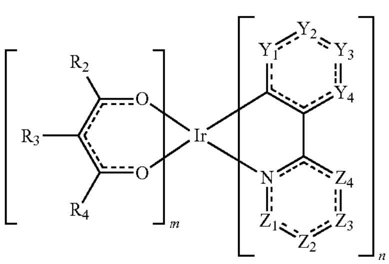

In Formula M-a above, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a phosphorescent dopant.

The compound represented by Formula M-a may be represented by any one of compounds M-a1 to M-a25 below. However, the compounds M-a1 to M-a25 below are presented as an example, and the compound represented by Formula M-a is not limited to those represented by the compounds M-a1 to M-a25 below.

M-a1

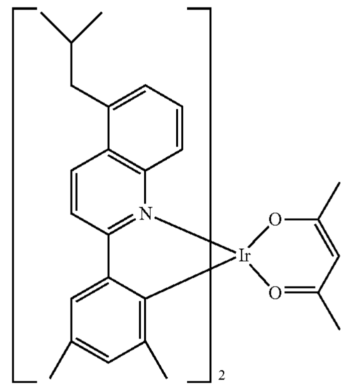

M-a2

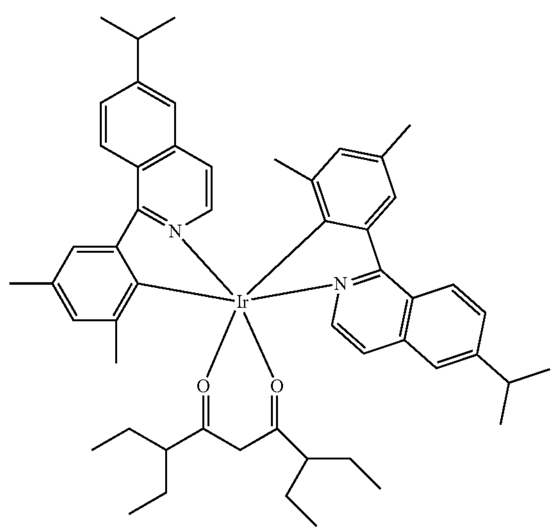

-continued
M-a3
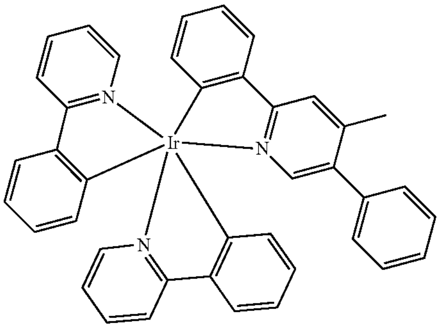
M-a4
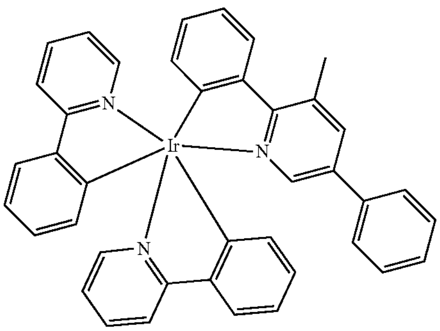
M-a5
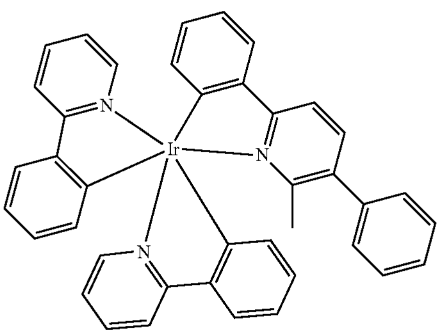
M-a6
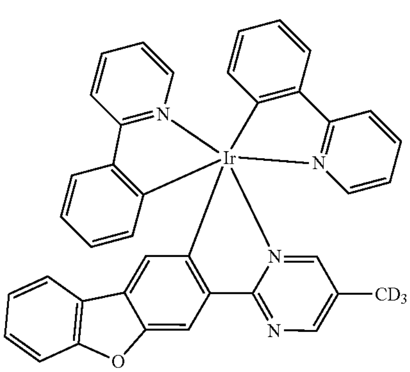
-continued
M-a7
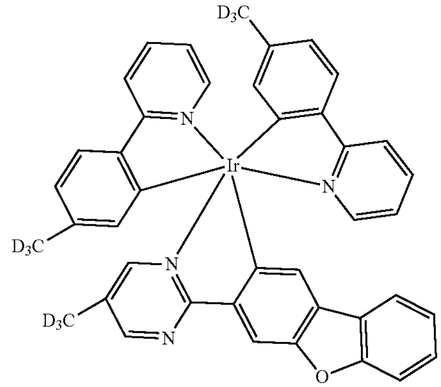
M-a8
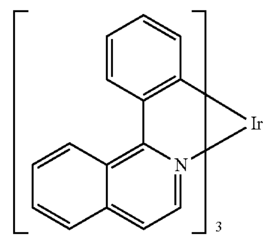
M-a9
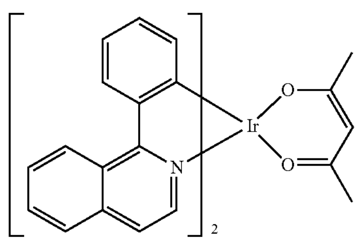
M-a10
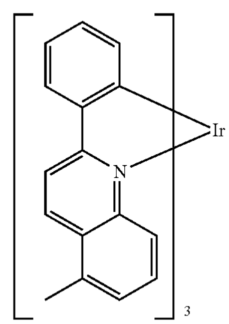
M-a11
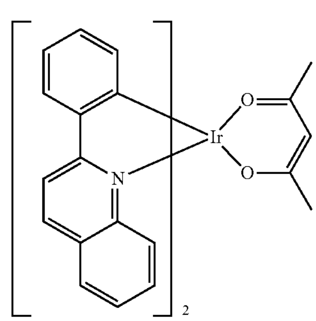

-continued
M-a12
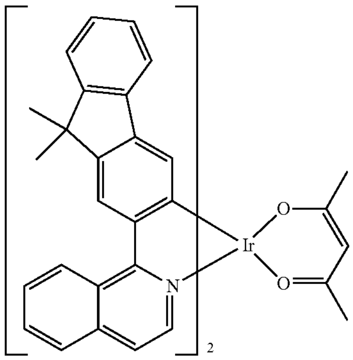
M-a13
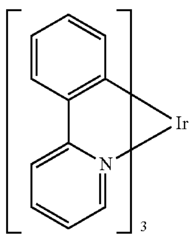
M-a14
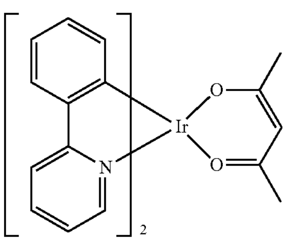
M-a15
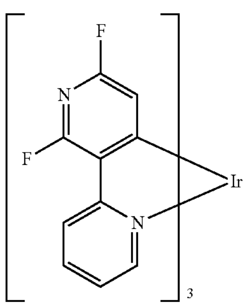
M-a16
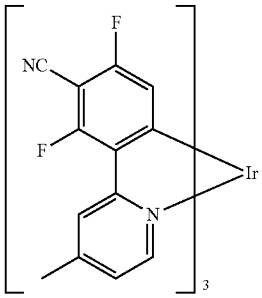
-continued
M-a17
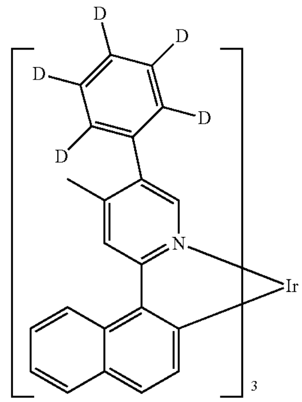
M-a18
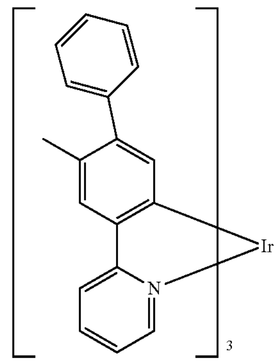
M-a19
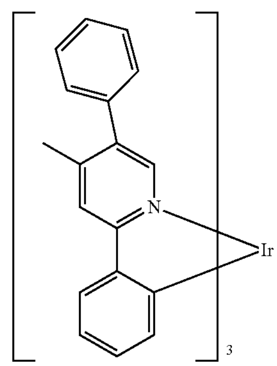
M-a20
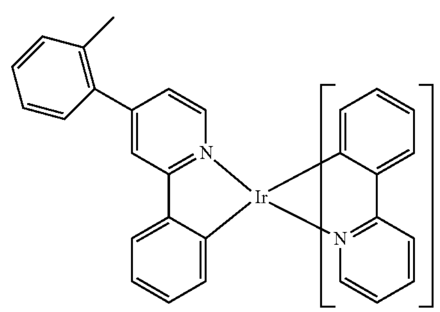

-continued

M-a21

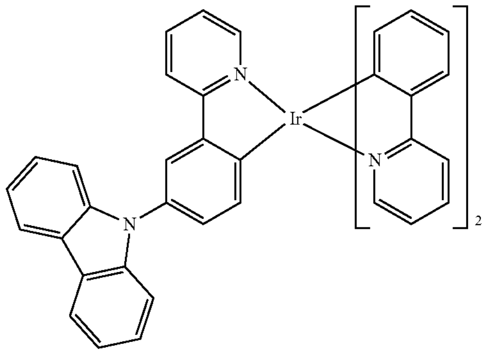

M-a22

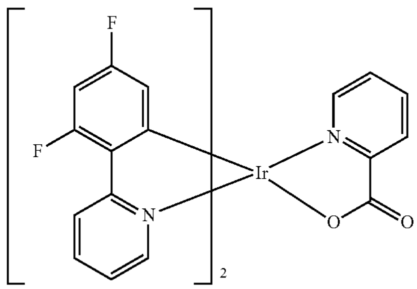

M-a23

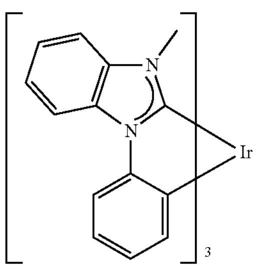

M-a24

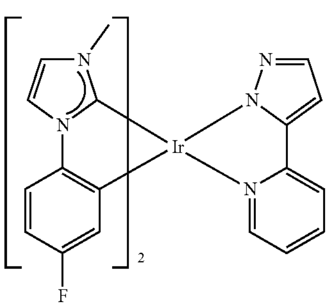

M-a25

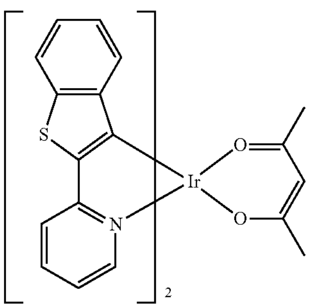

The compound M-a1 and the compound M-a2 may be used as a red dopant material, and the compounds M-a3 to M-a25 may be used as a green dopant material.

Formula M-b

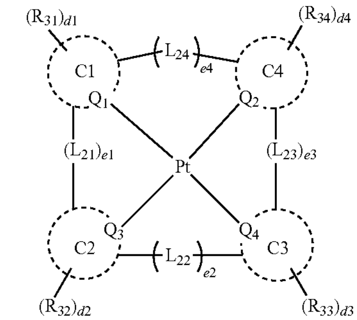

In Formula M-b, $Q_1$ to $Q_4$ may be each independently C or N, and C1 to C4 may be each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may be each independently a direct linkage,

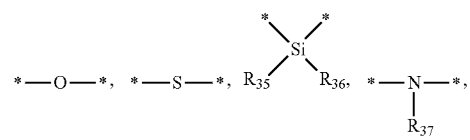

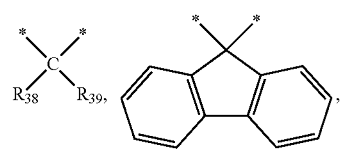

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and el to e4 are each independently 0 or 1. $R_{31}$ to $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring, and d1 to d4 are each independently an integer of 0 to 4.

The compound represented by Formula M-b may be used as a blue phosphorescent dopant or a green phosphorescent dopant.

The compound represented by Formula M-b may be represented by any one of compounds below. However, the compounds below are presented as an example, and the compound represented by Formula M-b is not limited to those represented by the compounds below.

M-b-1
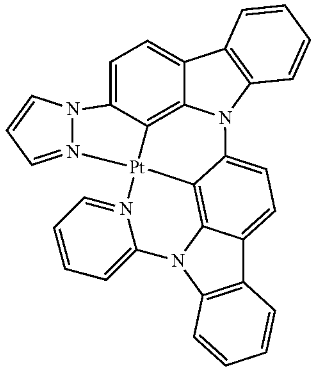
M-b-2
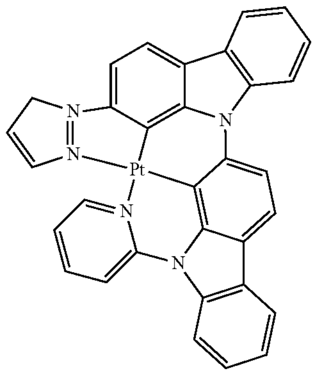
M-b-3
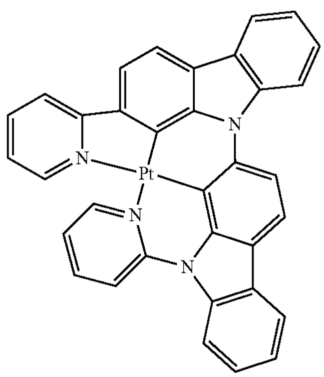
M-b-4
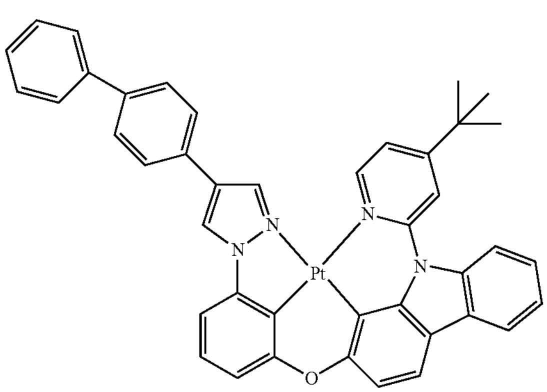
-continued
M-b-5
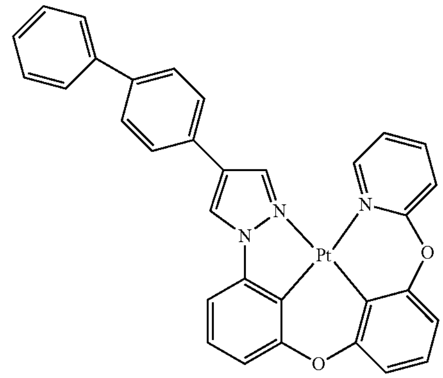
M-b-6
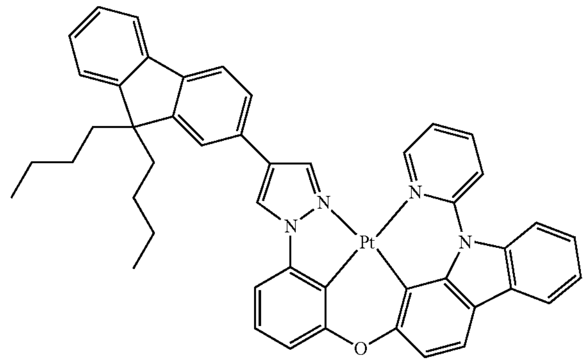
M-b-7
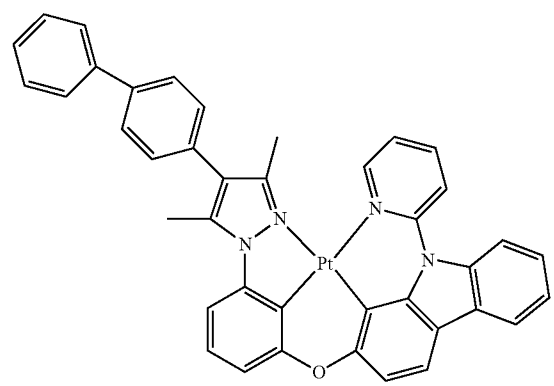
M-b-8
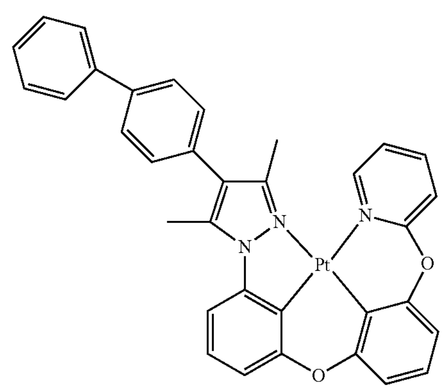

-continued

M-b-9

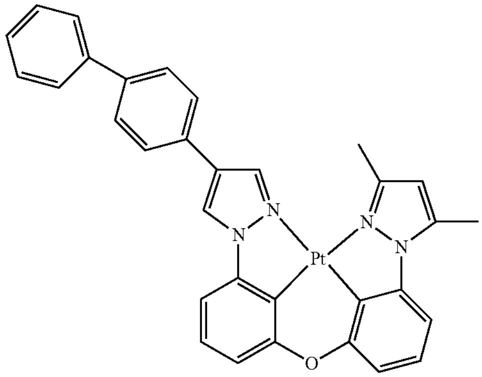

M-b-10

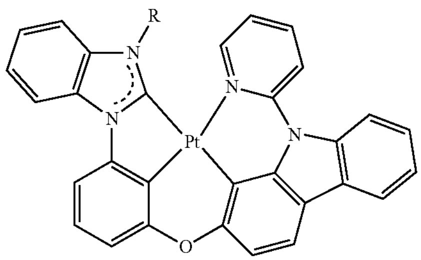

M-b-11

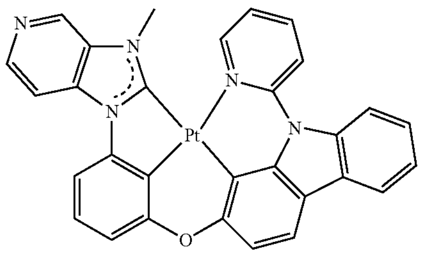

M-b-12

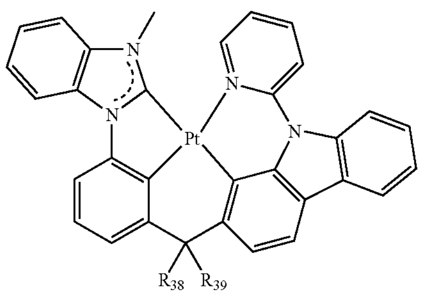

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formulae F-a to F-c below. The compounds represented by Formulae F-a to F-c below may be used as a fluorescent dopant material.

Formula F-a

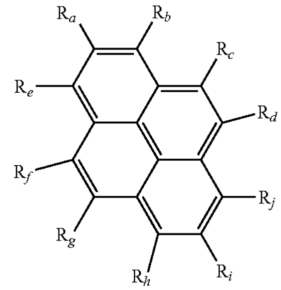

In Formula F-a above, two selected from $R_a$ to $R_j$ may be each independently substituted with *—$NAr_1Ar_2$. The rest of $R_a$ to $R_j$ which are not substituted with *—$NAr_1Ar_2$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In *—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ and/or $Ar_2$ may be a heteroaryl group containing O or S as a ring-forming atom.

The emission layer may include at least one of compounds FD1 to FD22 below as a fluorescent dopant.

FD1

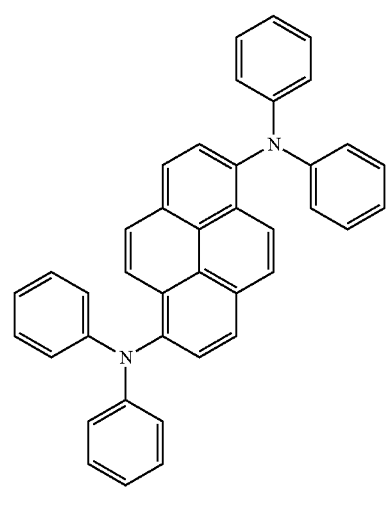

-continued
FD2
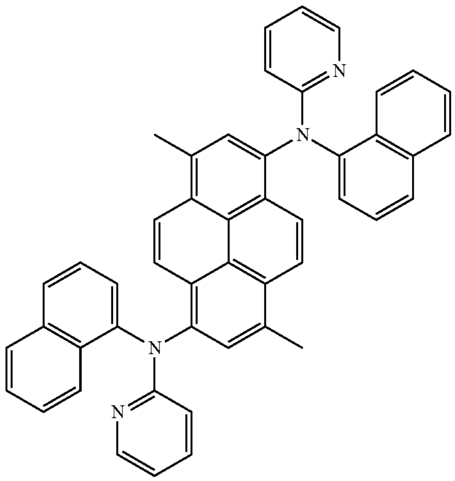
FD3
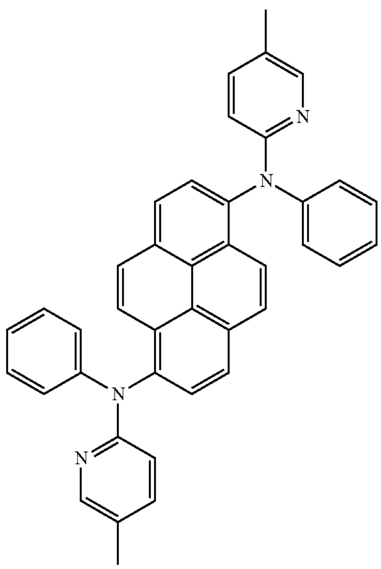
FD4
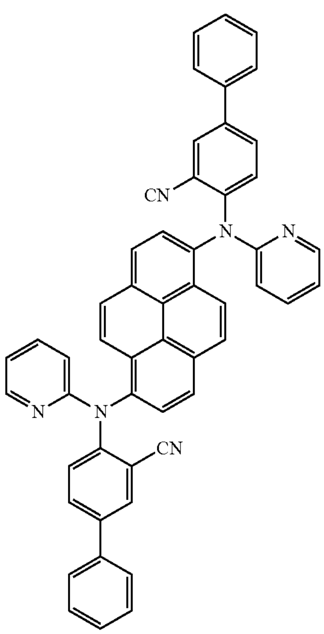
-continued
FD5
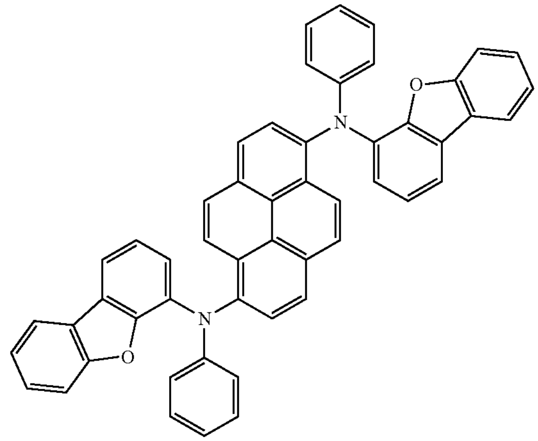
FD6
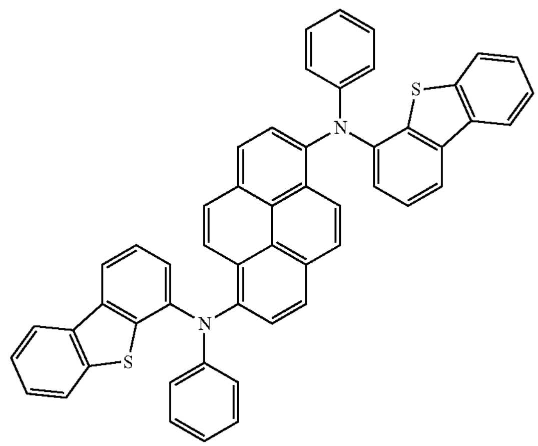
FD7
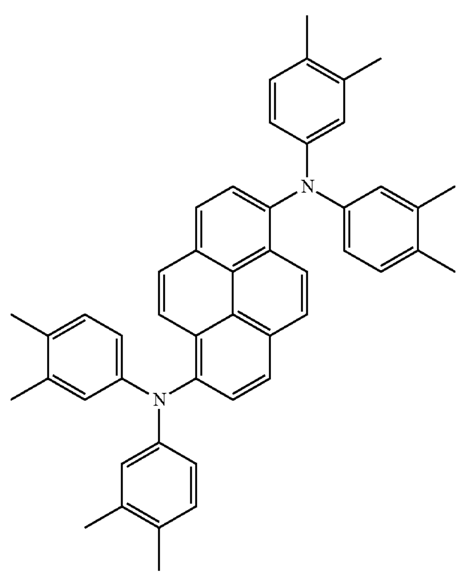

FD8
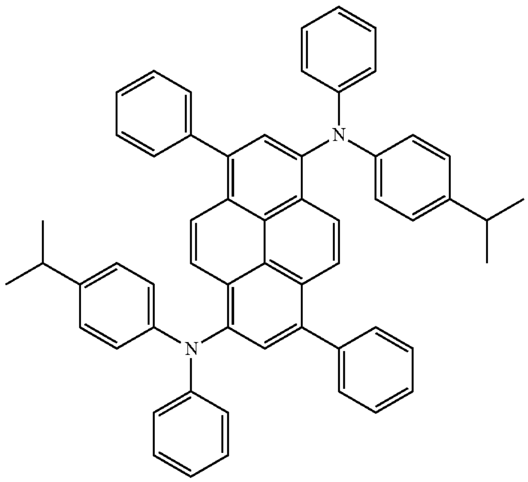
FD9
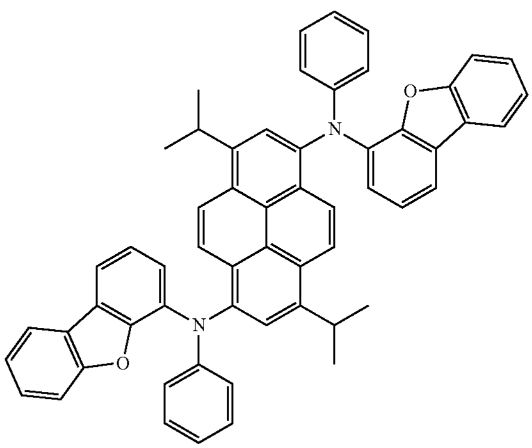
FD10
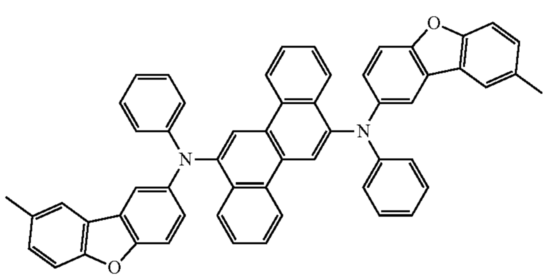
FD11
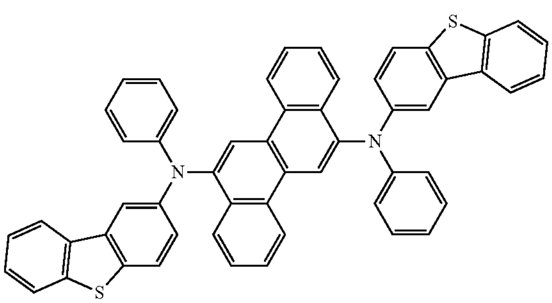
FD12
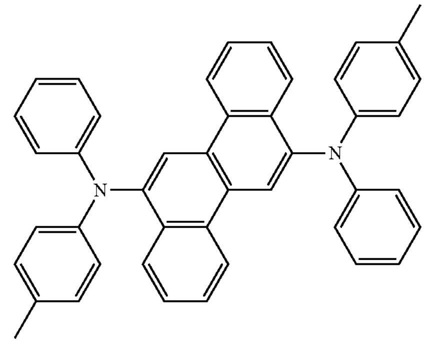
FD13
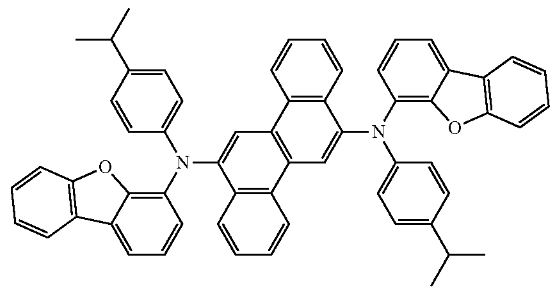
FD14
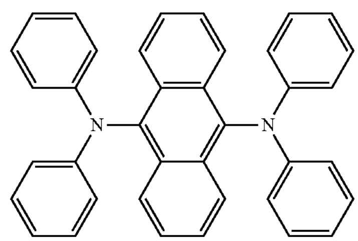
FD15
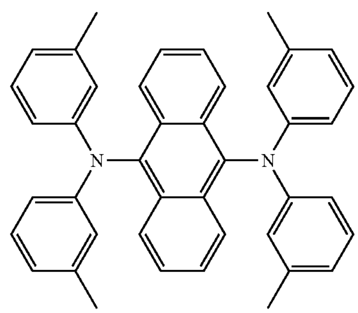
FD16
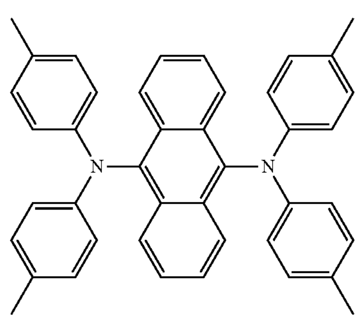

-continued

FD17

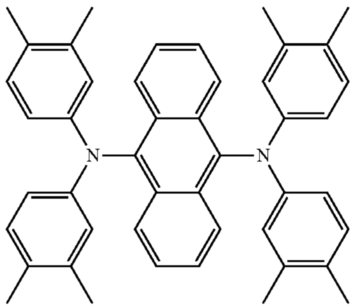

FD18

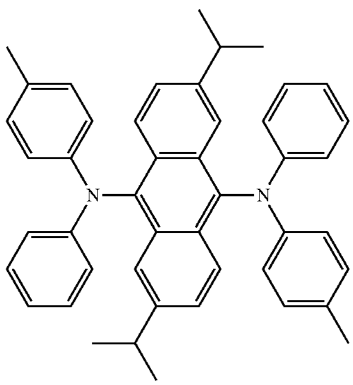

FD19

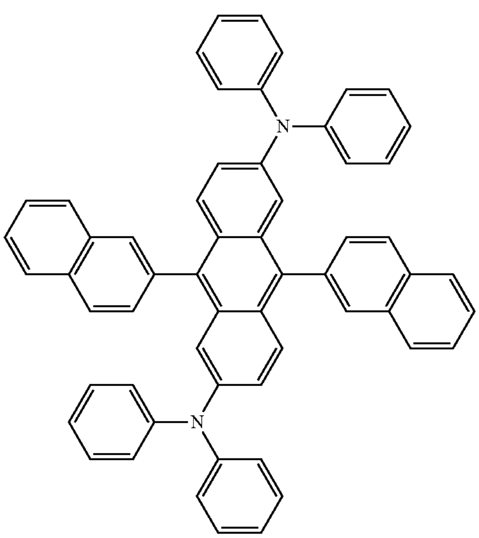

FD20

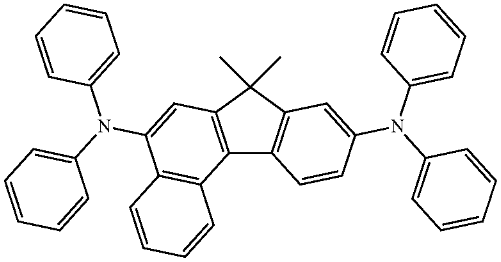

-continued

FD21

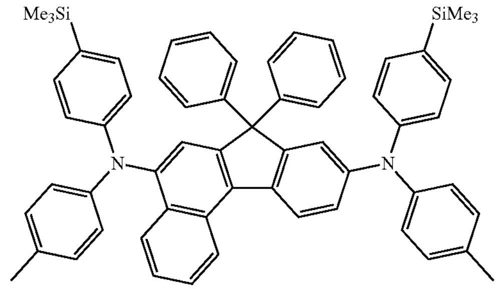

FD22

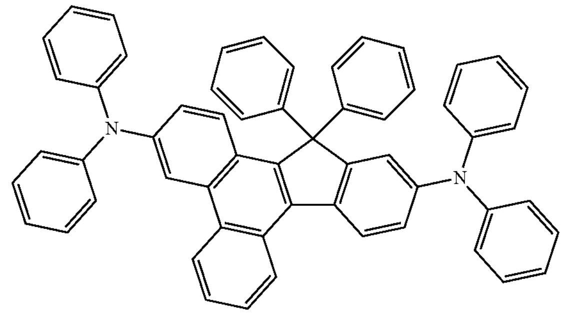

Formula F-b

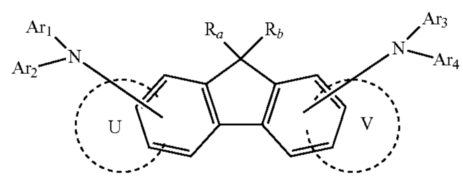

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, In Formula F-b, when the number of U or V is 1, one ring forms a condensed ring in a portion indicated by U or V, and when the number of U or V is 0, it means that no ring indicated by U or V is present. For example, when the number of U is 0 and the number of V is 1, or when the number of U is 1 and the number of V is 0, a condensed ring having a fluorene core of Formula F-b may be a cyclic compound having four rings. When both U and V are 0, the condensed ring of Formula F-b may be a cyclic compound having three rings. When both U and V are 1, the condensed ring having a fluorene core of Formula F-b may be a cyclic compound having five rings.

In Formula F-b, $A_1$ to $A_4$ may be each independently a substituted or unsubstituted aryl group having 6 to 30 ring-forming carbon atoms, or a substituted or unsubstituted heteroaryl group having 2 to 30 ring-forming carbon atoms, and/or bonded to an adjacent group to form a ring.

Formula F-c

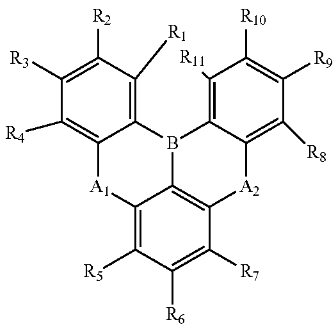

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may be each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring.

In Formula F-c, $A_1$ and $A_2$ may be each independently bonded to substituents of neighboring rings to form a condensed ring. For example, when $A_1$ and $A_2$ are each independently $NR_m$, $A_1$ may be bonded to $R_4$ or $R_5$ to form a ring. In some embodiments, $A_2$ may be bonded to $R_7$ or $R_8$ to form a ring.

The emission layer EML may include, as a suitable dopant material, styryl derivatives (e.g., 1,4-bis[2-(3-N-ethylcarbazoryl)vinyl]benzene (BCzVB), 4-(di-p-tolylamino)-4"-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or derivative(s) thereof (e.g., 2,5,8,11-tetra-t-butylperylene (TBP)), pyrene and/or derivatives thereof (e.g., 1,1-dipyrene, 1,4-dipyrenylbenzene, and/or 1,4-bis(N,N-diphenylamino)pyrene), etc.

The emission layer EML may include a suitable phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), terbium (Tb), and/or thulium (Tm) may be used. In one or more embodiments, iridium(III) bis(4,6-difluorophenylpyridinato-N,C2'), (FIrpic), bis(2,4-difluorophenylpyridinato)-tetrakis(1-pyrazolyl)borate iridium(III) (Fir6), platinum octaethyl porphyrin (PtOEP), etc. may be used as a phosphorescent dopant. However, the embodiment of the present disclosure is not limited thereto.

The emission layer EML may include a quantum dot material. The core of a quantum dot may be selected from a Group II-VI compound, a Group III-VI compound, a Group I-III-VI compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$; a ternary compound such as $InGaS_3$ and/or $InGaSe_3$; or any combination thereof.

The Group I-III-VI compound may include a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and any mixture thereof; a quaternary compound such as $AgInGaS_2$ and/or $CuInGaS_2$, or any combination thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GalnNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, and/or a quaternary compound may each independently be present in particles in a uniform concentration distribution, or may be present in the same particles in a partially different concentration distribution. In addition, a core/shell structure in which one quantum dot surrounds another quantum dot may be present. An interface between a core and a shell may have a concentration gradient in which the concentration of an element present in the shell becomes lower towards the center.

In some embodiments, a quantum dot may have the core/shell structure including a core having nano-crystals, and a shell surrounding (e.g., around) the core. The shell of the quantum dot may serve as a protection layer to prevent or reduce the chemical deformation of the core so as to keep semiconductor properties, and/or as a charging layer to impart electrophoresis properties to the quantum dot. The shell may be a single layer or multiple layers. An interface between the core and the shell may have a concentration gradient in which the concentration of an element present in the shell becomes lower towards the center. Examples of the shell of the quantum dot may be a metal oxide, a non-metal oxide, a semiconductor compound, and a combination thereof.

For example, the metal oxide and the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; and/or a ternary compound such as $MgAl_2O_4$, $CoFe_2O_4$, $NiFe_2O_4$, and/or $CoMn_2O_4$, but the embodiment of the present disclosure is not limited thereto.

In one or more embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

A quantum dot may have a full width of half maximum (FWHM) of a light emitting wavelength spectrum of about 45 nm or less, for example, about 40 nm or less, or about 30 nm or less, and color purity and/or color reproducibility may be enhanced in any of the above ranges. In addition, light emitted through such a quantum dot is emitted in all directions, and thus a wide viewing angle may be improved.

Although the form of a quantum dot is not particularly limited as long as it is a suitable form that can be used in the art, a quantum dot may be, for example, in the form of spherical, pyramidal, multi-arm, and/or cubic nanoparticles, nanotubes, nanowires, nanofibers, nanoplatelets, etc.

The quantum dot may control the color of emitted light according to particle size thereof, and thus the quantum dot may have various colors of emitted light such as blue, red, green, etc.

In the light emitting diode ED of one or more embodiments illustrated in FIGS. 1 to 4, an electron transport region ETR is provided on the emission layer EML.

The electron transport region ETR may include at least one selected from among a hole blocking layer HBL, an electron transport layer ETL, and an electron injection layer EIL, but the embodiment of the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, and may have a single layer structure formed of an electron injection material and/or an electron transport material. In one or more embodiments, the electron transport region ETR may have a single layer structure formed of a plurality of different materials, or may have a structure in which an electron transport layer ETL/electron injection layer EIL, or a hole blocking layer HBL/electron transport layer ETL/electron injection layer EIL are stacked in this order from the emission layer EML, but is not limited thereto. The electron transport region ETR may have a thickness of, for example, about 1000 Å to about 1500 Å.

The electron transport region ETR may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

Formula ET-1

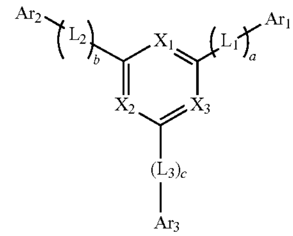

In Formula ET-1, at least one of $X_1$ to $X_3$ is N and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a to c are an integer of 2 or greater, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include at least one of compounds ET1 to ET36 below.

-continued
ET1
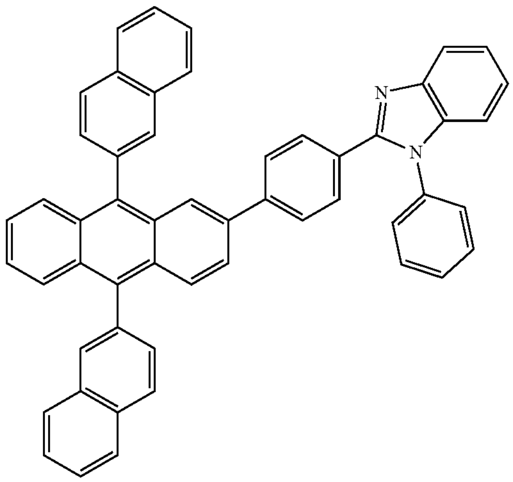
ET2
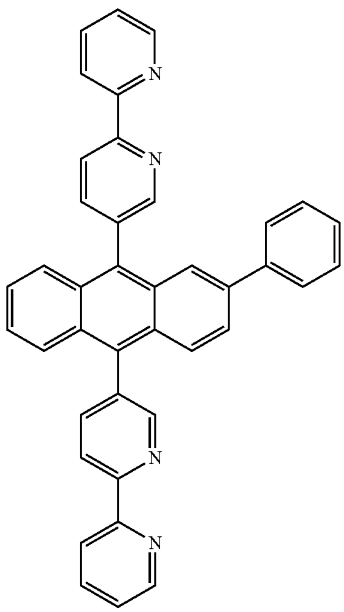
ET3
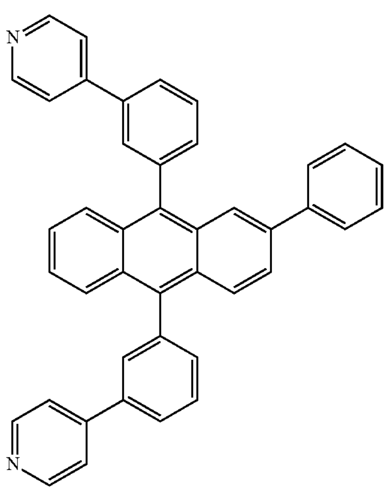
ET4
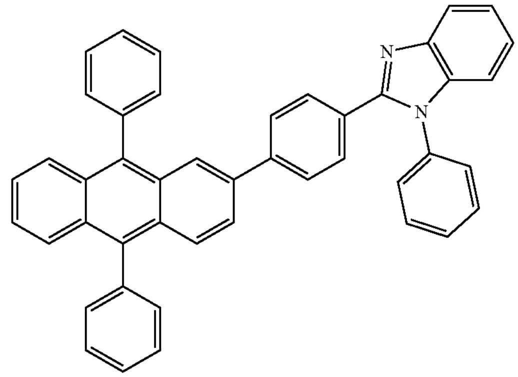
ET5
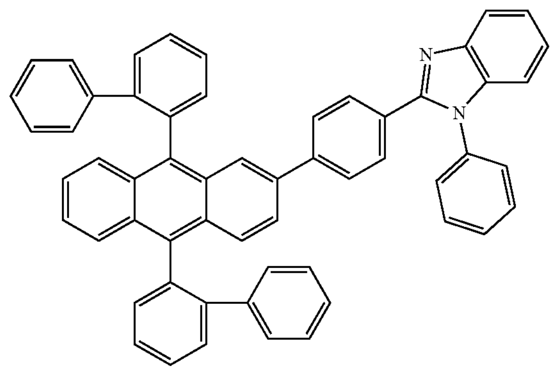
ET6
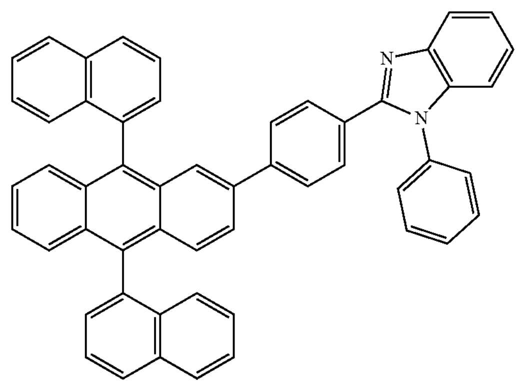
ET7
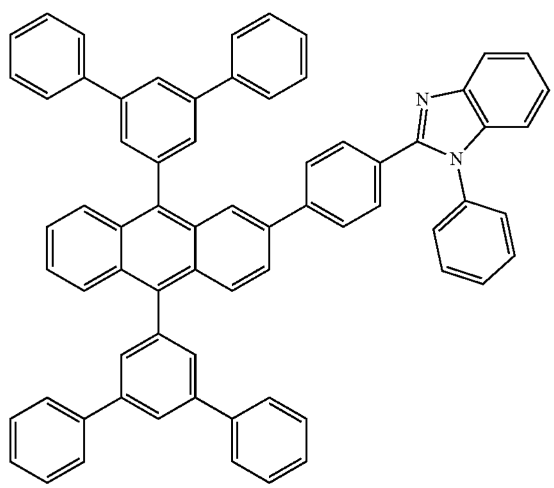

-continued
ET8
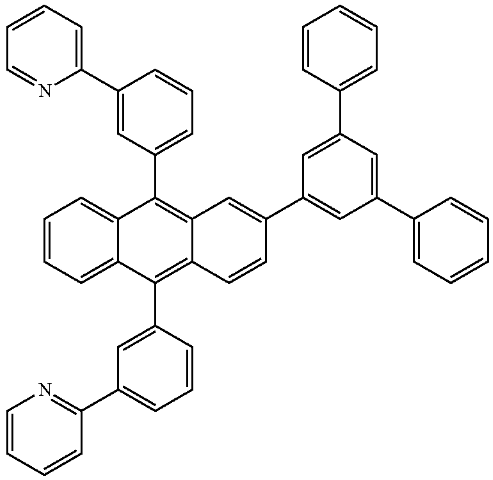
ET9
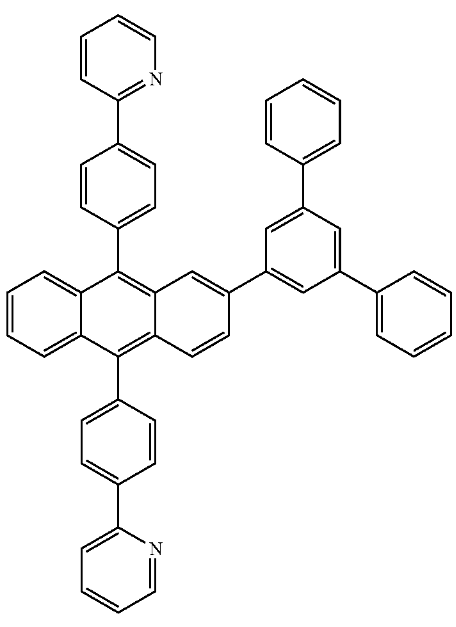
-continued
ET10
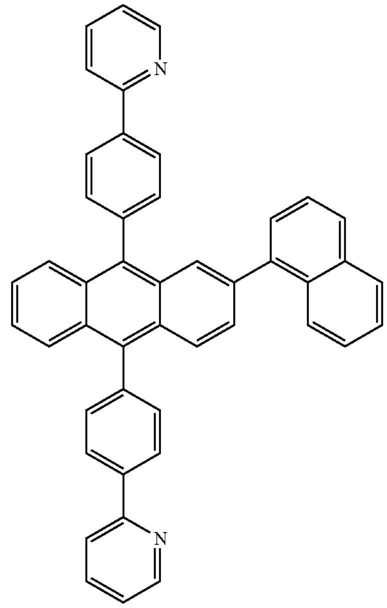
ET11
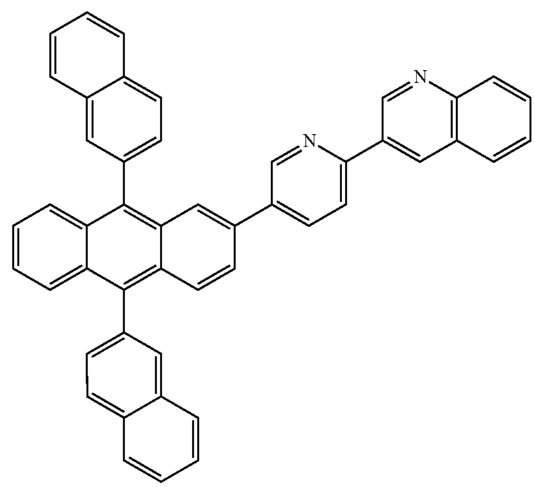
ET12
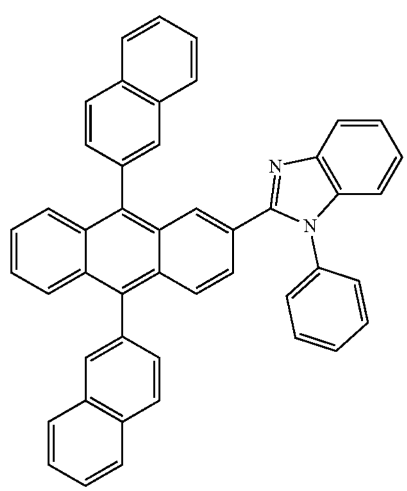

-continued
ET13
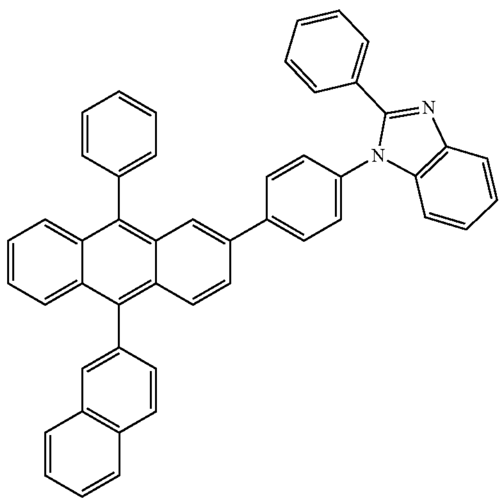
ET14
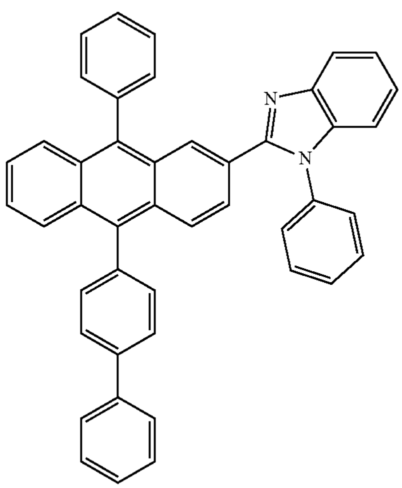
ET15
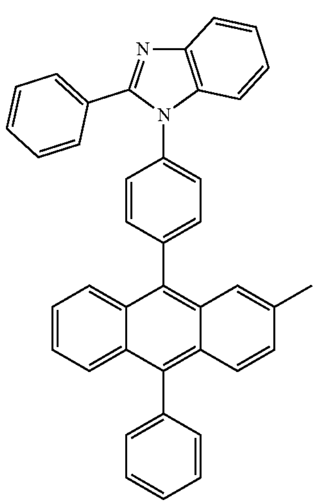
-continued
ET16
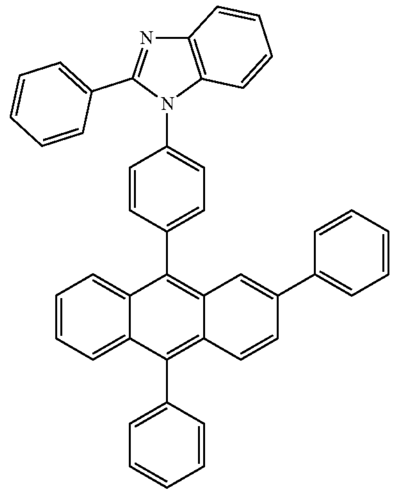
ET17
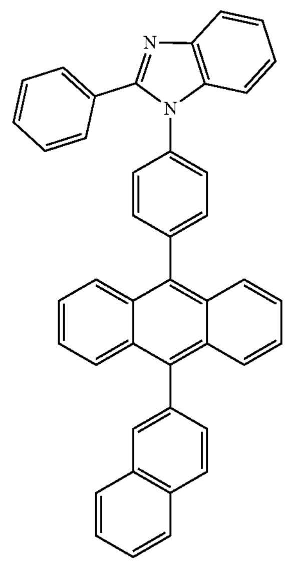
ET18
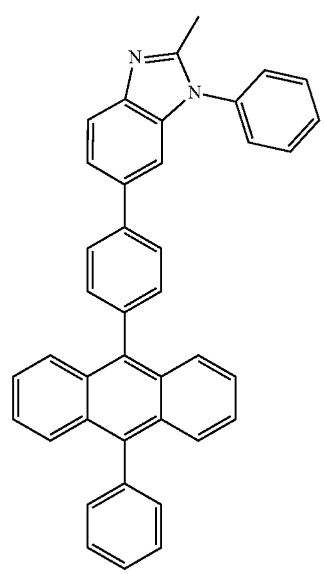

-continued
ET19
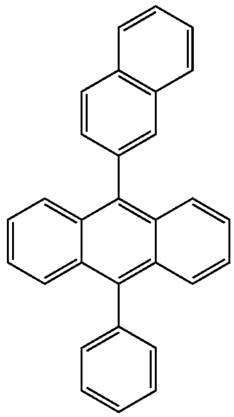
ET20
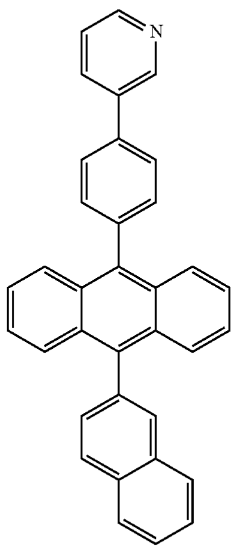
ET21
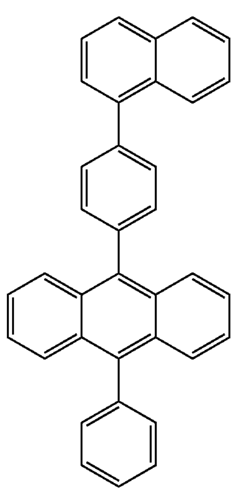
-continued
ET22
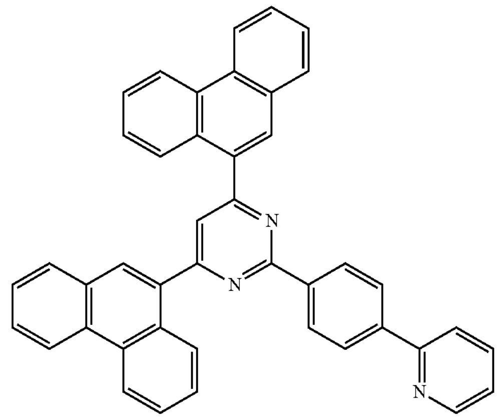
ET23
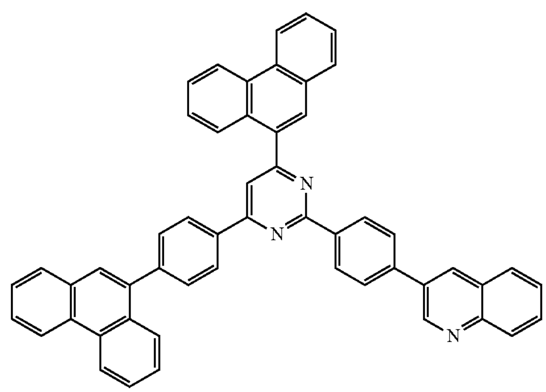
ET24
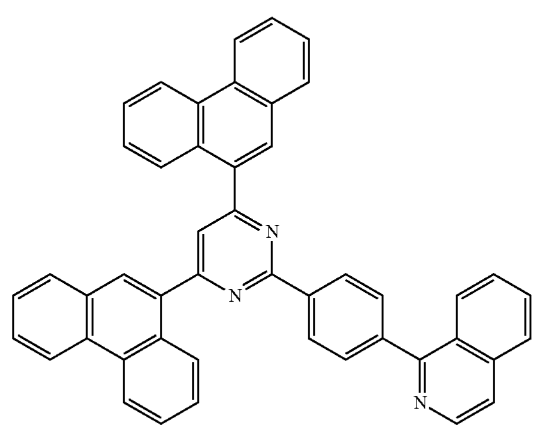

ET25
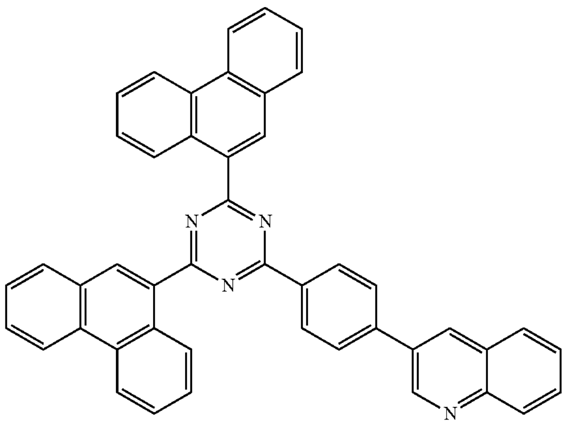
ET26
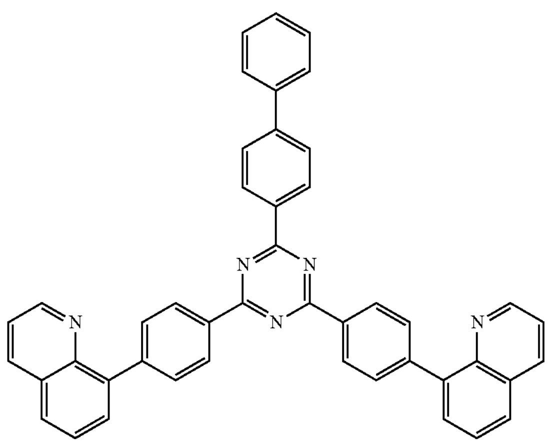
ET27
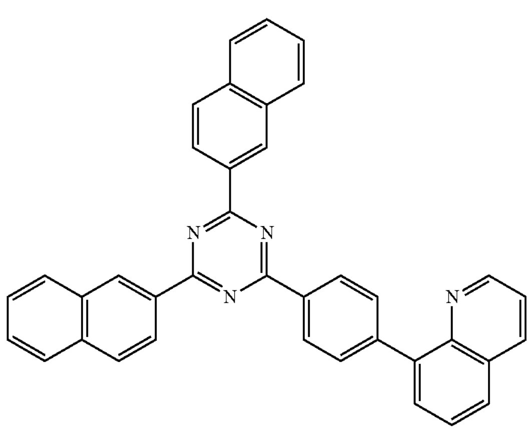
ET28
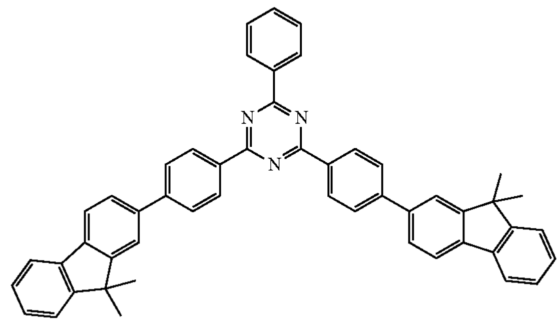
ET29
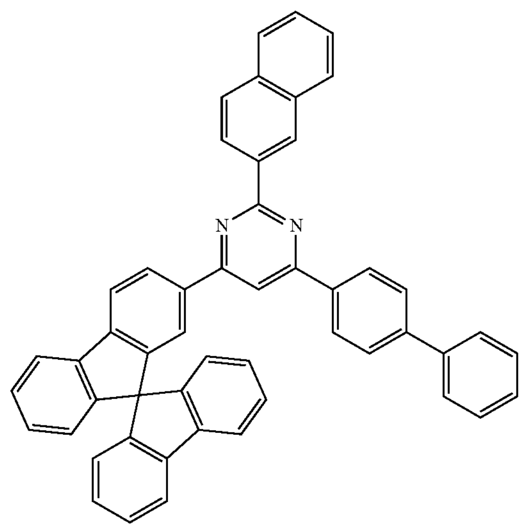
ET30
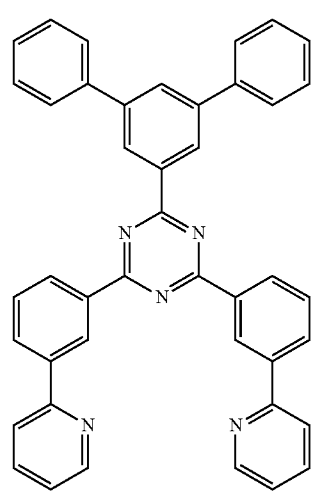

-continued

ET31

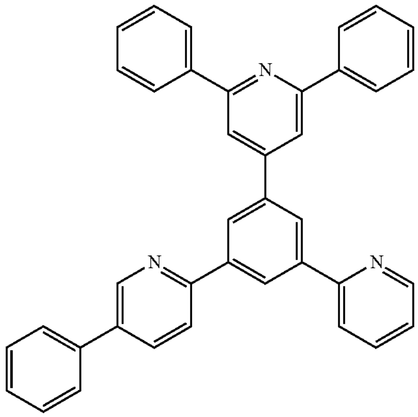

ET32

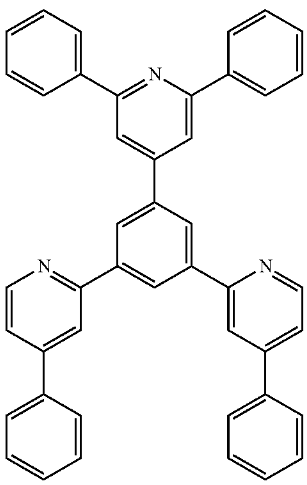

ET33

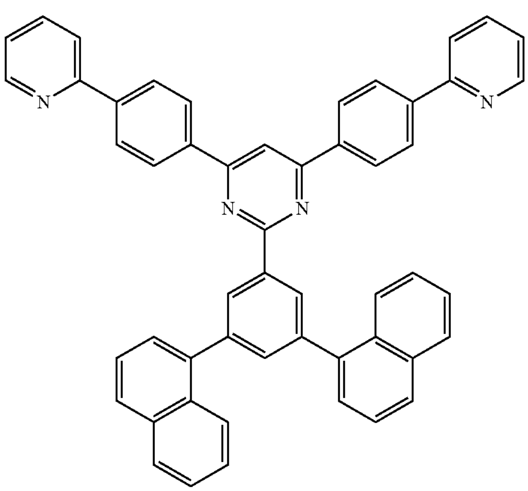

-continued

ET34

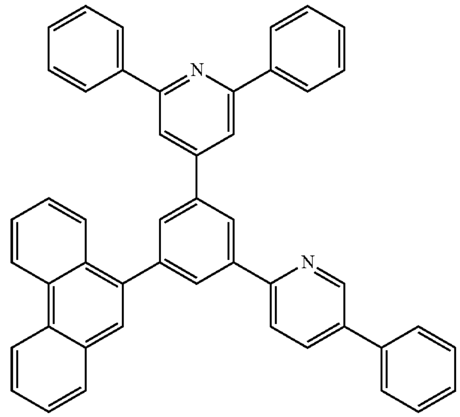

ET35

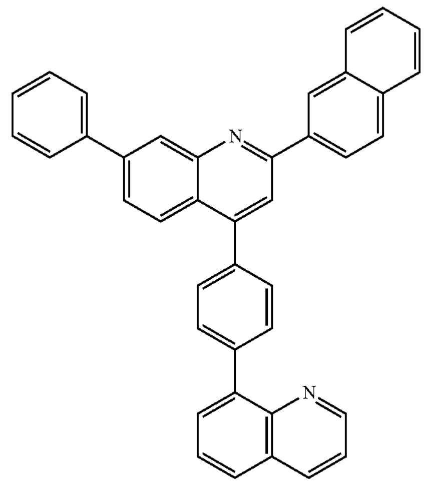

ET36

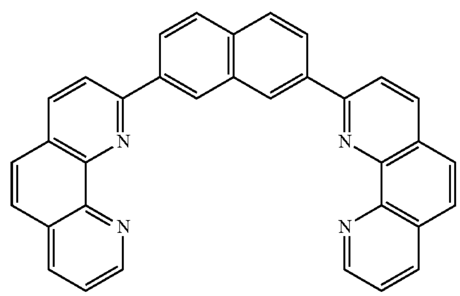

In one or more embodiments, the electron transport region ETR may include halogenated metals (such as LiF, NaCl, CsF, RbCl, RbI, CuI, and/or KI), lanthanide metals (such as Yb), and/or co-deposition materials of a halogenated metal and a lanthanide metal. For example, the electron transport region ETR may include KI:Yb, RbI:Yb, etc. as a co-deposition material. In one or more embodiments, for the electron transport region ETR, a metal oxide (such as $Li_2O$ and/or BaO), and/or 8-hydroxyl-lithium quinolate (Liq), etc. may be used, but the embodiment of the present disclosure is limited thereto. The electron transport region ETR may also be formed of a mixture material of an electron transport material and an insulating organo-metal salt. The organo-metal salt may be a material having an energy band gap of about 4 eV or greater. For example, the organo-metal salt may include, for example, metal acetates, metal benzoates, metal acetoacetates, metal acetylacetonates, and/or metal stearates.

The electron transport region ETR may further include, for example, at least one of 2,9-dimethyl-4,7-diphenyl-1,10-phenanthroline (BCP) and/or 4,7-diphenyl-1,10-phenanthroline (Bphen), in addition to the materials described above, but the embodiment of the present disclosure is not limited thereto.

The electron transport region ETR may include the compounds of the electron transport region described above in at least one selected from among the electron injection layer EIL, the electron transport layer ETL, and the hole blocking layer HBL.

When the electron transport region ETR includes the electron transport layer ETL, the electron transport layer ETL may have a thickness of about 100 Å to about 1000 Å, for example, about 150 Å to about 500 Å. When the thickness of the electron transport layer ETL satisfies any of the above-described ranges, satisfactory (or suitable) electron transport properties may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies any of the above-described ranges, satisfactory (or suitable) electron injection properties may be obtained without a substantial increase in driving voltage.

The second electrode EL2 is provided on the electron transport region ETR. The second electrode EL2 may be a common electrode. The second electrode EL2 may be a cathode or an anode, but the embodiment of the present disclosure is not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF, Mo, Ti, W, a compound thereof, or a mixture thereof (e.g., a mixture of Ag and Mg, a mixture of LiF and Ca, a mixture of LiF and Al, etc.). In one or more embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include any of the above-described metal materials, a combination of two or more metal materials selected from the above-described metal materials, and/or oxide(s) of the above-described metal materials.

In one or more embodiments, the second electrode EL2 may be connected (e.g., coupled) with an auxiliary electrode. When the second electrode EL2 is connected with the auxiliary electrode, the resistance of the second electrode EL2 may decrease.

In one or more embodiments, a capping layer CPL may be further disposed on the second electrode EL2 of the light emitting diode ED of one or more embodiments. The capping layer CPL may include a multilayer or a single layer.

In one or more embodiments, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, etc.

For example, when the capping layer CPL includes an organic material, the organic material may include α-NPD, NPB, TPD, m-MTDATA, $Alq_3$ CuPc, N4,N4,N4',N4'-tetra (biphenyl-4-yl) biphenyl-4,4'-diamine (TPD15), 4,4',4"-tris (carbazol-9-yl)triphenylamine (TCTA), etc., and in some embodiments, may include epoxy resins and/or acrylates such as methacrylates. However, the embodiment of the present disclosure is not limited thereto, and the capping layer CPL may include compounds P1 to P5 below.

P1

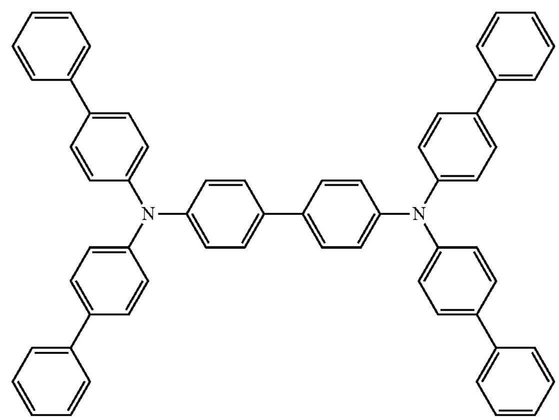

P2

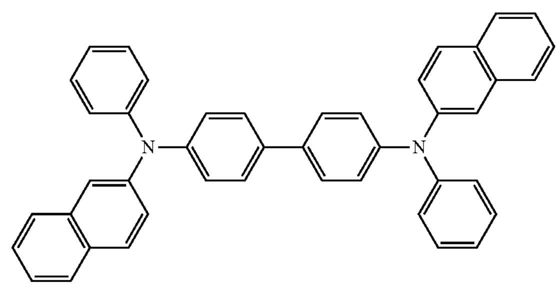

P3

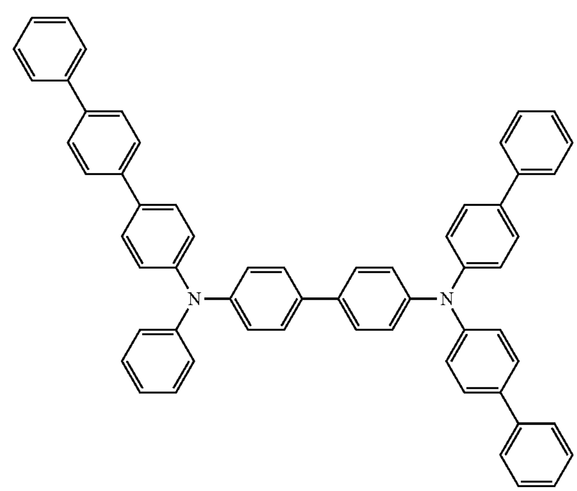

-continued

P4

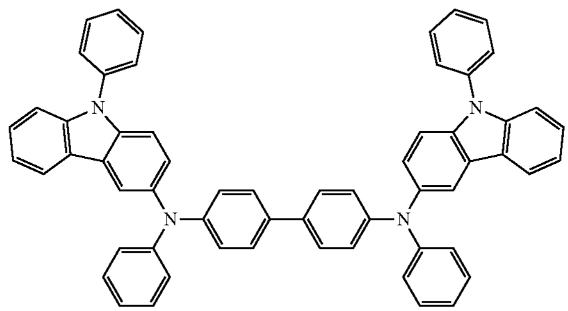

P5

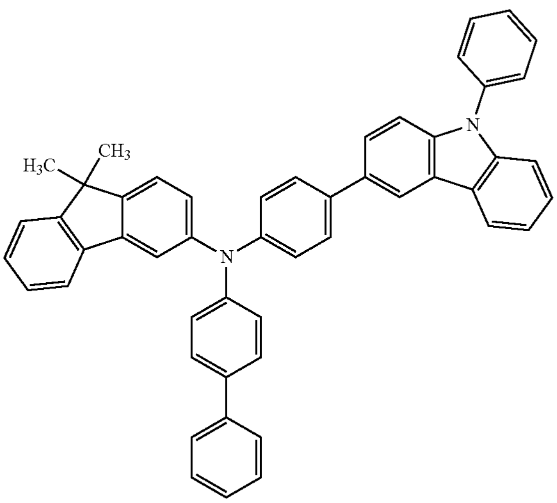

In one or more embodiments, the capping layer CPL may have a refractive index of about 1.6 or greater. For example, the capping layer CPL may have a refractive index of about 1.6 or greater in a wavelength range of about 550 nm to about 660 nm.

Figure 7:
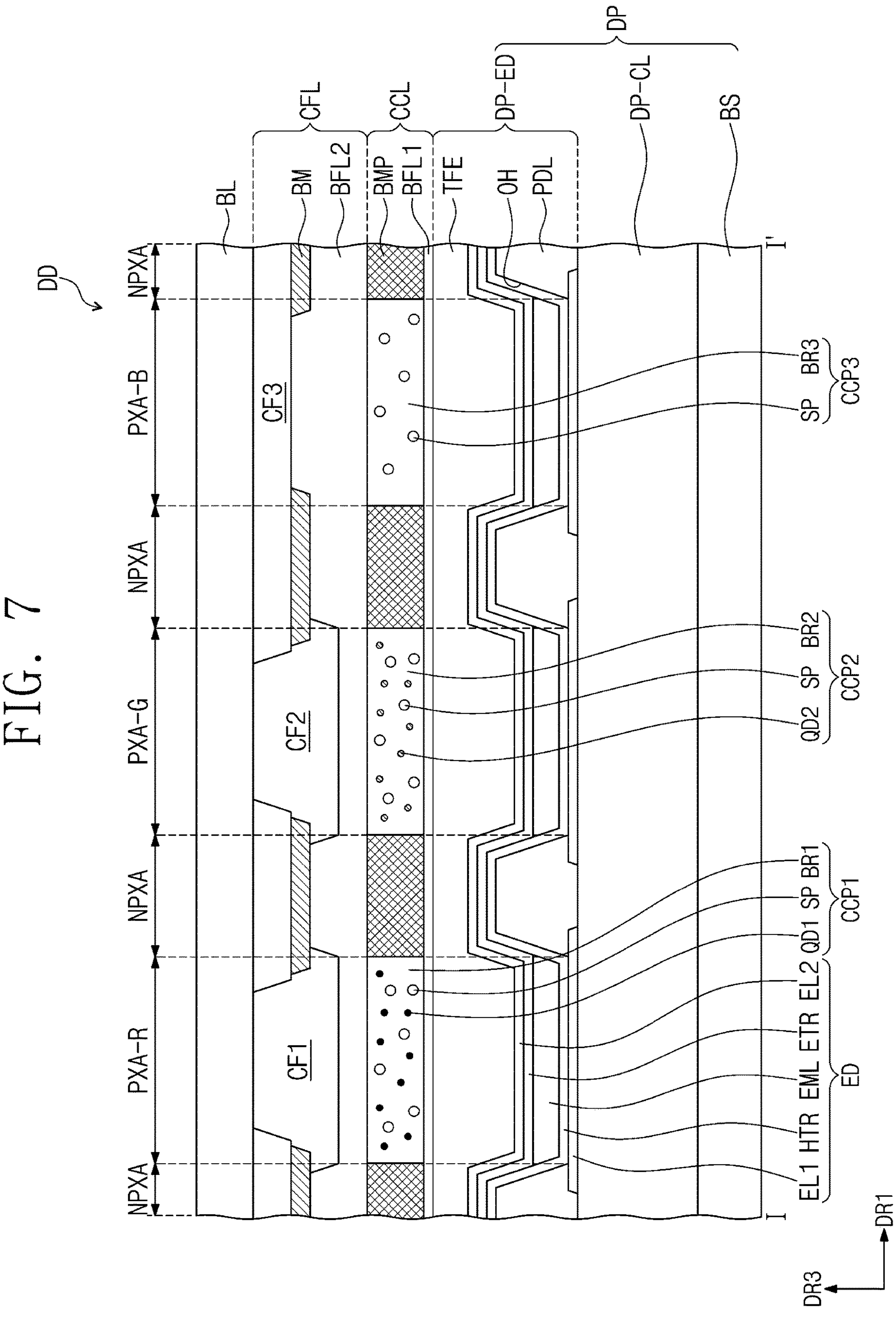
FIG. 7 is a cross-sectional view of a display device according to one or more embodiments.
Figure 8:
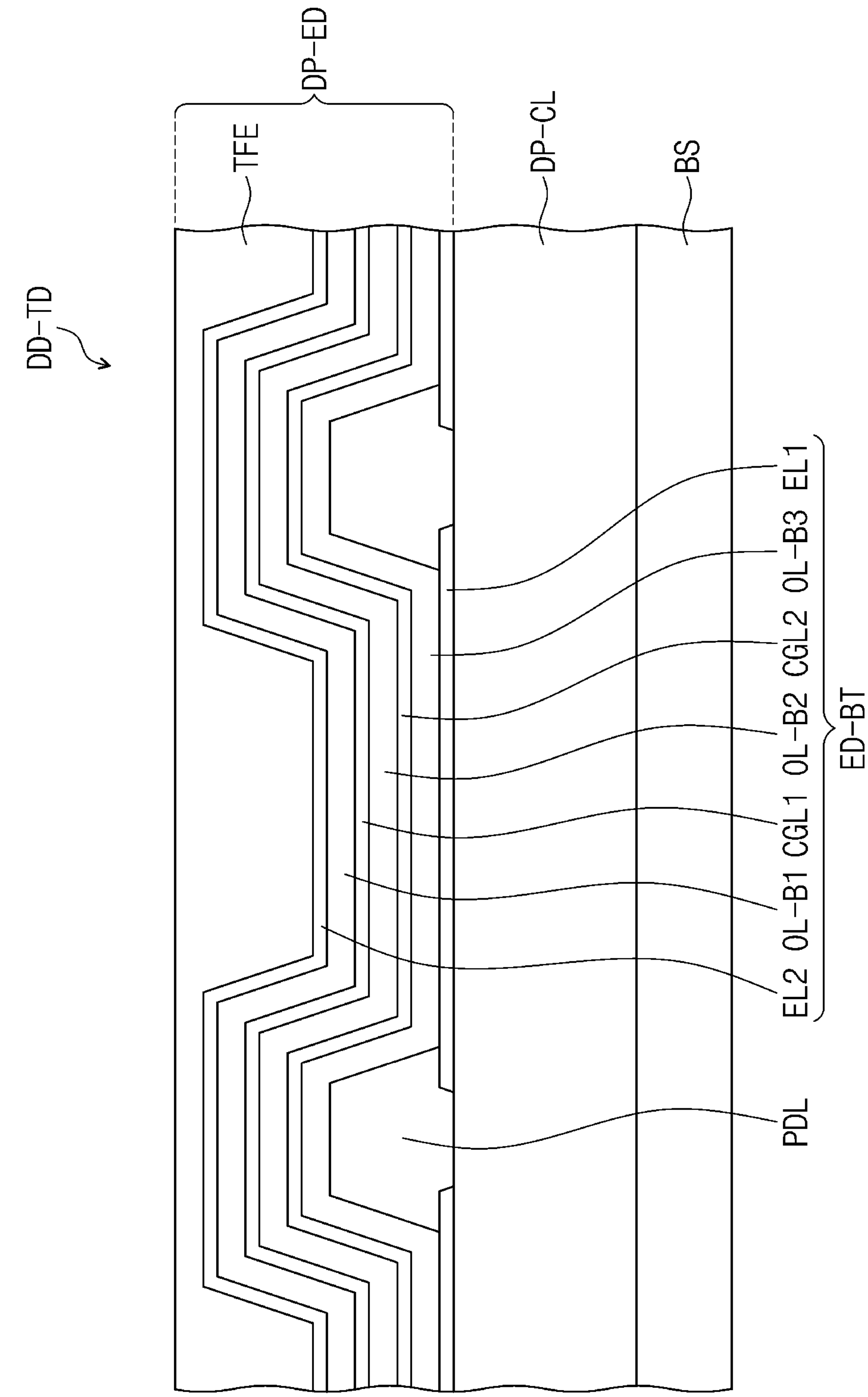
FIG. 8 is a cross-sectional view of a display device according to one or more embodiments.

FIGS. 7 and 8 each are cross-sectional views of a display device according to one or more embodiments. Hereinafter, in the description of the display device according to one or more embodiments with reference to FIGS. 7 and 8, content overlapping the one described above with reference to FIGS. 1 to 6 will not be described again, and the differences will be mainly described.

Referring to FIG. 7, a display device DD according to one or more embodiments may include a display panel DP having a display element layer DP-ED, a light control layer CCL disposed on the display panel DP, and a color filter layer CFL.

In one or more embodiments illustrated in FIG. 7, the display panel DP may include a base layer BS, a circuit layer DP-CL provided on the base layer BS, and a display element layer DP-ED, and the display element layer DP-ED may include a light emitting diode ED.

The light emitting diode ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. In one or more embodiments, a structure of the light emitting diode ED shown in FIG. 7 may be the same as the structure of the light emitting diode of FIGS. 3 to 6 described above.

Referring to FIG. 7, the emission layer EML may be disposed in the openings OH defined in the pixel defining films PDL. For example, the emission layer EML separated by the pixel defining films PDL and provided corresponding to each of light emitting areas PXA-R, PXA-G, and PXA-B may emit light in the same wavelength ranges. In the display device DD of one or more embodiments, the emission layer EML may emit blue light. In one or more embodiments, the emission layer EML may be provided as a common layer throughout the light emitting areas PXA-R, PXA-G, and PXA-B.

The light control layer CCL may be disposed on the display panel DP. The light control layer CCL may include a photoconverter. The photoconverter may be a quantum dot or a phosphor. The photoconverter may convert the wavelength of received light, and emit the resulting (e.g., converted) light. For example, the light control layer CCL may be a layer containing quantum dots or phosphors.

The light control layer CCL may include a plurality of light control units CCP1, CCP2, and CCP3. The light control units CCP1, CCP2, and CCP3 may be spaced apart from each other.

Referring to FIG. 7, a division pattern BMP may be disposed between the light control units CCP1, CCP2, and CCP3 spaced apart from each other, but the embodiment of the present disclosure is not limited thereto. In FIG. 7, the division pattern BMP is shown to non-overlap the light control units CCP1, CCP2, and CCP3, but in some embodiments, edges of the light control units CCP1, CCP2, and CCP3 may overlap at least a portion of the division pattern BMP.

The light control layer CCL may include a first light control unit CCP1 including a first quantum dot QD1 for converting first color light provided from the light emitting diode ED into second color light, a second light control unit CCP2 including a second quantum dot QD2 for converting the first color light into third color light, and a third light control unit CCP3 transmitting the first color light.

In one or more embodiments, the first light control unit CCP1 may provide red light, which is the second color light, and the second light control unit CCP2 may provide green light, which is the third color light. The third light control unit CCP3 may transmit and provide blue light, which is the first color light provided from the light emitting diode ED. For example, the first quantum dot QD1 may be a red quantum dot and the second quantum dot QD2 may be a green quantum dot. The same descriptions above may be applied to the quantum dots QD1 and QD2.

In one or more embodiments, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include any one selected from among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may respectively include base resins BR1, BR2, and BR3 for dispersing the quantum dots QD1 and QD2 and the scatterer SP. In one or more embodiments, the first light control unit CCP1 may include the first quantum dot QD1 and the scatterer SP dispersed in the first base resin BR1, the second light control unit CCP2 may include the second quantum dot QD2 and the scatterer SP dispersed in the second base resin BR2, and the third light control unit CCP3 may include the scatterer SP dispersed in the third base resin BR3. The base resins BR1, BR2, and BR3 are a medium in which the quantum dots QD1 and QD2 and the scatterer SP are dispersed, and may be formed of one or more suitable resin compositions, which may be generally referred to as a binder. For example, the base resins BR1, BR2, and BR3 may be an acrylic resin, a urethane-based resin, a silicone-based resin, an epoxy-based resin, etc. The base resins BR1, BR2, and BR3 may be a transparent resin. In one or more embodiments, the first base resin BR1, the second base resin BR2, and the third base resin BR3 each may be the same as or different from each other.

The light control layer CCL may include a barrier layer BFL1. The barrier layer BFL1 may serve to prevent or reduce moisture and/or oxygen (hereinafter referred to as "moisture/oxygen") from being introduced. The barrier layer BFL1 may be disposed on the light control units CCP1, CCP2, and CCP3 to prevent or reduce the exposure of the light control units CCP1, CCP2, and CCP3 to moisture/oxygen. In one or more embodiments, the barrier layer BFL1 may cover the light control units CCP1, CCP2, and CCP3. In one or more embodiments, a barrier layer BFL2 may be further provided between the color filter layer CFL and the light control units CCP1, CCP2, and CCP3.

The barrier layers BFL1 and BFL2 may include at least one inorganic layer. For example, the barrier layers BFL1 and BFL2 may each independently be formed of an inorganic material. For example, the barrier layers BFL1 and BFL2 may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, and/or any suitable metal thin film in which light transmittance is secured, etc. In one or more embodiments, the barrier layers BFL1 and BFL2 may each independently further include an organic film. The barrier layers BFL1 and BFL2 may be formed of a single layer or a plurality of layers.

In the display device DD of one or more embodiments, the color filter layer CFL may be disposed on the light control layer CCL. For example, the color filter layer CFL may be directly disposed on the light control layer CCL. In this case, the barrier layer BFL2 may be omitted.

The color filter layer CFL may include a light blocking unit BM and filters CF1, CF2, and CF3. For example, the color filter layer CFL may include a first filter CF1 configured to transmit second color light, a second filter CF2 configured to transmit third color light, and a third filter CF3 configured to transmit first color light. For example, the first filter CF1 may be a red filter, the second filter CF2 may be a green filter, and the third filter CF3 may be a blue filter. The filters CF1, CF2, and CF3 each may include a polymer photosensitive resin, a pigment, and/or a dye. The first filter CF1 may include a red pigment and/or a red dye, the second filter CF2 may include a green pigment and/or a green dye, and the third filter CF3 may include a blue pigment and/or a blue dye. However, the embodiment of the present disclosure is not limited thereto, and the third filter CF3 may not include a pigment or a dye. The third filter CF3 may include a polymer photosensitive resin, but not include a pigment or a dye. The third filter CF3 may be transparent. The third filter CF3 may be formed of a transparent photosensitive resin.

In one or more embodiments, the first filter CF1 and the second filter CF2 may be yellow filters. The first filter CF1 and the second filter CF2 may not be separated from each other and may be provided as a single body.

The light blocking unit BM may be a black matrix. The light blocking unit BM may be formed including an organic light blocking material and/or an inorganic light blocking material, both including a black pigment and/or a black dye. The light blocking unit BM may prevent or reduce light leakage, and separate (e.g., set) boundaries between the adjacent filters CF1, CF2, and CF3. In one or more embodiments, the light blocking unit BM may be formed of a blue filter.

The first to third filters CF1, CF2, and CF3 may be disposed corresponding to the red light emitting area PXA-R, green light emitting area PXA-G, and blue light emitting area PXA-B, respectively.

The base substrate BL may be disposed on the color filter layer CFL. The base substrate BL may be a member providing a base surface on which the color filter layer CFL and the light control layer CCL are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer (e.g., including an organic material and an inorganic material). In one or more embodiments, the base substrate BL may be omitted.

FIG. 8 is a cross-sectional view showing a portion of a display device according to one or more embodiments. FIG. 8 illustrates a cross-sectional view of a portion corresponding to the display panel DP of FIG. 7. In a display device DD-TD of one or more embodiments, a light emitting diode ED-BT may include a plurality of light emitting structures OL-B1, OL-B2, and OL-B3. The light emitting diode ED-BT may include the first electrode EL1 and the second electrode EL2 facing each other, and the plurality of light emitting structures OL-B1, OL-B2, and OL-B3 provided by being sequentially stacked in a thickness direction between the first electrode EL1 and the second electrode EL2. The light emitting structures OL-B1, OL-B2, and OL-B3 each may include an emission layer EML (FIG. 7), and a hole transport region HTR and an electron transport region ETR disposed with the emission layer EML (FIG. 7) therebetween.

For example, the light emitting diode ED-BT included in the display device DD-TD of one or more embodiments may be a light emitting diode having a tandem structure including a plurality of emission layers.

In one or more embodiments illustrated in FIG. 8, light emitted from each of the light emitting structures OL-B1, OL-B2, and OL-B3 may all be blue light. However, the embodiment of the present disclosure is not limited thereto, and wavelength ranges of light emitted from each of the light emitting structures OL-B1, OL-B2, and OL-B3 may be different from each other. For example, the light emitting diode ED-BT, including the plurality of light emitting structures OL-B1, OL-B2, and OL-B3 emitting light in different wavelength ranges, may emit white light.

A charge generation layer CGL may be disposed between neighboring light emitting structures OL-B1, OL-B2, and OL-B3. For example, the charge generation layer CGL may include a first charge generation layer CGL1 between light emitting structures OL-B1 and OL-B2, and a second charge generation layer CGL2 between light emitting structures OL-B2 and OL-B3. The charge generation layer CGL may include a p-type charge generation layer and/or an n-type charge generation layer.

At least one of the light emitting structures OL-B1, OL-B2, and OL-B3 included in the display device DD-TD of one or more embodiments may include the condensed polycyclic compound of one or more embodiments described above.

The light emitting diode ED according to one or more embodiments of the present disclosure includes the condensed polycyclic compound of one or more embodiments described above in at least one functional layer disposed between the first electrode EL1 and the second electrode EL2, and may thus exhibit improved lifespan characteristics. The light emitting diode ED according to one or more embodiments may include the condensed polycyclic compound of one or more embodiments described above in at least one selected from among the hole transport region HTR, the emission layer EML, or the electron transport region ETR (disposed between the first electrode EL1 and the second electrode EL2), or the capping layer CPL.

For example, the condensed polycyclic compound according to one or more embodiments may be included in the emission layer EML of the light emitting diode ED of one or more embodiments, and the light emitting diode according to one or more embodiments may exhibit high efficiency characteristics.

The condensed polycyclic compound of one or more embodiments described above may include a structure in which two condensed compounds, each containing a boron atom, are connected by a spiro compound. For example, the spiro compound may be 9,9'-spirobi[fluorene]. The condensed polycyclic compound of the present disclosure may thus have excellent absorbance and increased multi-resonance effects. In addition, the two condensed rings connected by the spiro compound are arranged perpendicular (or substantially perpendicular) to each other, and the interaction between molecules may be reduced. Accordingly, the condensed polycyclic compound of one or more embodiments has excellent molecular stability and improved material stability, and when used as a material for a light emitting diode, may help improve the efficiency of the light emitting diode.

Hereinafter, with reference to Examples and Comparative Examples, a condensed polycyclic compound and a light emitting diode according to one or more embodiments of the present disclosure will be described in more detail. However, Examples shown below are provided only for the understanding of the present disclosure, and the scope of the present disclosure is not limited thereto.

EXAMPLES

1. Synthesis of Condensed Polycyclic Compounds

First, a method of synthesizing condensed polycyclic compounds according to one or more embodiments of the present disclosure will be described in more detail by providing a method of synthesizing Compound 3, Compound 13, Compound 56, and Compound 74 as an example. However, a process of synthesizing condensed polycyclic compounds, which will be described below, is provided as an example, and thus a process of synthesizing condensed polycyclic compounds according to one or more embodiments of the present disclosure is not limited to Examples below.

(1) Synthesis of Compound 3

Condensed polycyclic Compound 3 according to one or more embodiments may be synthesized by, for example, Reaction Formula 1.

Reaction Formula 1

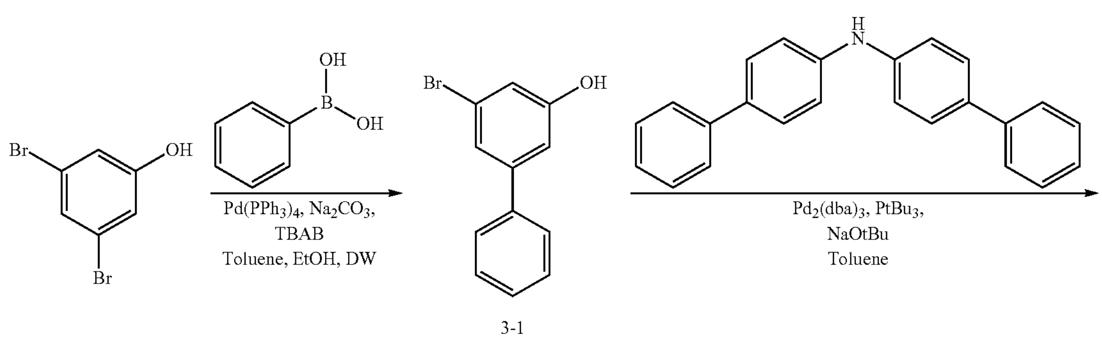

-continued

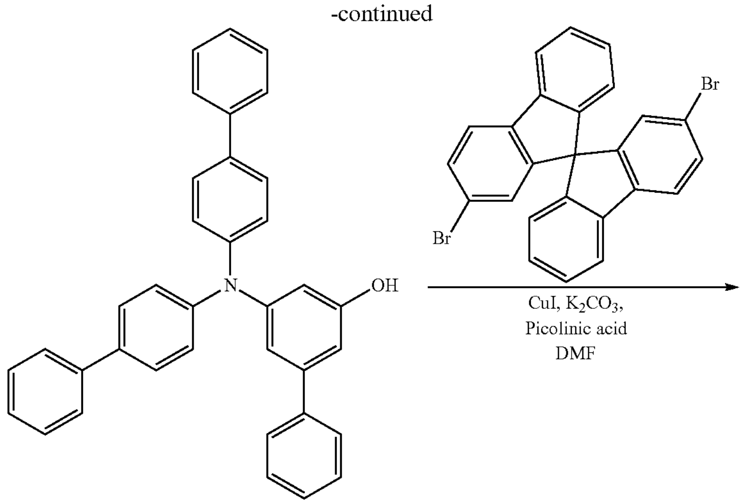

3-2

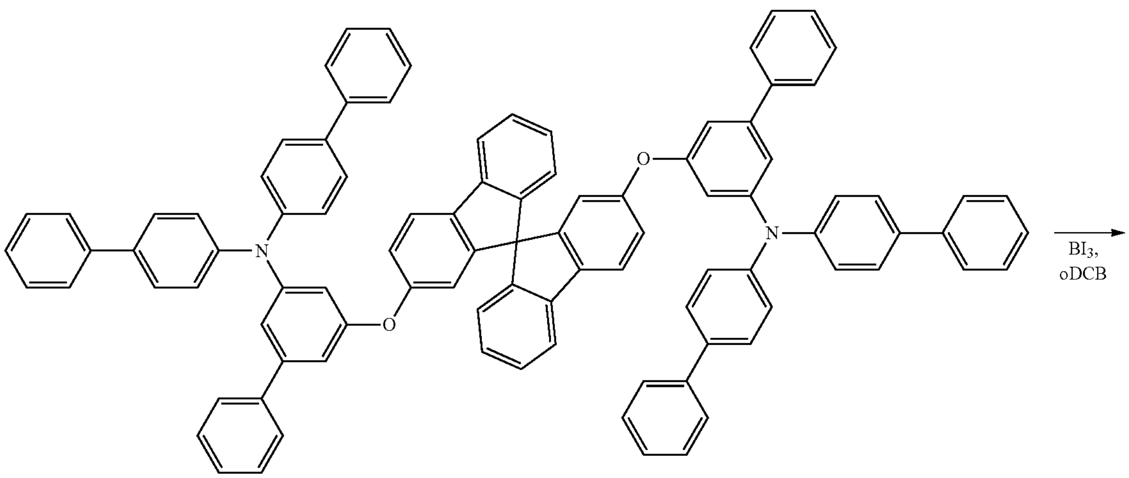

3-3

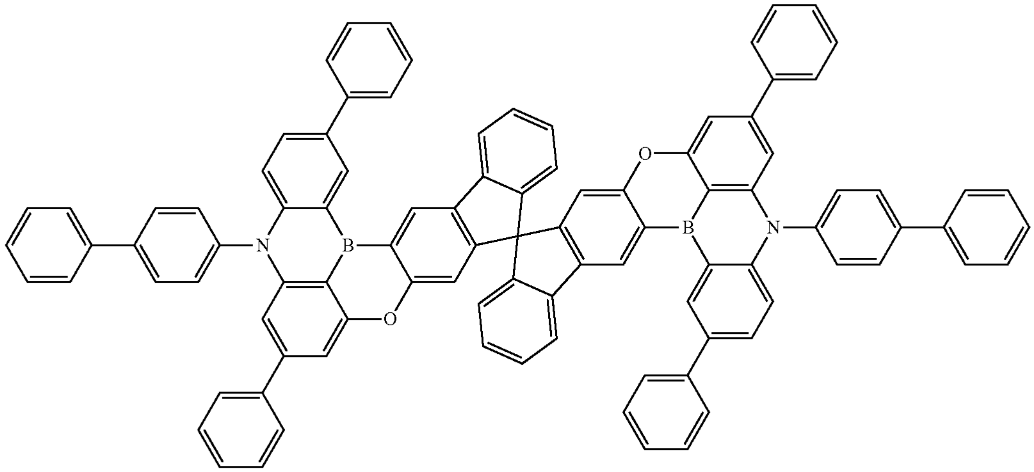

3

Synthesis of Intermediate 3-1

3,5-dibromophenol (1eq), phenylboronic acid (1eq), tetrakis(triphenylphosphine)-palladium(0) (0.05eq), tetra-n-butylammonium bromide (0.05eq), and sodium carbonate (3eq) were dissolved in toluene:ethanol:DW (5:1:2) and stirred at 110° C. for 13 hours. After cooling, the resultant was dried under reduced pressure to remove ethanol. Thereafter, the resultant was washed with ethyl acetate and water three times to obtain an organic layer, which was then dried over $MgSO_4$ and dried under reduced pressure. The obtained product was purified through column chromatography and recrystallized (dichloromethane:n-Hexane), thereby obtaining Intermediate 3-1. (Yield: 73%)

Synthesis of Intermediate 3-2

Intermediate 3-1 (1eq), di([1,1'-biphenyl]-4-yl)amine (1eq), tris(dibenzylideneacetone)dipalladium(0) (0.1eq), tri-tert-butylphosphine (0.2eq), and sodium tert-butoxide (3eq) were dissolved in toluene and stirred at 110° C. for 20 hours in a nitrogen atmosphere. After cooling, the resultant was dried under reduced pressure to remove toluene. Thereafter, the resultant was washed with ethyl acetate and water three times to obtain an organic layer, which was then dried over $MgSO_4$ and dried under reduced pressure. The obtained product was purified through column chromatography and recrystallized (dichloromethane:n-Hexane), thereby obtaining Intermediate 3-2. (Yield: 68%)

Synthesis of Intermediate 3-3

Intermediate 3-2 (2eq), 2,2'-dibromo-9,9'-spirobi[fluorene] (1eq), CuI (0.4eq), $K_2CO_3$ (5eq), and picolinic acid (0.4eq) were dissolved in DMF and stirred at 160° C. for 24 hours. After cooling, the resultant was dried under reduced pressure to remove DMF. Thereafter, the resultant was washed with ethyl acetate and water to obtain an organic layer, which was then dried over $MgSO_4$ and dried under reduced pressure. The obtained product was purified through column chromatography and recrystallized (dichloromethane:n-Hexane), thereby obtaining Intermediate 3-3. (Yield: 53%)

Synthesis of Compound 3

Intermediate 3-3 (1 eq) was dissolved in ortho dichlorobenzene, and the flask was cooled to 0° C. in a nitrogen atmosphere, and then $BI_3$ (2.5 eq) dissolved in ortho dichlorobenzene was slowly injected thereto. After the dropping was completed, the temperature was raised to 150° C. to stir the resultant for 6 hours. After cooling the resultant to 0° C., triethylamine was slowly dropped into the flask until the exotherm stopped to complete the reaction, and then hexane was added to precipitate the mixture to obtain a solid through filtration. The obtained solid was purified through silica filtration and then purified through MC/Hex recrystallization, thereby obtaining Compound 3. Thereafter, the final purification was performed on Compound 3 through sublimation purification. (Yield after sublimation: 3.3%)

(2) Synthesis of Compound 13

Condensed polycyclic Compound 13 according to one or more embodiments may be synthesized by, for example, Reaction Formula 2.

Reaction Formula 2

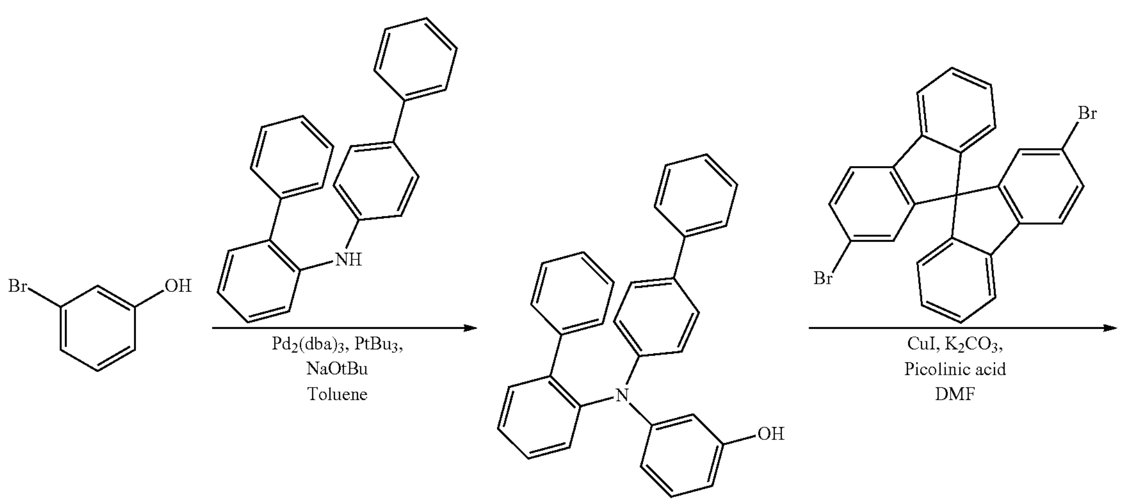

13-1

-continued

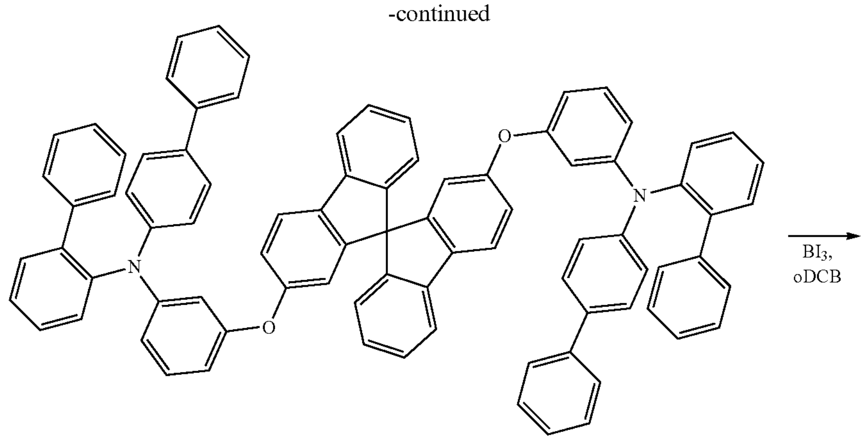

13-2

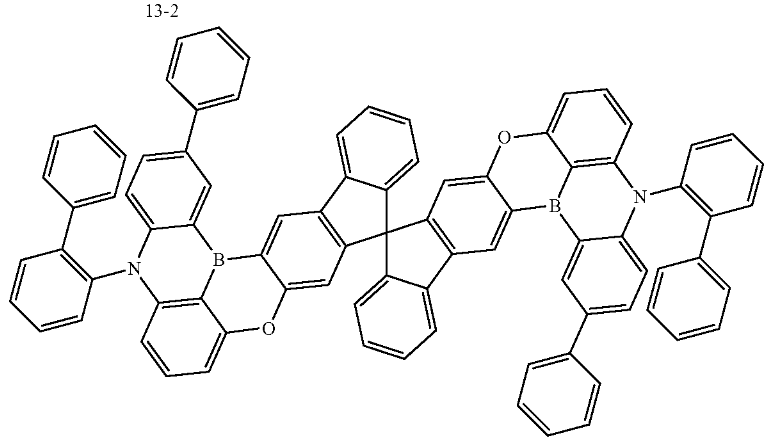

13

Synthesis of Intermediate 13-1

3-bromophenol (1eq), N-([1,1'-biphenyl]-4-yl)-[1,1'-biphenyl]-2-amine (1eq), tris(dibenzylideneacetone)dipalladium(0) (0.05eq), tri-tert-butylphosphine (0.1eq), and sodium tert-butoxide (2eq) were dissolved in toluene and stirred at 110° C. for 20 hours in a nitrogen atmosphere. After cooling, the resultant was dried under reduced pressure to remove toluene. Thereafter, the resultant was washed with ethyl acetate and water three times to obtain an organic layer, which was then dried over $MgSO_4$ and dried under reduced pressure. The obtained product was purified through column chromatography and recrystallized (dichloromethane:n-Hexane), thereby obtaining Intermediate 13-1. (Yield: 71%)

Synthesis of Intermediate 13-2

Intermediate 13-1 (2eq), 2,2'-dibromo-9,9'-spirobi[fluorene] (1eq), CuI (0.5eq), $K_2CO_3$ (5eq), and picolinic acid (0.5eq) were dissolved in DMF and stirred at 160° C. for 24 hours. After cooling, the resultant was dried under reduced pressure to remove DMF. Thereafter, the resultant was washed with ethyl acetate and water to obtain an organic layer, which was then dried over $MgSO_4$ and dried under reduced pressure. The obtained product was purified through column chromatography and recrystallized (dichloromethane:n-Hexane), thereby obtaining Intermediate 13-2. (Yield: 52%)

Synthesis of Compound 13

Intermediate 13-2 (1 eq) was dissolved in ortho dichlorobenzene, and the flask was cooled to 0° C. in a nitrogen atmosphere, and then $BI_3$ (2.5 eq) dissolved in ortho dichlorobenzene was slowly injected thereto. After the dropping was completed, the temperature was raised to 150° C. to stir the resultant for 8 hours. After cooling the resultant to 0° C., triethylamine was slowly dropped into the flask until the exotherm stopped to complete the reaction, and then hexane was added to precipitate the mixture to obtain a solid through filtration. The obtained solid was purified through silica filtration and then purified through MC/Hex recrystallization, thereby obtaining Compound 13. Thereafter, the final purification was performed on Compound 13 through sublimation purification. (Yield after sublimation: 8.3%)

(3) Synthesis of Compound 56

Condensed polycyclic Compound 56 according to one or more embodiments may be synthesized by, for example, Reaction Formula 3.

Reaction Formula 3.
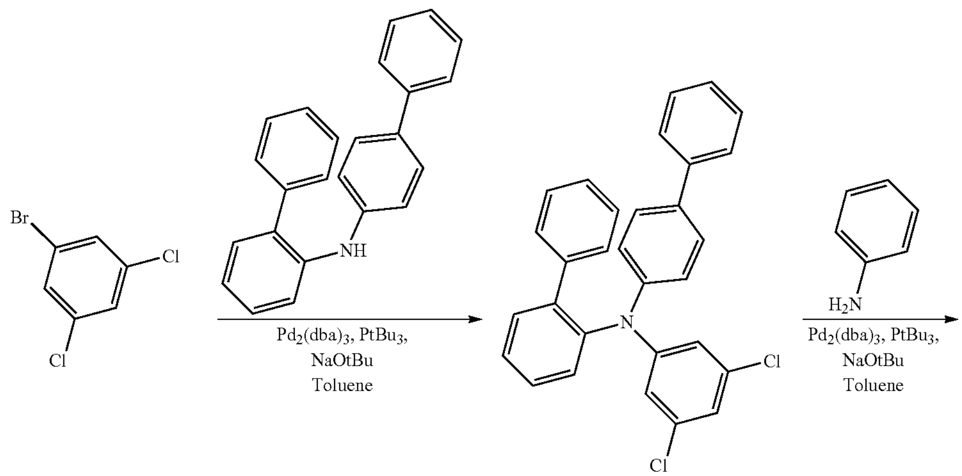
56-1
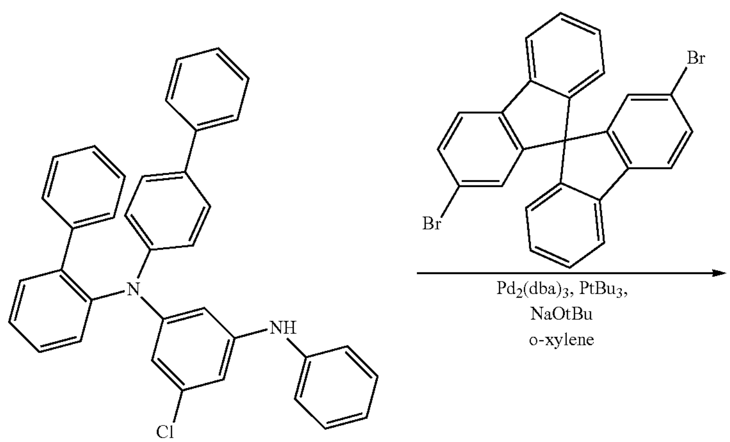
56-2
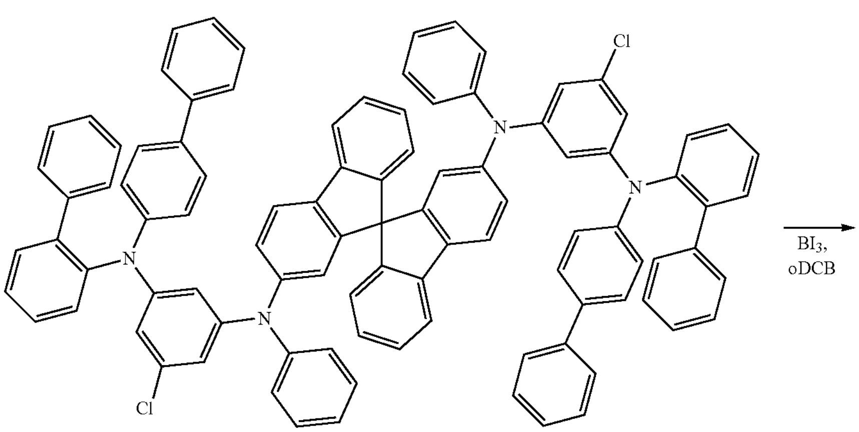
56-3

-continued

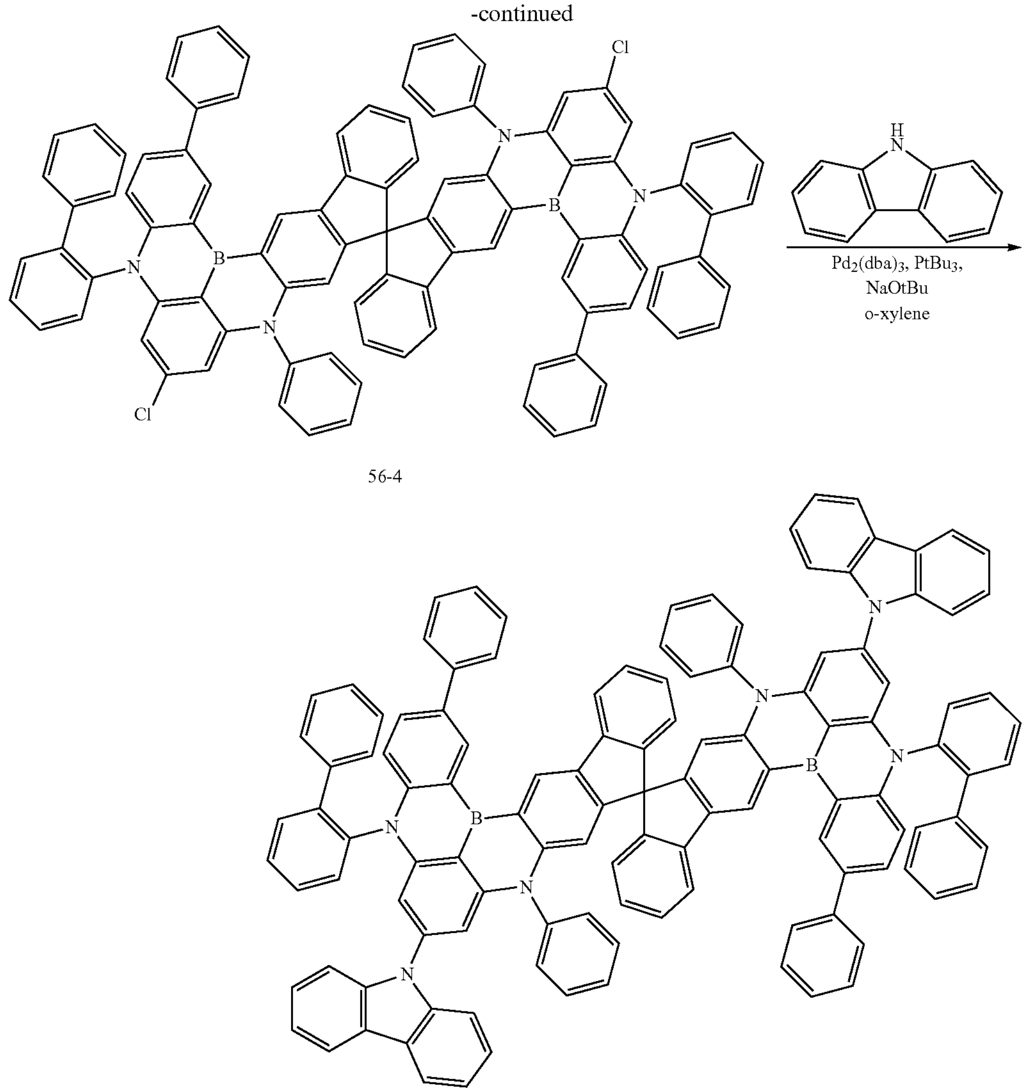

56-4

56

Synthesis of Intermediate 56-1

1-bromo-3,5-dichlorobenzene (1eq), N-([1,1'-biphenyl]-4-yl)-[1,1'-biphenyl]-2-amine (1eq), tris(dibenzylideneacetone)dipalladium(0) (0.05eq), tri-tert-butylphosphine (0.1eq), and sodium tert-butoxide (2eq) were dissolved in toluene and stirred at 110° C. for 20 hours in a nitrogen atmosphere. After cooling, the resultant was dried under reduced pressure to remove toluene. Thereafter, the resultant was washed with ethyl acetate and water three times to obtain an organic layer, which was then dried over $MgSO_4$ and dried under reduced pressure. The obtained product was purified through column chromatography and recrystallized (dichloromethane:n-Hexane), thereby obtaining Intermediate 56-1. (Yield: 76%)

Synthesis of Intermediate 56-2

Intermediate 56-1 (1eq), aniline (1eq), tris(dibenzylideneacetone)dipalladium(0) (0.05eq), tri-tert-butylphosphine (0.1eq), and sodium tert-butoxide (2eq) were dissolved in toluene and stirred at 110° C. for 24 hours in a nitrogen atmosphere. After cooling, the resultant was dried under reduced pressure to remove toluene. Thereafter, the resultant was washed with ethyl acetate and water three times to obtain an organic layer, which was then dried over $MgSO_4$ and dried under reduced pressure. The obtained product was purified through column chromatography (dichloromethane: n-Hexane), thereby obtaining Intermediate 56-2. (Yield: 63%)

Synthesis of Intermediate 56-3

Intermediate 56-2 (1eq), 2,2'-dibromo-9,9'-spirobi[fluorene] (1eq), tris(dibenzylideneacetone)dipalladium(0) (0.10eq), tri-tert-butylphosphine (0.2eq), and sodium tert-butoxide (4eq) were dissolved in xylene and stirred at 150° C. for 24 hours in a nitrogen atmosphere. After cooling, the resultant was dried under reduced pressure to remove xylene. Thereafter, the resultant was washed with ethyl acetate and water three times to obtain an organic layer, which was then dried over $MgSO_4$ and dried under reduced pressure. The obtained product was purified through column chromatography (dichloromethane:n-Hexane), thereby obtaining Intermediate 56-3. (Yield: 59%)

Synthesis of Intermediate 56-4

Intermediate 56-3 (1 eq) was dissolved in ortho dichlorobenzene, and the flask was cooled to 0° C. in a nitrogen atmosphere, and then $BI_3$ (2.5 eq) dissolved in ortho dichlorobenzene was slowly injected thereto. After the dropping was completed, the temperature was raised to 150° C. to stir the resultant for 8 hours. After cooling the resultant to 0° C., triethylamine was slowly dropped into the flask until the exotherm stopped to complete the reaction, and then hexane was added to precipitate the mixture to obtain a solid through filtration. The obtained solid was purified through silica filtration and then purified through MC/Hex recrystallization, thereby obtaining Intermediate 56-4. Thereafter, the final purification was performed on Intermediate 56-4 through sublimation purification. (Yield: 48.3%)

Synthesis of Compound 56

Intermediate 56-4 (1eq), 9H-carbazole (2eq), tris(dibenzylideneacetone)dipalladium(0) (0.10eq), tri-tert-butylphosphine (0.2eq), and sodium tert-butoxide (4eq) were dissolved in xylene and stirred at 150° C. for 24 hours in a nitrogen atmosphere. After cooling, the resultant was dried under reduced pressure to remove xylene. Thereafter, the resultant was washed with ethyl acetate and water three times to obtain an organic layer, which was then dried over $MgSO_4$ and dried under reduced pressure. The obtained product was purified through column chromatography (dichloromethane:n-Hexane), thereby obtaining Compound 56. Thereafter, the final purification was performed on Compound 56 through sublimation purification. (Yield: 52%)

(4) Synthesis of Compound 74

Condensed polycyclic compound 74 according to one or more embodiments may be synthesized by, for example, Reaction Formula 4.

Reaction Formula 4.

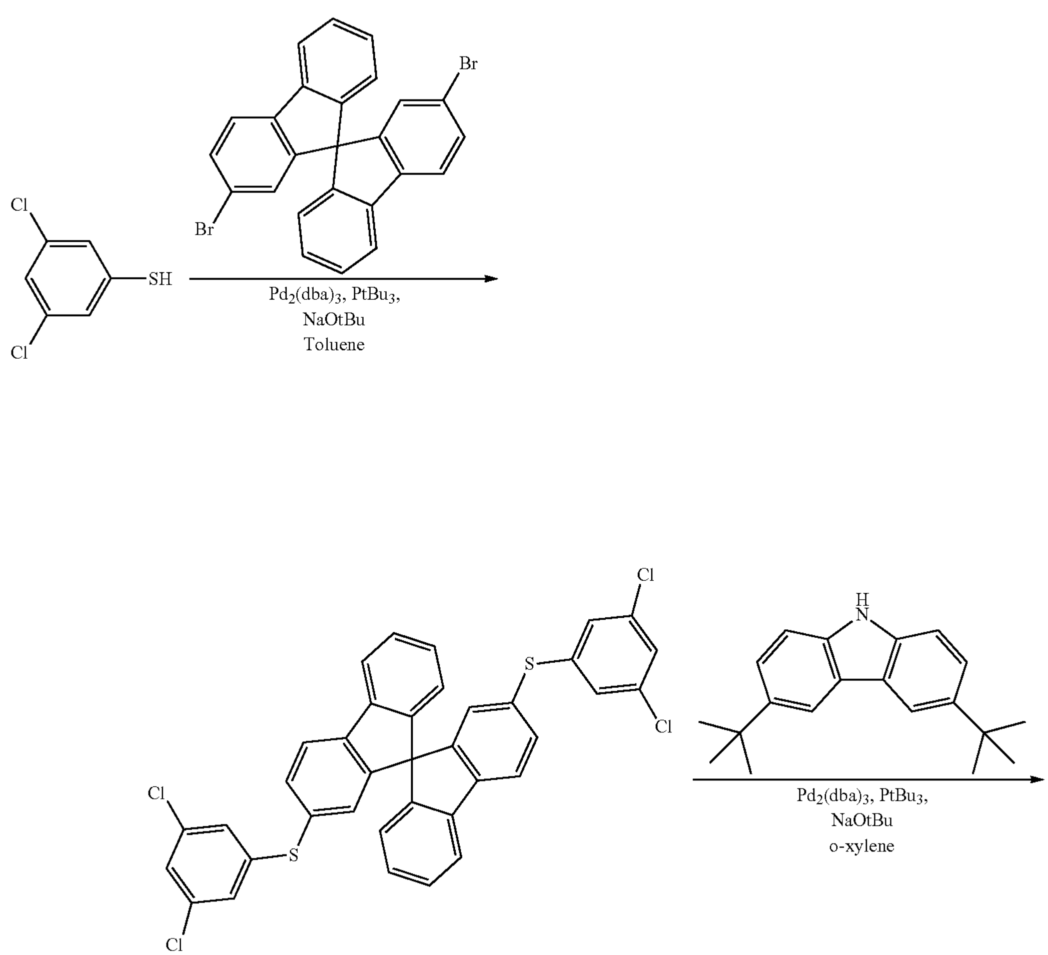

74-1

-continued

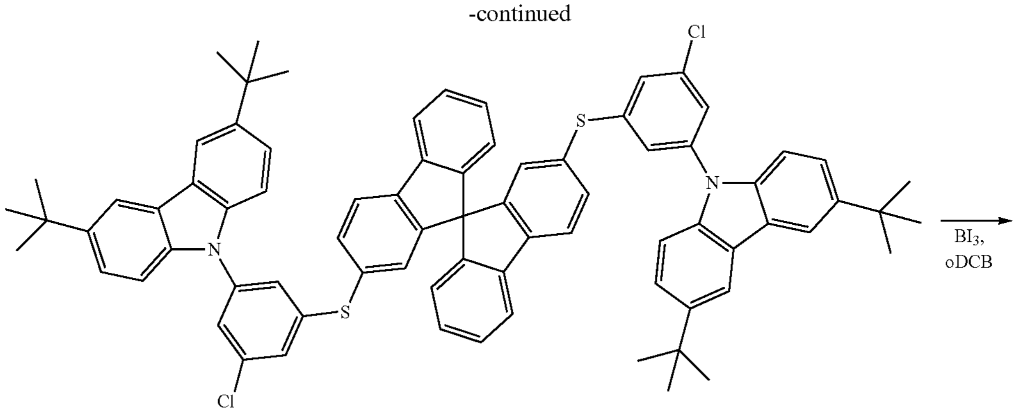

74-2

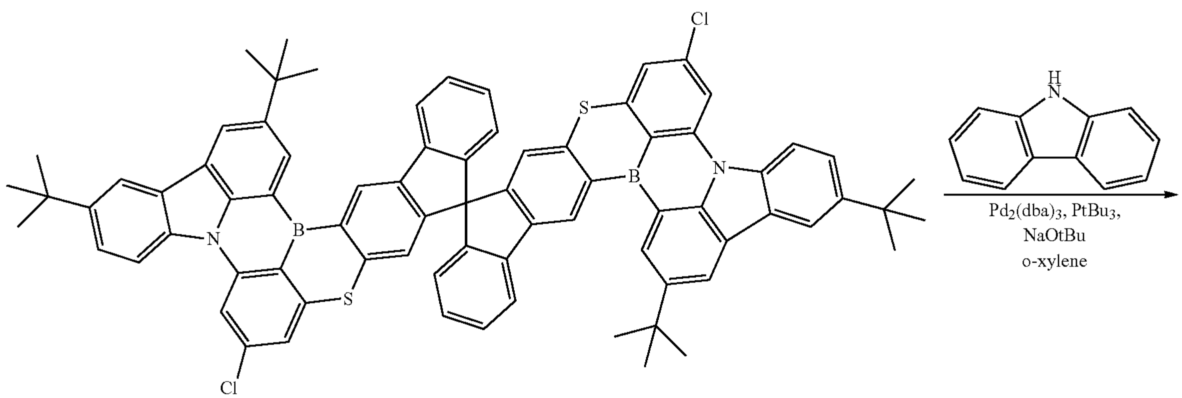

74-3

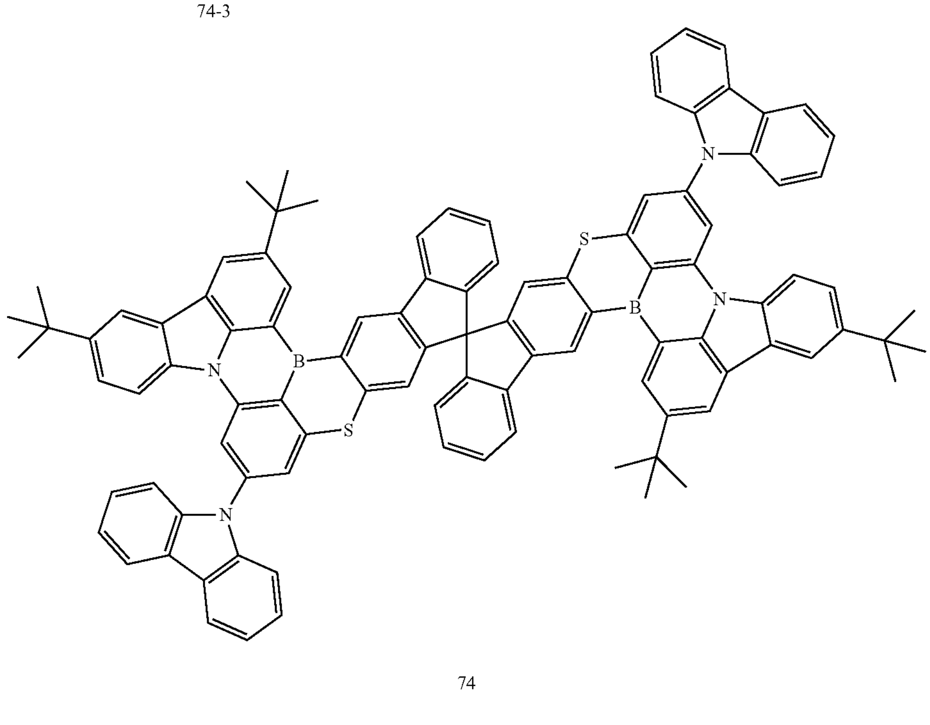

74

Synthesis of Intermediate 74-1

3,5-dichlorobenzenethiol (2.1eq), 2,2'-dibromo-9,9'-spirobi[fluorene] (1eq), tris(dibenzylideneacetone)dipalladium (0) (0.1eq), tri-tert-butylphosphine (0.2eq), and sodium tert-butoxide (3.5eq) were dissolved in toluene and stirred at 110° C. for 24 hours in a nitrogen atmosphere. After cooling, the resultant was dried under reduced pressure to remove toluene. Thereafter, the resultant was washed with ethyl acetate and water three times to obtain an organic layer, which was then dried over $MgSO_4$ and dried under reduced pressure. The obtained product was purified through column chromatography (dichloromethane:n-Hexane), thereby obtaining Intermediate 74-1. (Yield: 54%)

Synthesis of Intermediate 74-2

Intermediate 74-1 (1eq), 3,6-di-tert-butyl-9H-carbazole (2eq), tris(dibenzylideneacetone)dipalladium(0) (0.1eq), tri-tert-butylphosphine (0.2eq), and sodium tert-butoxide (3.5eq) were dissolved in xylene and stirred at 140° C. for 24 hours in a nitrogen atmosphere. After cooling, the resultant was dried under reduced pressure to remove xylene. Thereafter, the resultant was washed with ethyl acetate and water three times to obtain an organic layer, which was then dried over $MgSO_4$ and dried under reduced pressure. The obtained product was purified through column chromatography (dichloromethane:n-Hexane), thereby obtaining Intermediate 74-2. (Yield: 64%)

Synthesis of Intermediate 74-3

Intermediate 74-2 (1 eq) was dissolved in ortho dichlorobenzene, and the flask was cooled to 0° C. in a nitrogen atmosphere, and then $BI_3$ (2.5 eq) dissolved in ortho dichlorobenzene was slowly injected thereto. After the dropping was completed, the temperature was raised to 150° C. to stir the resultant for 8 hours. After cooling the resultant to 0° C., triethylamine was slowly dropped into the flask until the exotherm stopped to complete the reaction, and then hexane was added to precipitate the mixture to obtain a solid through filtration. The obtained solid was purified through silica filtration and then purified through MC/Hex recrystallization, thereby obtaining Intermediate 74-3. Thereafter, the final purification was performed on Intermediate 74-3 through sublimation purification. (Yield: 55%)

Synthesis of Compound 74

Intermediate 74-3 (1eq), 9H-carbazole (2eq), tris(dibenzylideneacetone)dipalladium(0) (0.1eq), tri-tert-butylphosphine (0.2eq), and sodium tert-butoxide (3.5eq) were dissolved in xylene and stirred at 150° C. for 24 hours in a nitrogen atmosphere. After cooling, the resultant was dried under reduced pressure to remove xylene. Thereafter, the resultant was washed with ethyl acetate and water three times to obtain an organic layer, which was then dried over $MgSO_4$ and dried under reduced pressure. The obtained product was purified through column chromatography (dichloromethane n-Hexane), thereby obtaining Compound 74. Thereafter, the final purification was performed on Compound 74 through sublimation purification. (Yield: 53%)

The molecular weight and NMR analysis results of each of the synthesized Compound 3, Compound 13, Compound 56, and Compound 74 are shown in Table 1 below.

TABLE 1

| Compound | H NMR (δ) | Calc | Found |
|---|---|---|---|
| 3 | 9.21 (2H, s), 9.12 (2H, s), 8.07 (2H, s), 7.88 (2H, d), 7.71-7.61 (18H, m), 7.58-7.42 (24H, m), 7.31-7.11 (26H, m), 6.34, (2H, s), 6.26 (2H, d) | 1306.48 | 1307.29 |
| 13 | 9.33 (2H, s), 9.24 (2H, s), 7.97 (2H, s), 7.83 (2H, d), 7.62-7.50 (15H, m), 7.45-7.32 (17H, m), 7.26-7.12 (8H, m), 6.23, (2H, d), 6.15 (2H, d) | 1154.42 | 1155.36 |
| 56 | 9.38 (2H, s), 9.22 (2H, s), 8.07 (2H, s), 7.88 (2H, d), 7.71-7.61 (18H, m), 7.58-7.42 (22H, m), 7.31-7.11 (24H, m), 6.34, (2H, s), 6.26 (2H, d) | 1634.63 | 1635.71 |
| 74 | 9.16 (2H, s), 9.02 (2H, s), 8.02 (2H, s), 7.91 (2H, s) 7.78 (2H, d), 7.74-7.62 (9H, m), 7.59-7.43 (11H, m), 7.36-7.23 (8H, m), 6.42, (2H, s), 6.36 (2H, d), 1.41 (18H, s), 1.35 (18H, s) | 1432.59 | 1433.45 |

2. Manufacture of Light Emitting Diodes and Evaluation of Condensed Polycyclic Compounds Light emitting diodes of one or more embodiments containing a condensed polycyclic compound of one or more embodiments in an emission layer were manufactured using a method below.

The light emitting diodes of one or more embodiments were manufactured respectively using Compound 3, Compound 13, Compound 56, and Compound 74 described above as a dopant material of the emission layer. In addition, light emitting diodes of Comparative Examples were manufactured respectively using Comparative Example Compound R1 and Comparative Example Compound R2 as a dopant material of the emission layer.

The compounds used for the emission layer in Examples 1 to 4 and Comparative Examples 1 and 2 are shown below.

Example Compounds Used in Diode Manufacturing

3

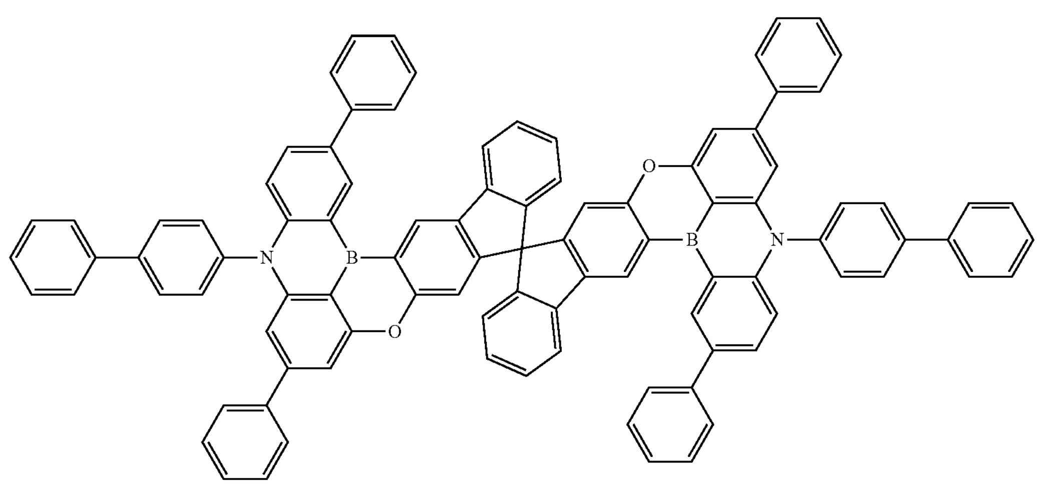

-continued
13
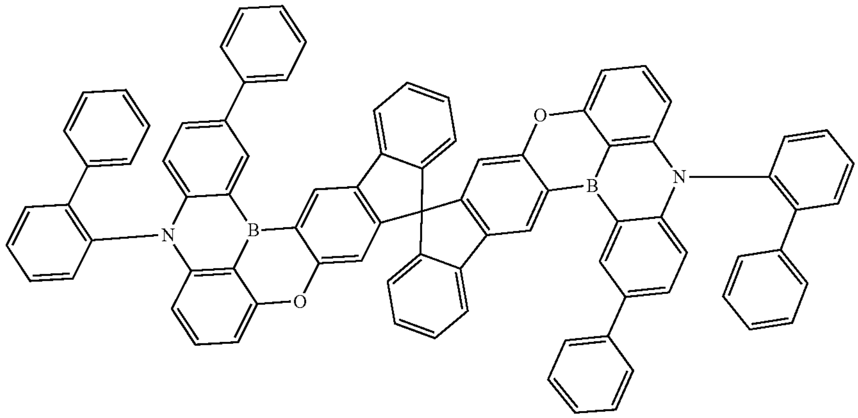
56
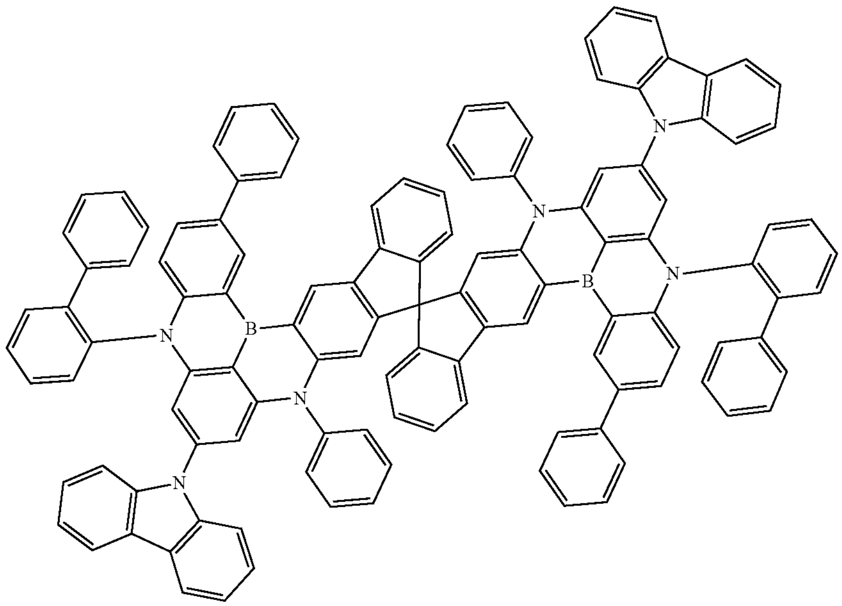
74
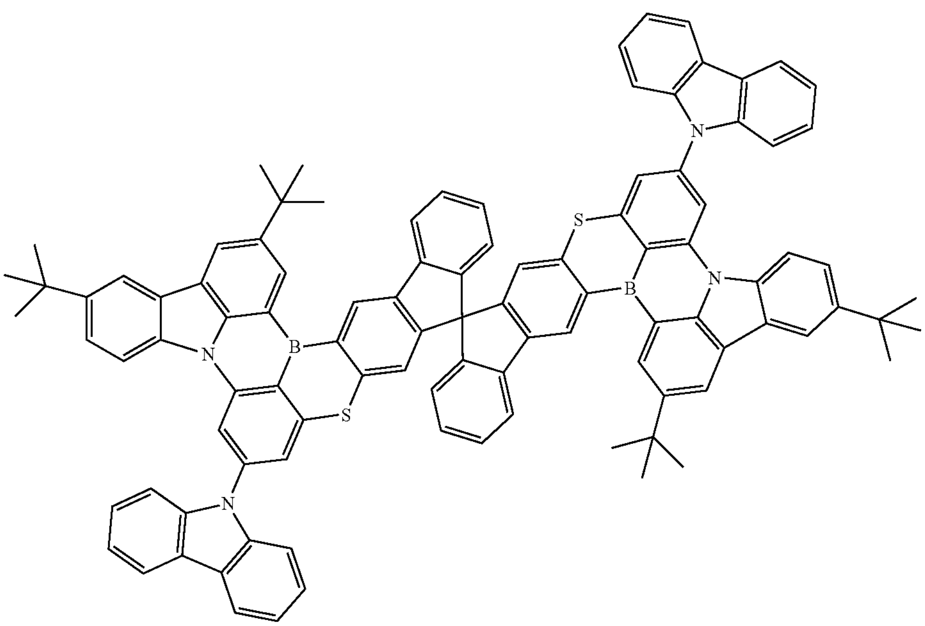

Comparative Example Compounds Used in Diode Manufacturing

R1

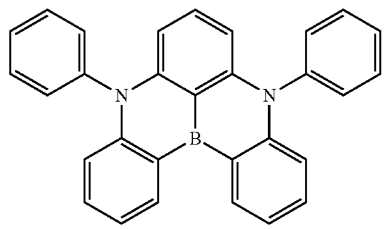

R2

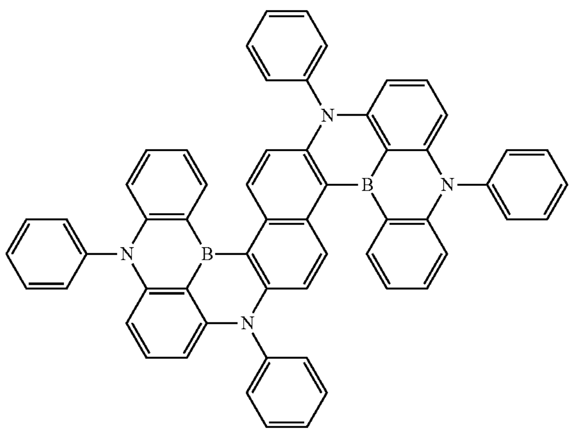

Manufacture of Light Emitting Diodes

In order to form a first electrode, an ITO glass substrate (Corning, 15 Ω/cm$^2$, 1200 Å) was cut to a size of about 50 mm×50 mm×0.7 mm, subjected to ultrasonic cleaning using isopropyl alcohol and pure water for 5 minutes respectively and ultraviolet irradiation for 30 minutes, and then exposed to ozone for cleaning to form the glass substrate in a vacuum deposition apparatus.

On an upper portion of the glass substrate, NPD was vacuum deposited at a thickness of 300 Å to form a hole injection layer, and then, on an upper portion of the hole injection layer, TCTA was vacuum deposited at a thickness of 200 Å to form a hole transport layer. On an upper portion of the hole transport layer, CzSi was vacuum deposited at a thickness of 100 Å.

On the layer, mCP and a respective one of Example Compounds or Comparative Example Compounds were co-deposited at a weight ratio of 99:1 to form an emission layer having a thickness of 200 Å.

Thereafter, TSPO1 was vacuum deposited at a thickness of 200 Å to form an electron transport layer, and then TPBi was vacuum deposited at a thickness of 300 Å to form an electron injection layer.

On an upper portion of the electron transport layer LiF, an alkali metal, was vacuum deposited at a thickness of 10 Å, and Al was vacuum deposited at a thickness of 3000 Å to form a LiF/Al second electrode so as to obtain a light emitting diode.

Evaluation of Light Emitting Diode Properties

Table 2 shows results of evaluation on light emitting diodes of Examples 1 to 4, and Comparative Examples 1 and 2. In Table 2, the driving voltage, luminous efficiency, and maximum quantum efficiency of the manufactured light emitting diodes are compared and shown.

The light emitting diodes of Table 2 contain the following compound G as a hole transport material:

Compound G

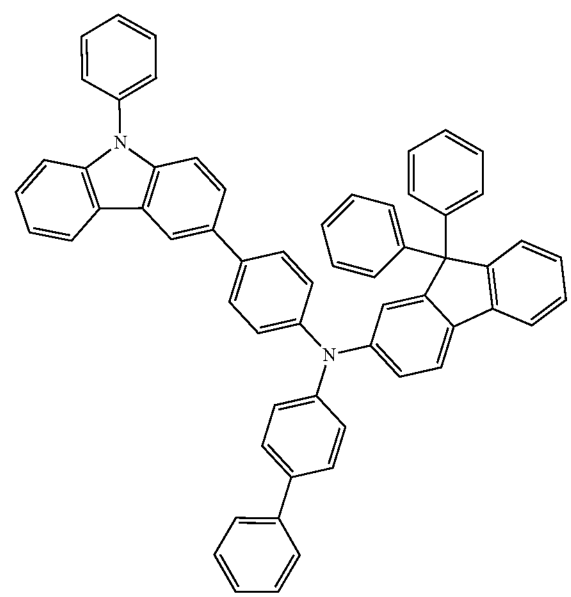

TABLE 2

| Type | Hole transport layer material | Dopant compound | Driving voltage (V) | Luminous efficiency (cd/A) | Max external Quantum efficiency (%) | Emitted color |
|---|---|---|---|---|---|---|
| Example 1 | Compound G | Compound 3 | 4.7 | 21.3 | 20.9 | blue |
| Example 2 | Compound G | Compound 13 | 4.6 | 20.7 | 19.7 | blue |
| Example 3 | Compound G | Compound 56 | 4.5 | 25.6 | 24.8 | blue |
| Example 4 | Compound G | Compound 74 | 4.4 | 24.7 | 23.9 | blue |
| Comparative Example 1 | Compound G | Comparative Example Compound R1 | 5.4 | 14.6 | 10.4 | blue |
| Comparative Example 2 | Compound G | Comparative Example Compound R2 | 5.3 | 18.2 | 15.6 | blue |

Referring to the results of Table 2, the light emitting diodes of Examples 1 to 4, and Comparative Examples 1 and 2 all emit blue light. However, it is seen that compared to the light emitting diodes of Comparative Examples 1 and 2, the light emitting diodes of Examples 1 to 4 using the condensed polycyclic compounds according to one or more embodiments of the present disclosure as an emission layer material had a lower driving voltage, excellent luminous efficiency, and improved maximum external quantum efficiency. The condensed polycyclic compounds contained in the light emitting diodes of Examples 1 to 4 have a structure in which two condensed rings each containing a boron atom are connected through a spiro structure.

Comparative Example Compound R1 has a condensed ring containing one boron atom and does not have a spiro structure. Accordingly, the diode of Comparative Example 1 exhibits deteriorated diode characteristics compared to the diodes of Examples.

Comparative Example Compound R2 has a structure in which condensed rings each containing one boron atom are connected, but does not have a spiro structure. Accordingly, the diode of Comparative Example 2 exhibits deteriorated diode characteristics compared to the diodes of Examples.

The condensed polycyclic compound of the present disclosure includes a skeleton in which two condensed rings each containing a boron atom are connected through a spiro structure, and thus may reduce vibration of molecules, increase absorbance, and exhibit excellent molecular stability and improved material stability.

The light emitting diode of the present disclosure includes the condensed polycyclic compound according to one or more embodiments of the present disclosure in an emission layer, and may thus exhibit a low driving voltage, improved luminous efficiency, and excellent maximum external quantum efficiency.

A light emitting diode of one or more embodiments includes a condensed polycyclic compound of one or more embodiments in an emission layer, and may thus exhibit high efficiency characteristics.

A condensed polycyclic compound of one or more embodiments may improve the efficiency of a light emitting diode.

Although the present disclosure has been described with reference to one or more embodiments of the present disclosure, it will be understood that the present disclosure should not be limited to these embodiments but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. A light emitting diode comprising:

a first electrode;

a second electrode on the first electrode; and at least one functional layer between the first electrode and the second electrode, the at least one functional layer comprising a condensed polycyclic compound represented by Formula 1, wherein the first electrode and the second electrode each independently comprise at least one selected from Ag, Mg, Cu, Al, Pt, Pd, Au, Ni, Nd, Ir, Cr, Li, Ca, LiF, Mo, Ti, W, In, Sn, and Zn, compounds selected thereof, and mixtures thereof:

Formula 1

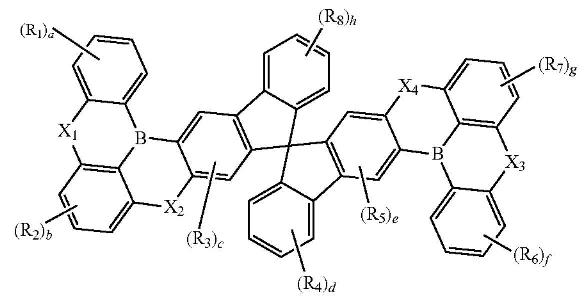

wherein in Formula 1, $X_1$, $X_2$, $X_3$, and $X_4$ are each independently $NR_X$, O, S, or Se, $R_x$, and $R_1$ to $R_8$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, a is an integer of 0 to 4, b is an integer of 0 to 3, c is an integer of 0 to 2, d is an integer of 0 to 4, e is an integer of 0 to 2, f is an integer of 0 to 4, g is an integer of 0 to 3, and h is an integer of 0 to 4.

2. The light emitting diode of claim 1, wherein the at least one functional layer comprises an emission layer, a hole transport region between the first electrode and the emission layer, and an electron transport region between the emission layer and the second electrode, and wherein the emission layer comprises the condensed polycyclic compound.

3. The light emitting diode of claim 2, wherein the emission layer comprises a dopant and a host, and the dopant comprises the condensed polycyclic compound.

4. The light emitting diode of claim 2, wherein the emission layer is configured to emit blue light.

5. The light emitting diode of claim 2, wherein the emission layer is configured to emit thermally activated delayed fluorescence.

6. The light emitting diode of claim 2, wherein the electron transport region comprises Compound G:

Compound G

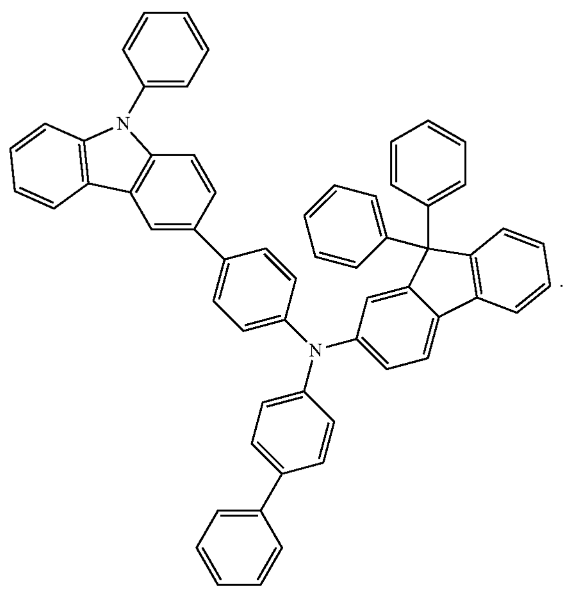

7. The light emitting diode of claim 1, wherein $X_1$ is the same as $X_3$, and $X_2$ is the same as $X_4$.

8. The light emitting diode of claim 1, wherein the condensed polycyclic compound represented by Formula 1 is represented by any one of Formulae 2-1 to 2-3:

Formula 2-1

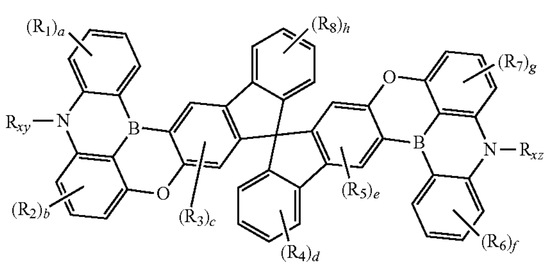

-continued

Formula 2-2

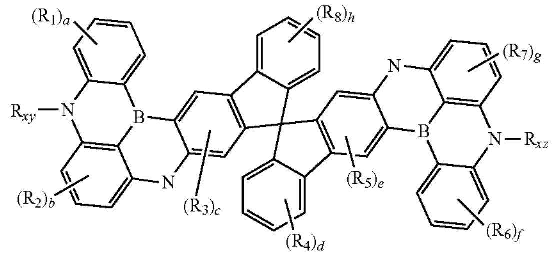

Formula 2-3

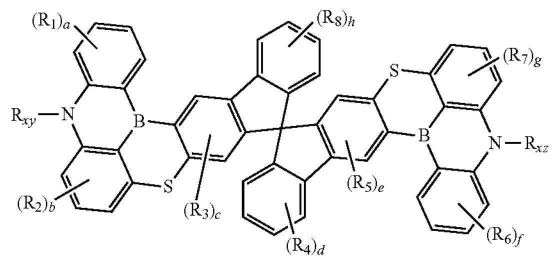

wherein in Formulae 2-1 to 2-3, $R_{xy}$ and $R_{xz}$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, and $R_1$ to $R_8$, and a to h are the same as defined in Formula 1.

9. The light emitting diode of claim 1, wherein the condensed polycyclic compound represented by Formula 1 is represented by Formula 3-1 or Formula 3-2:

Formula 3-1

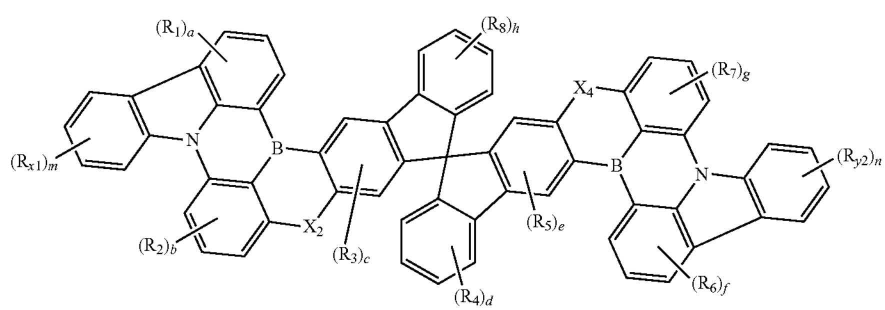

-continued

Formula 3-2

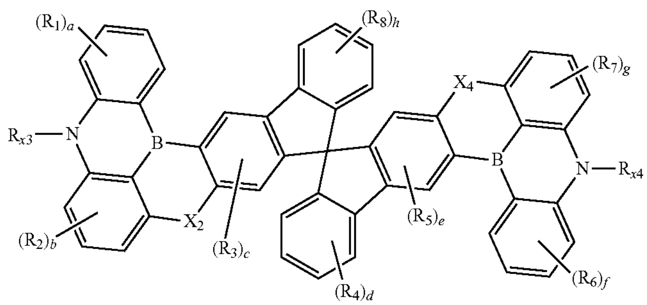

wherein in Formulas 3-1 and 3-2, $R_{X1}$ and $R_{X2}$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, $R_{X3}$ and $R_{X4}$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, m and n are each independently an integer of 0 to 4, and $X_2$, $X_4$, $R_1$ to $R_8$, and a to h are the same as defined in Formula 1.

10. The light emitting diode of claim 1, wherein the condensed polycyclic compound represented by Formula 1 is represented by Formula 4-1:

Formula 4-1

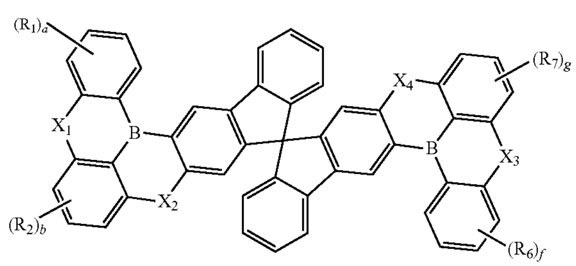

wherein in Formula 4-1, $X_1$, $X_2$, $X_3$, $X_4$, $R_1$, $R_2$, $R_6$, $R_7$, a, b, f, and g are the same as defined in Formula 1.

11. The light emitting diode of claim 1, wherein the condensed polycyclic compound represented by Formula 1 is represented by Formula 5-1:

Formula 5-1

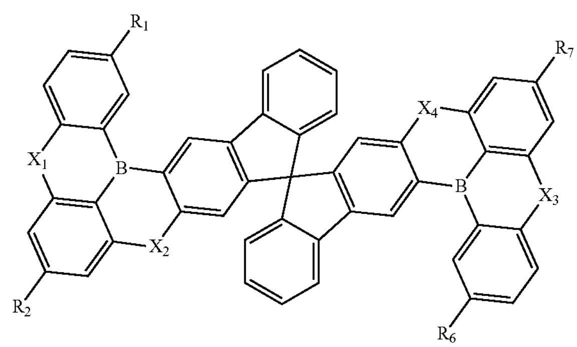

wherein in Formula 5-1, $X_1$, $X_2$, $X_3$, $X_4$, $R_1$, $R_2$, and $R_6$ are the same as defined in Formula 1.

12. The light emitting diode of claim 1, wherein $X_1$, $X_2$, $R_1$, $R_2$, $R_3$, $R_4$, a, b, c, and d are the same as $X_3$, $X_4$, $R_6$, $R_7$, $R_5$, $R_8$, f, g, e, and h, respectively.

13. The light emitting diode of claim 1, wherein $R_X$, and $R_1$ to $R_8$ are each independently a hydrogen atom, a deuterium atom, a t-butyl group, a substituted or unsubstituted diphenylamine group, a substituted or unsubstituted phenyl group, a substituted or unsubstituted biphenyl group, a substituted or unsubstituted carbazole group, and/or bonded to an adjacent group to form a ring.

14. The light emitting diode of claim 1, wherein the condensed polycyclic compound represented by Formula 1 comprises any one of compounds in Compound Group 1:

Compound Group 1
1
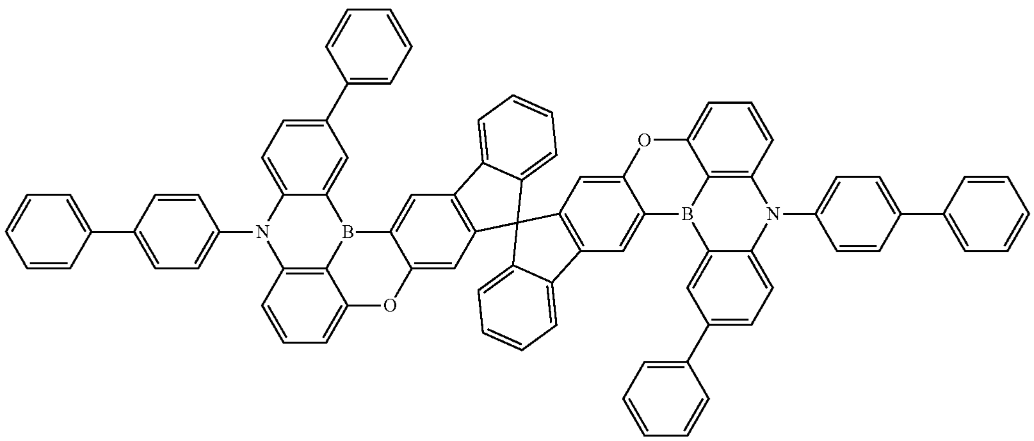
2
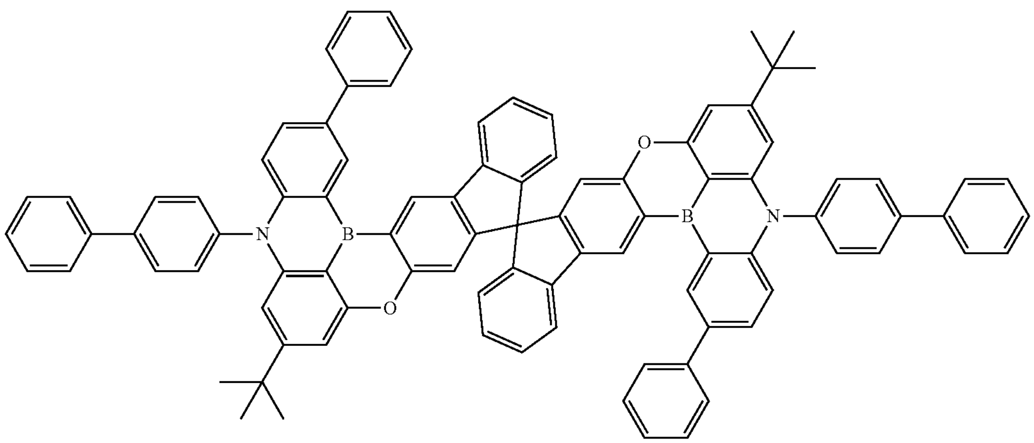
3
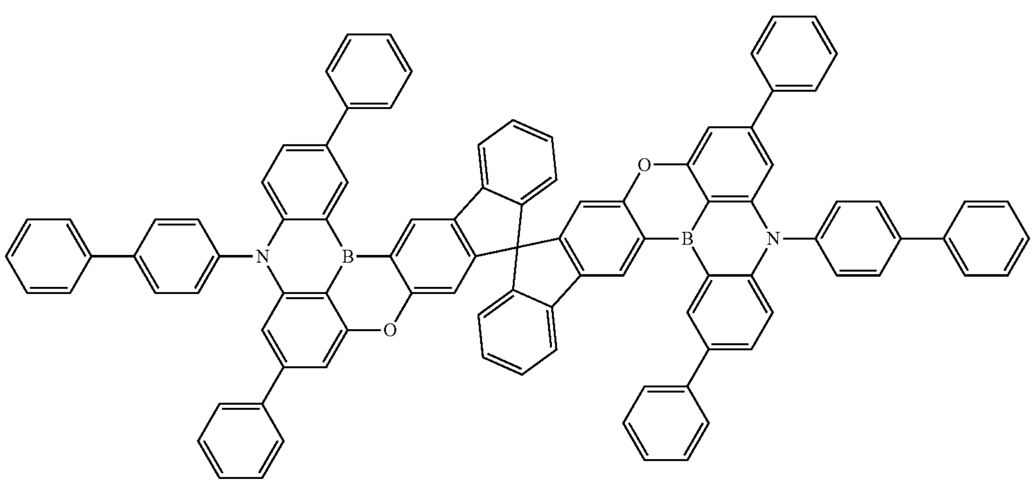

-continued
4
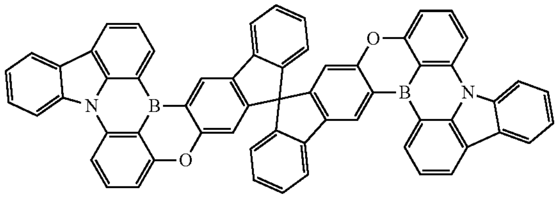
5
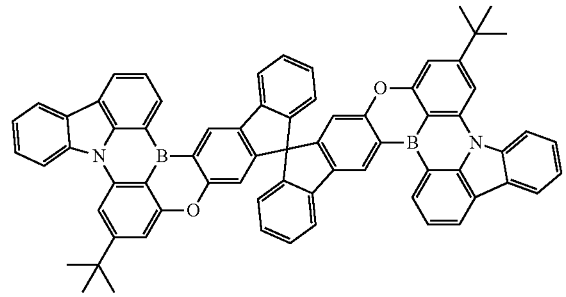
6
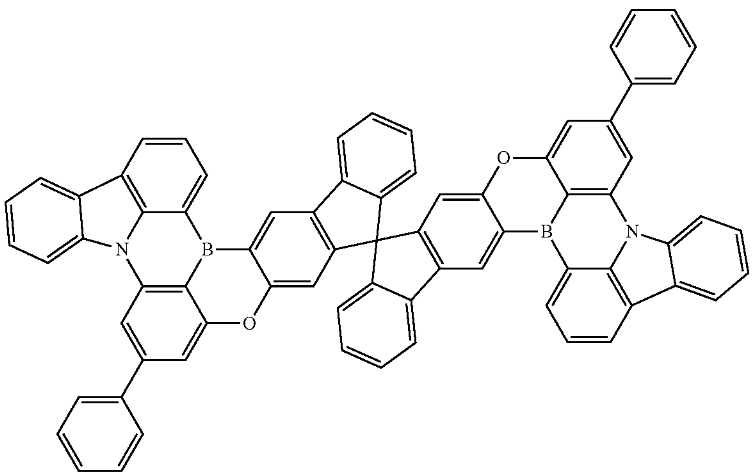
7
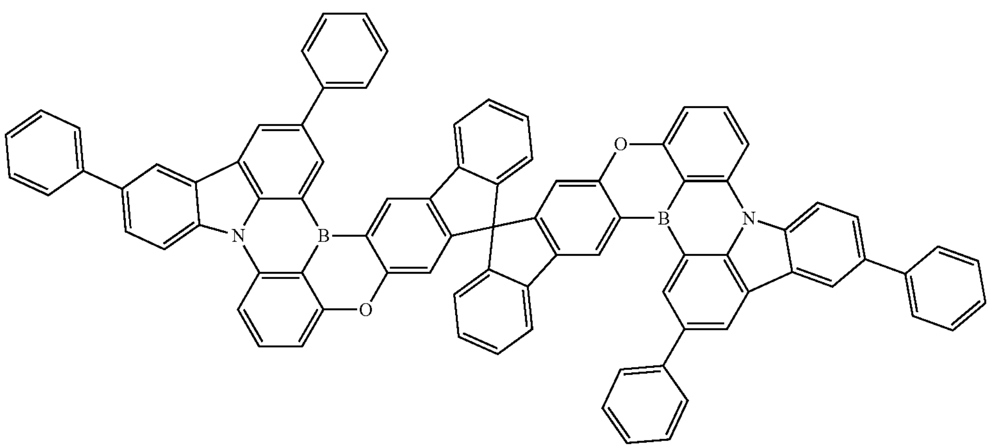
8
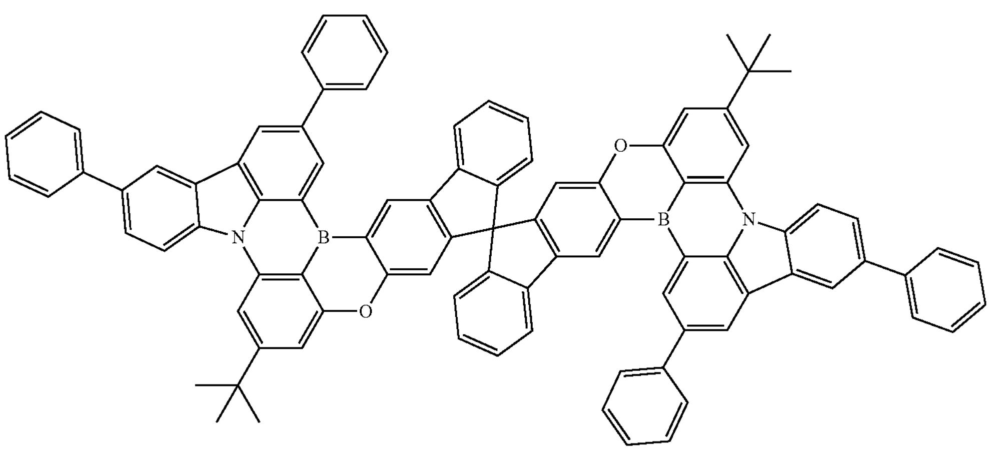

-continued
9
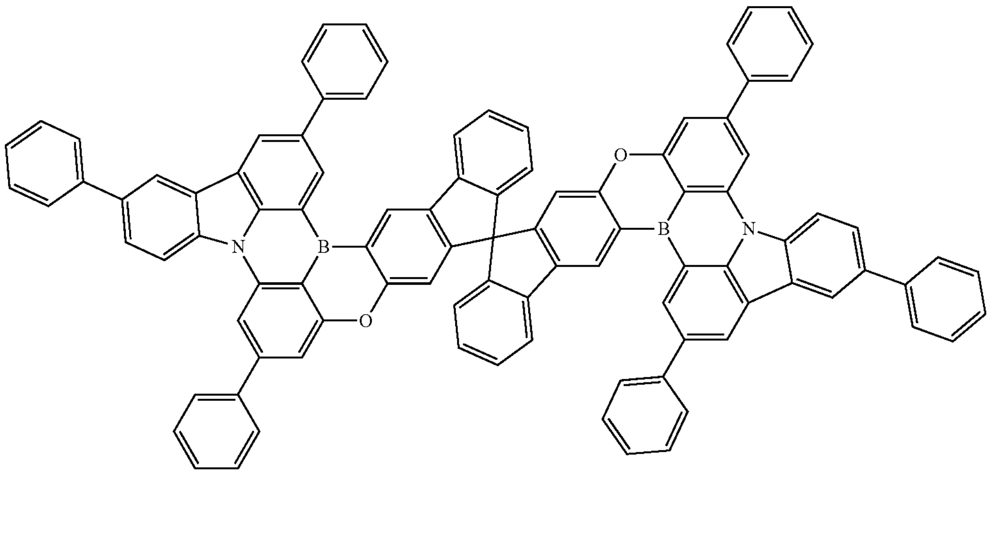
10
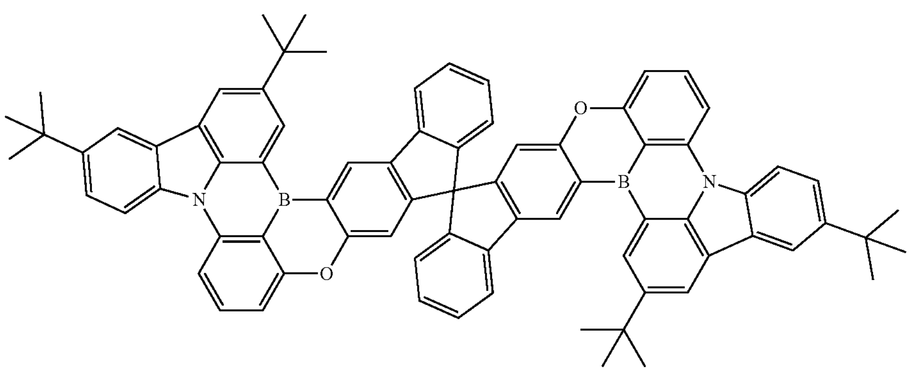
11
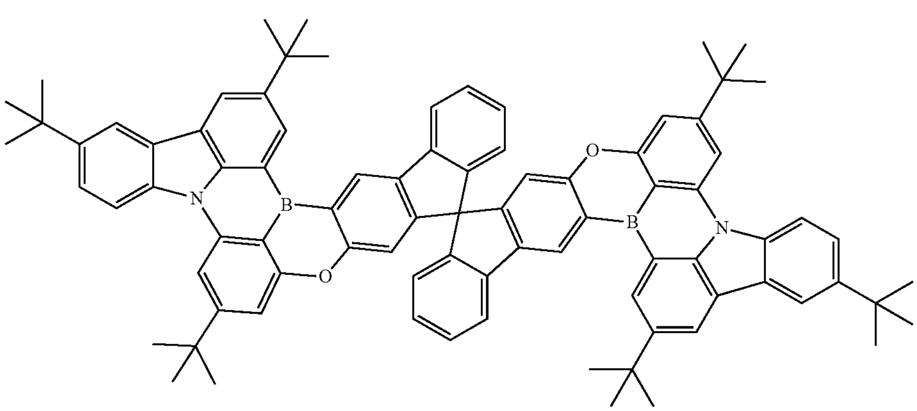

-continued
12
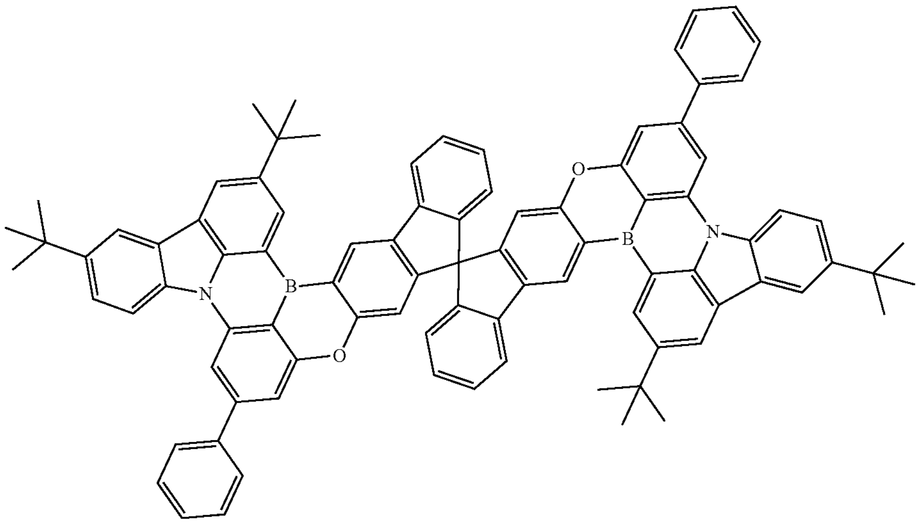
13
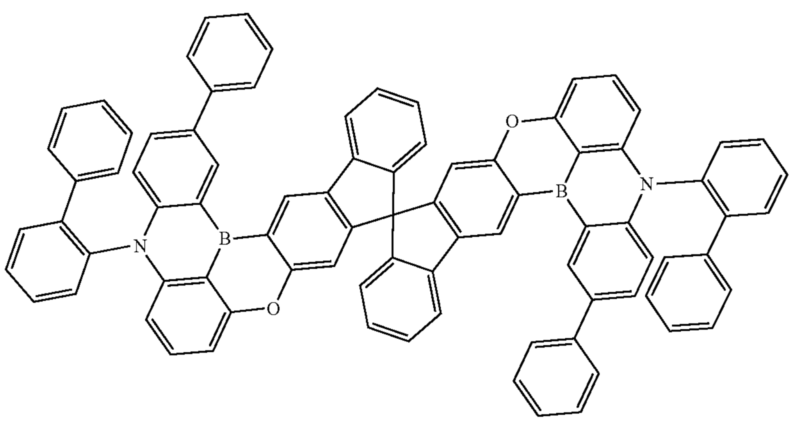
14
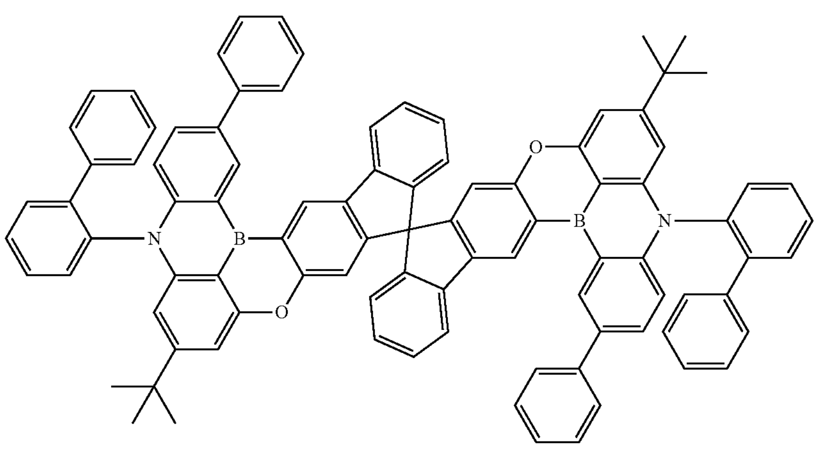

-continued
15
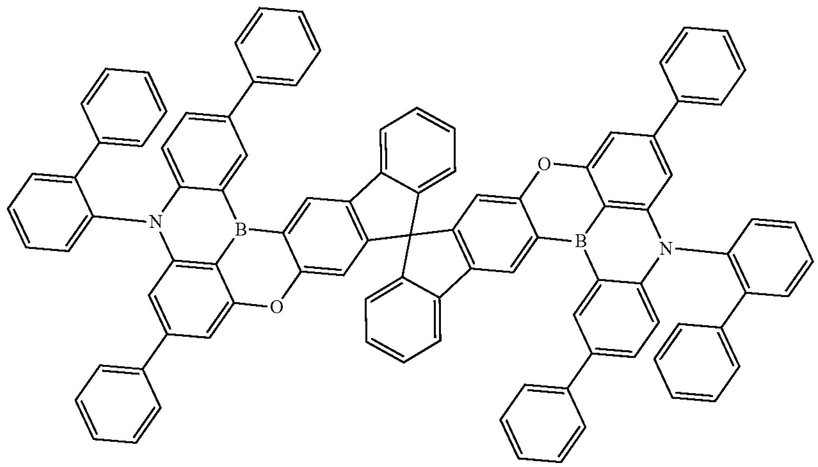
16
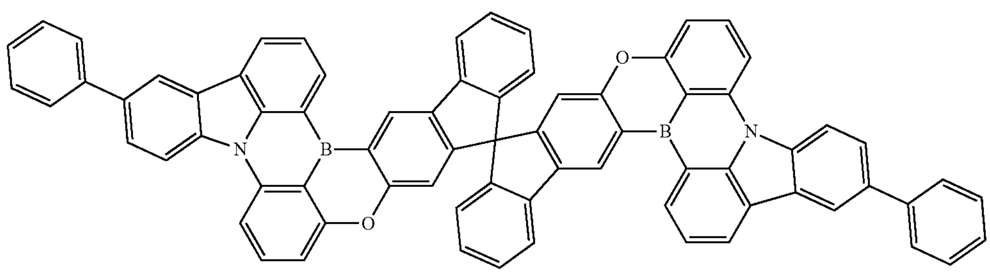
17
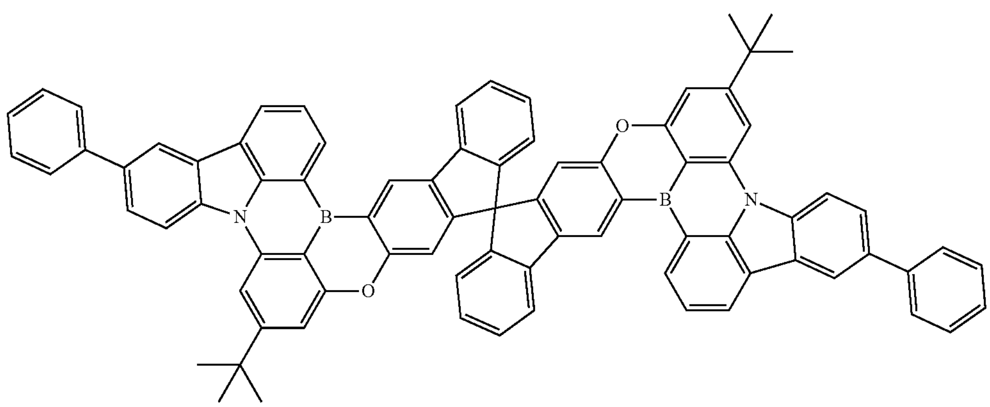
18
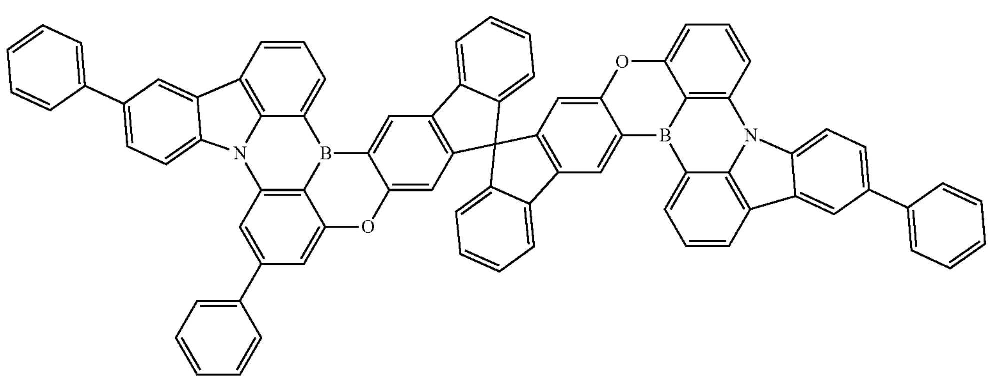

-continued
19
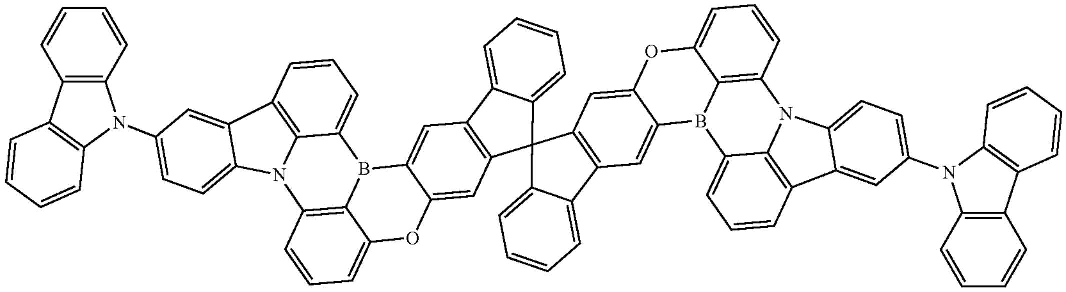
20
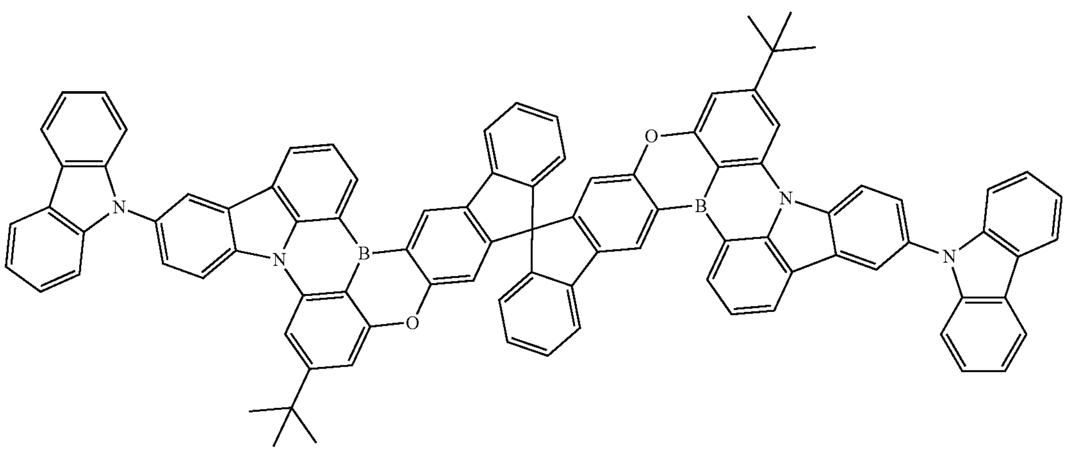
21
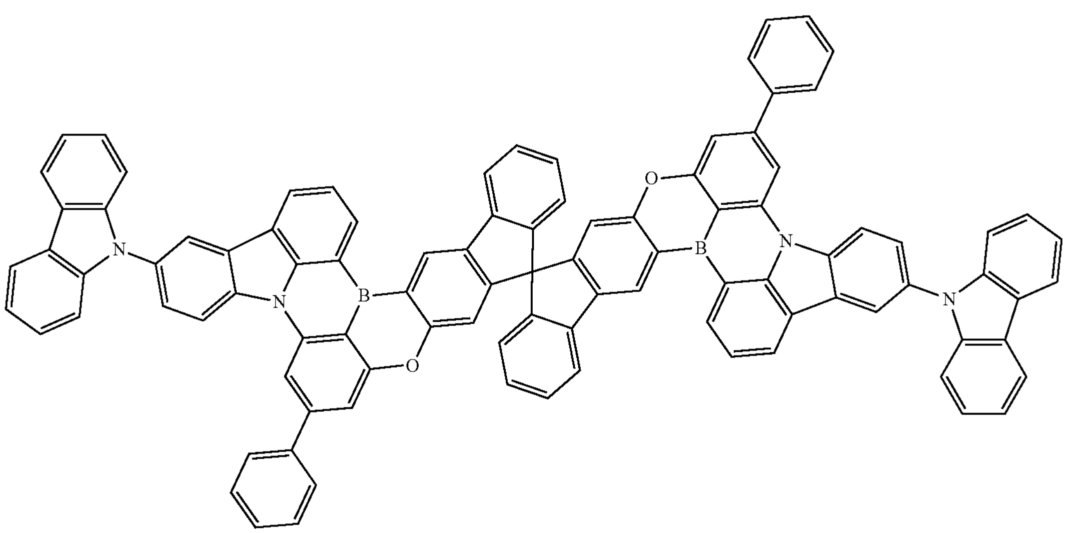

-continued
22
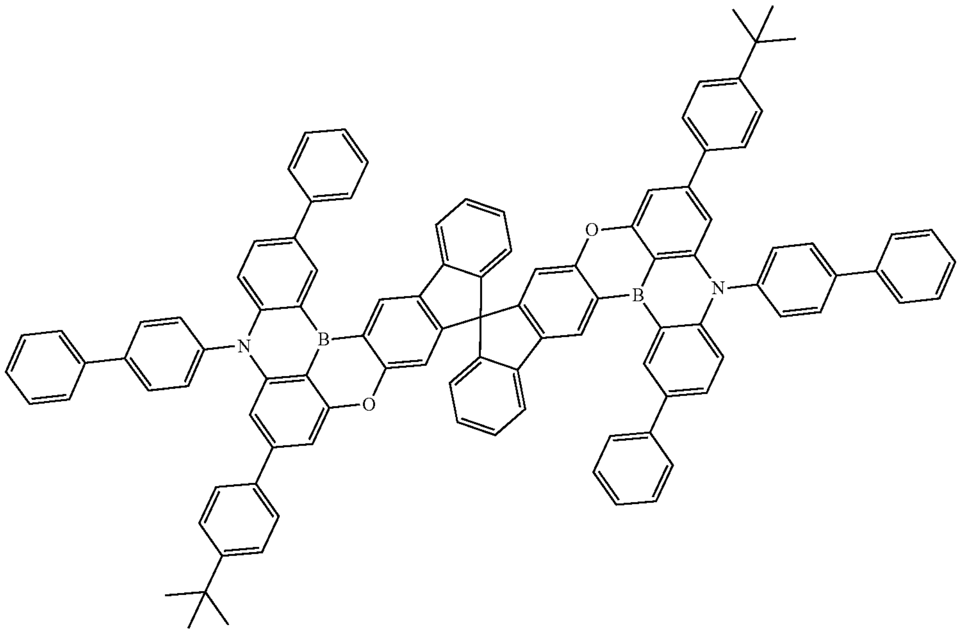
23
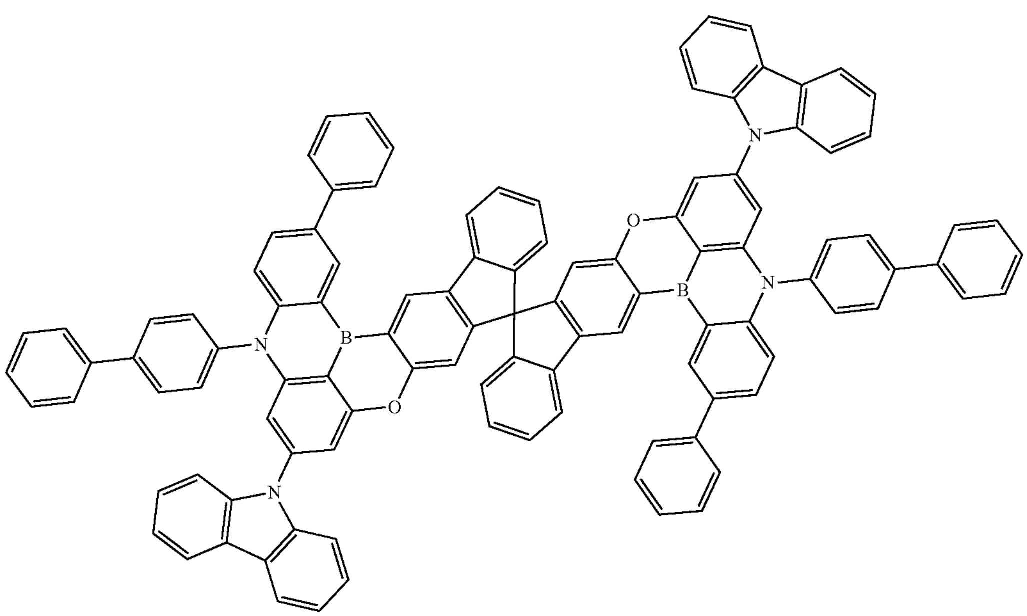

-continued
24
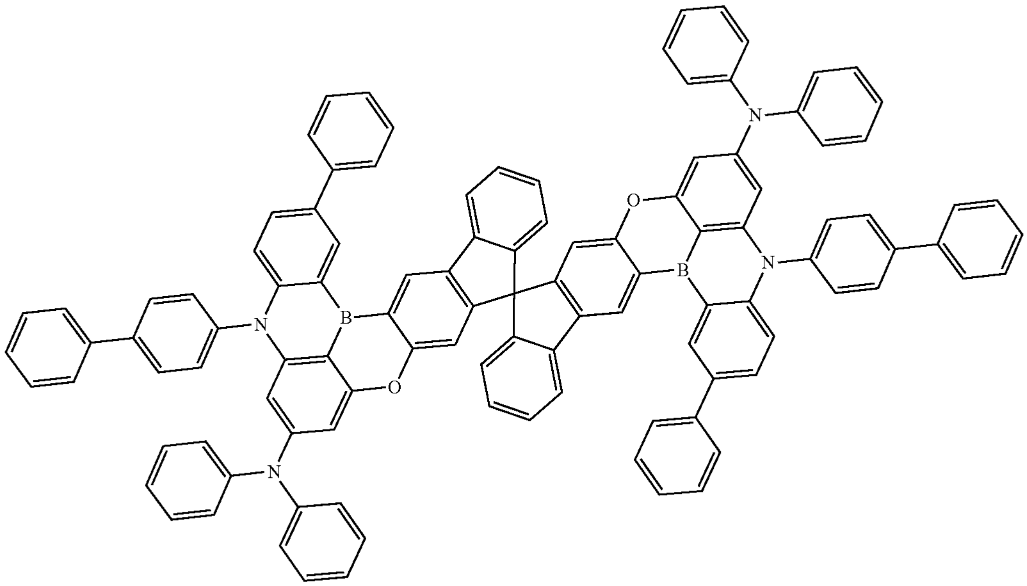
25
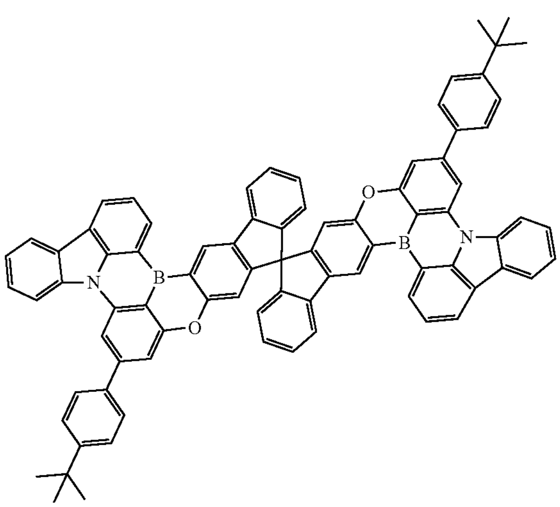
26
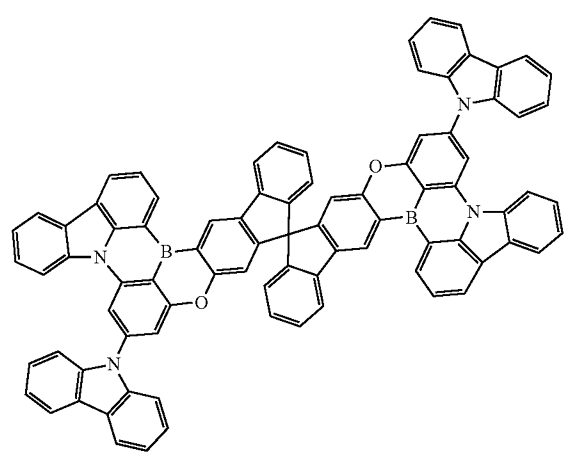

-continued
27
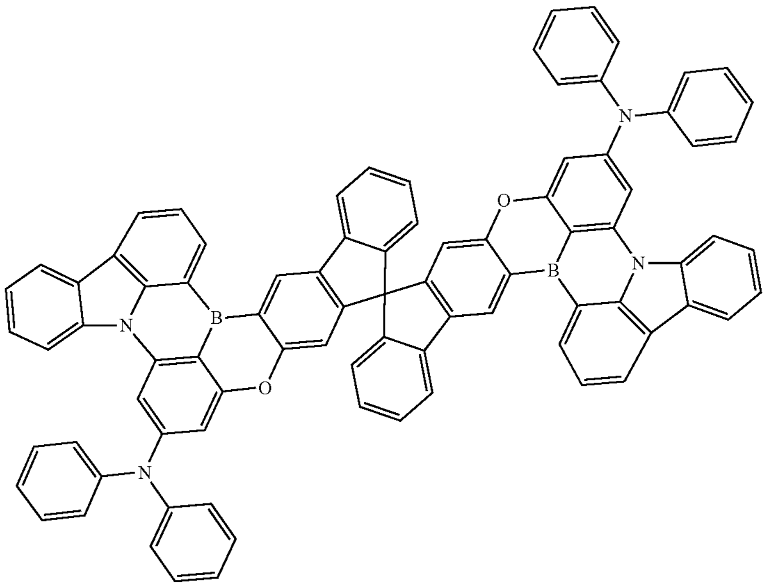
28
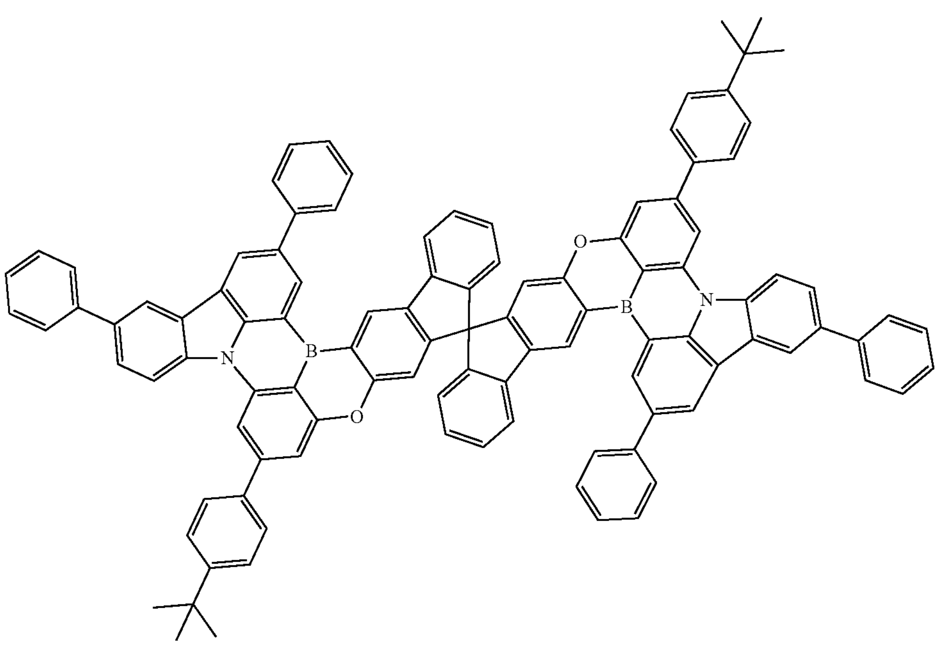

-continued
29
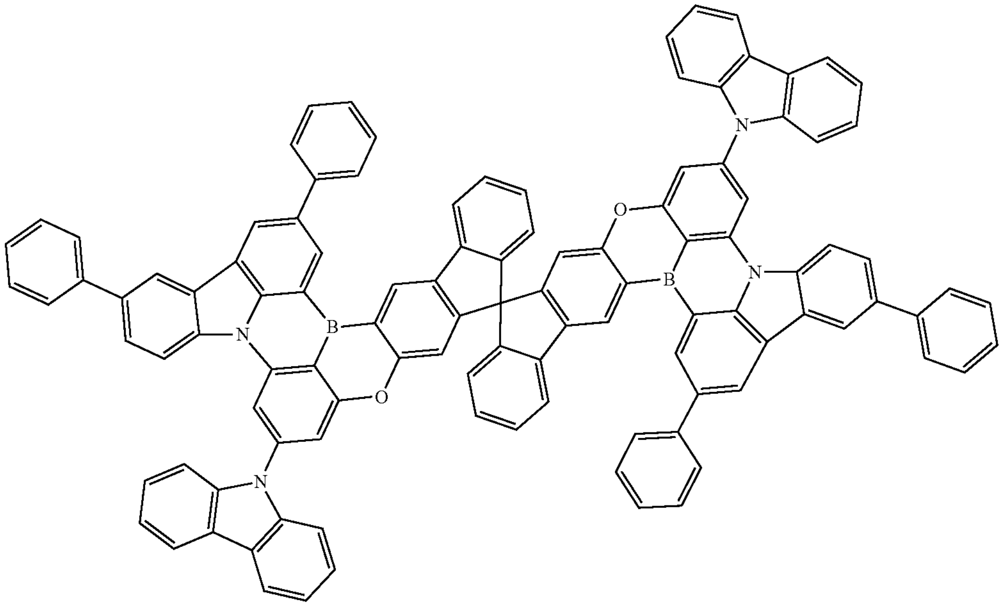
30
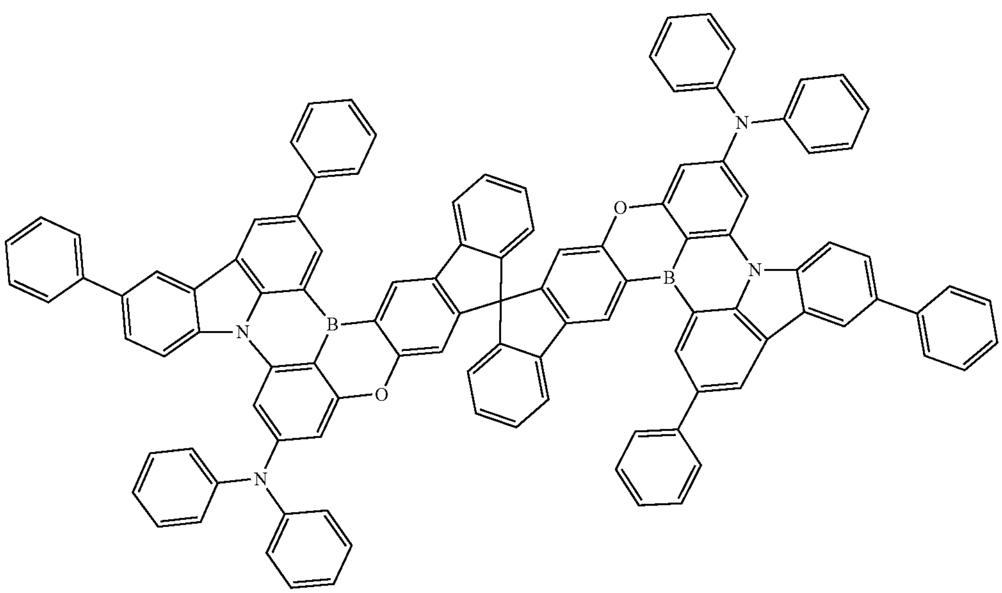

-continued
31
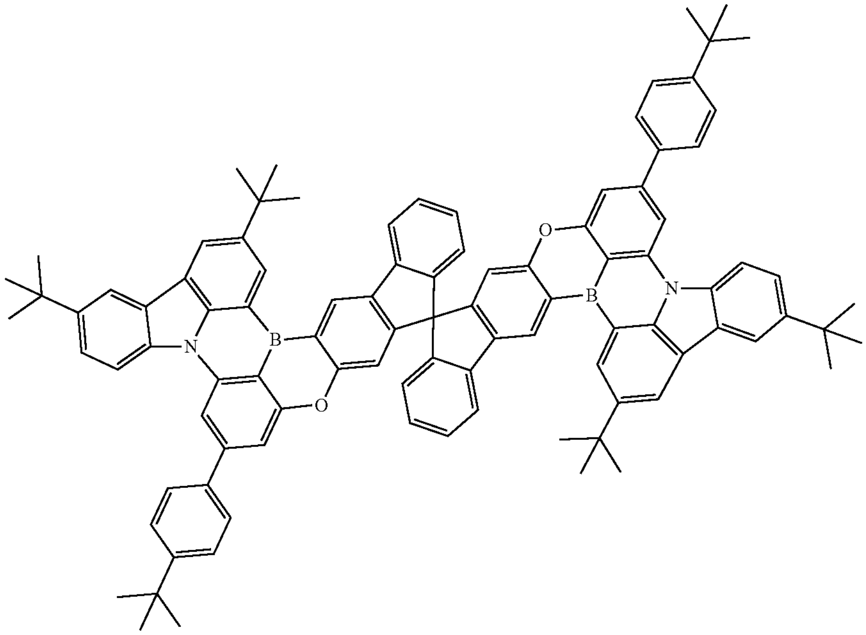
32
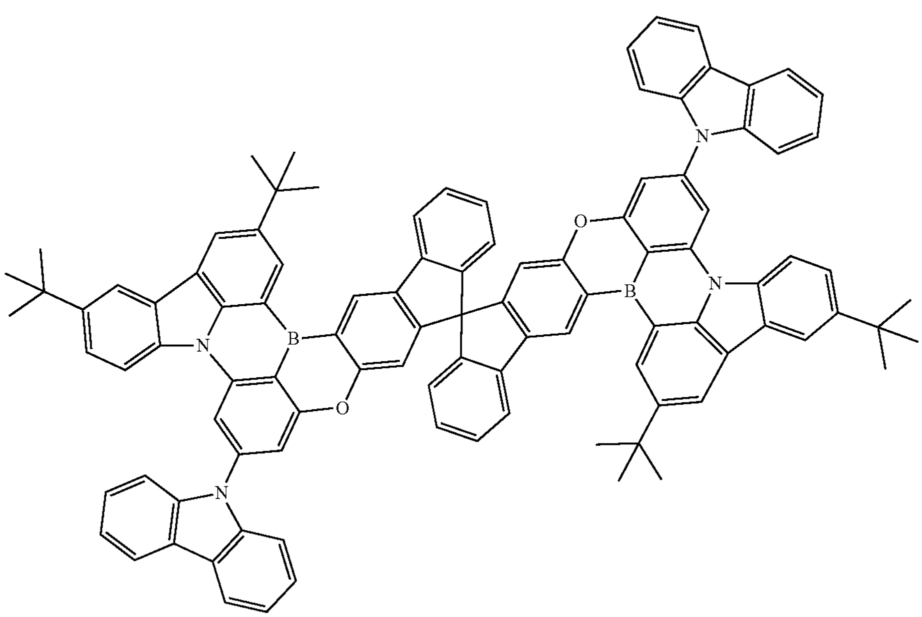

-continued
33
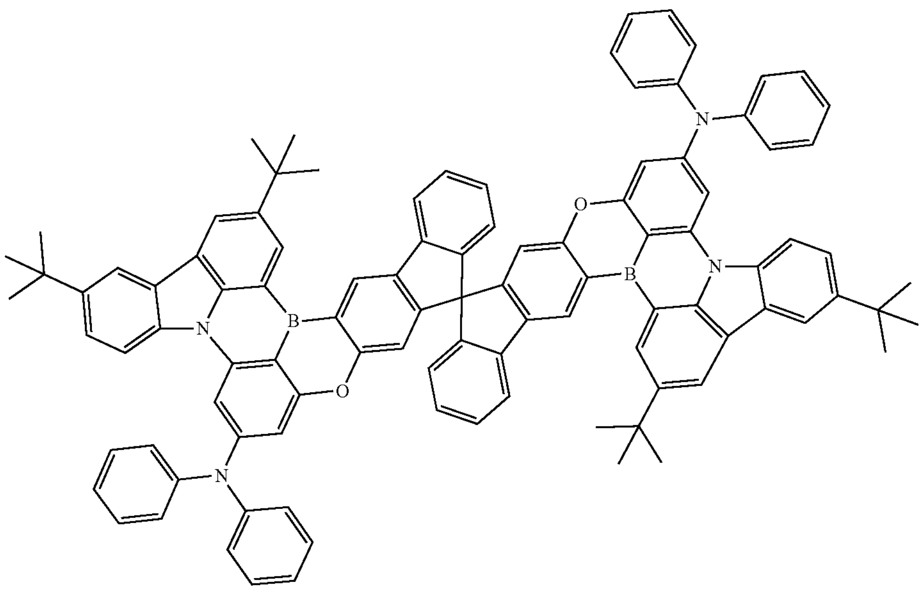
34
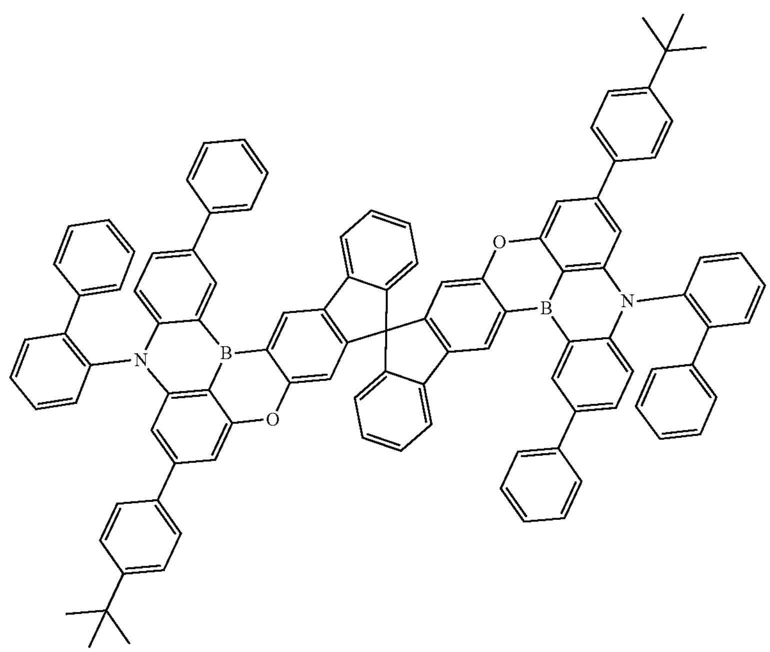

-continued
35
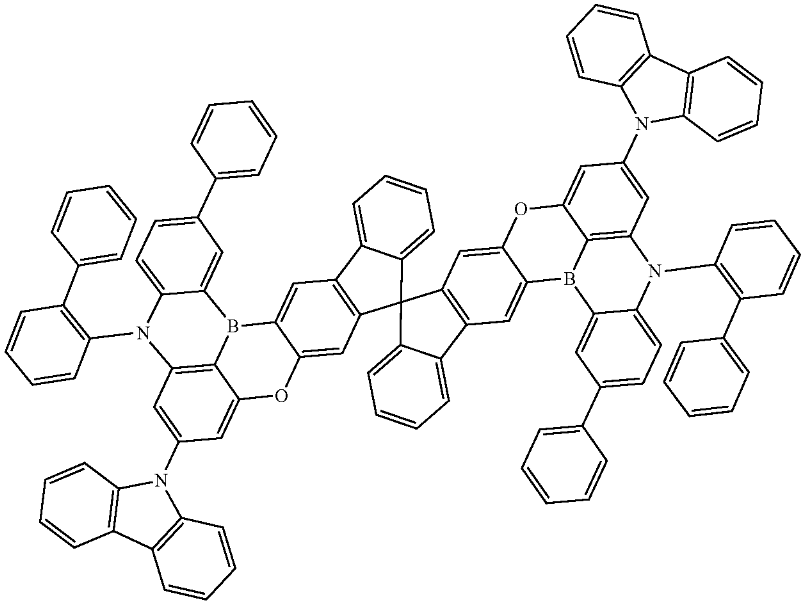
36
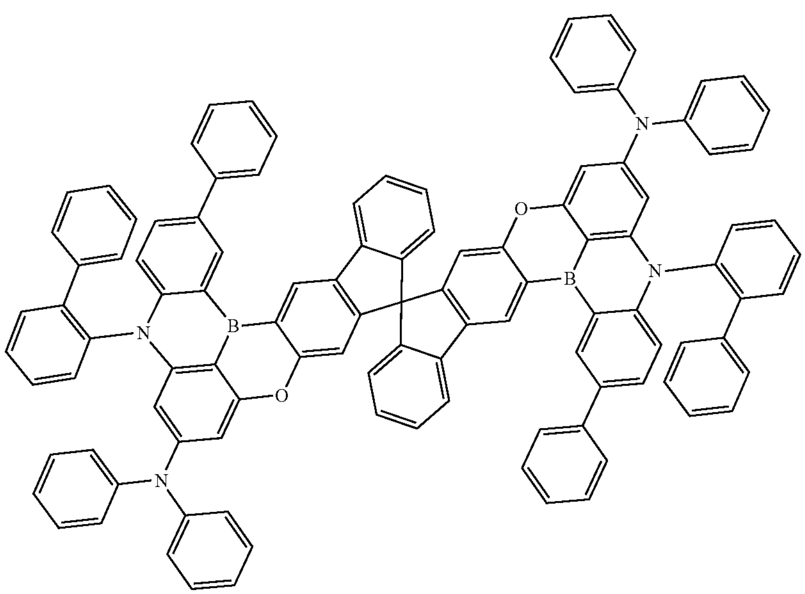

-continued
37
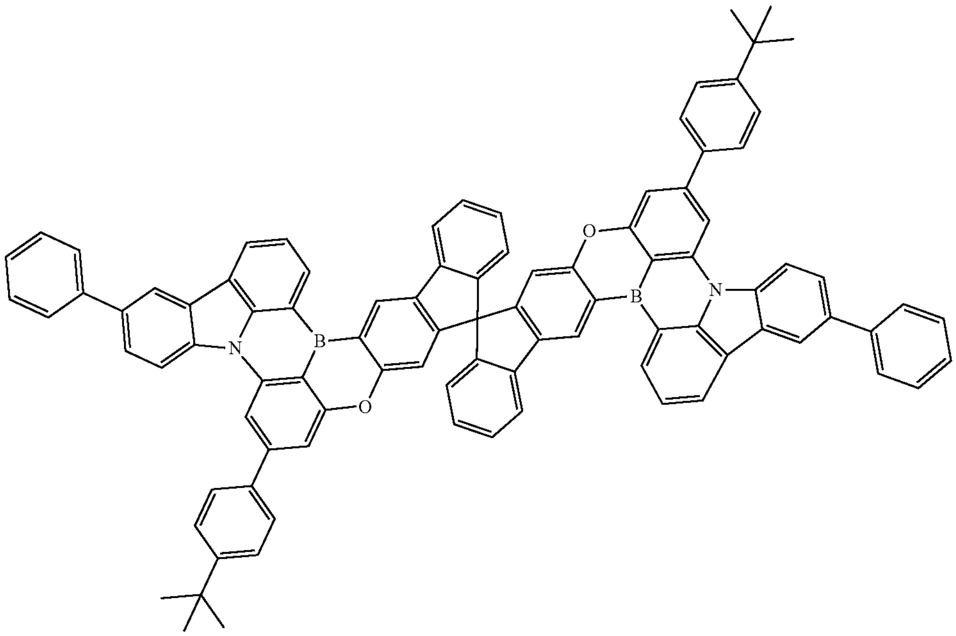
38
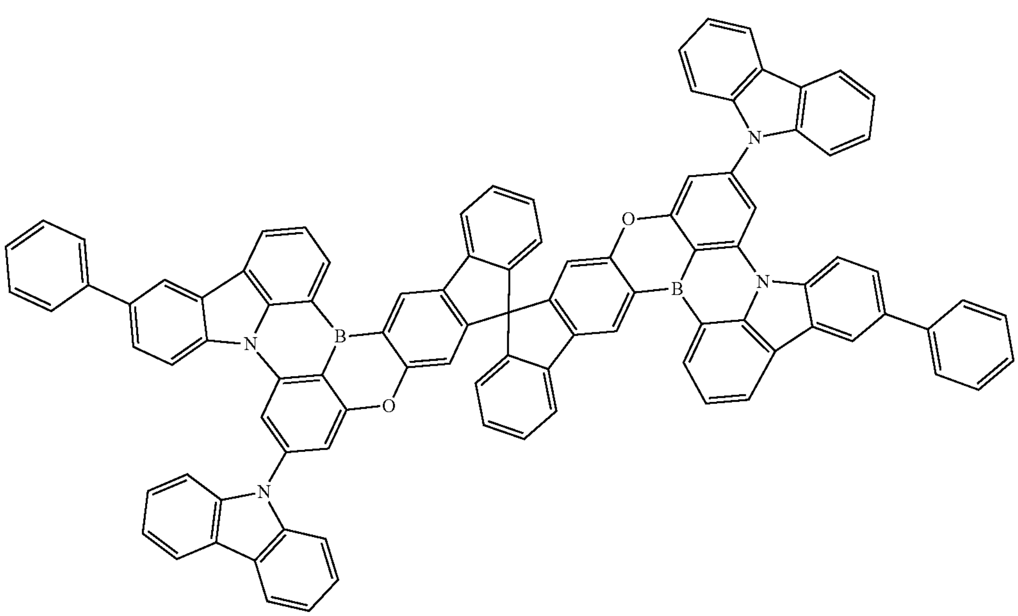

-continued
39
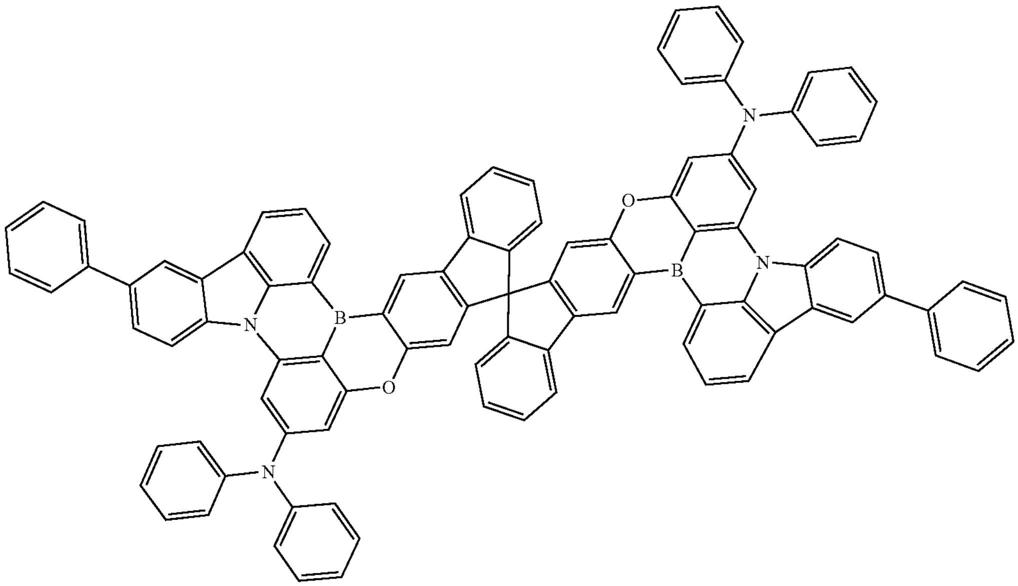
40
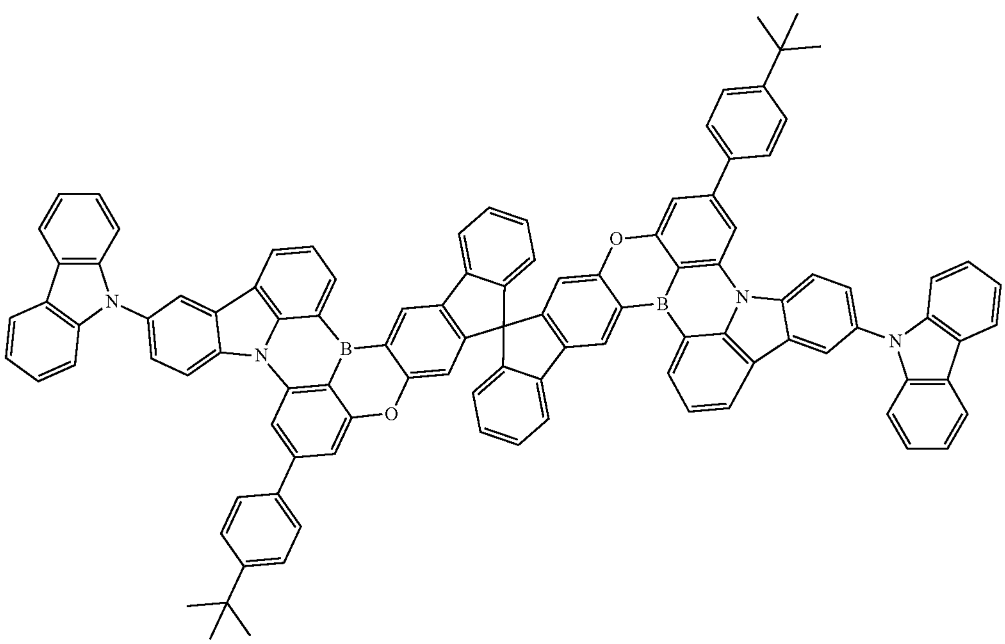

-continued
41
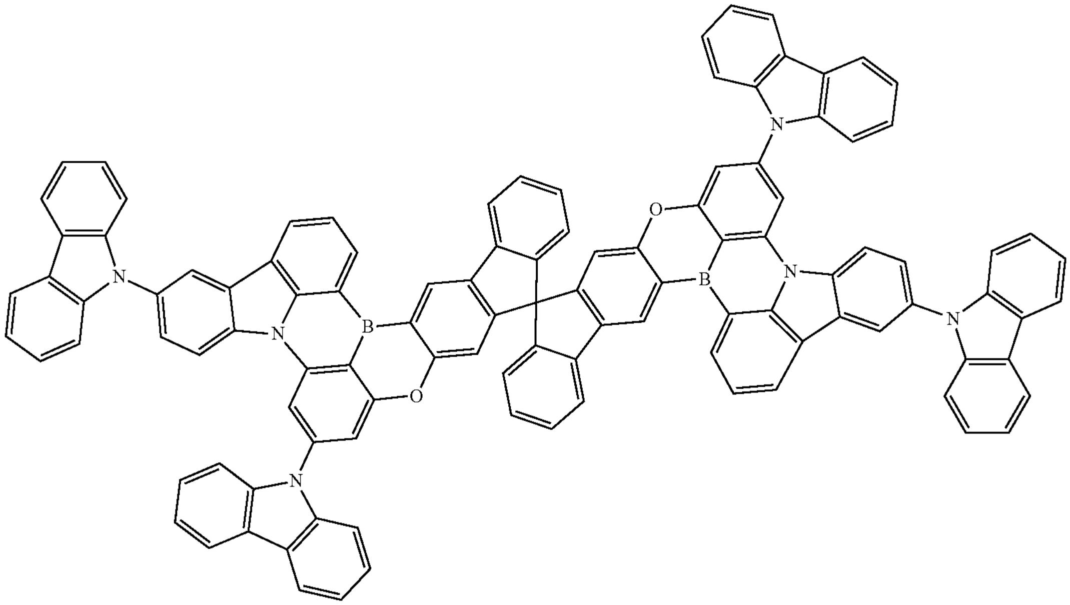
42
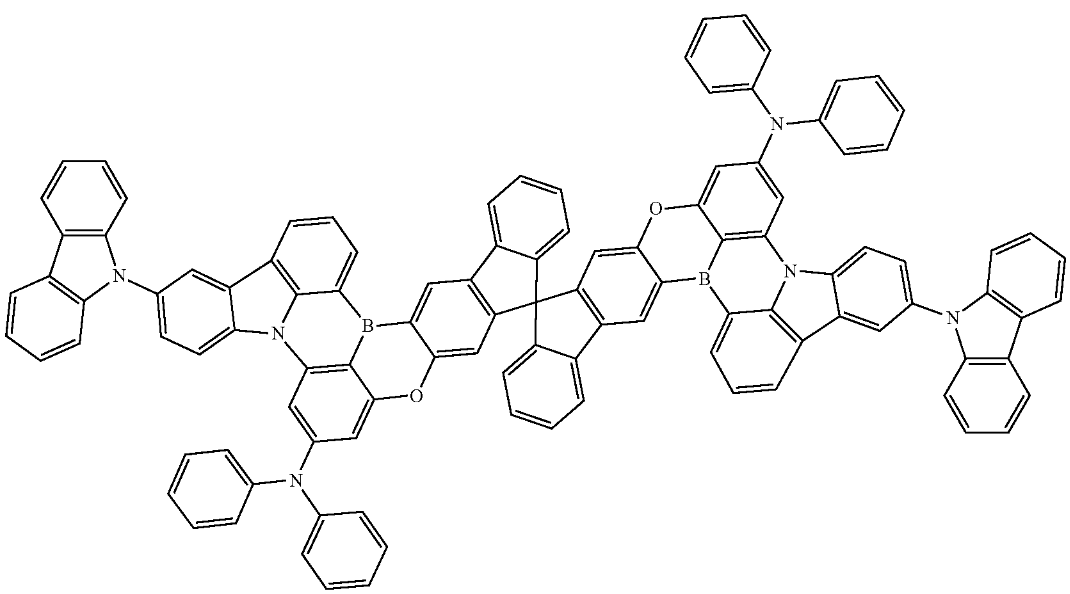

-continued
43
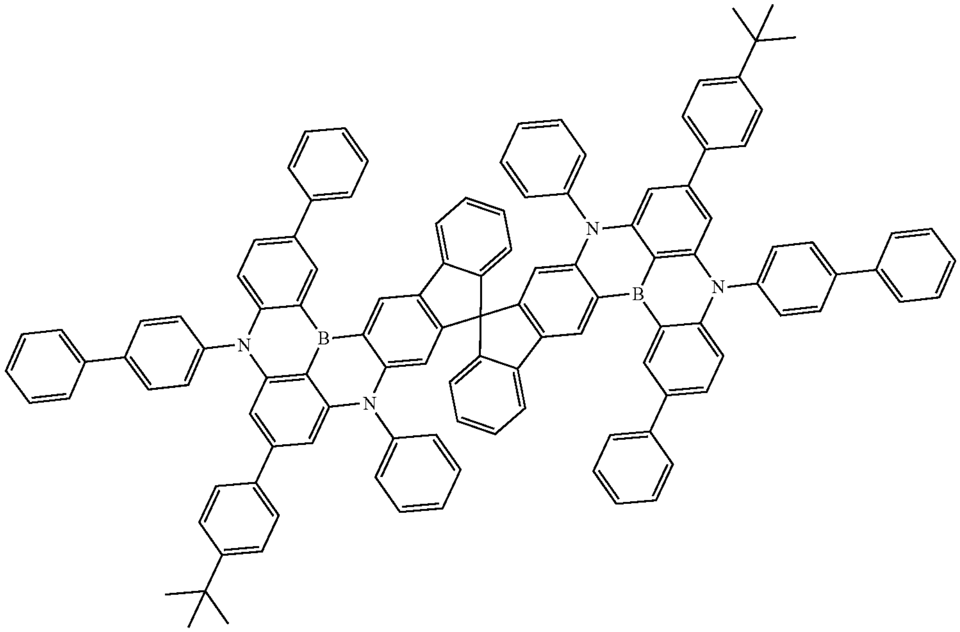
44
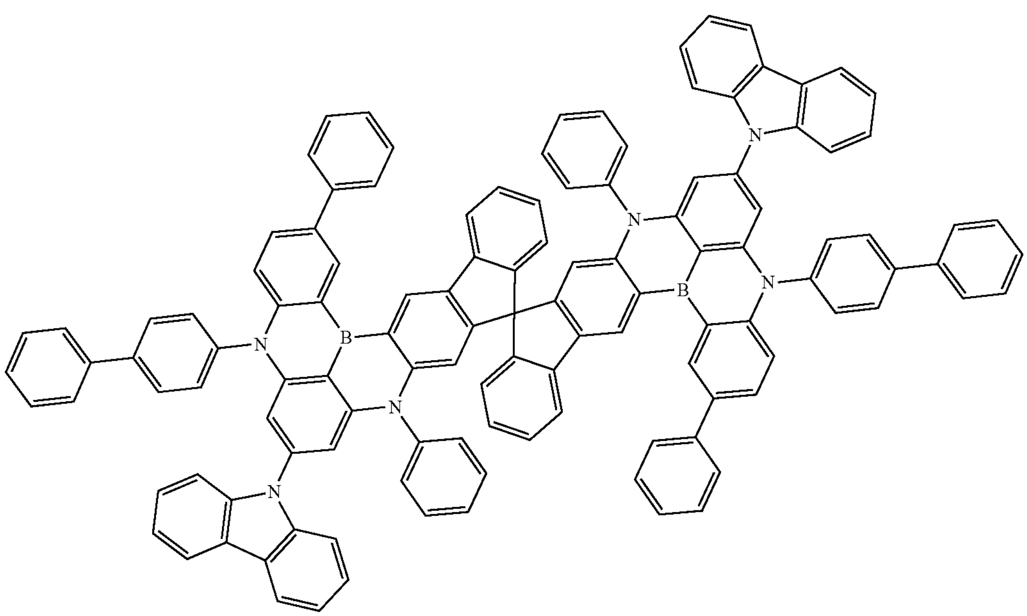

-continued
45
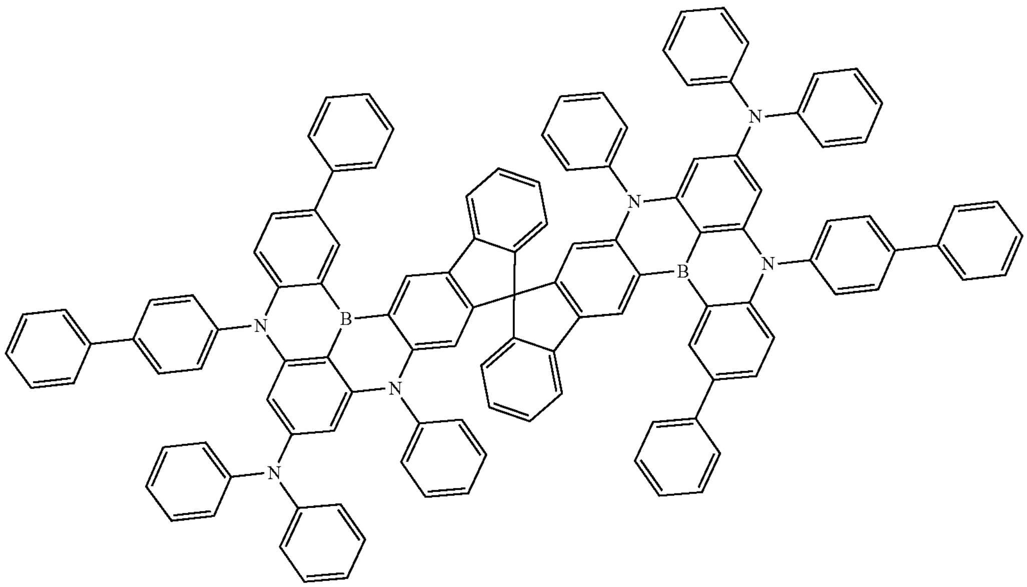
46
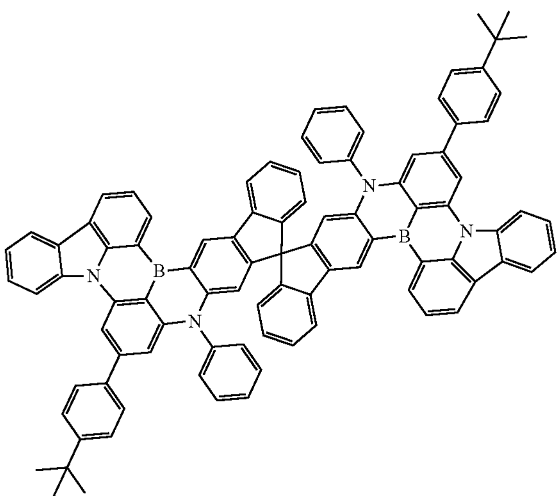
47
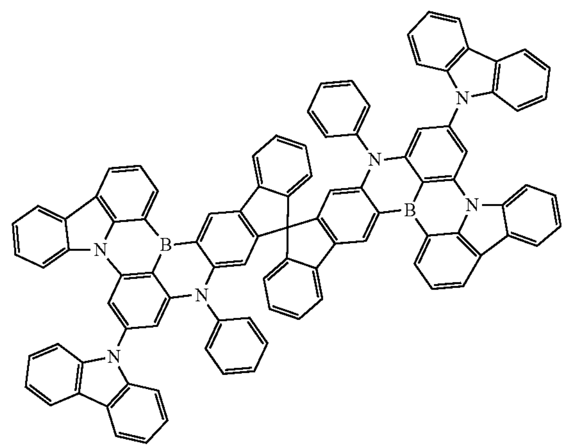
48
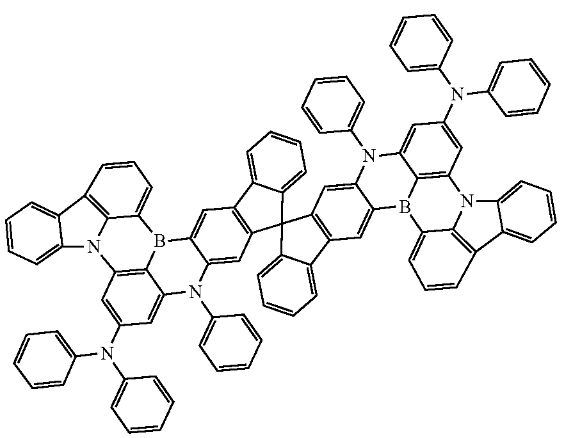

-continued
49
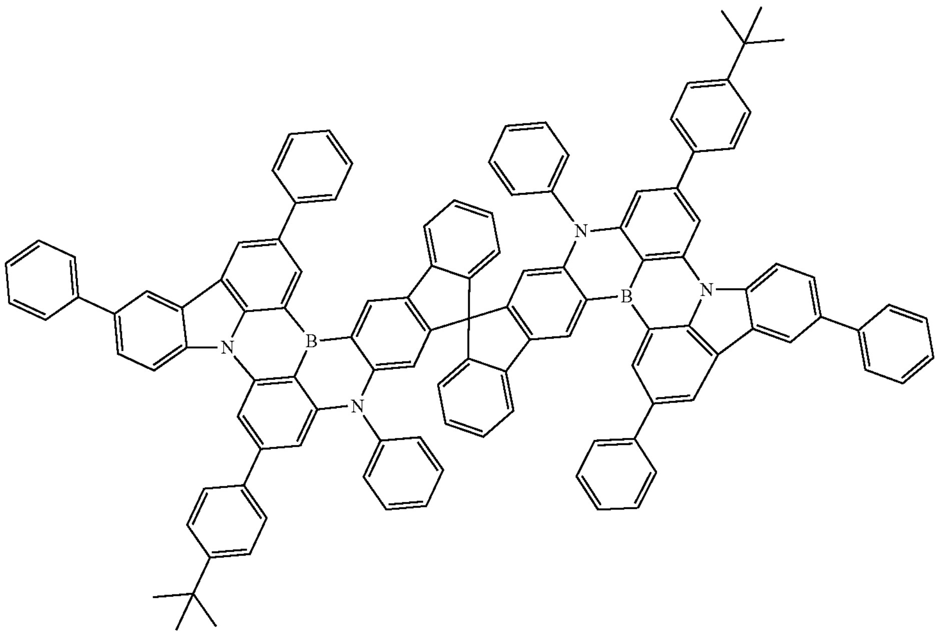
50
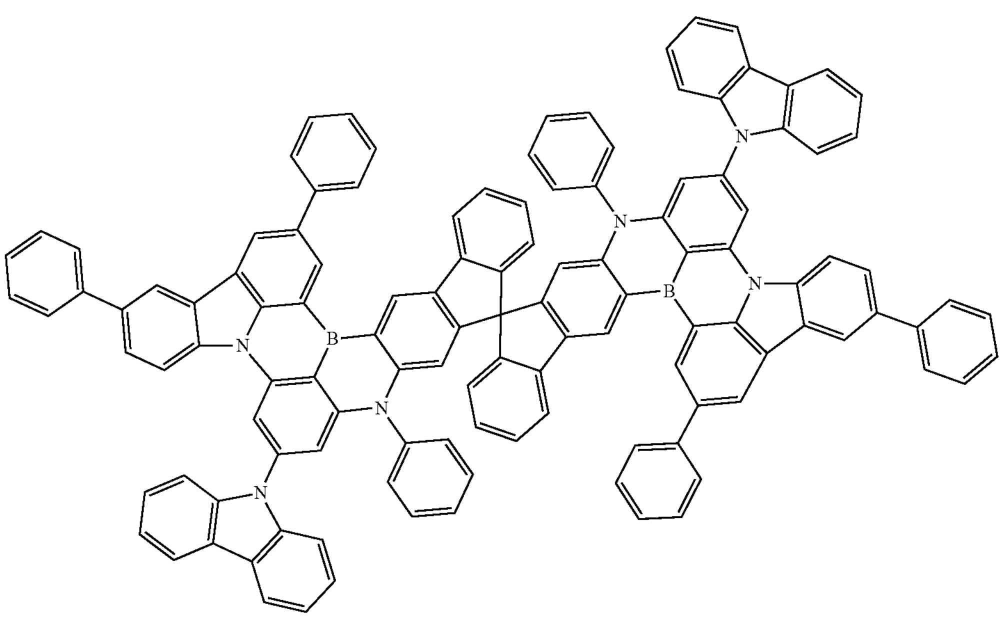

-continued
51
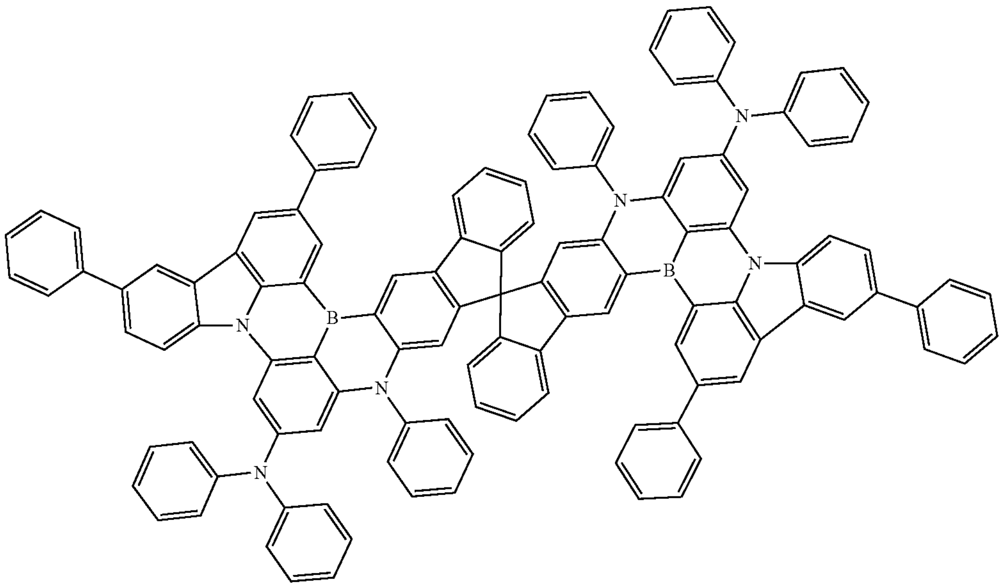
52
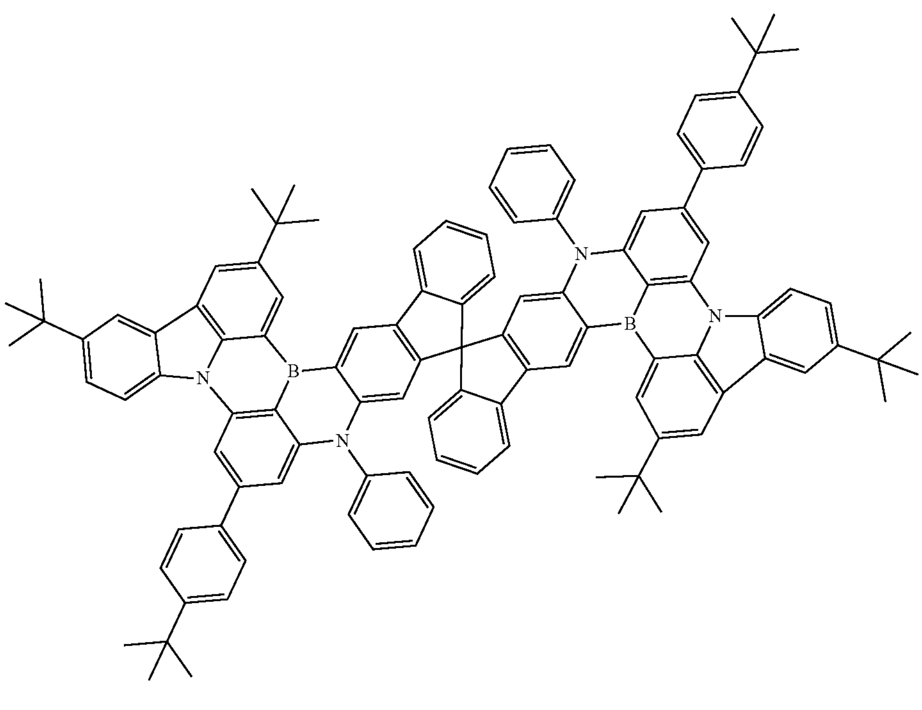

-continued
53
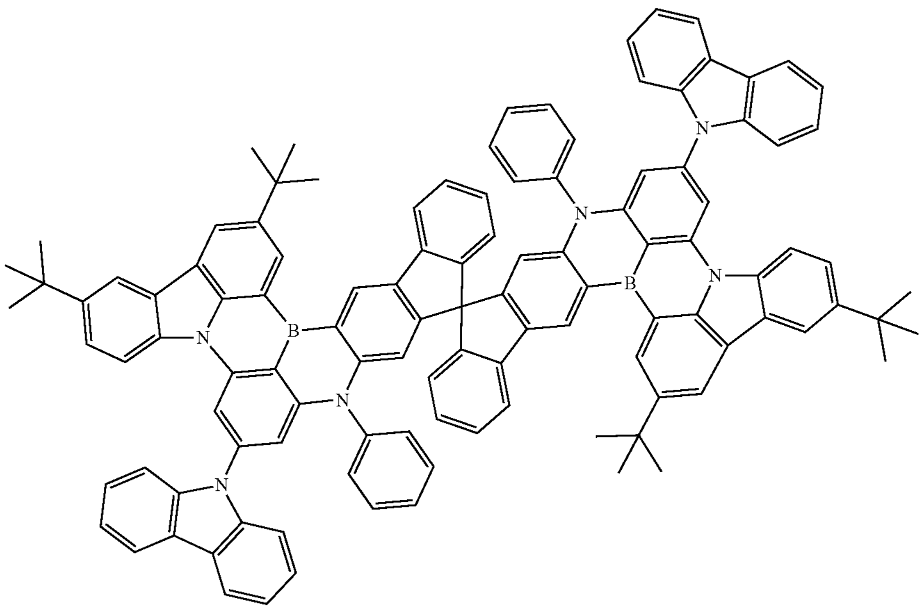
54
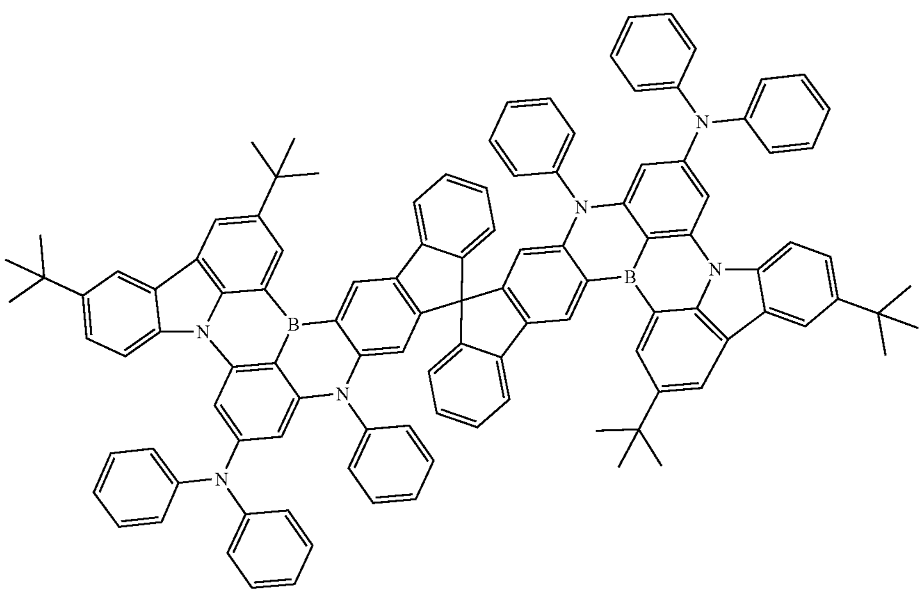

-continued
55
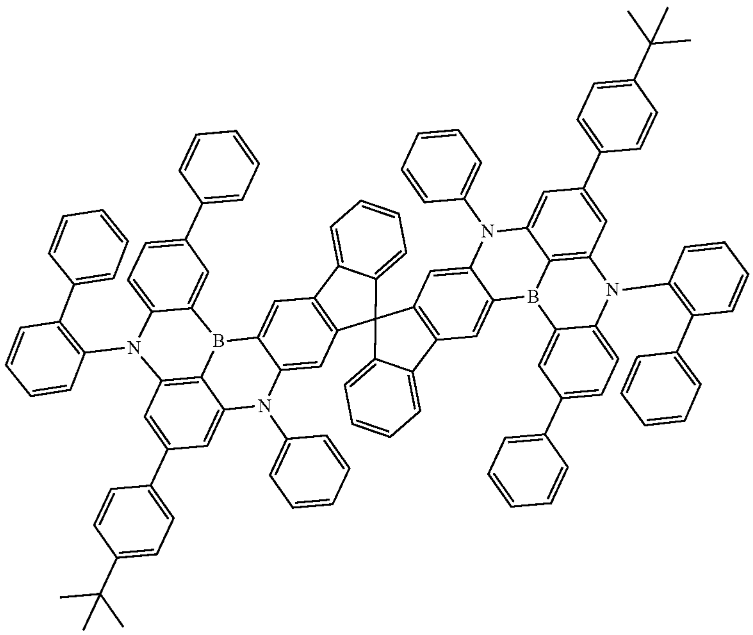
56
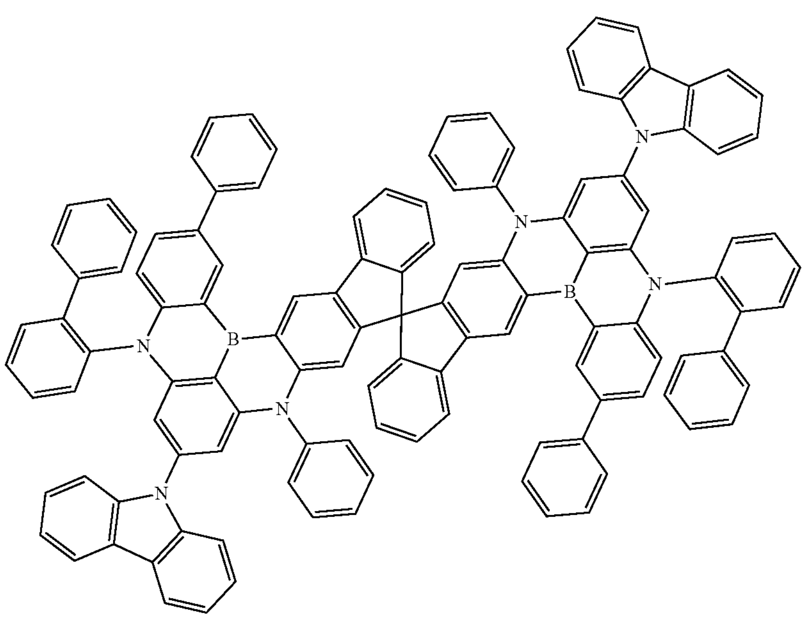

-continued
57
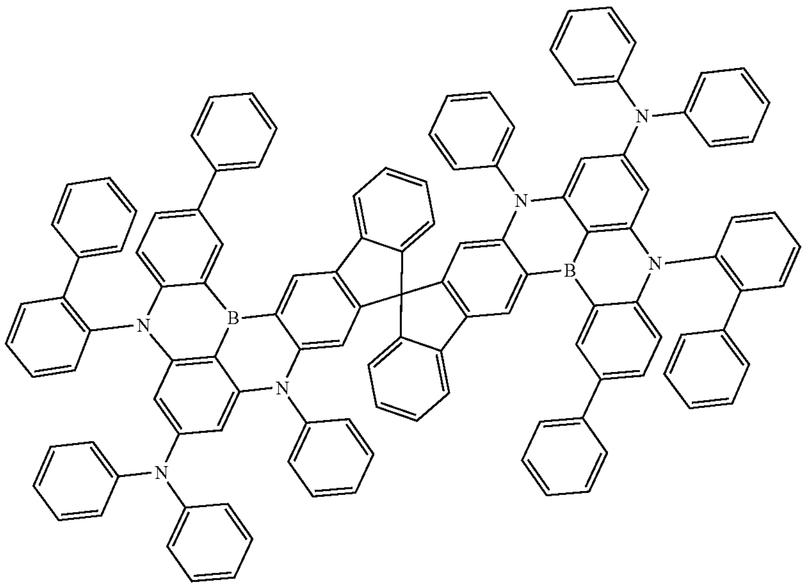
58
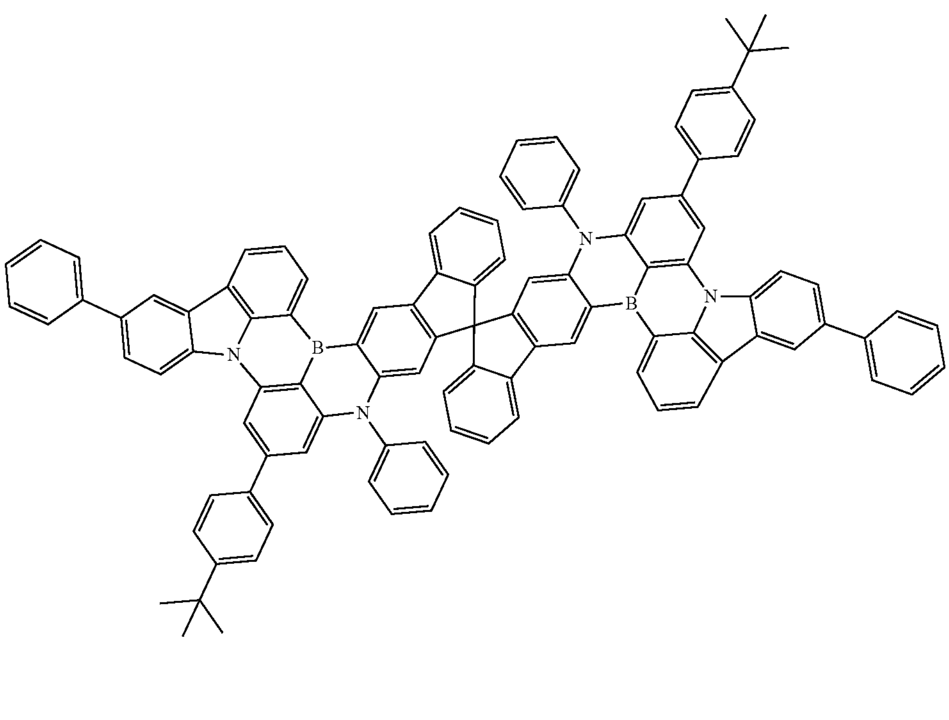

-continued
59
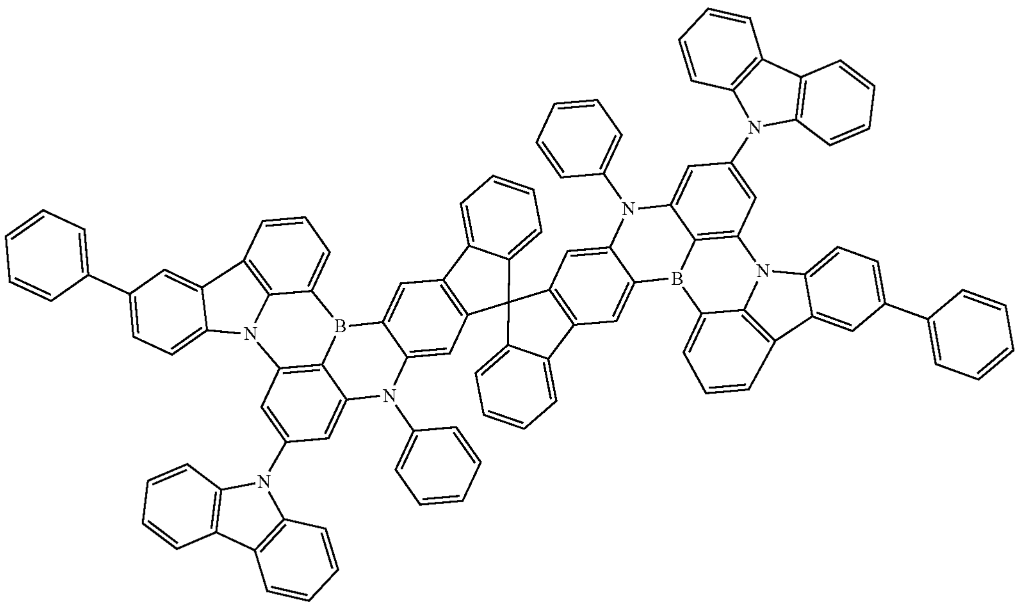
60
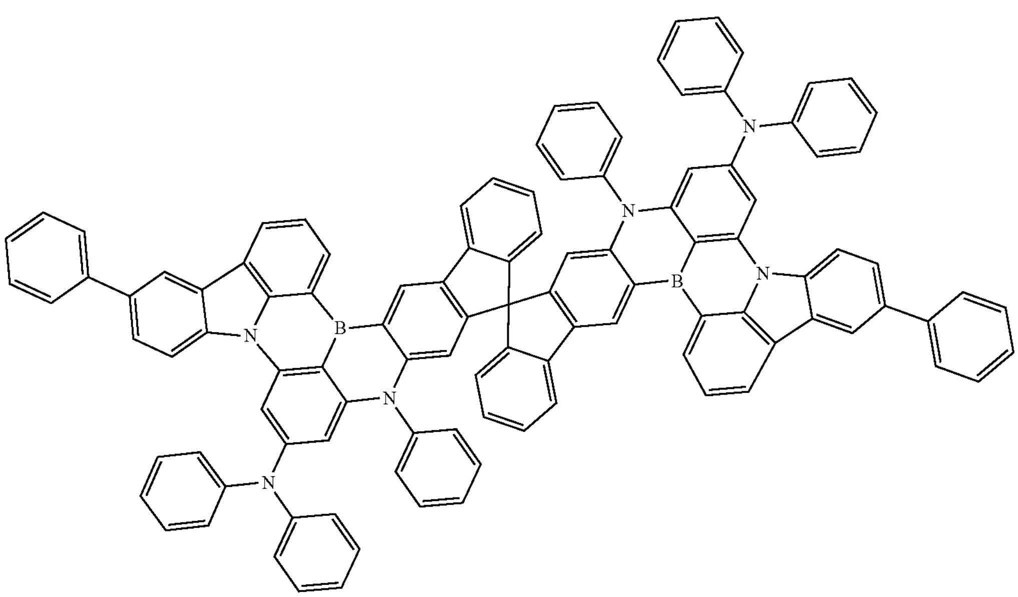

-continued
61
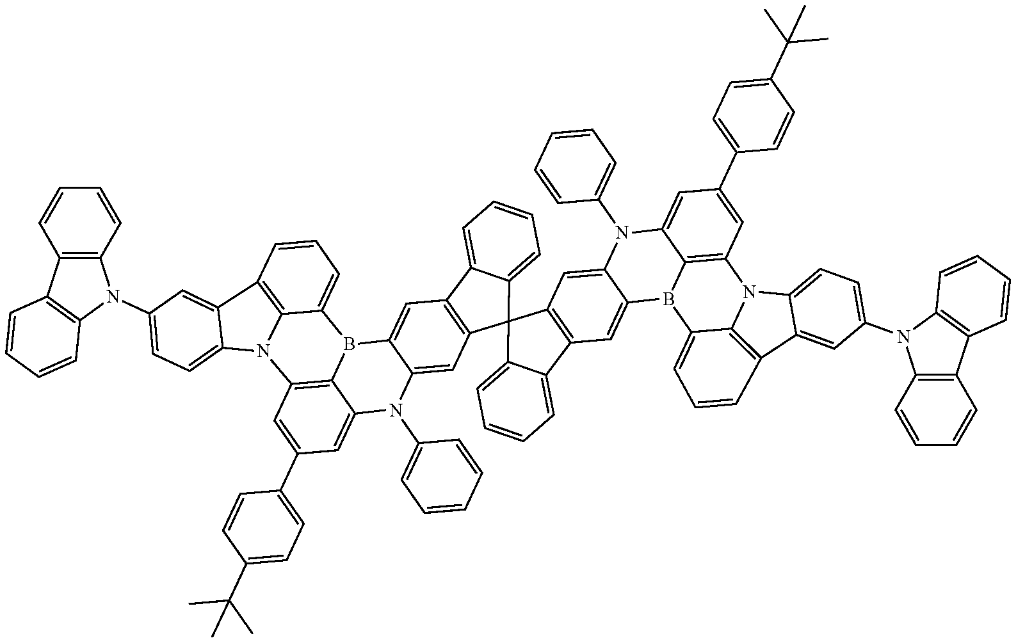
62
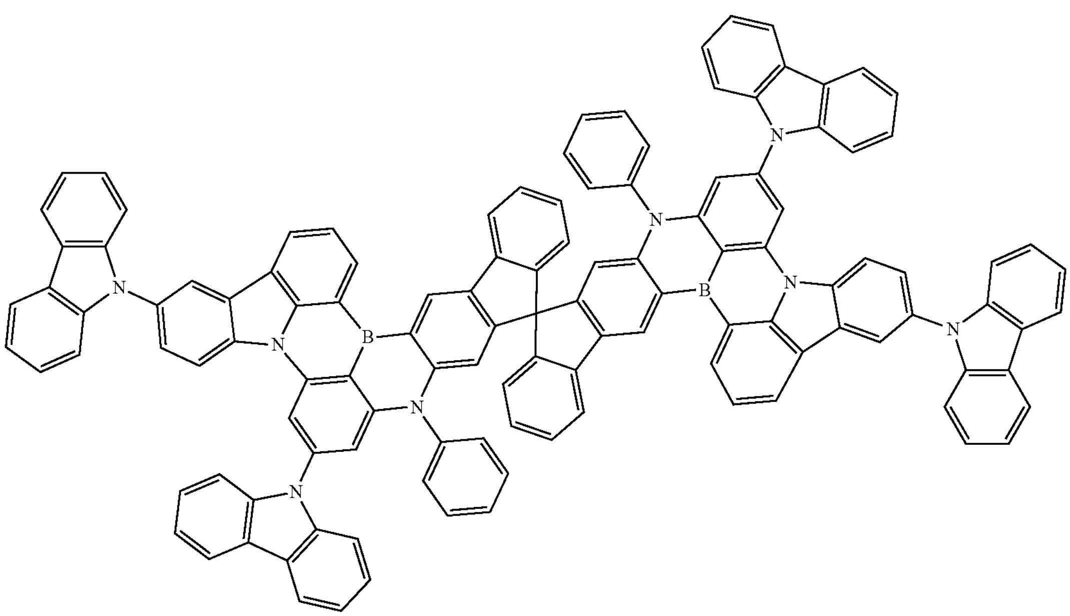

-continued
63
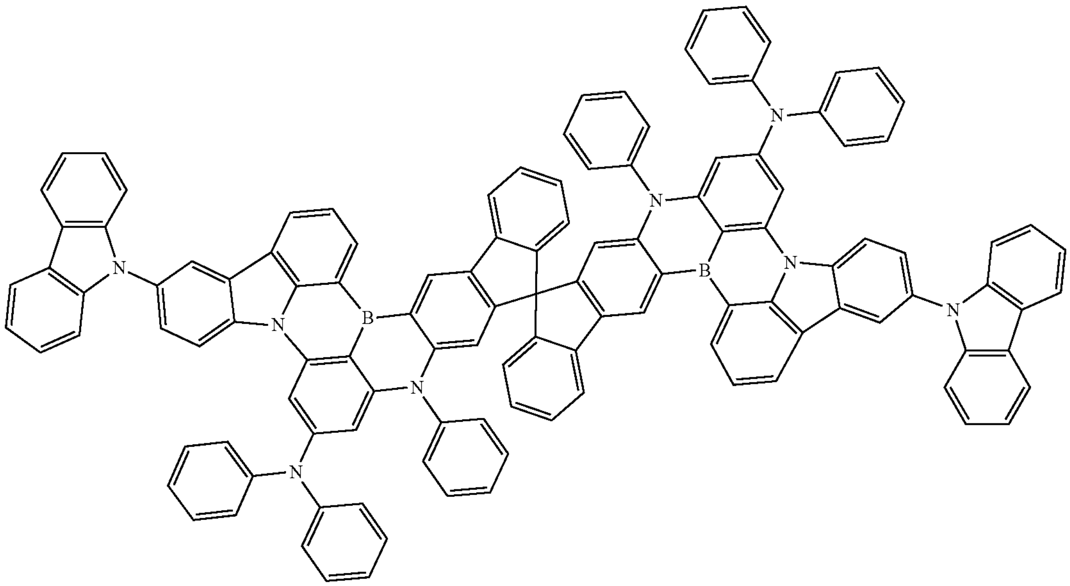
64
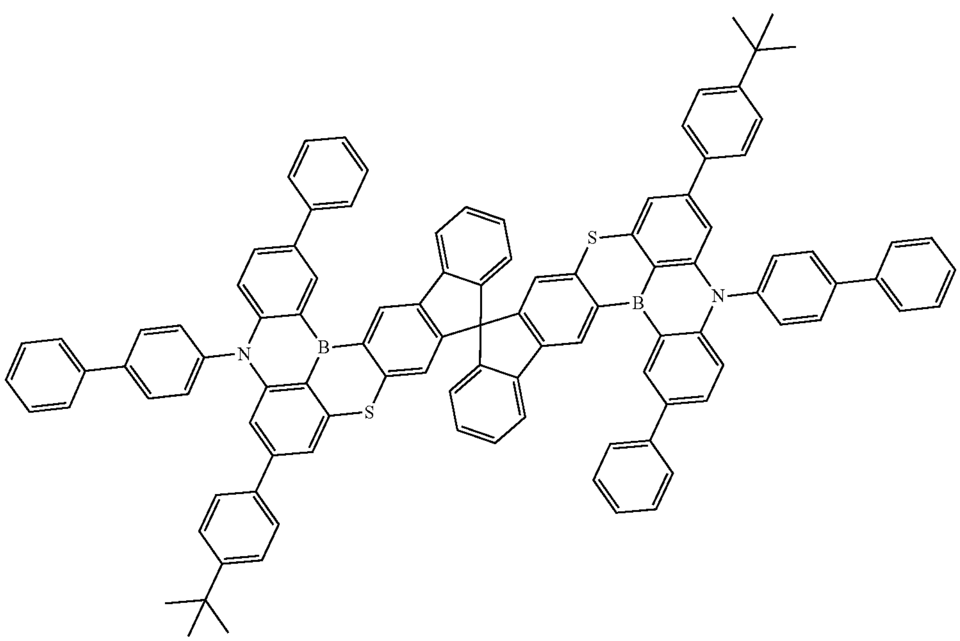

-continued
65
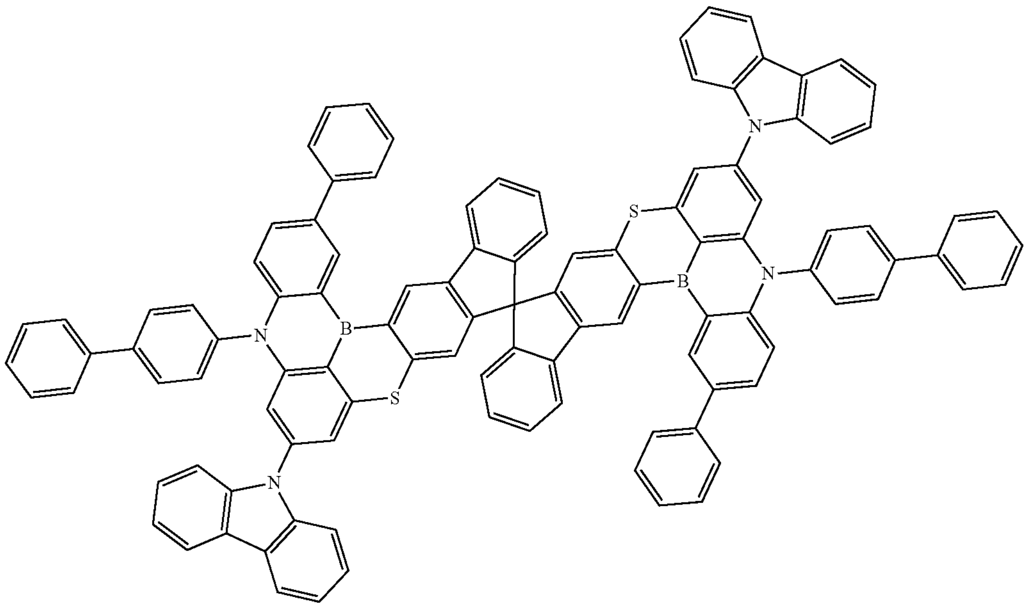
66
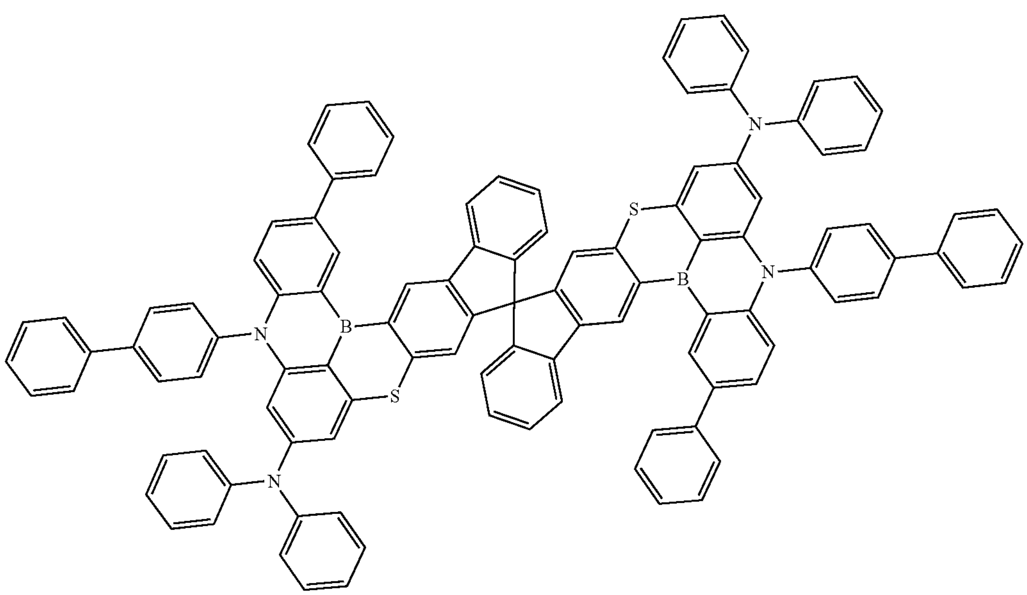

-continued
67
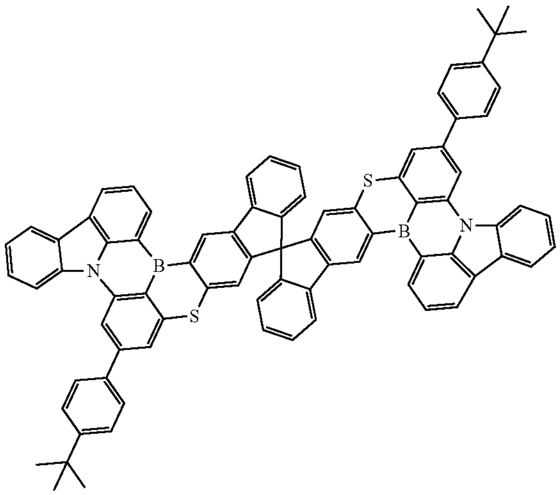
68
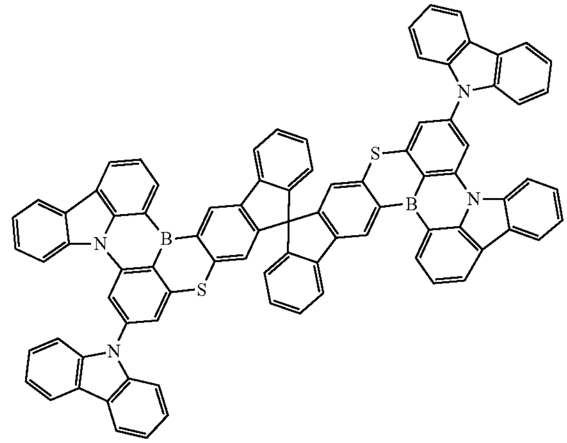
69
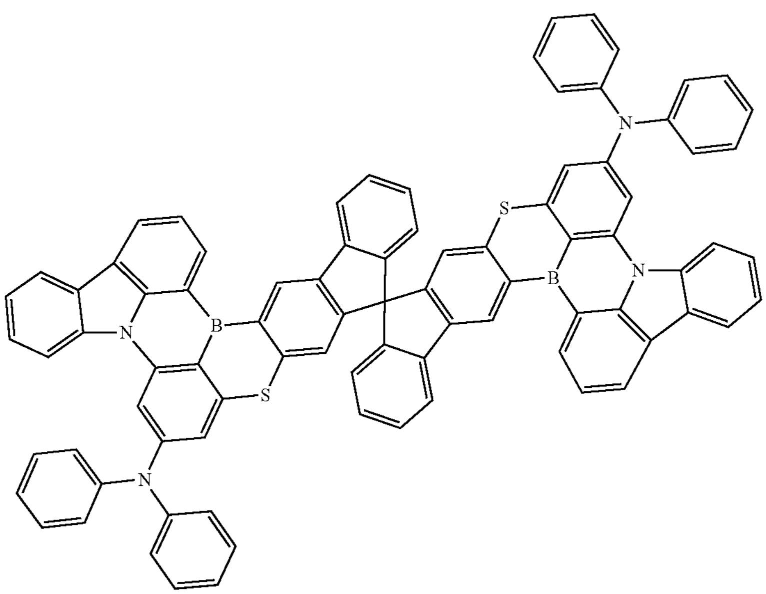

-continued
70
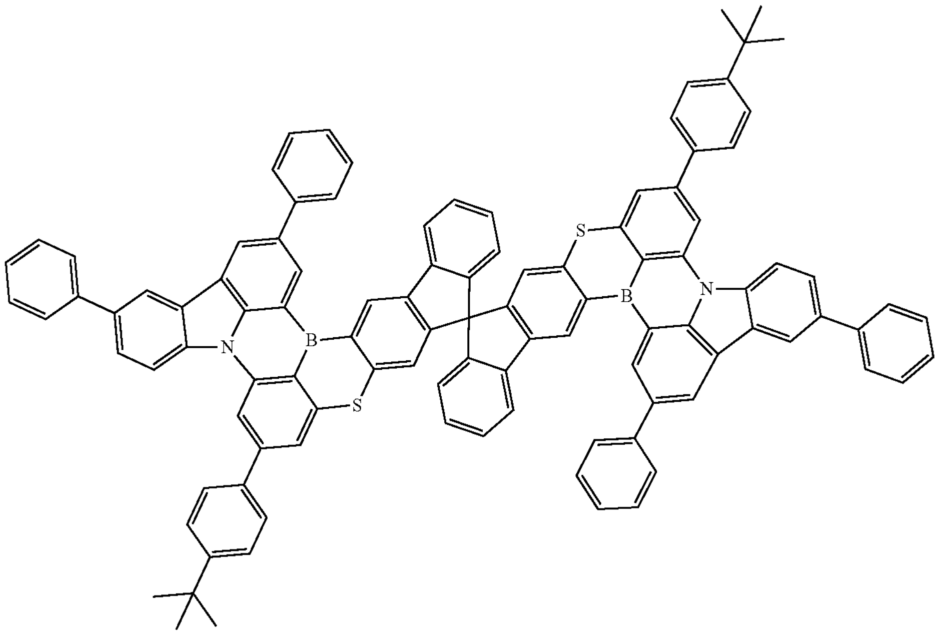
71
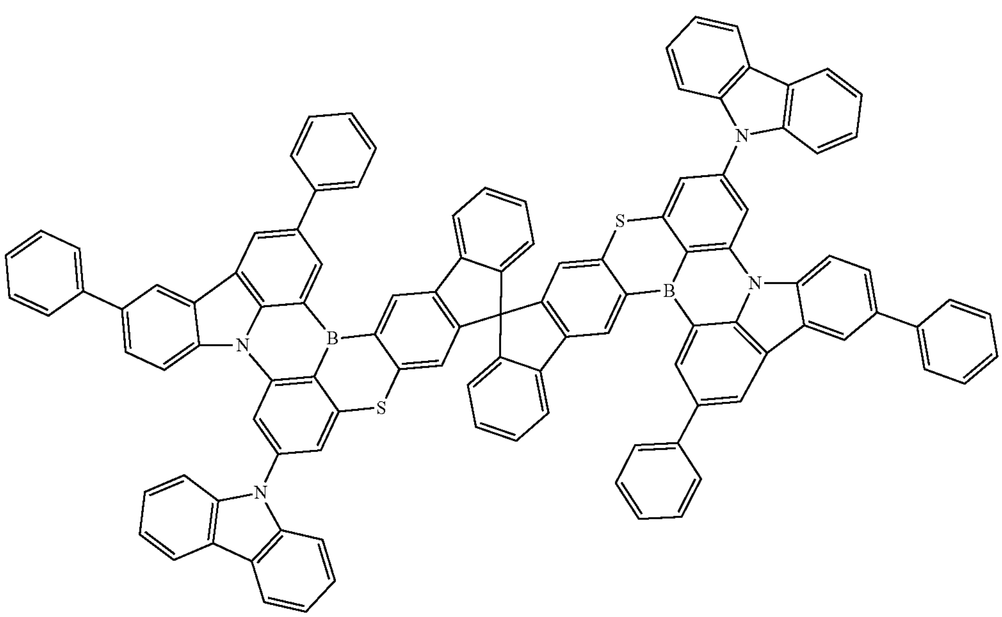

-continued
72
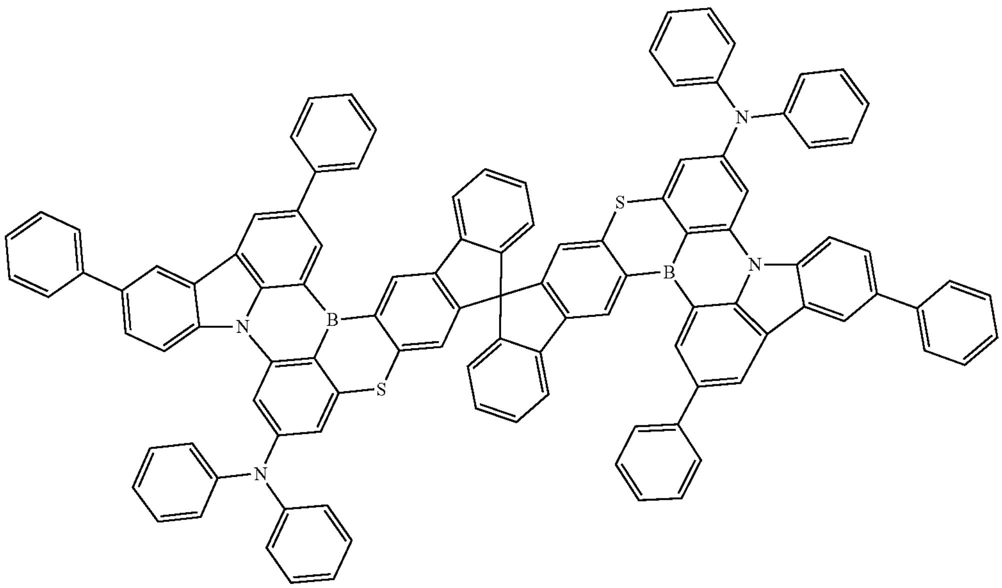
73
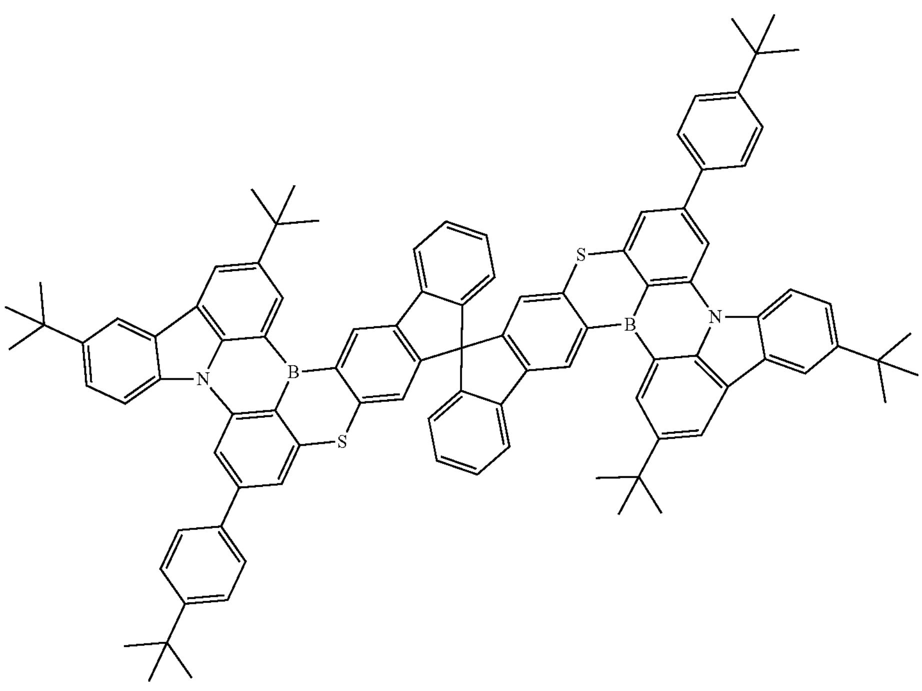

-continued
74
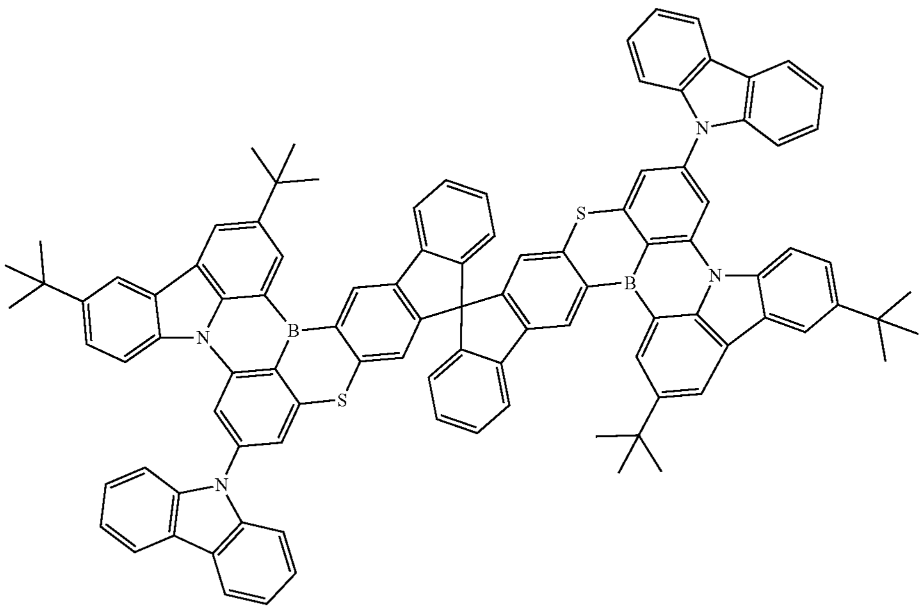
75
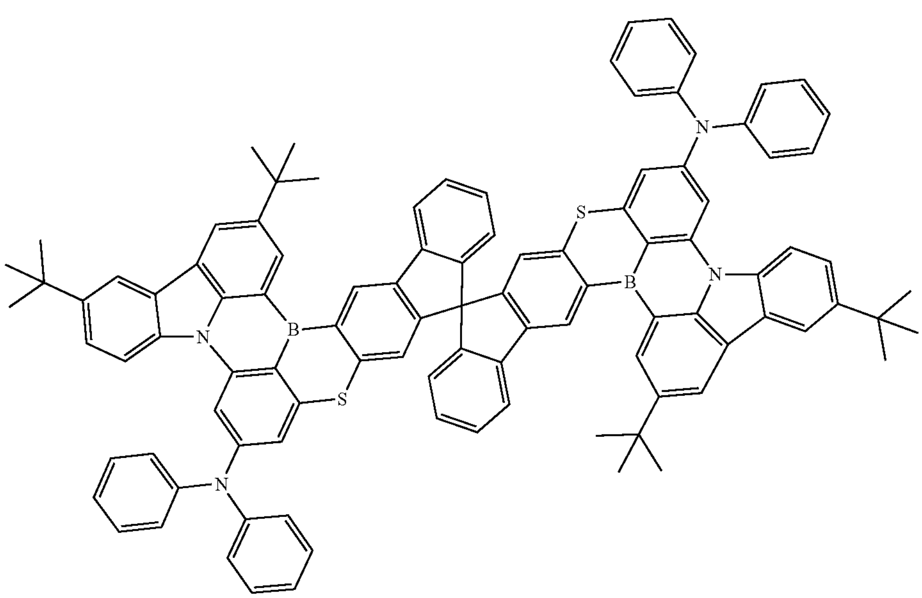

-continued
77
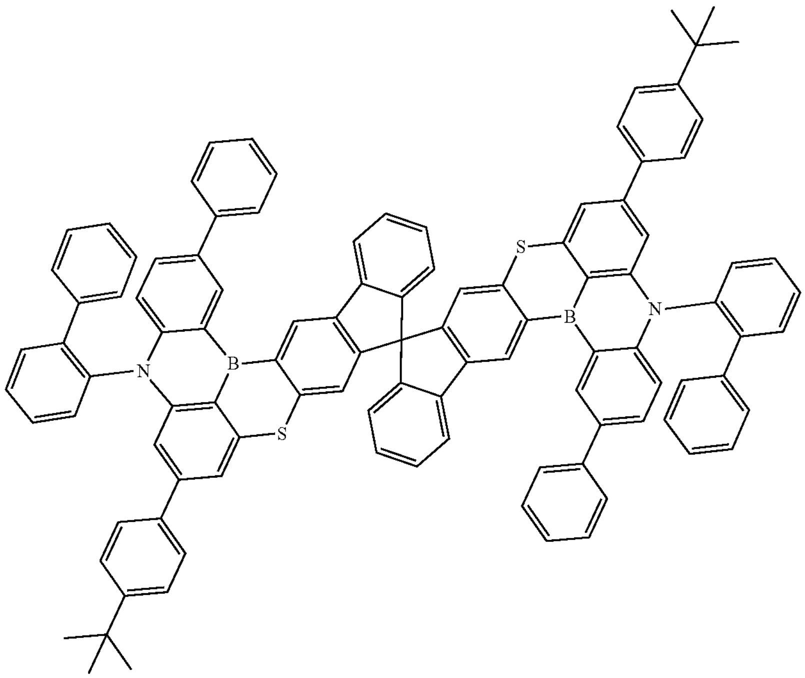
76
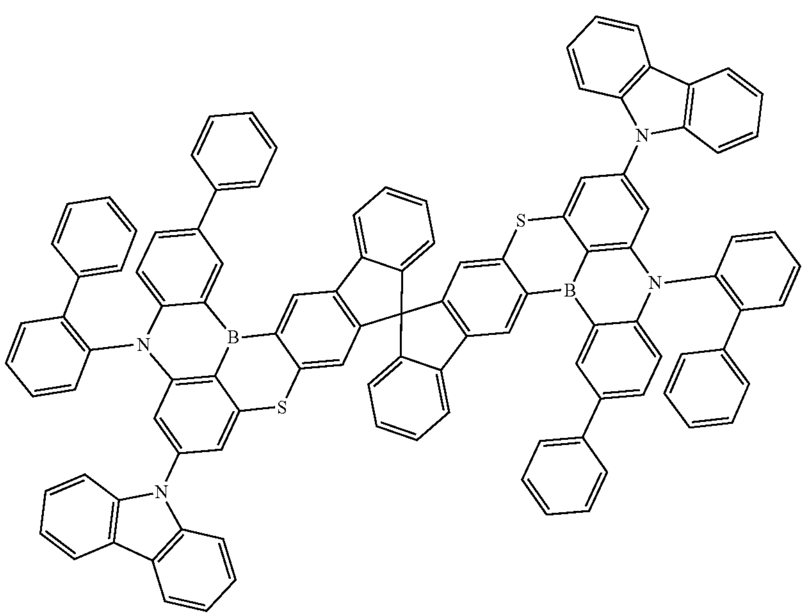
77

-continued
78
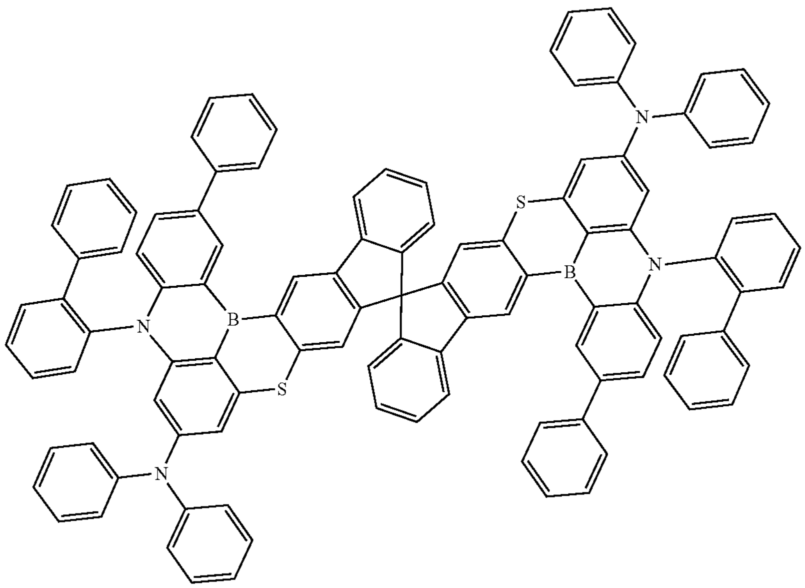
79
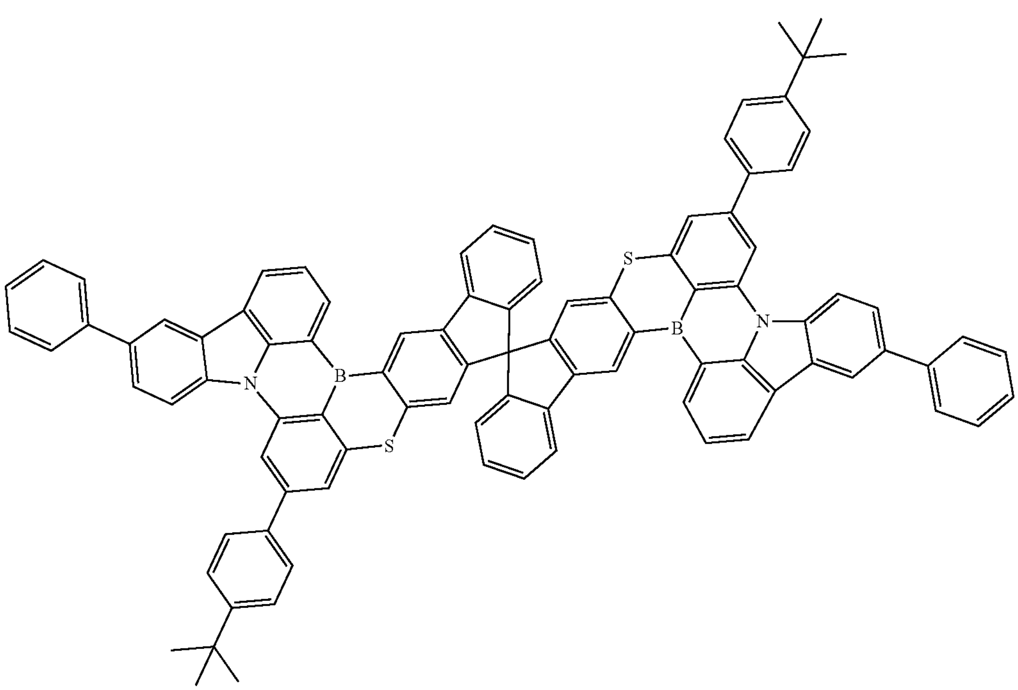

-continued
80
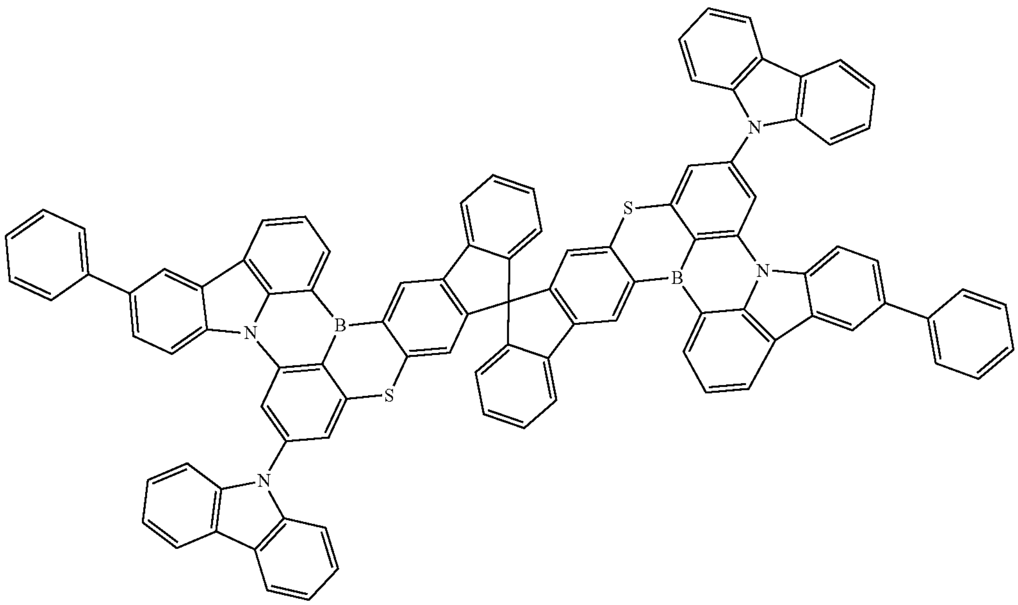
81
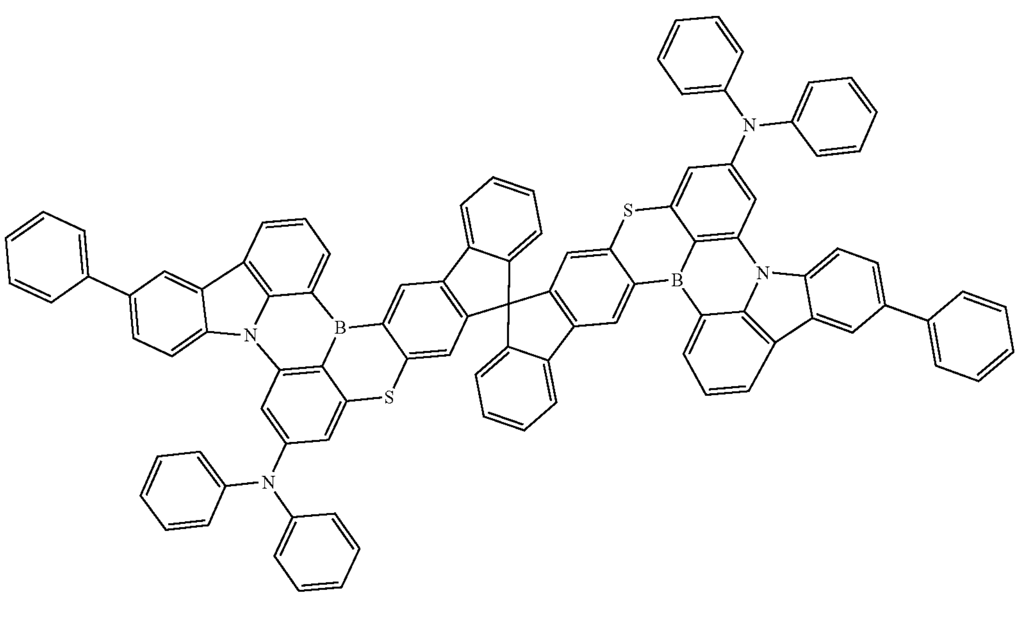

-continued
82
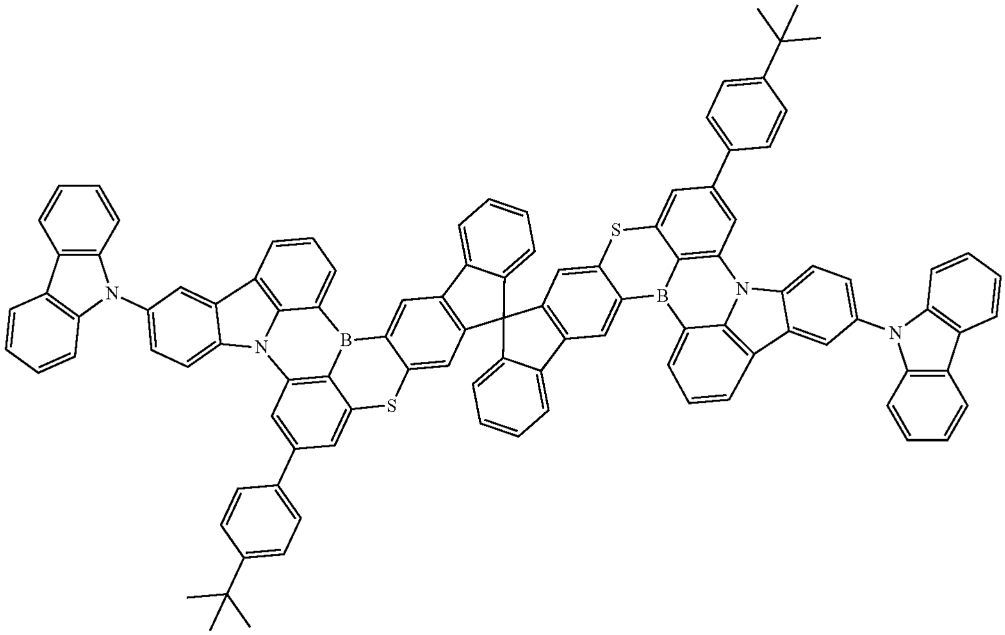
83
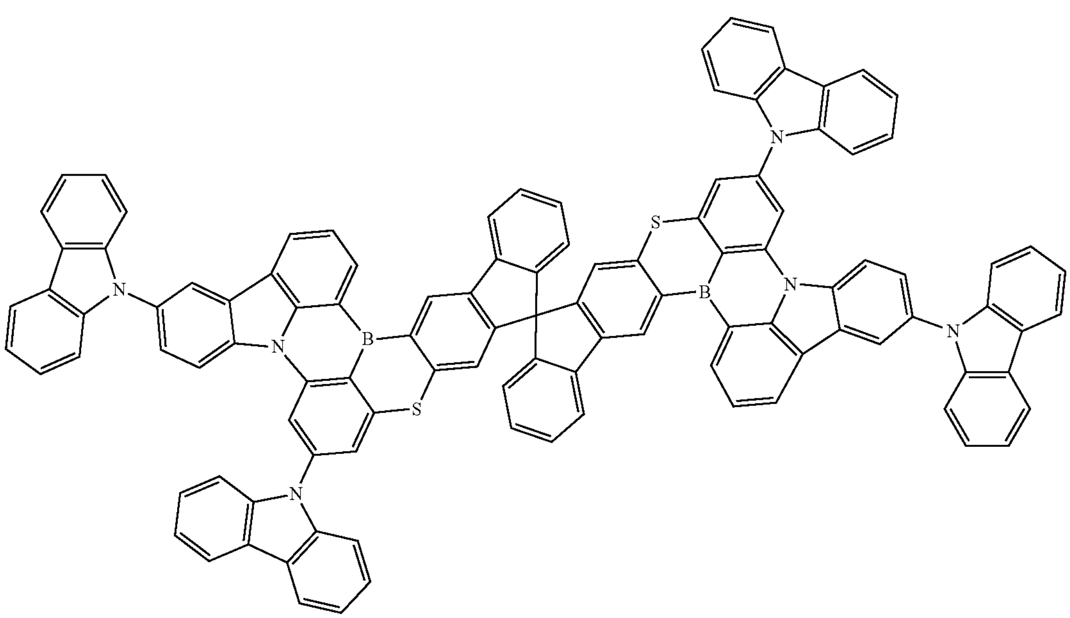

-continued

84

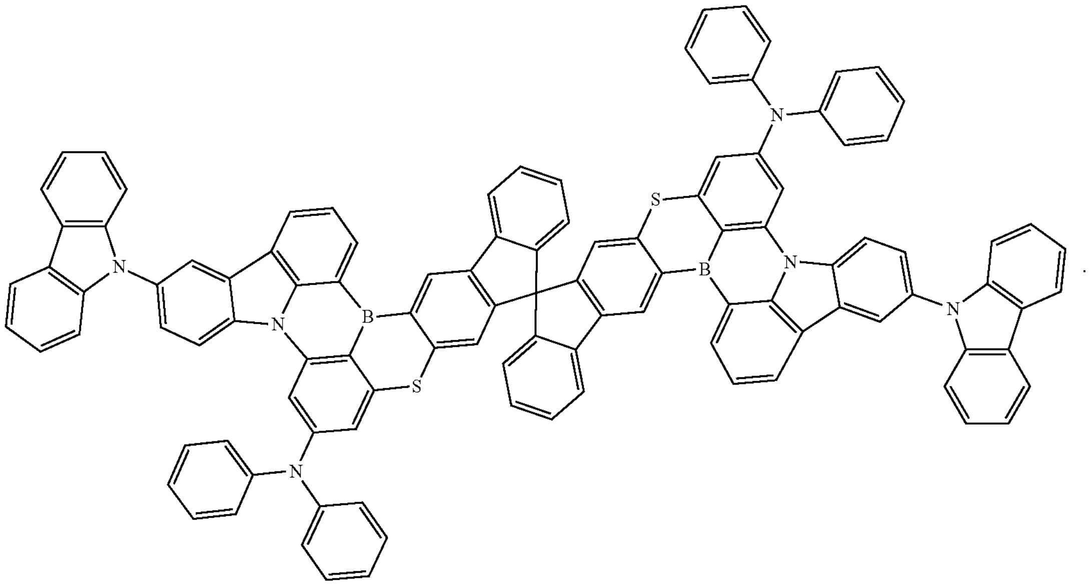

15. A light emitting diode comprising:

a first electrode;

a hole transport region on the first electrode and comprising Compound G;

a second electrode on the first electrode; and at least one functional layer between the first electrode and the second electrode, wherein the at least one functional layer comprises a condensed polycyclic compound represented by Formula 1 and the Compound G:

Compound G

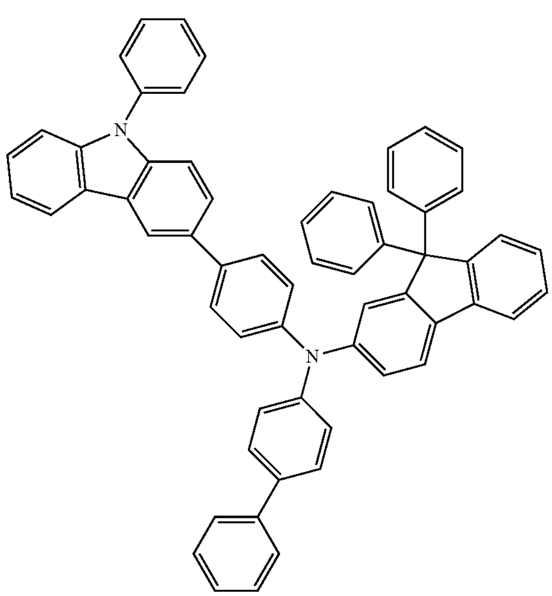

-continued

Formula 1

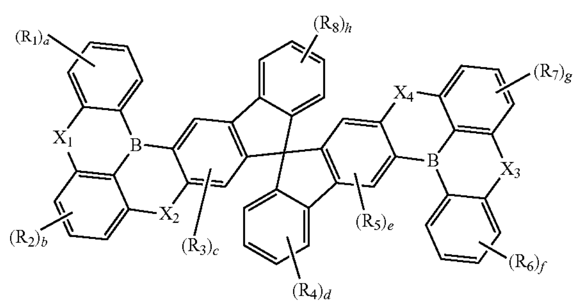

wherein in Formula 1, $X_1$, $X_2$, $X_3$, and $X_4$ are each independently $NR_X$, O, S, or Se, $R_x$, and $R_1$ to $R_8$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, a is an integer of 0 to 4, b is an integer of 0 to 3, c is an integer of 0 to 2, d is an integer of 0 to 4, e is an integer of 0 to 2, f is an integer of 0 to 4, g is an integer of 0 to 3, and h is an integer of 0 to 4.

16. The light emitting diode of claim 15, wherein the condensed polycyclic compound represented by Formula 1 is represented by any one of Formulae 2-1 to 2-3:

-continued

Formula 2-1

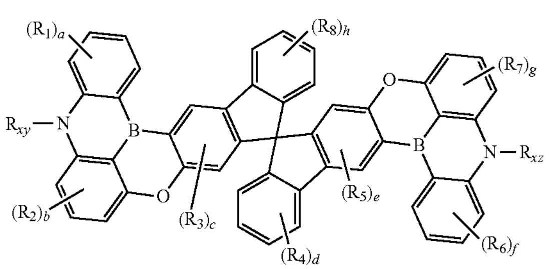

Formula 2-2

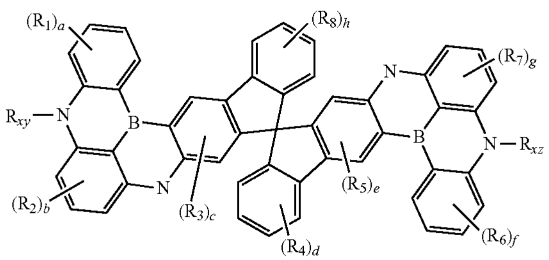

Formula 2-3

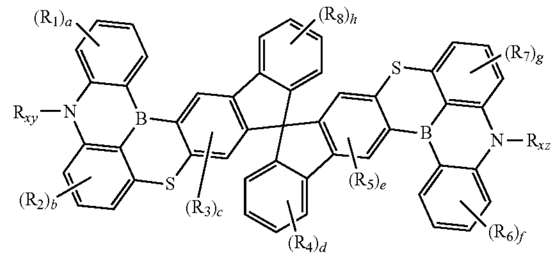

wherein in Formulae 2-1 to 2-3, $R_{xy}$ and $R_{xz}$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, and $R_1$ to $R_8$, and a to h are the same as defined in Formula 1.

17. The light emitting diode of claim 15, wherein the condensed polycyclic compound represented by Formula 1 is represented by Formula 3-1 or Formula 3-2:

Formula 3-1

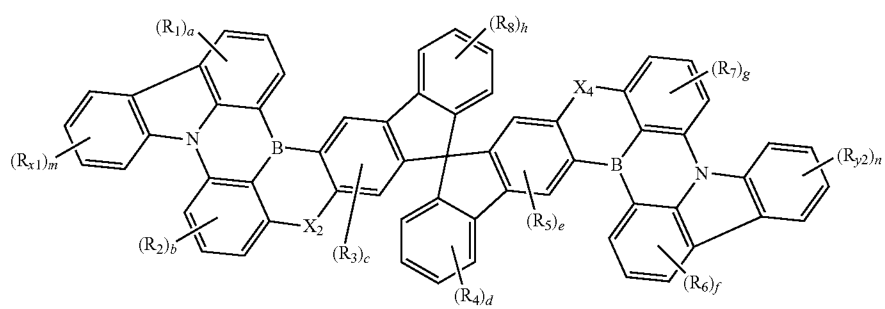

Formula 3-2

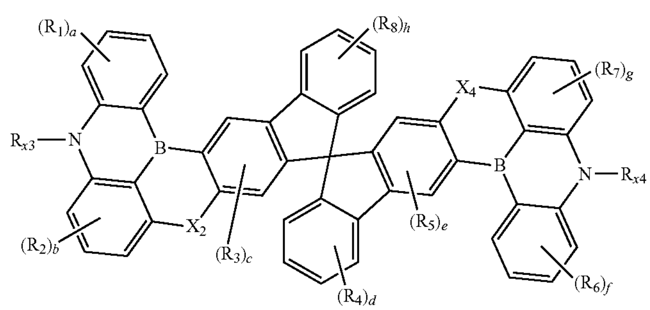

wherein in Formulae 3-1 and 3-2, $R_{X1}$ and $R_{X2}$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, and/or bonded to an adjacent group to form a ring, $R_{X3}$ and $R_{X4}$ are each independently a hydrogen atom, a deuterium atom, a halogen atom, a cyano group, a substituted or unsubstituted silyl group, a substituted or unsubstituted amine group, a substituted or unsubstituted alkyl group having 1 to 30 carbon atoms, a substituted or unsubstituted aryl group having 6 to 50 ring-forming carbon atoms, or a substituted or unsubstituted heteroaryl group having 2 to 50 ring-forming carbon atoms, m and n are each independently an integer of 0 to 4, and $X_2$, $X_4$, $R_1$ to $R_8$, and a to h are the same as defined in Formula 1.

18. The light emitting diode of claim 15, wherein the condensed polycyclic compound represented by Formula 1 is represented by Formula 4-1:

[Formula 4-1]

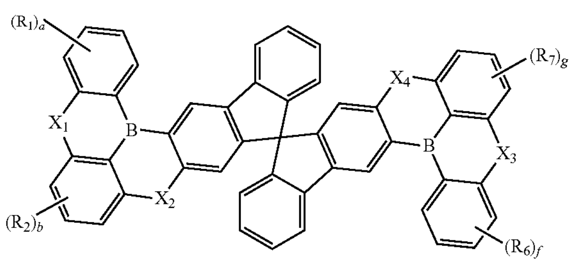

wherein in Formula 4-1, $X_1$, $X_2$, $X_3$, $X_4$, $R_1$, $R_2$, $R_6$, $R_7$, a, b, f, and g are the same as defined in Formula 1.

19. The light emitting diode of claim 15, wherein the condensed polycyclic compound represented by Formula 1 is represented by Formula 5-1:

Formula 5-1

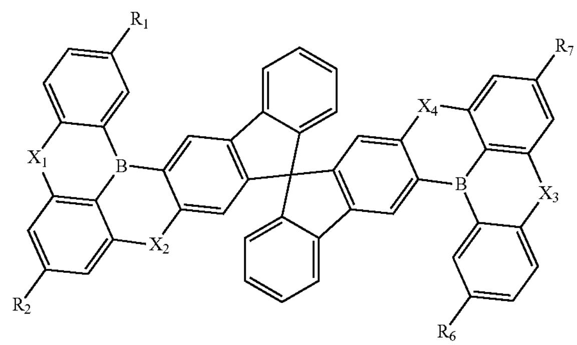

wherein in Formula 5-1, $X_1$, $X_2$, $X_3$, $X_4$, $R_1$, $R_2$, and $R_6$ are the same as defined in Formula 1.

20. The light emitting diode of claim 15, wherein the condensed polycyclic compound represented by Formula 1 comprises any one of compounds in Compound Group 1:

Compound Group 1

1

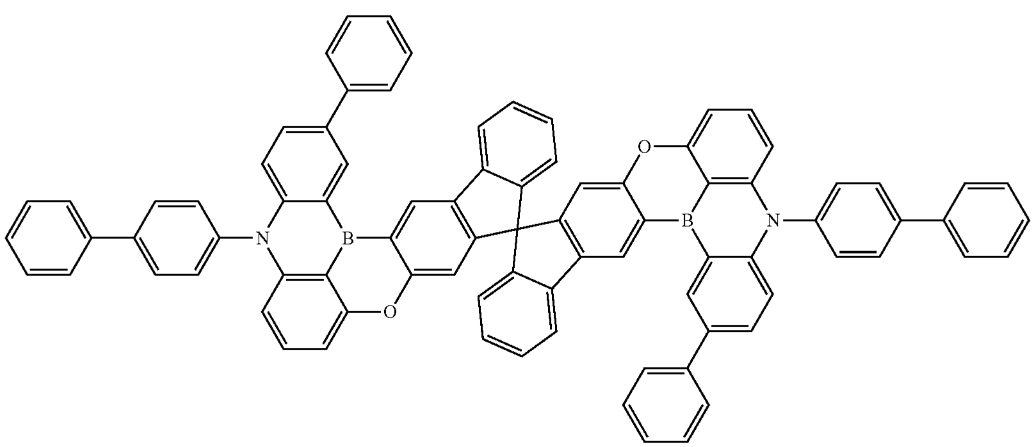

-continued
2
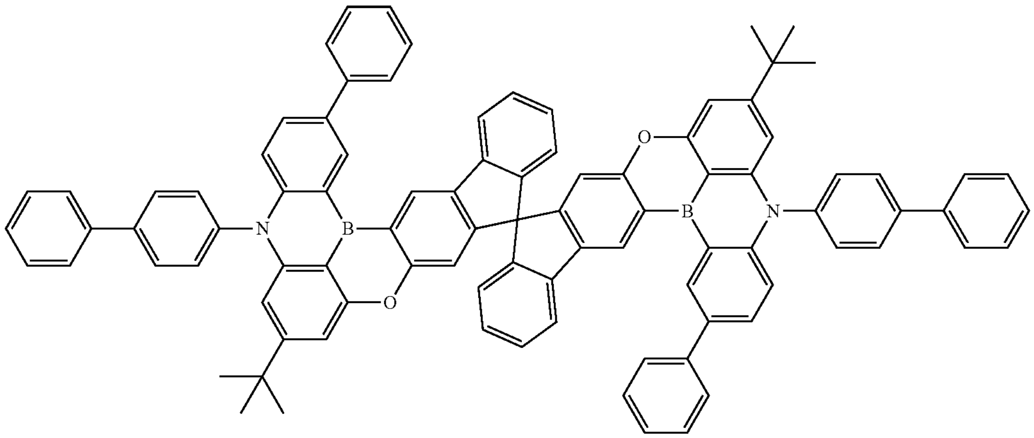
3
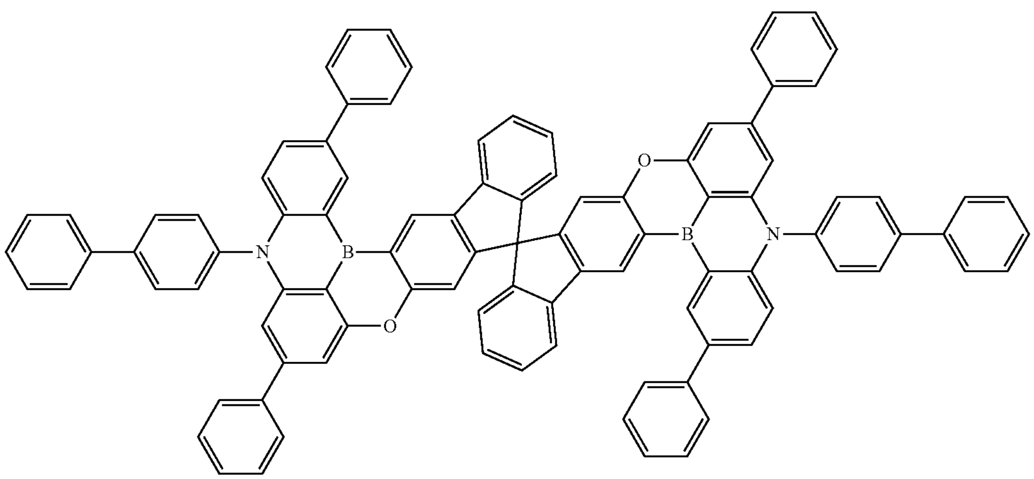
4
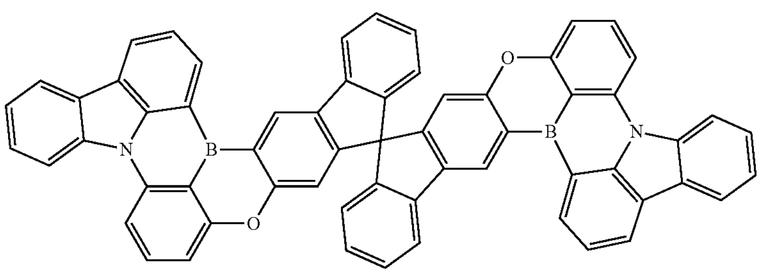
5
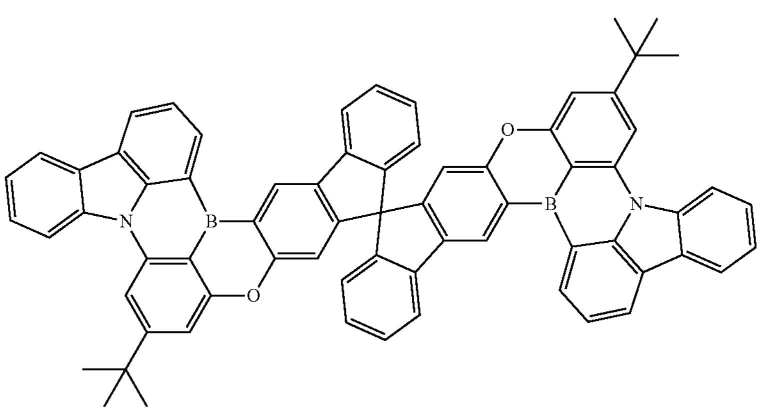

-continued
6
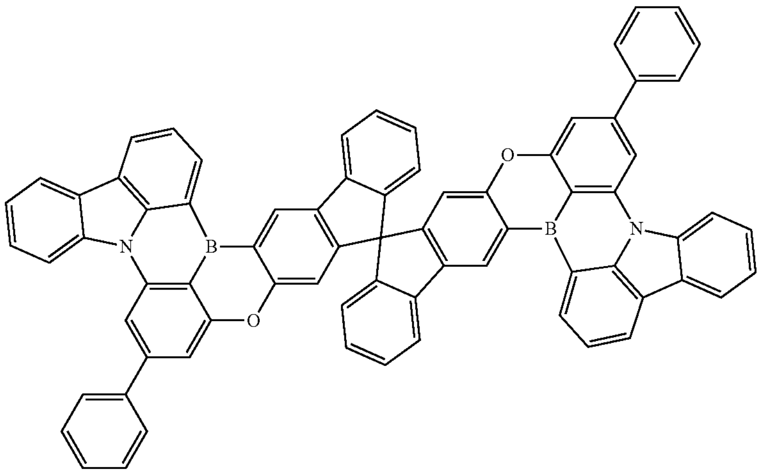
7
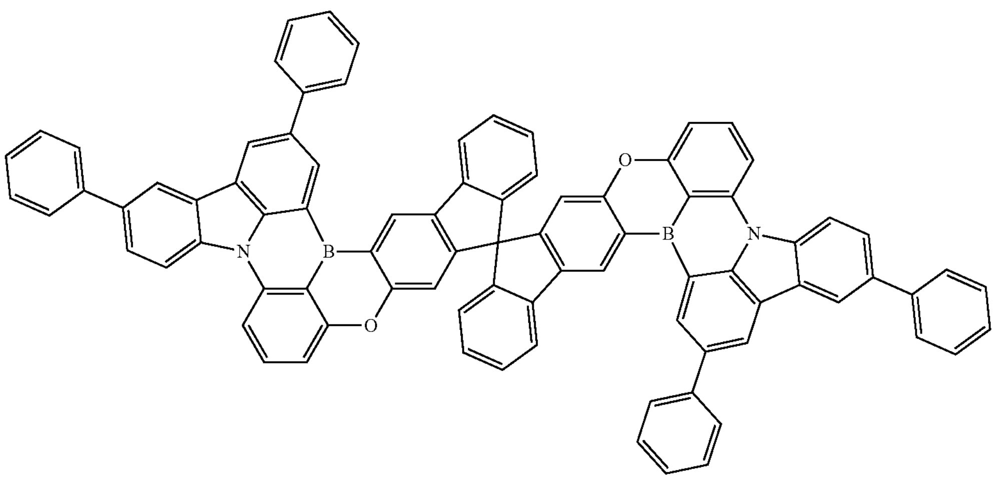
8
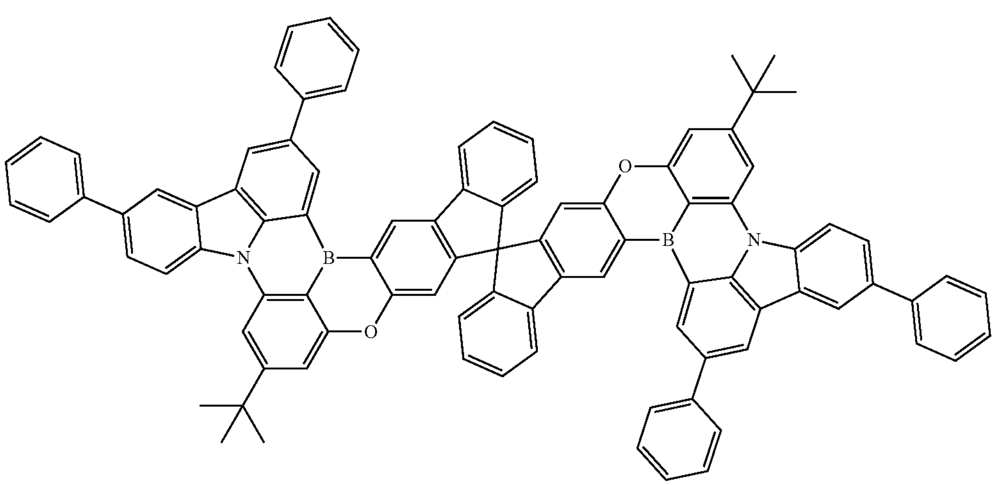

-continued
9
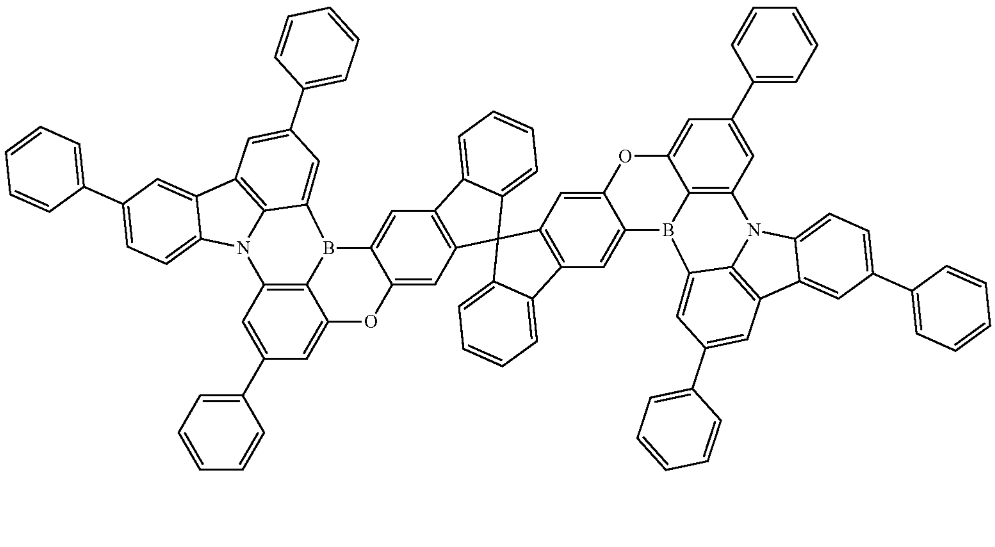
10
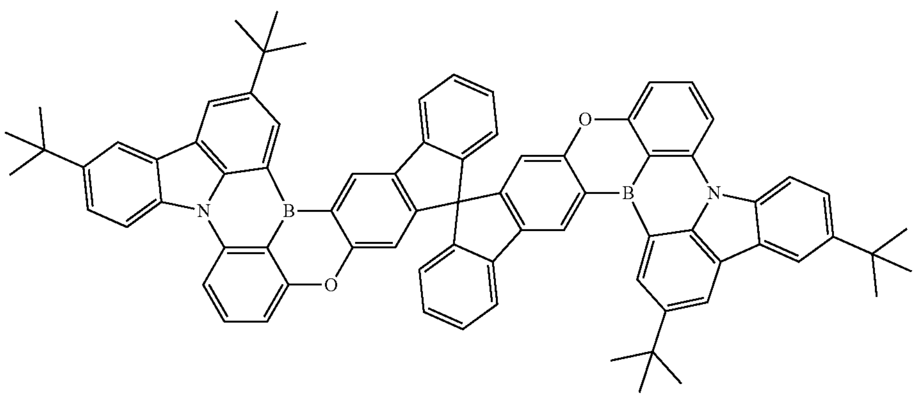
11
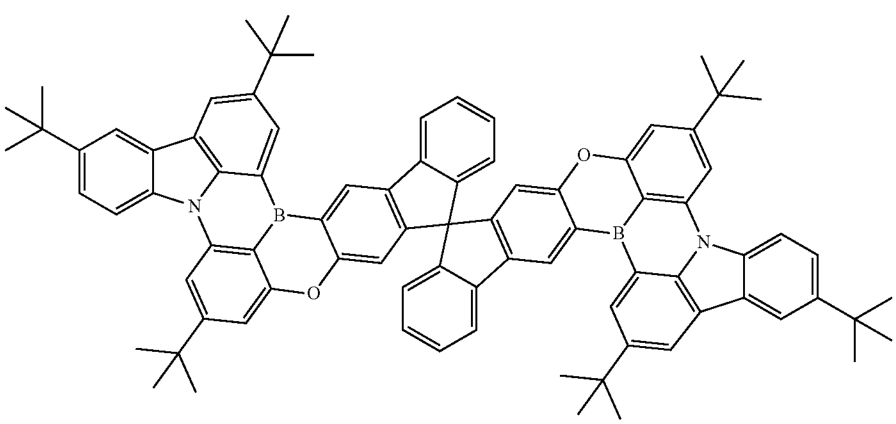

-continued
12
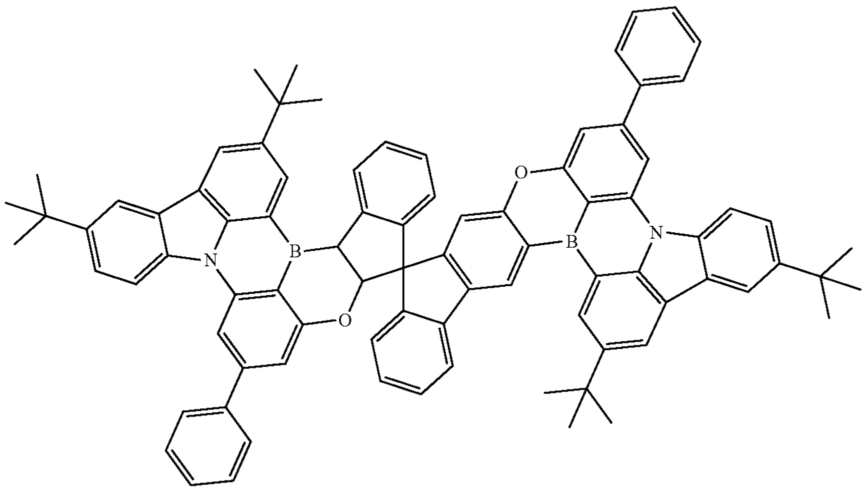
13
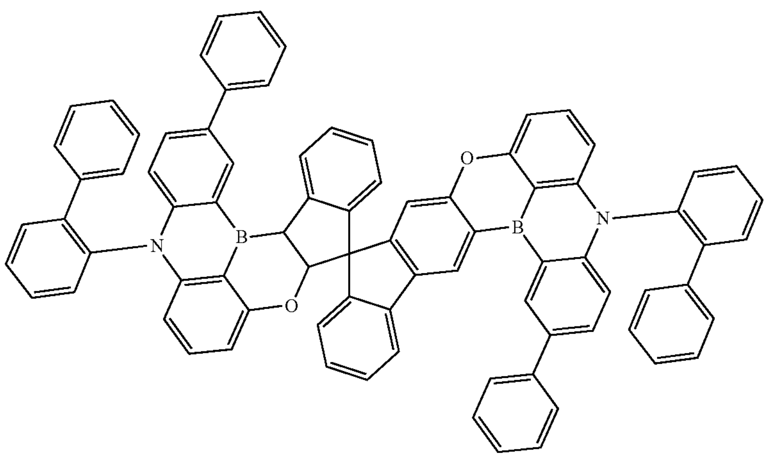
14
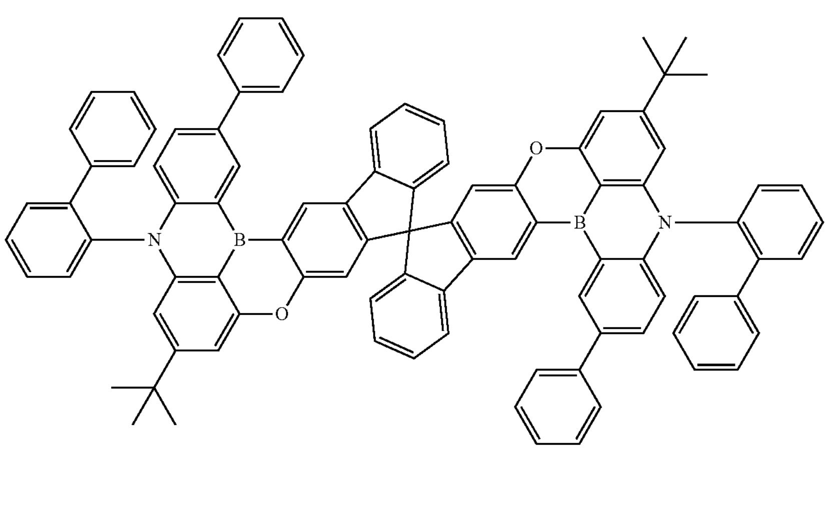

-continued
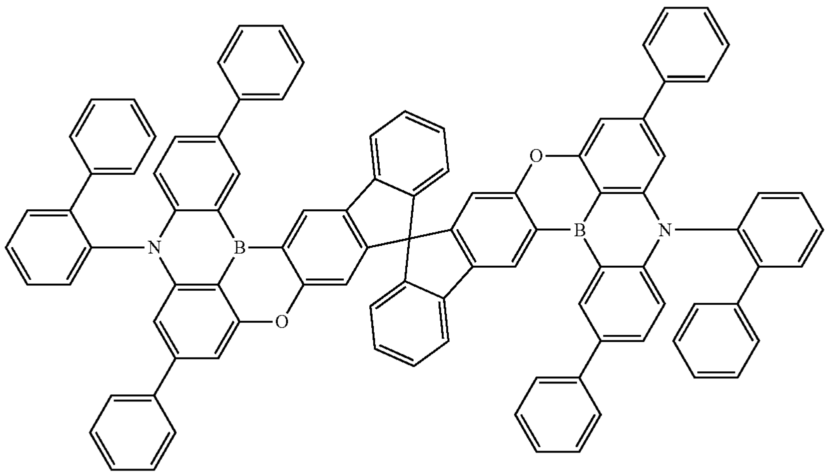
15
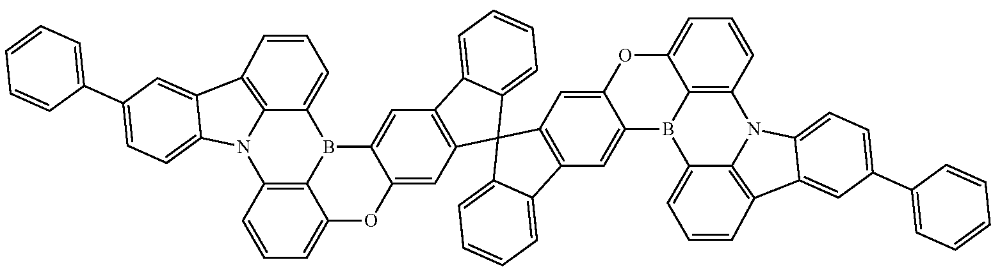
16
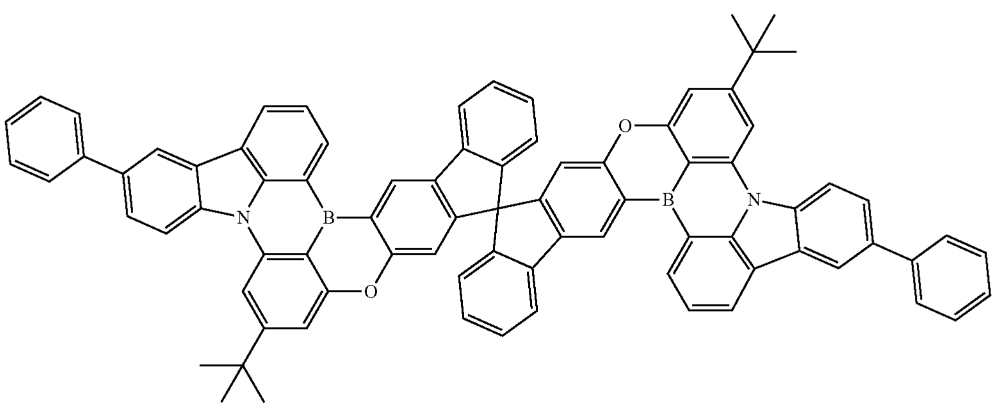
17
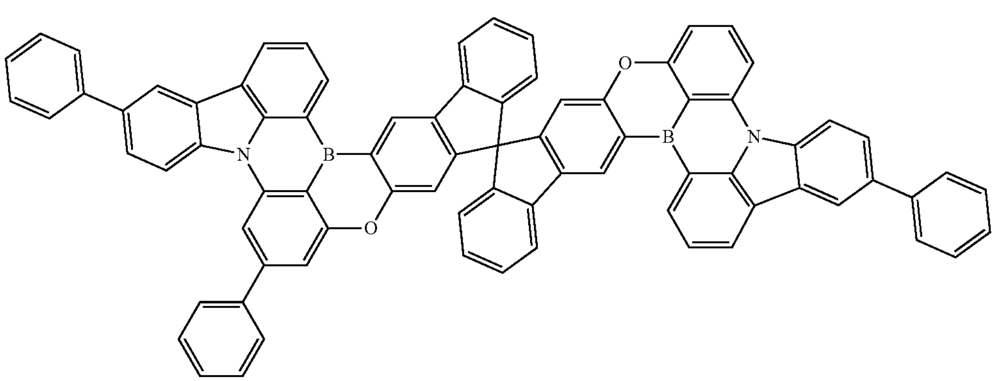
18

-continued
19
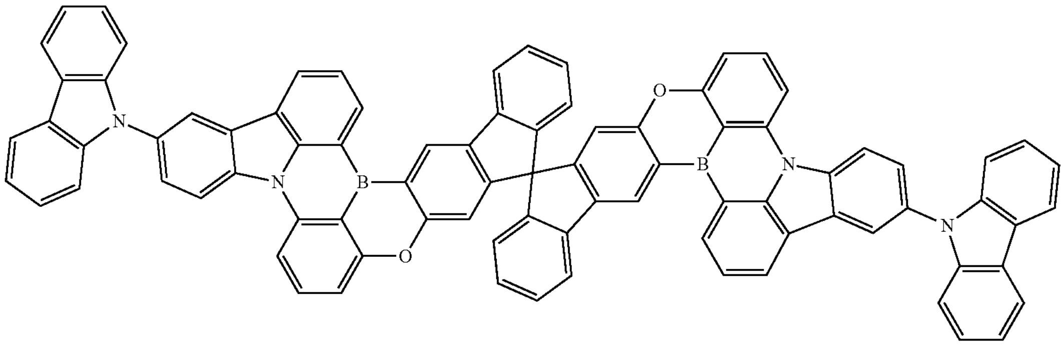
20
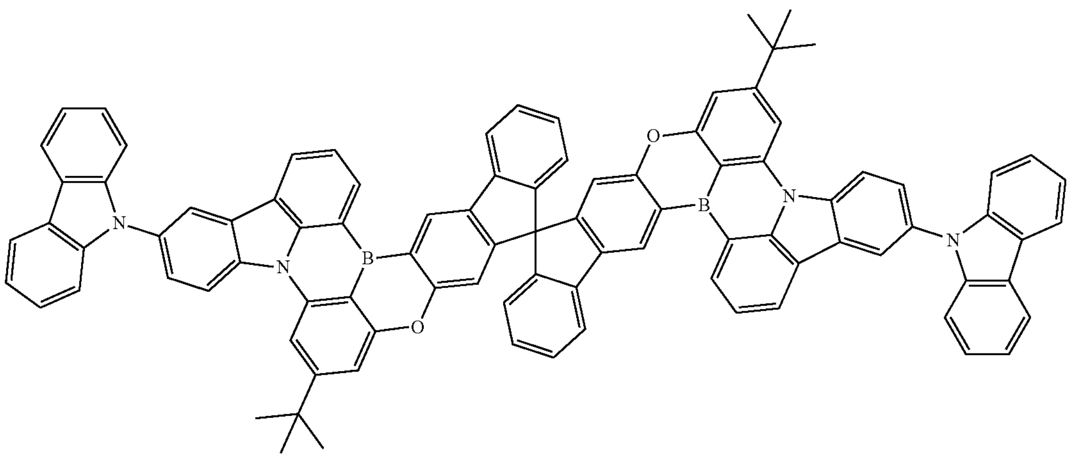
21
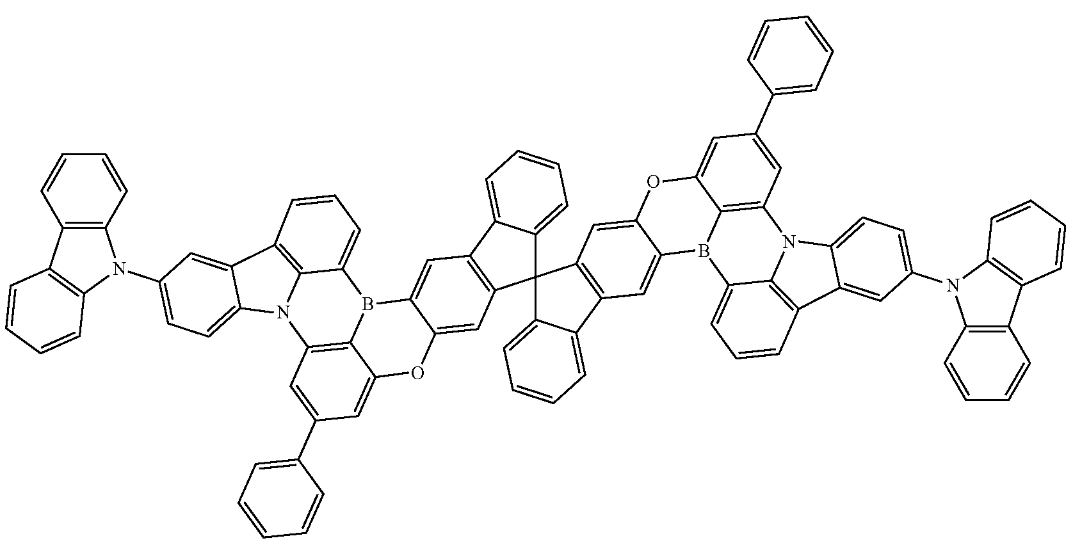

-continued
22
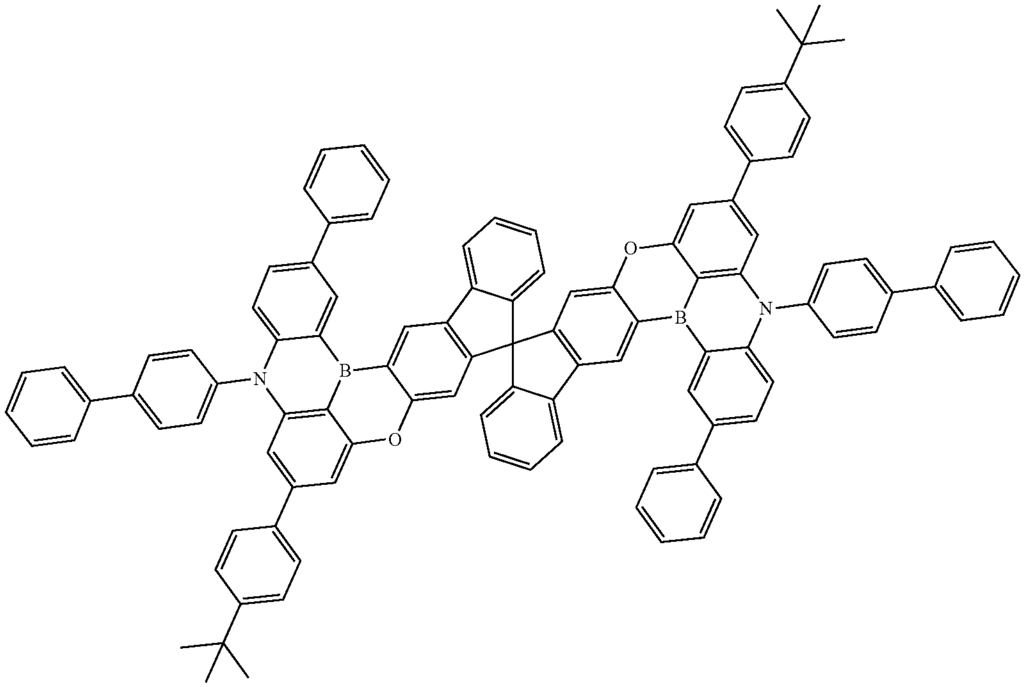
23
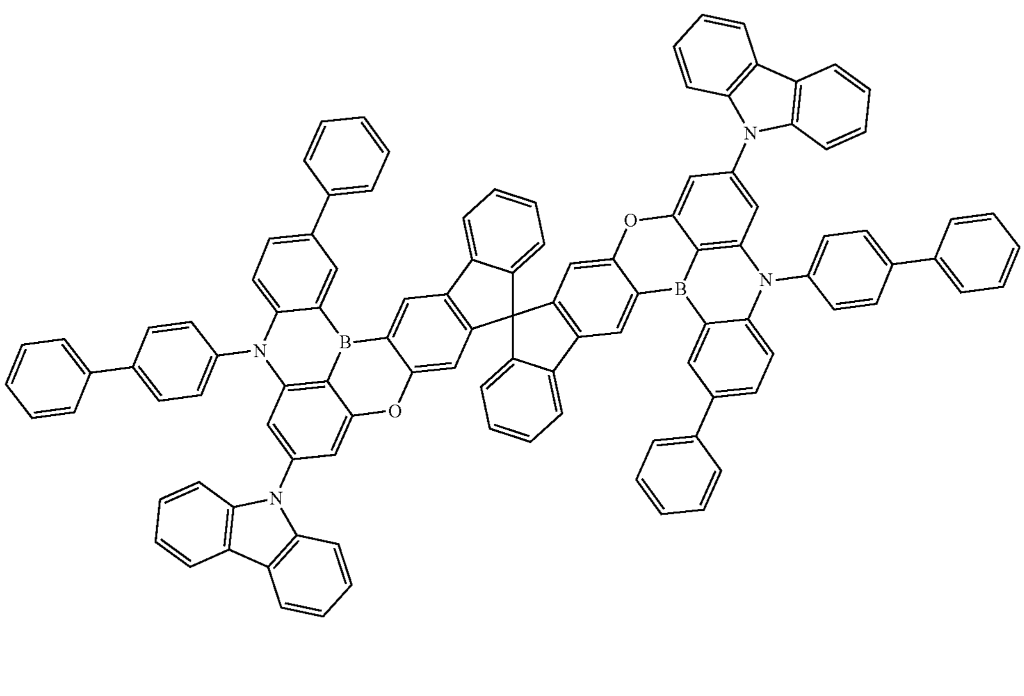

-continued
24
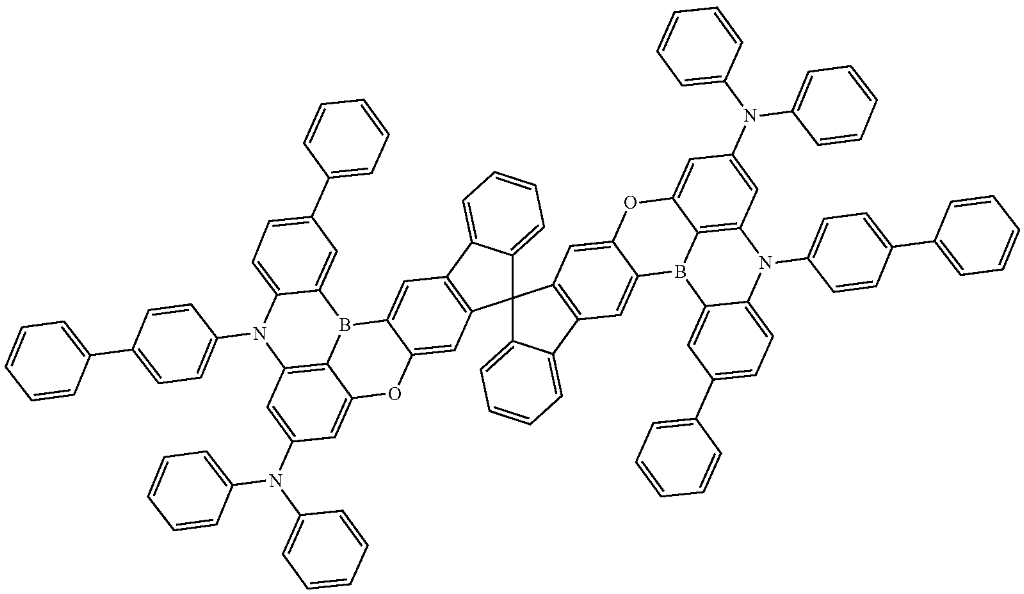
25
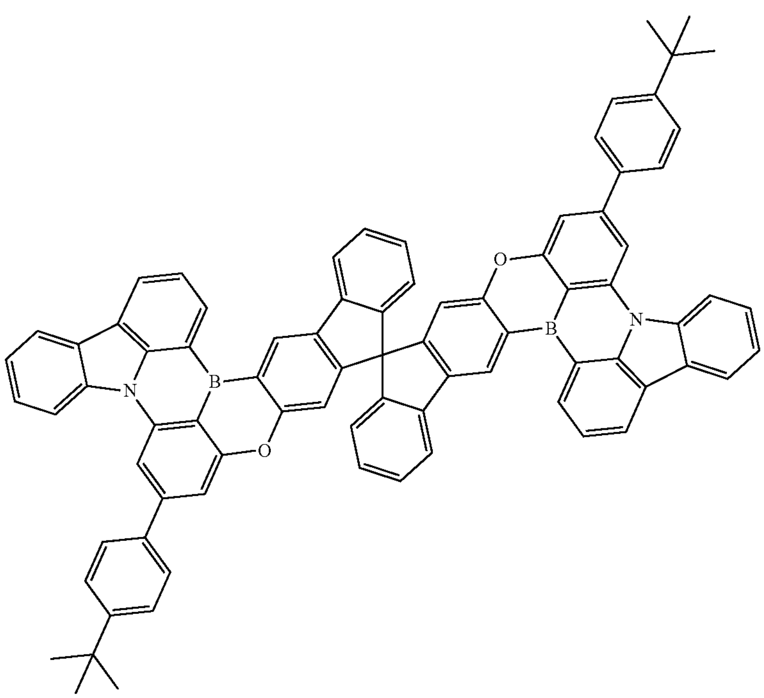

-continued
26
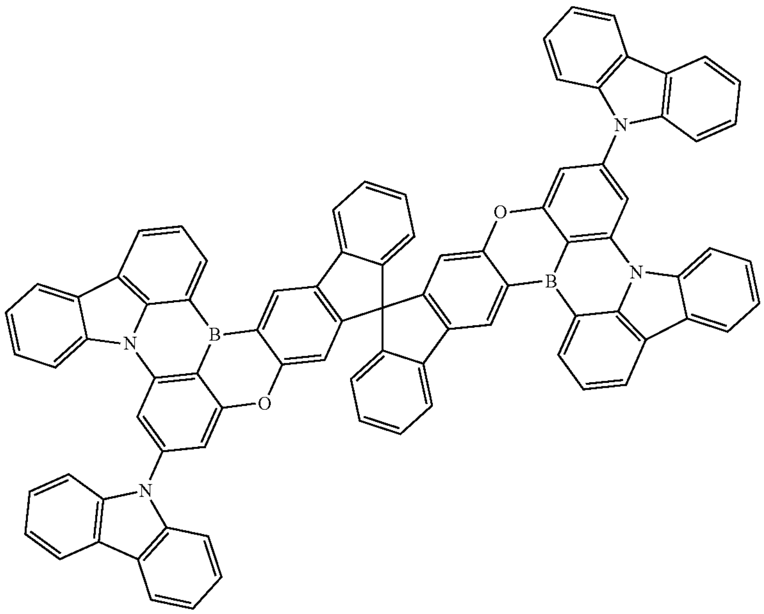
27
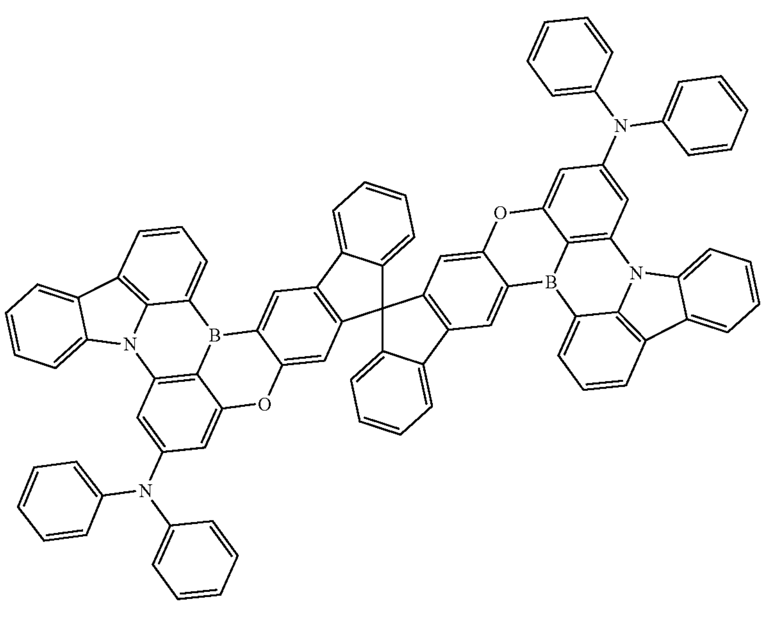

-continued
28
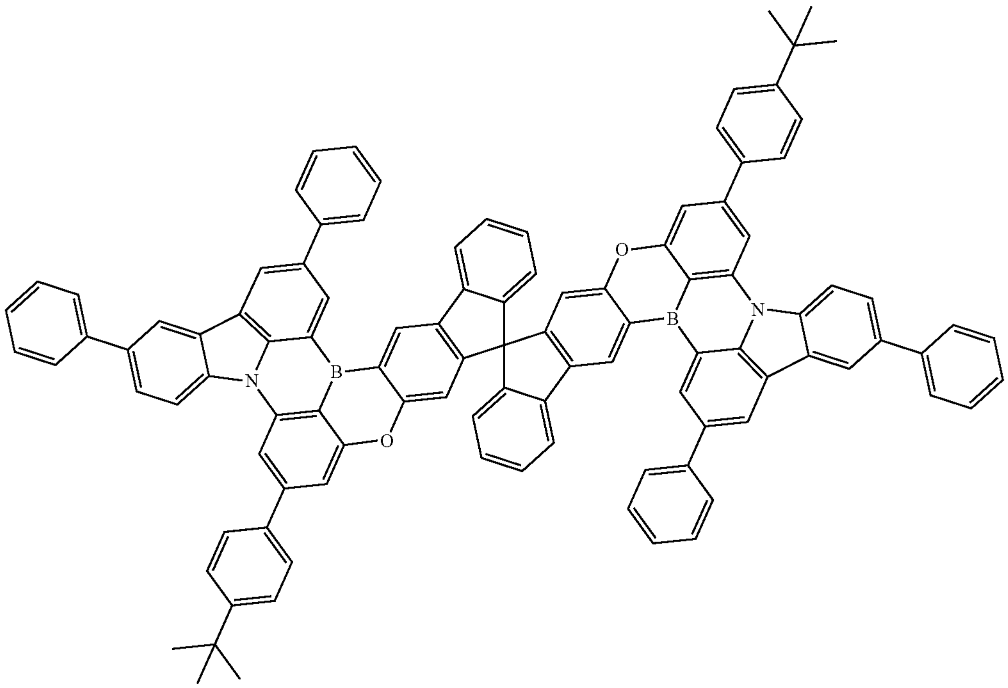
29
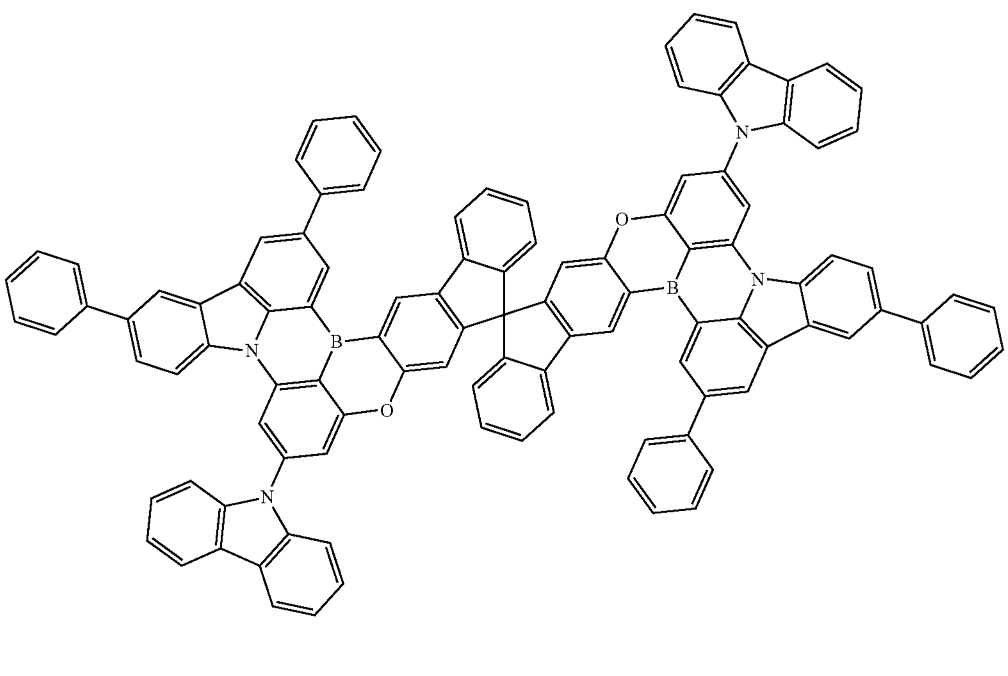

-continued
30
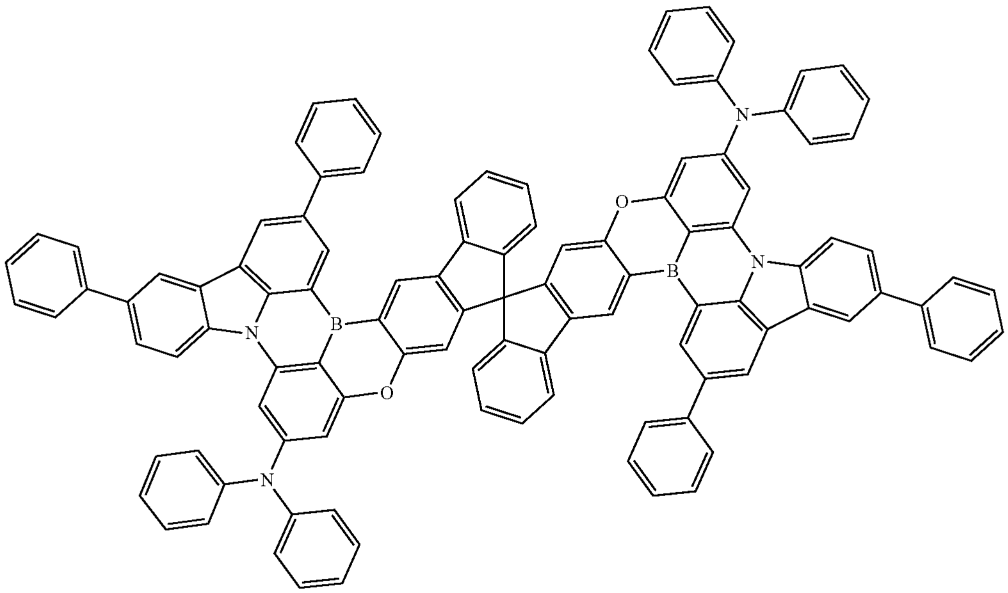
31
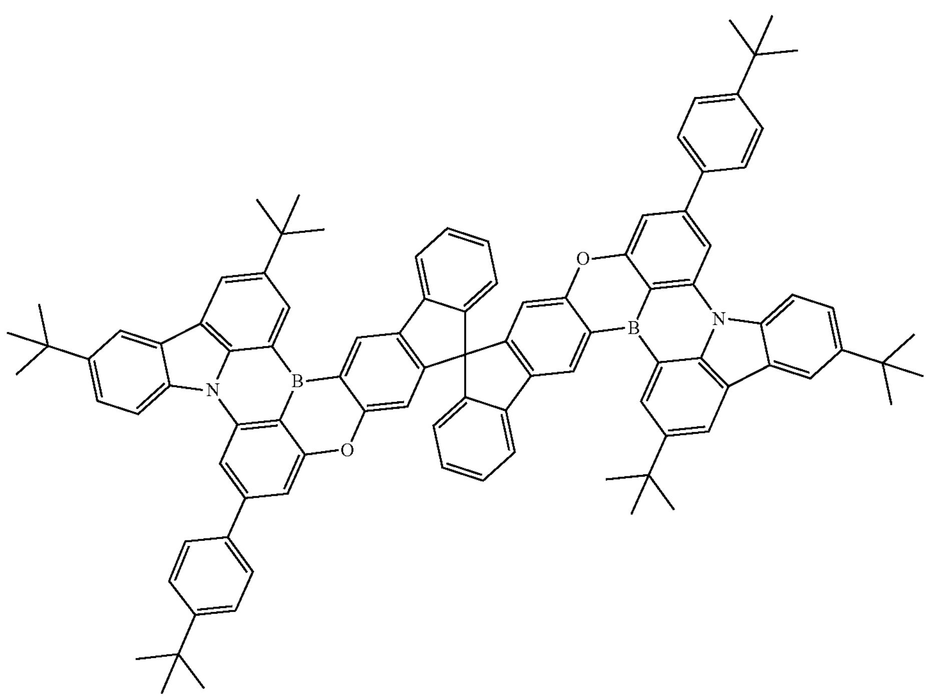

-continued
32
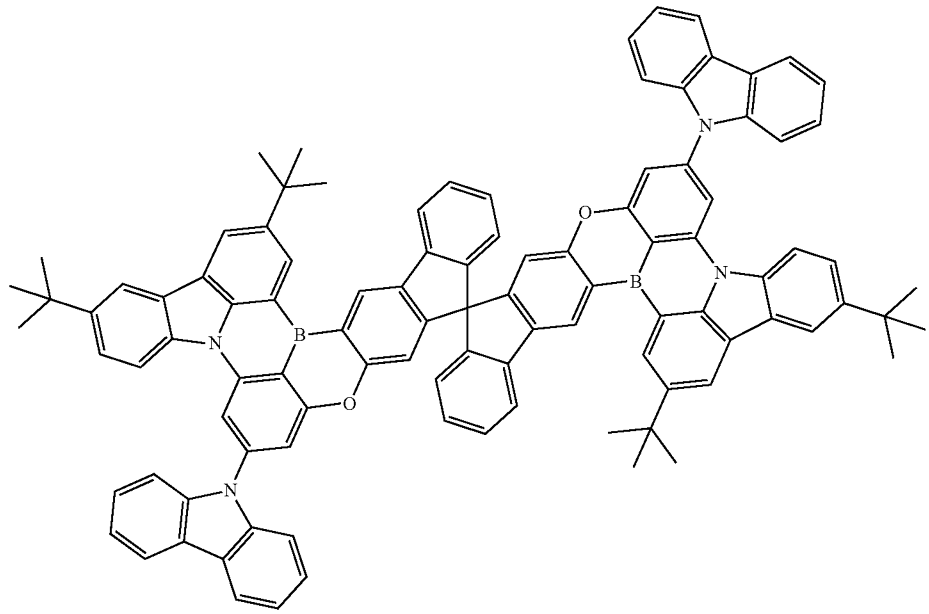
33
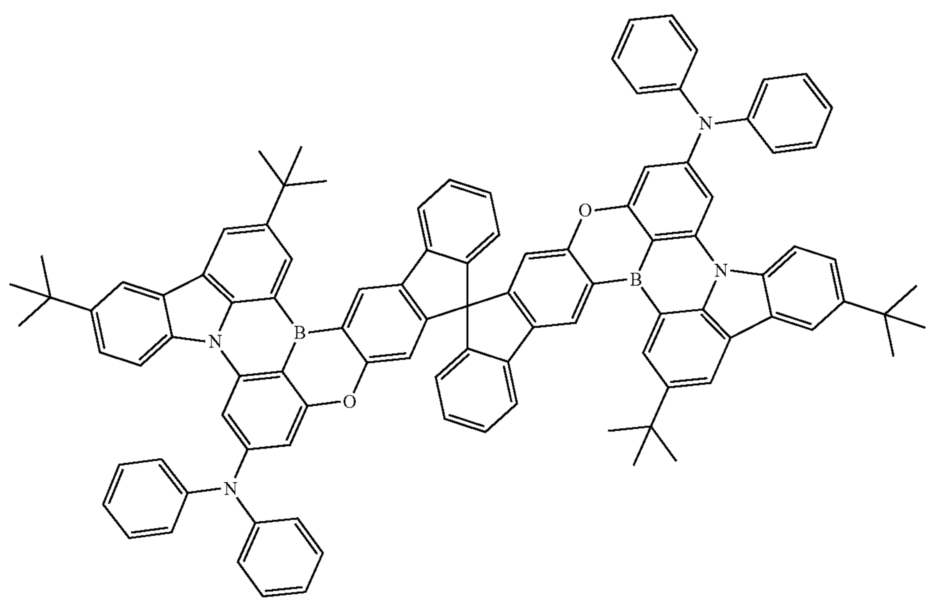

-continued
34
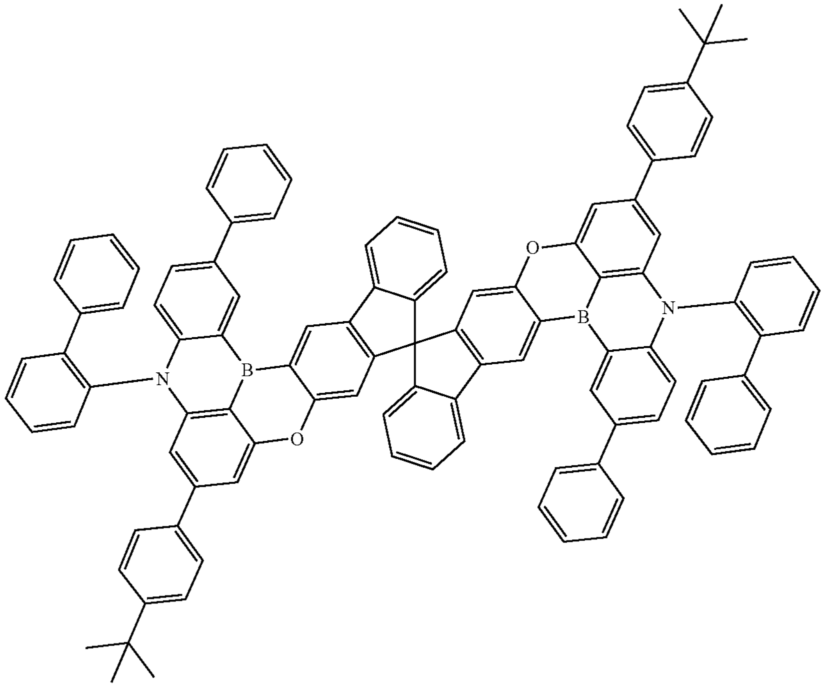
35
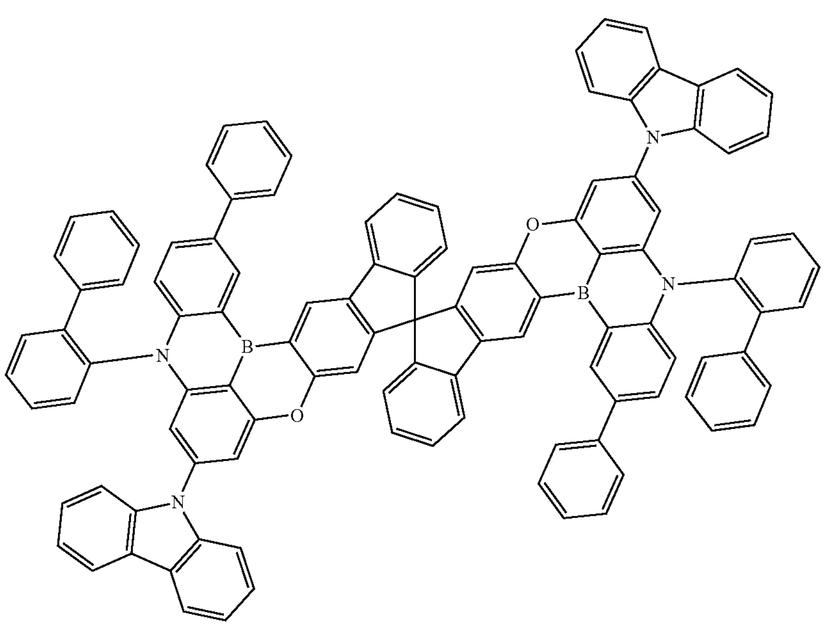

-continued
36
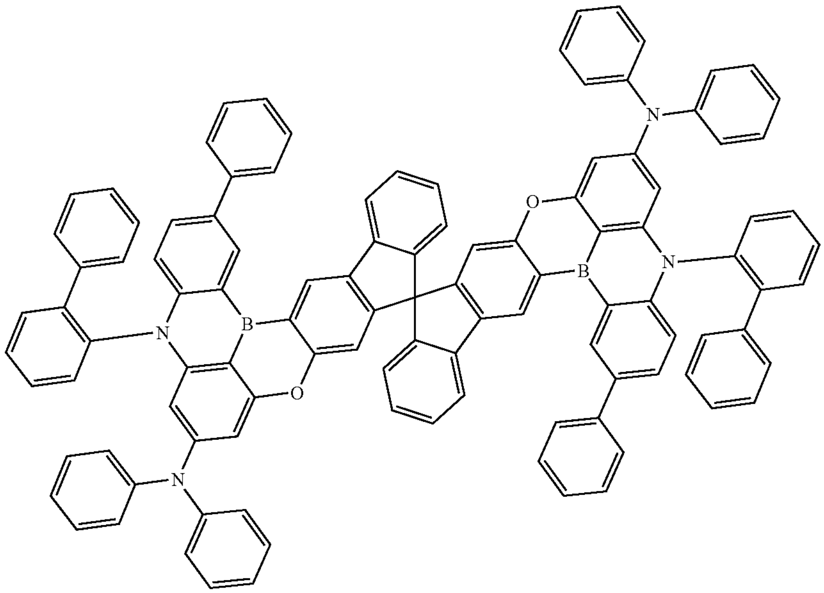
37
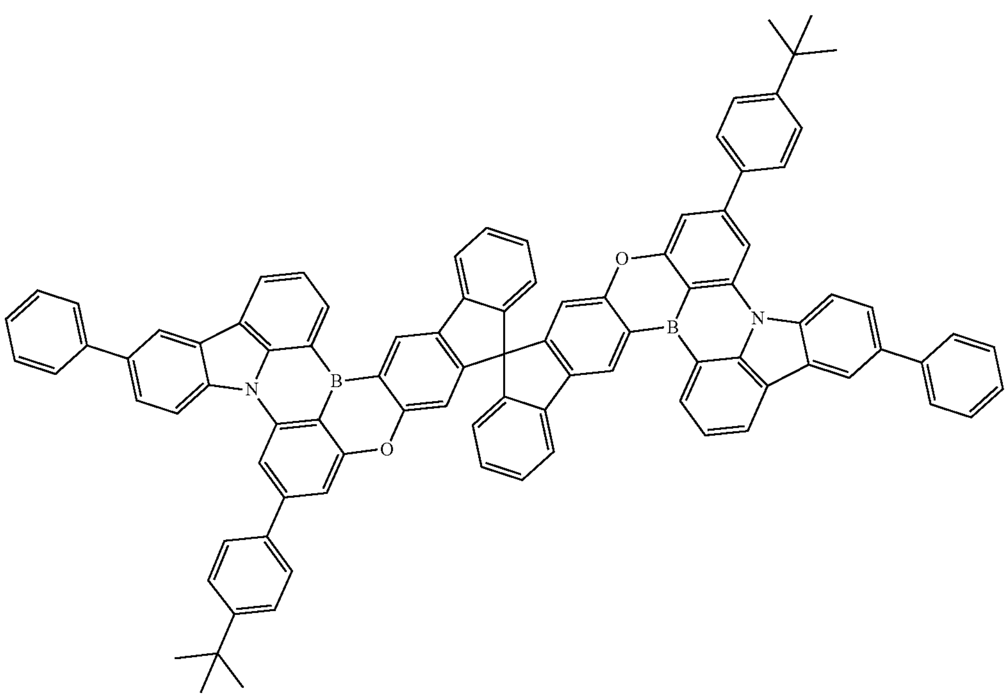

-continued
38
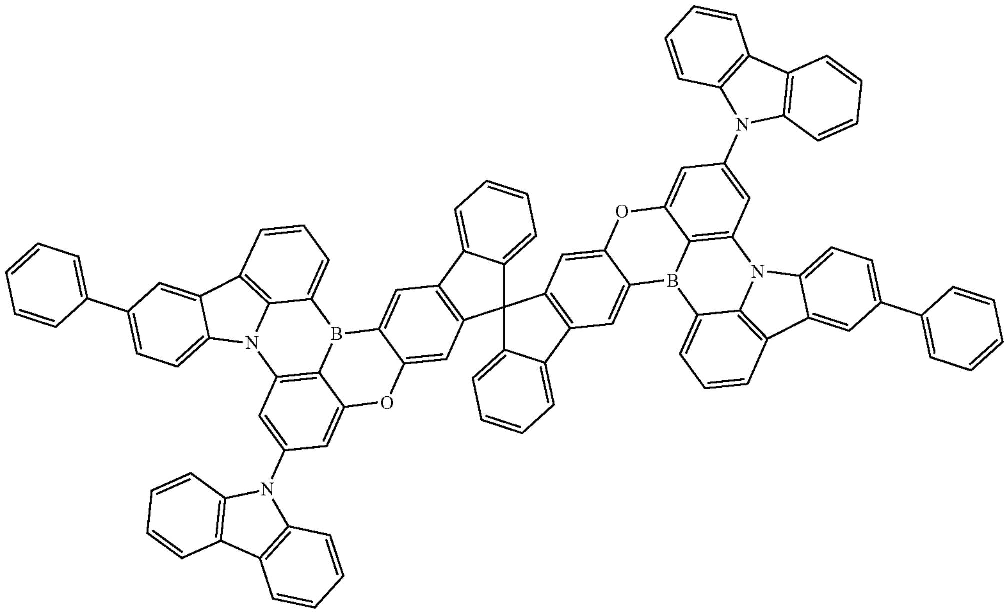
39
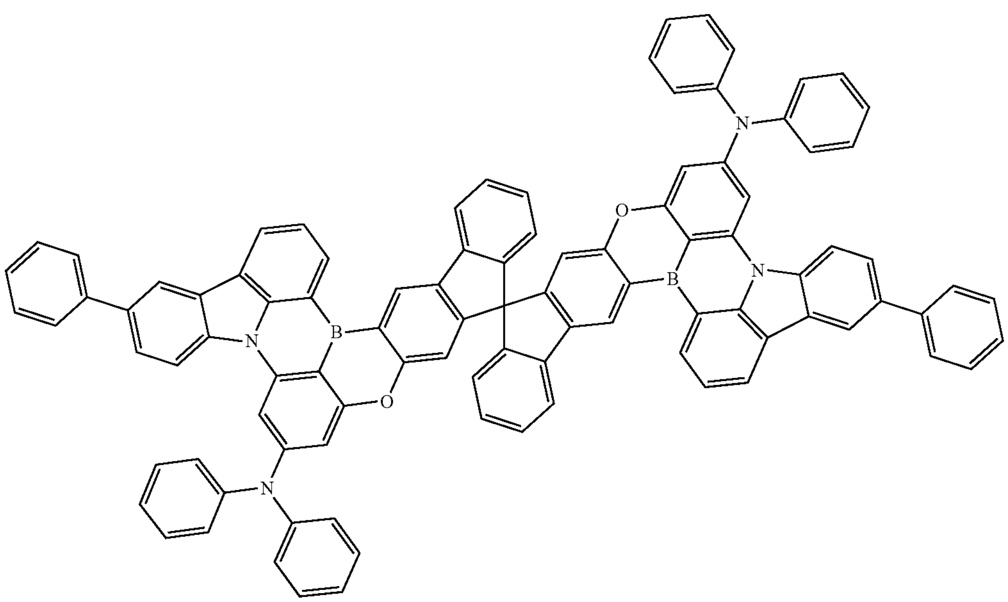

-continued
40
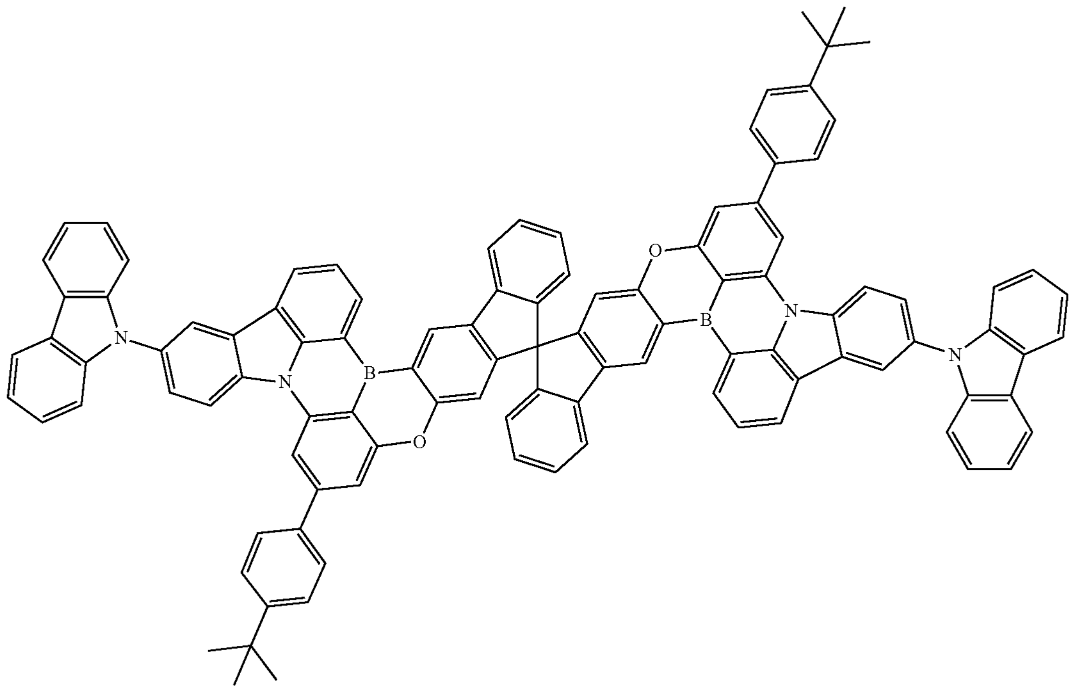
41
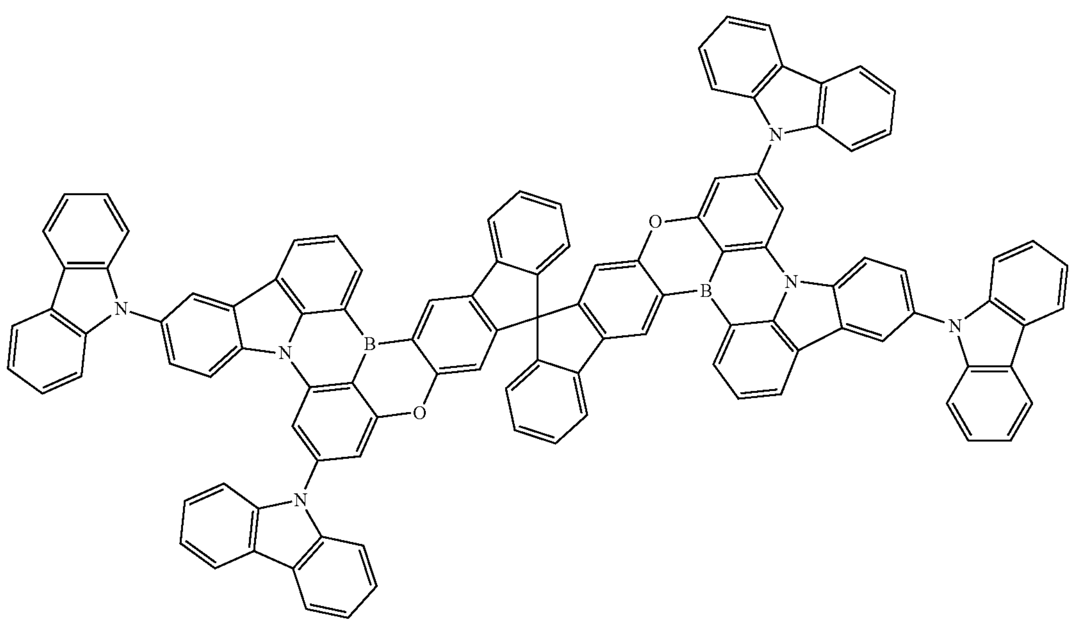

-continued
42
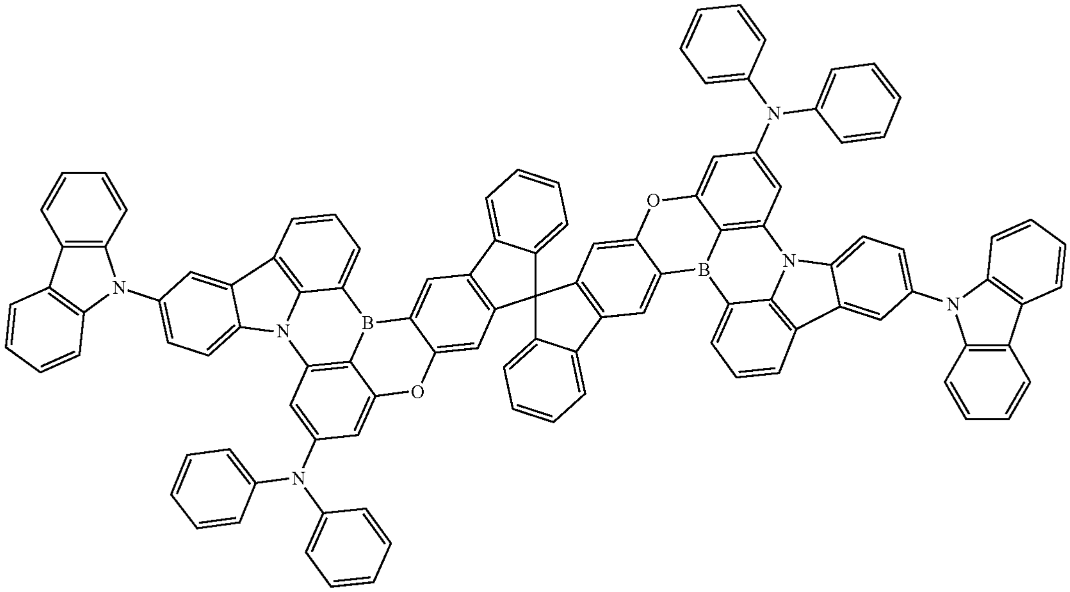
43
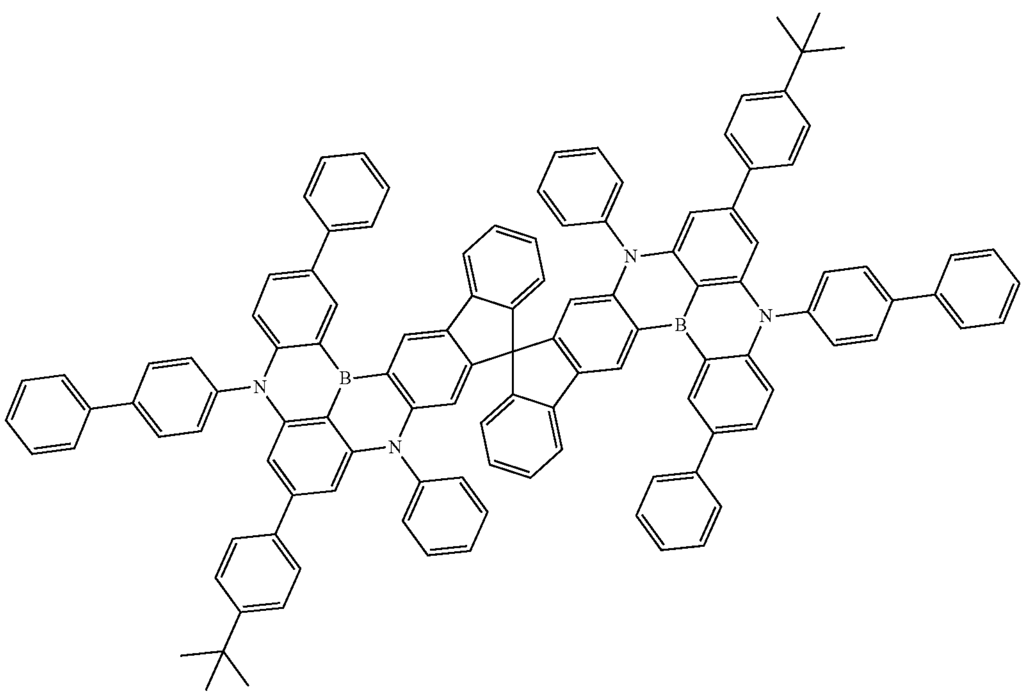

-continued
44
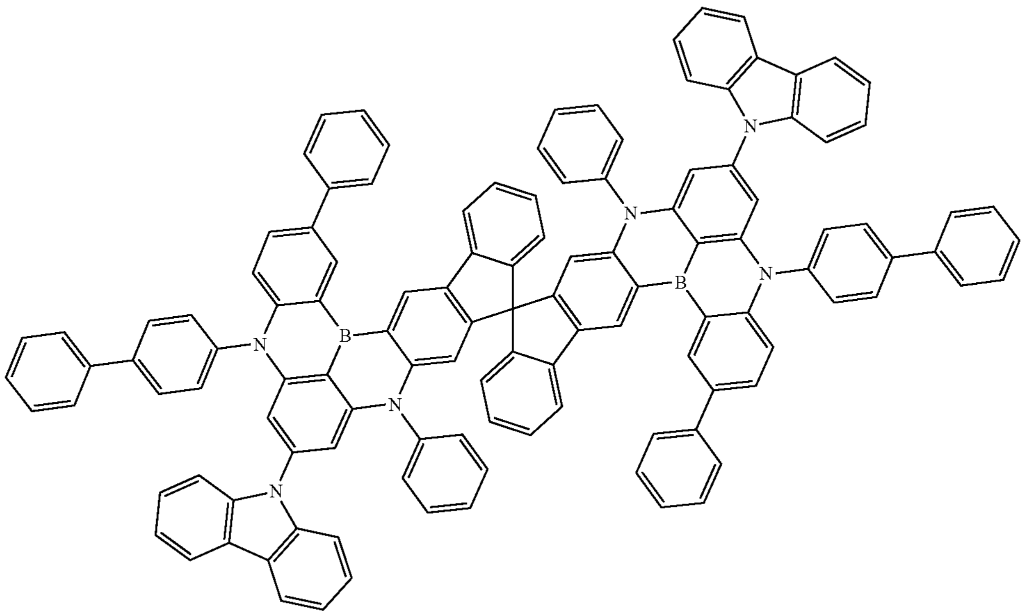
45
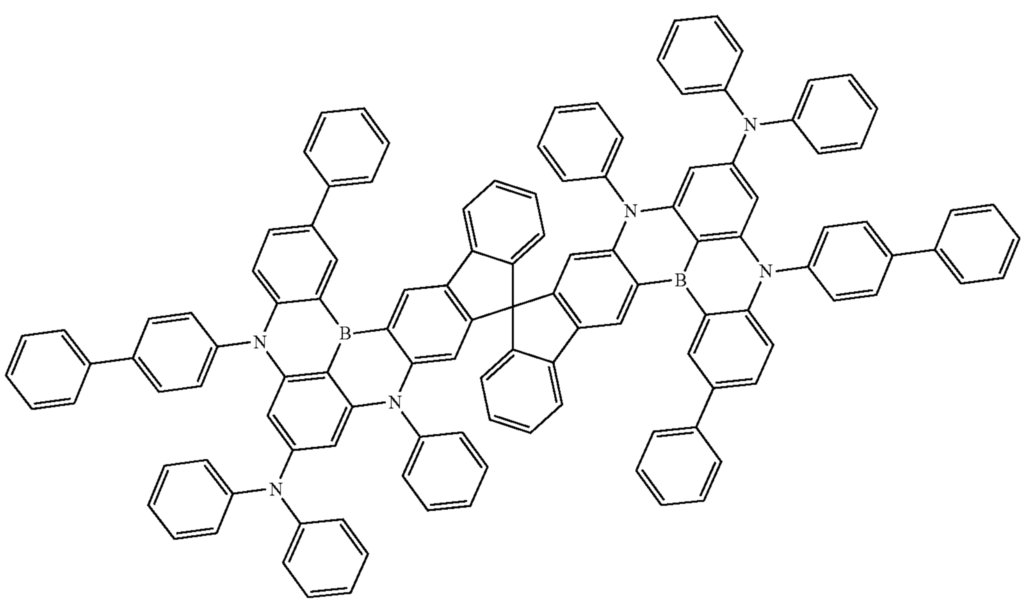

-continued
46
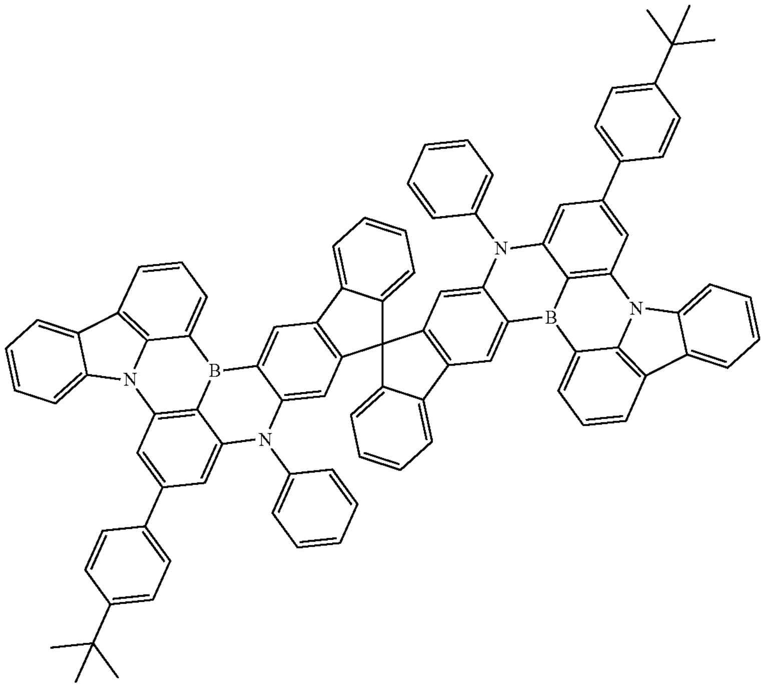
47
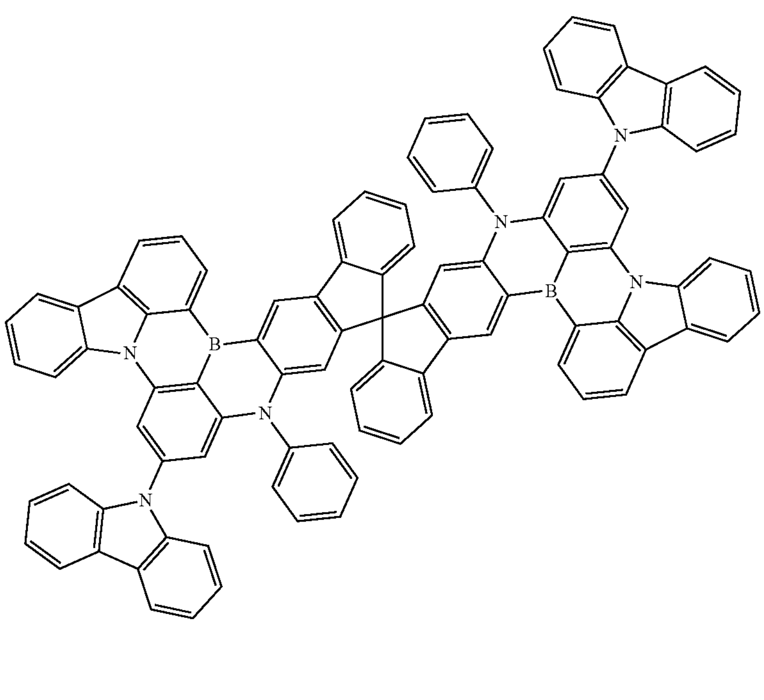

-continued
48
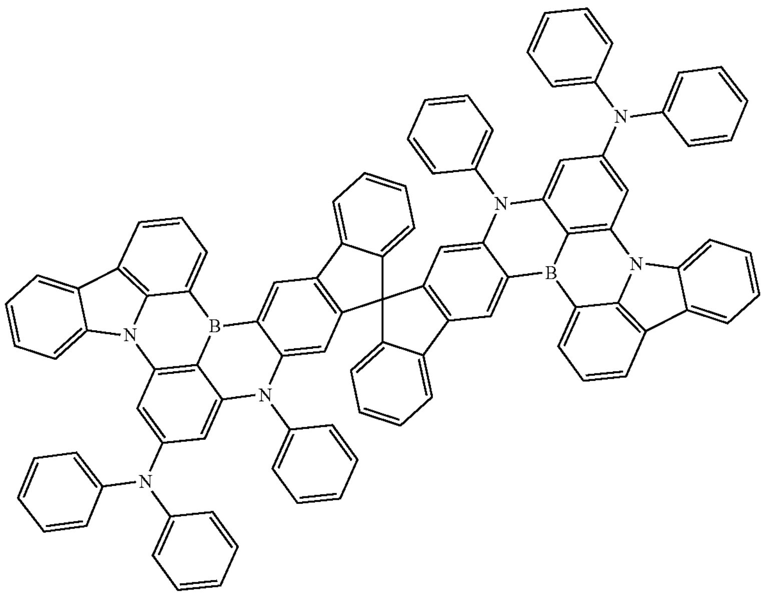
49
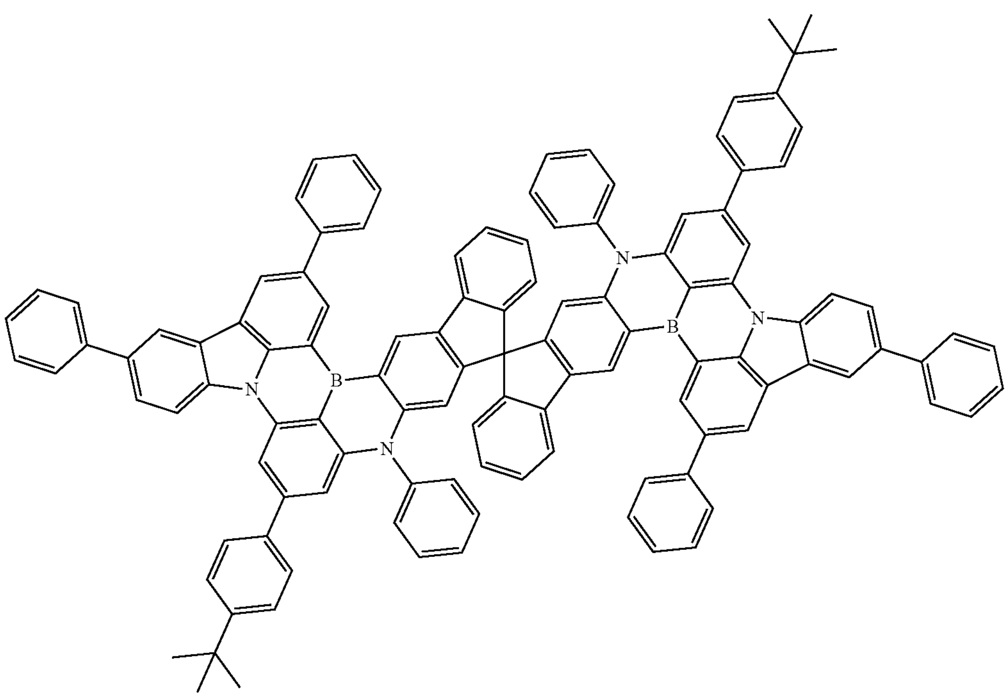

-continued
50
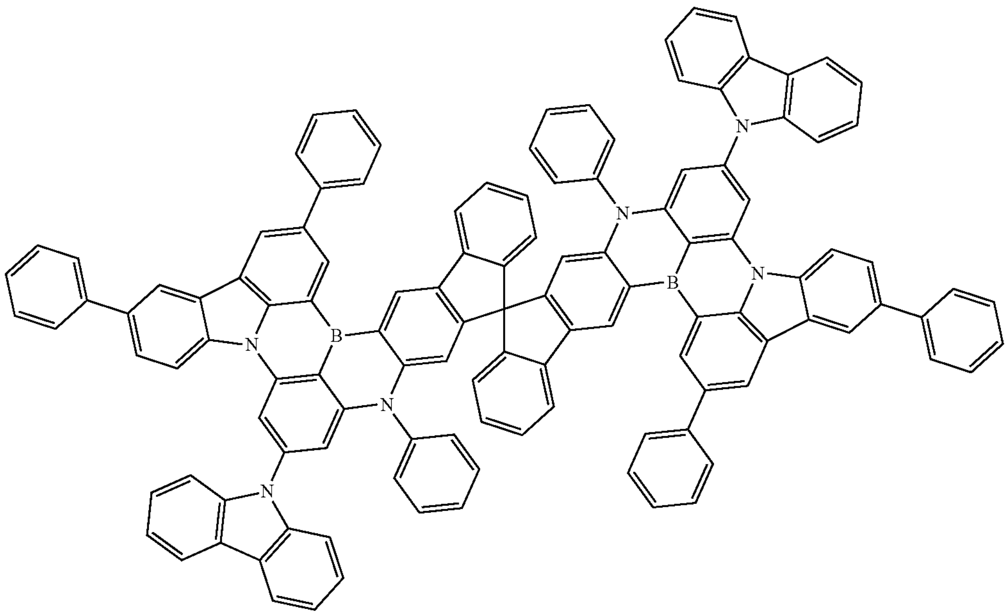
51
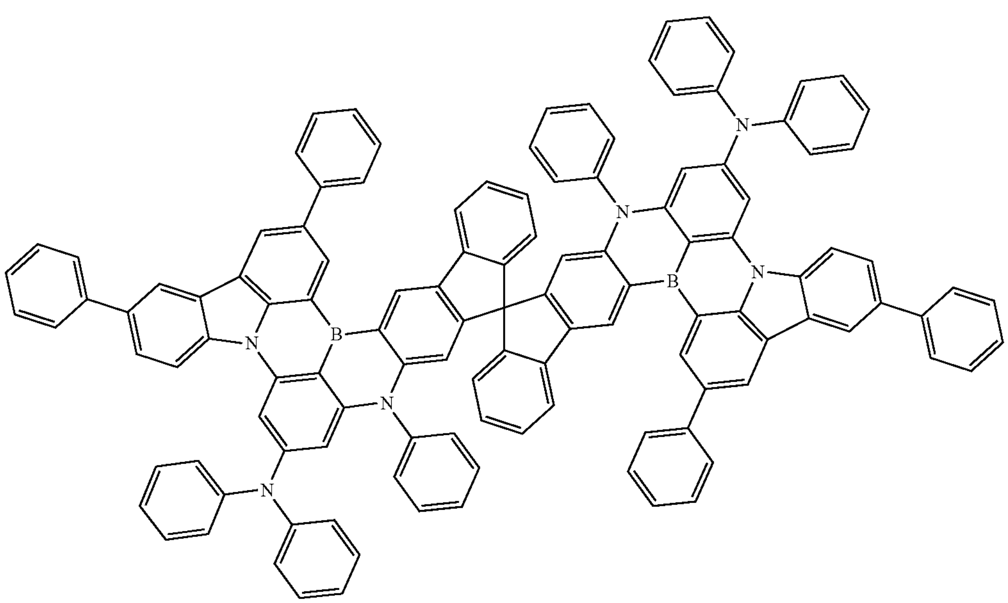

-continued
52
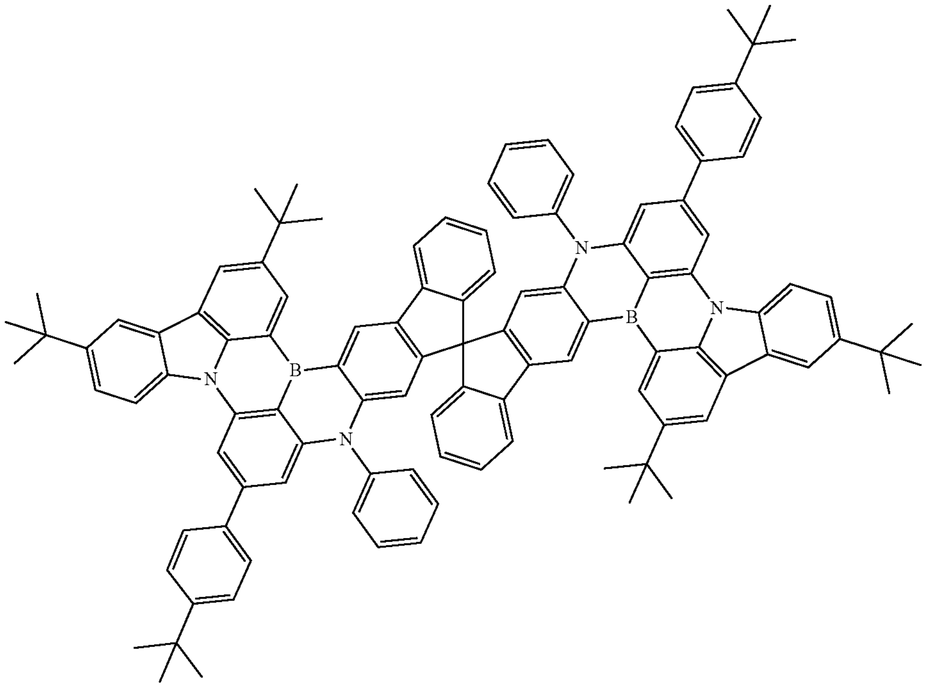
53
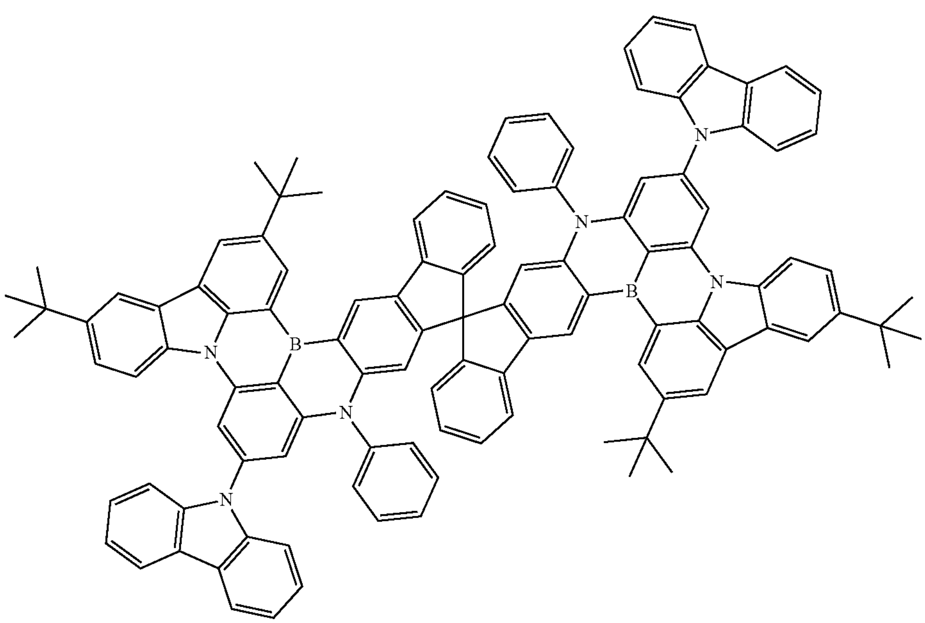

-continued
54
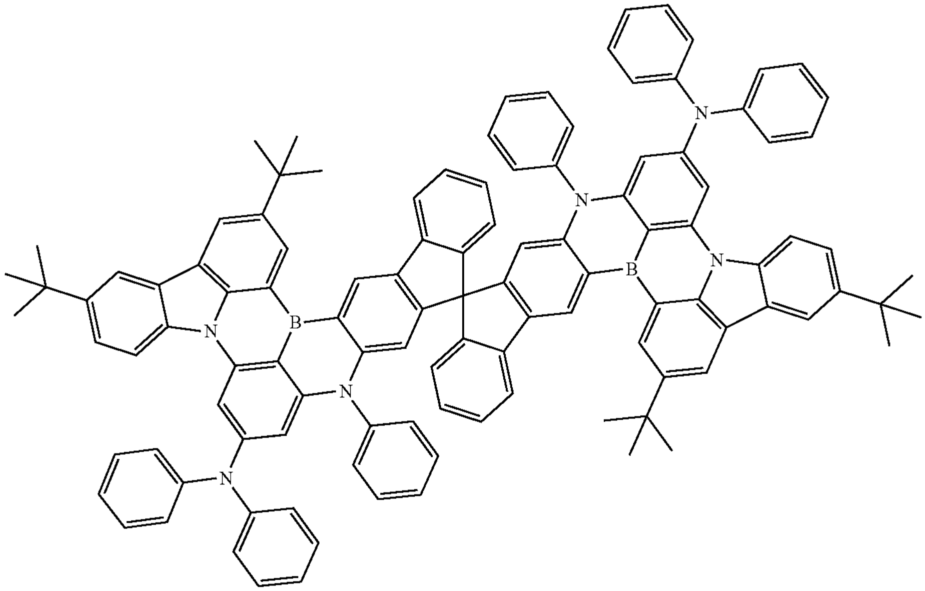
55
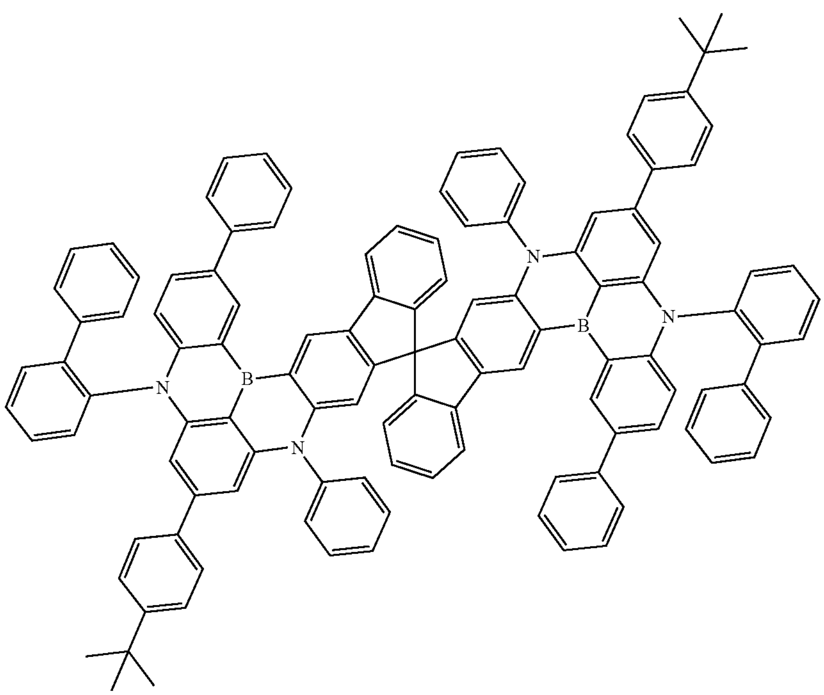

-continued
56
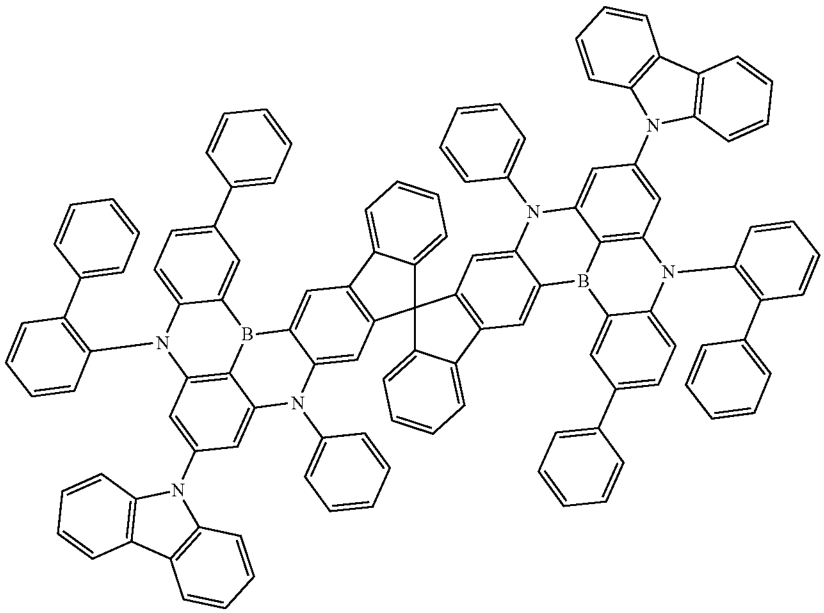
57
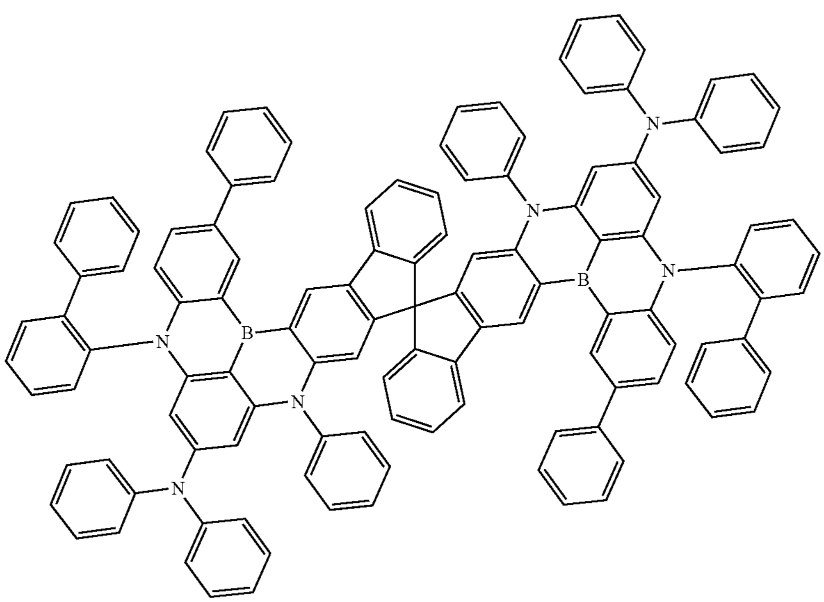

-continued
58
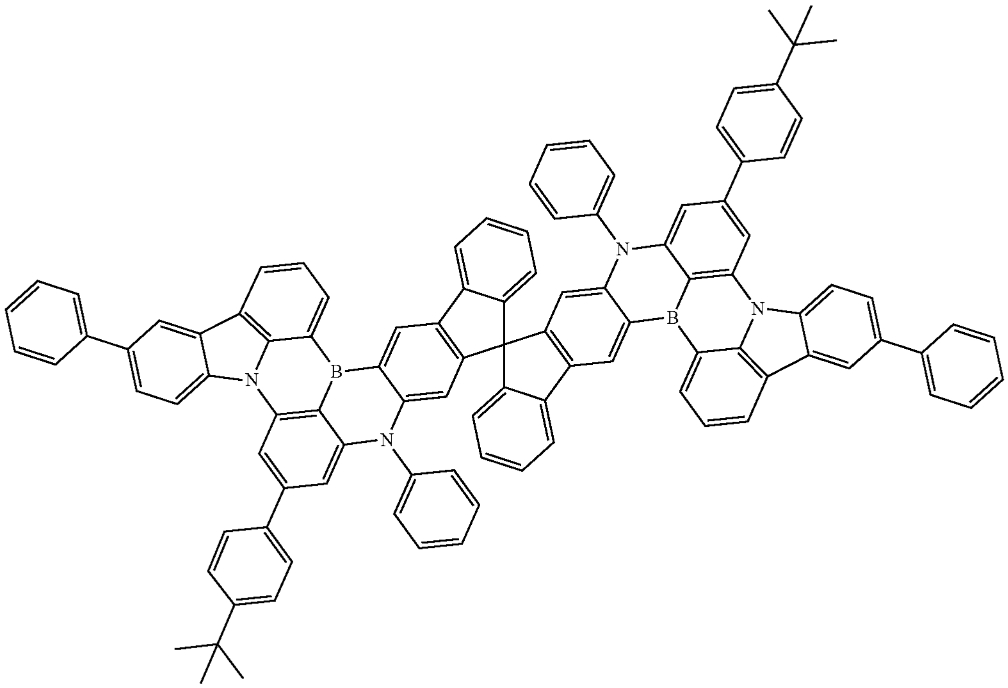
59
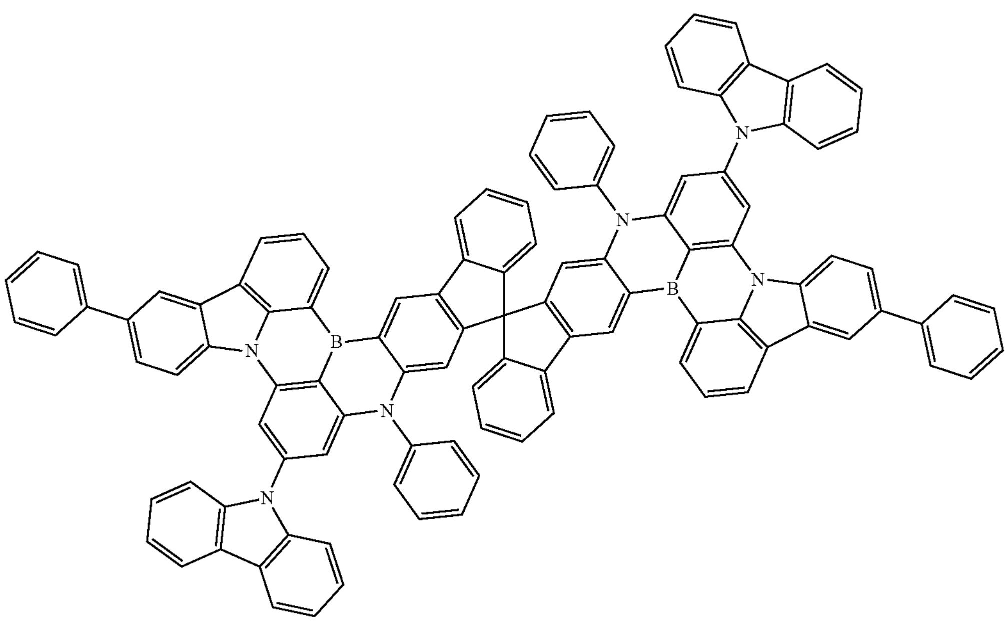

-continued
60
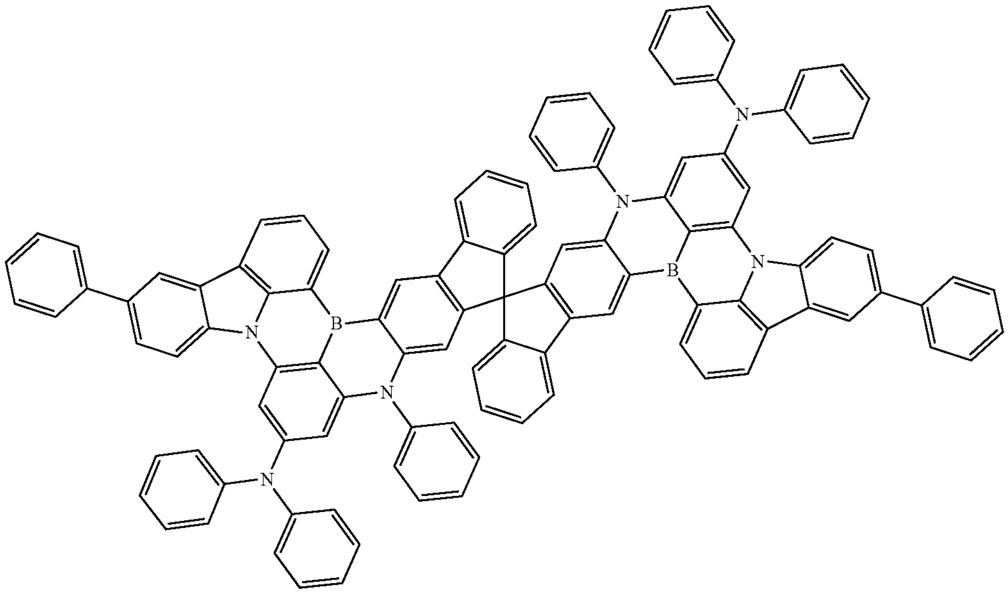
61
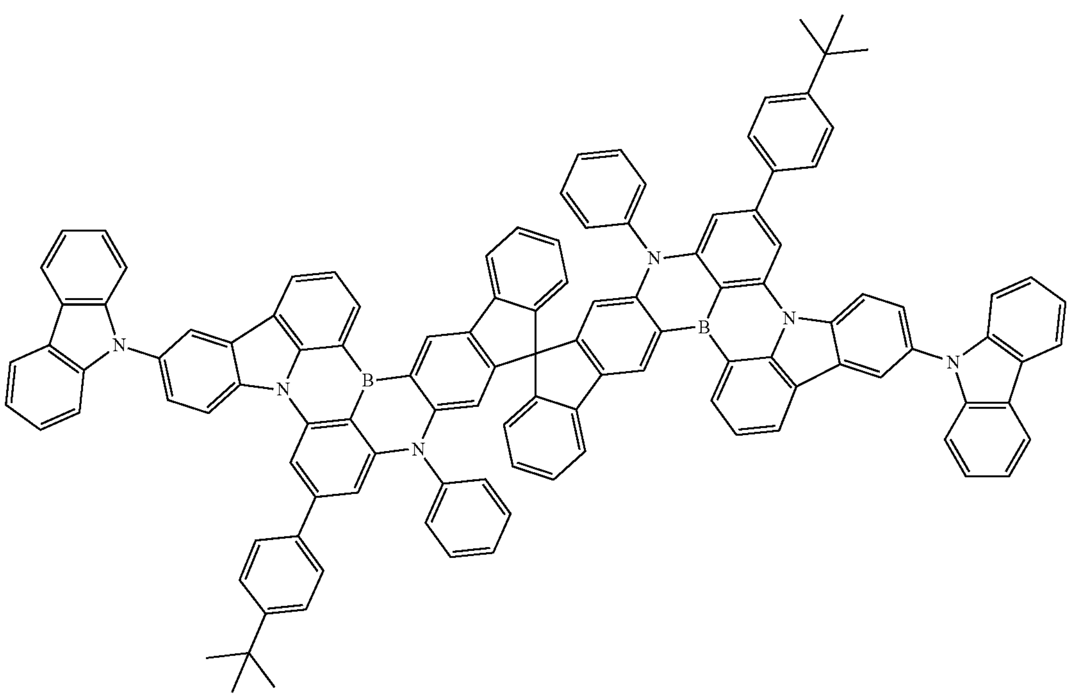

-continued
62
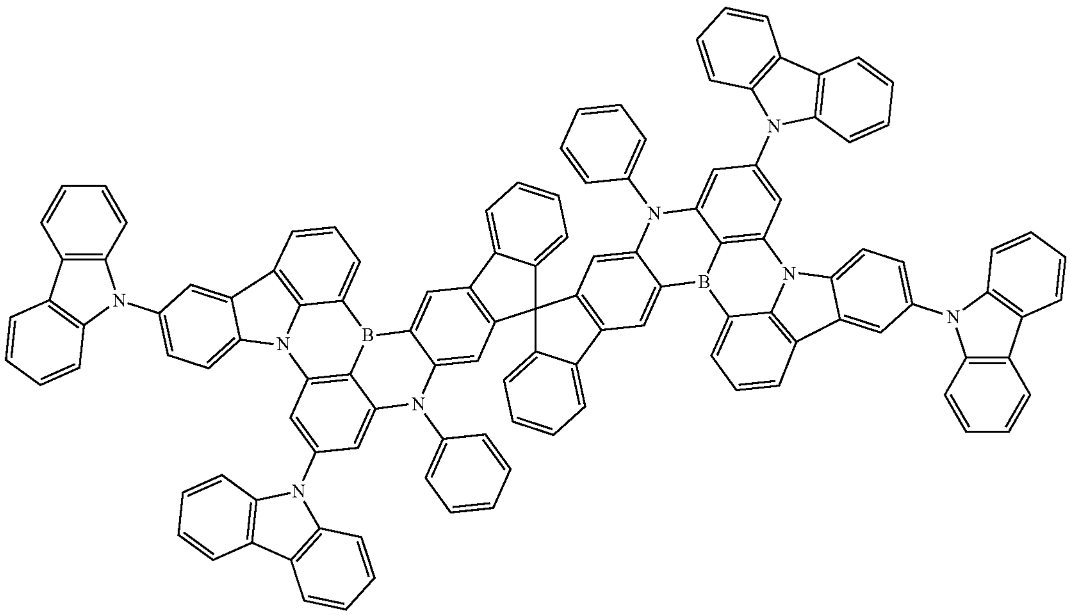
63
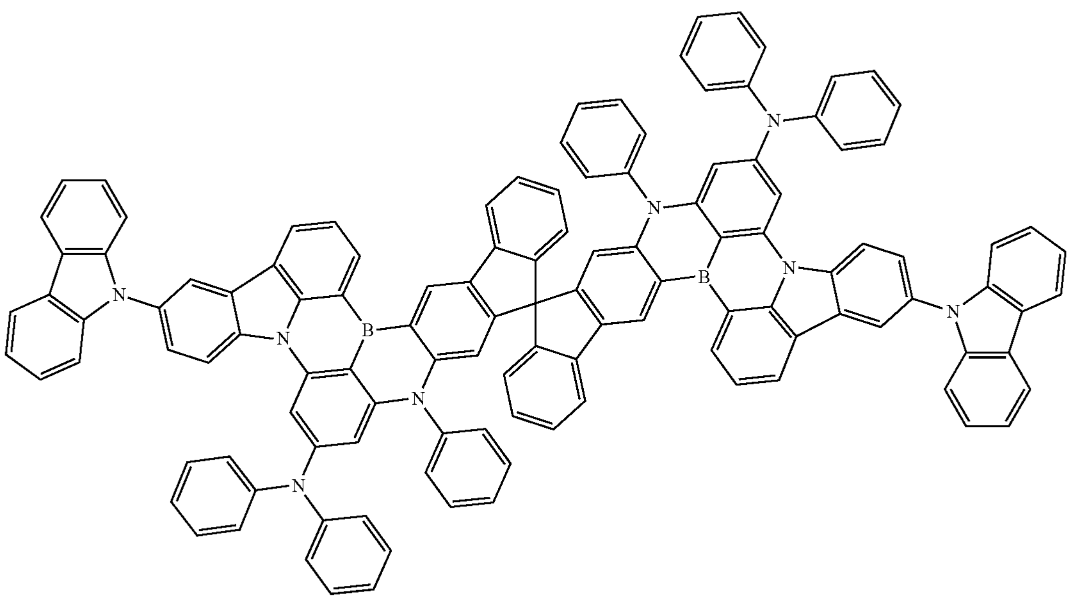

-continued
64
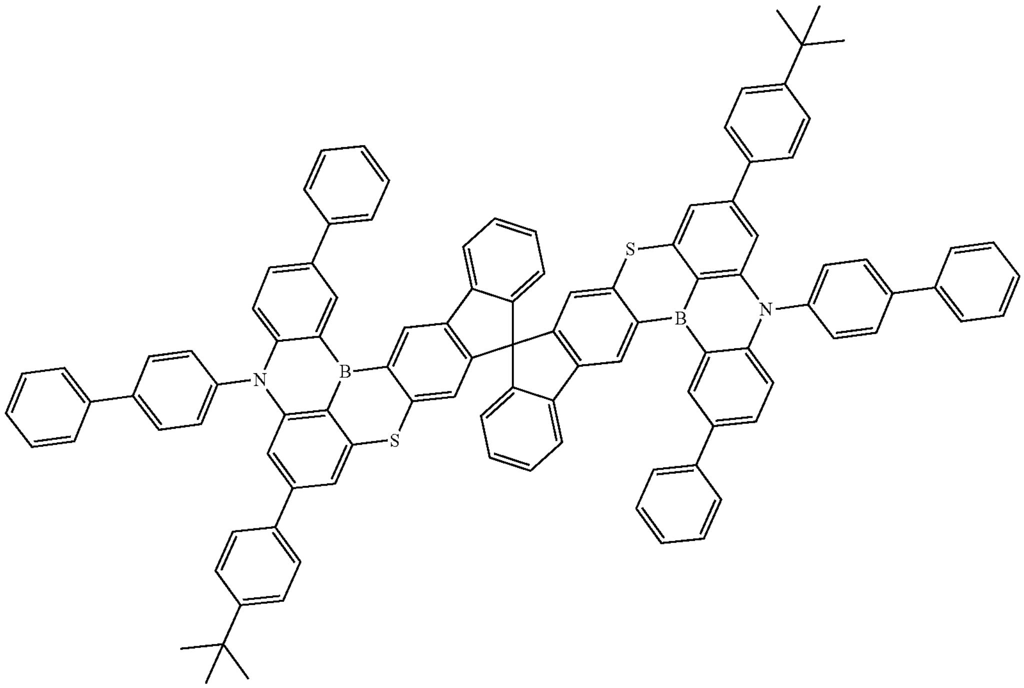
65
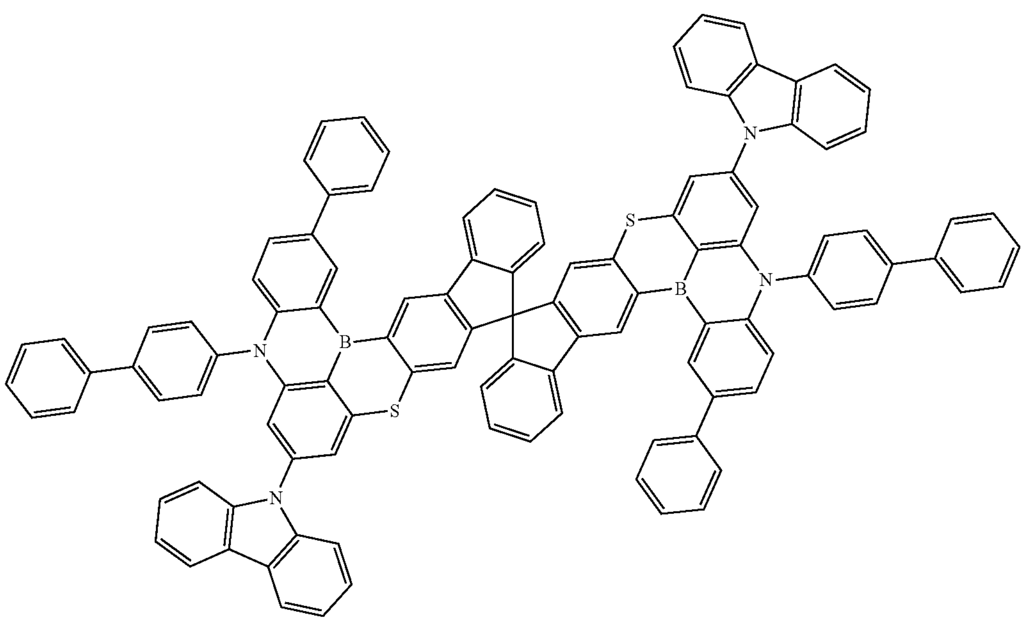

-continued
66
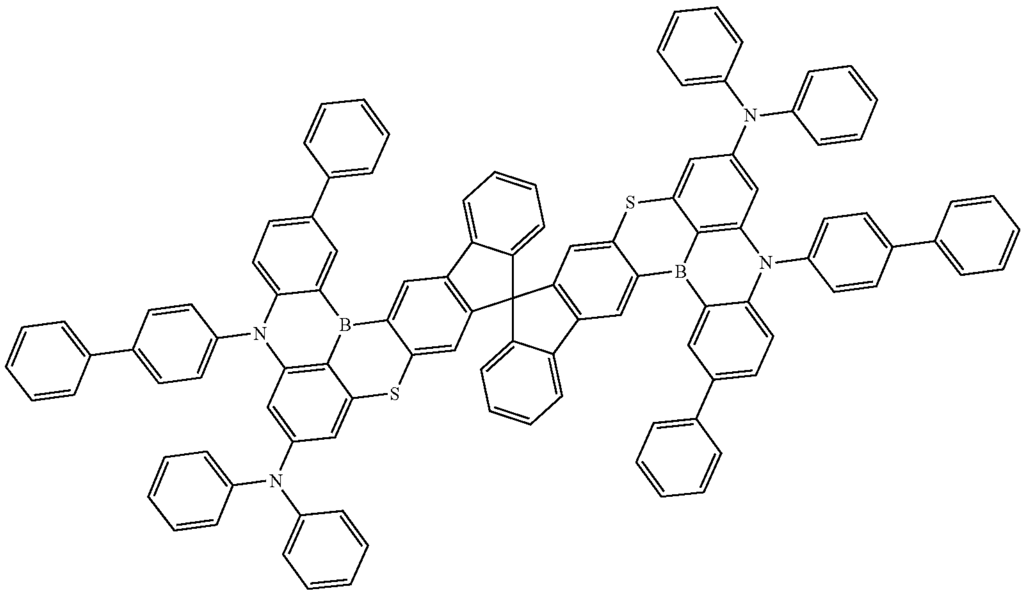
67
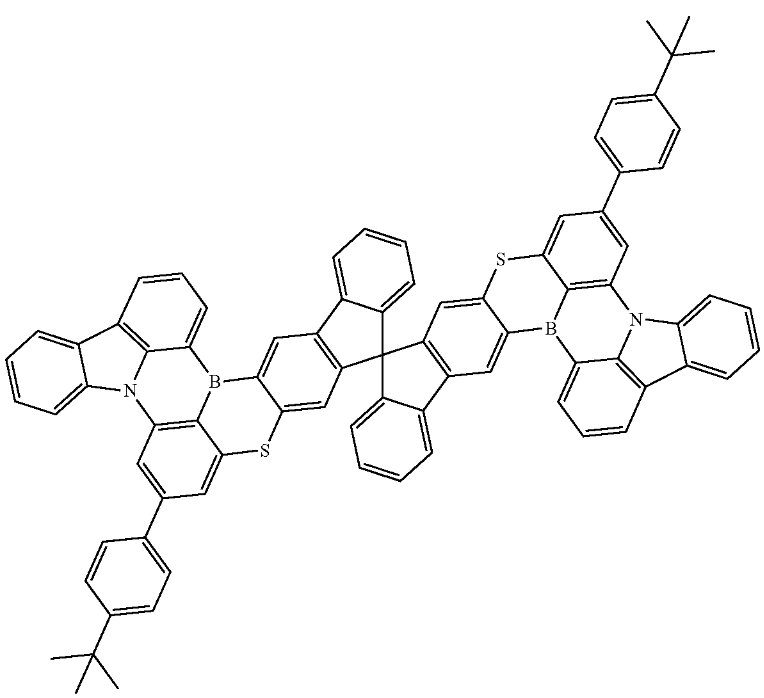

-continued
68
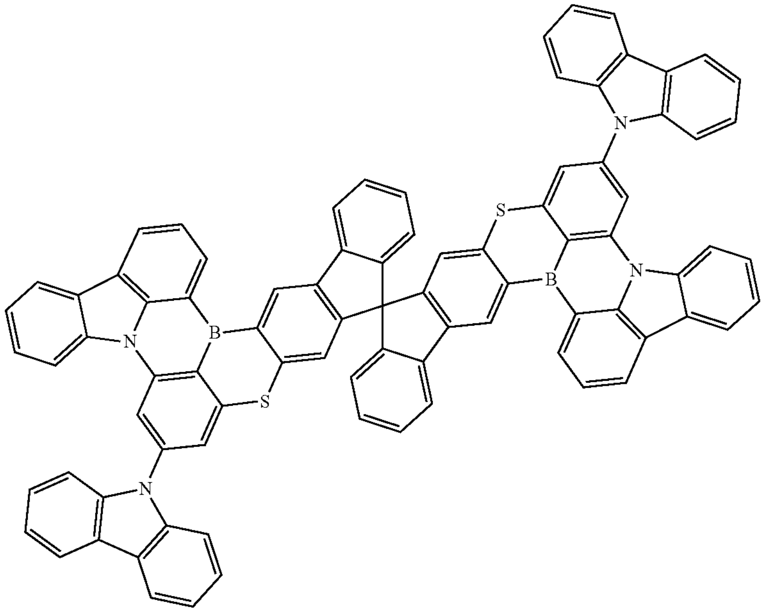
69
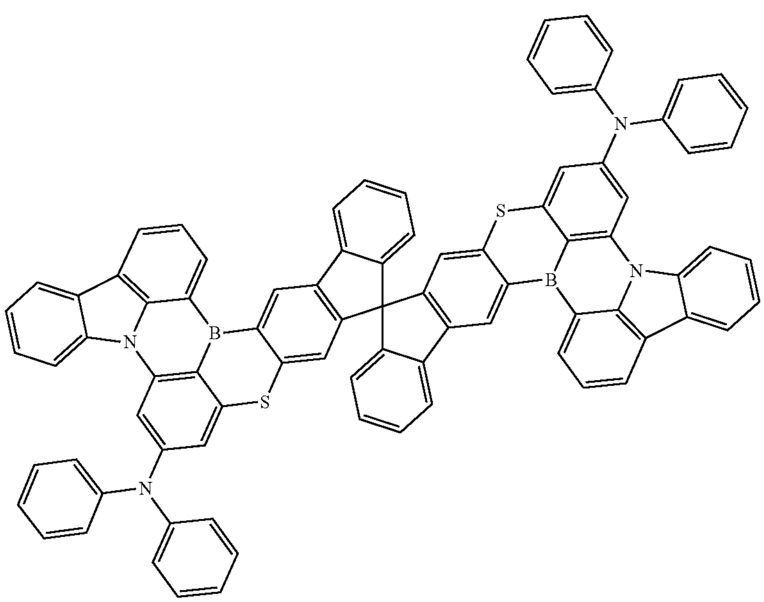

-continued
70
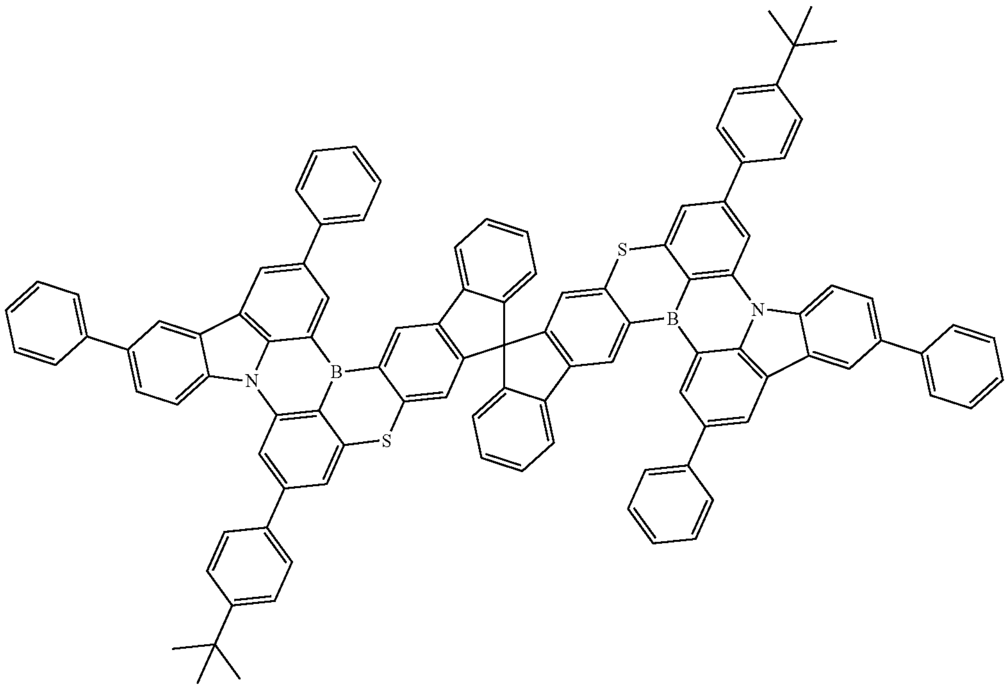
71
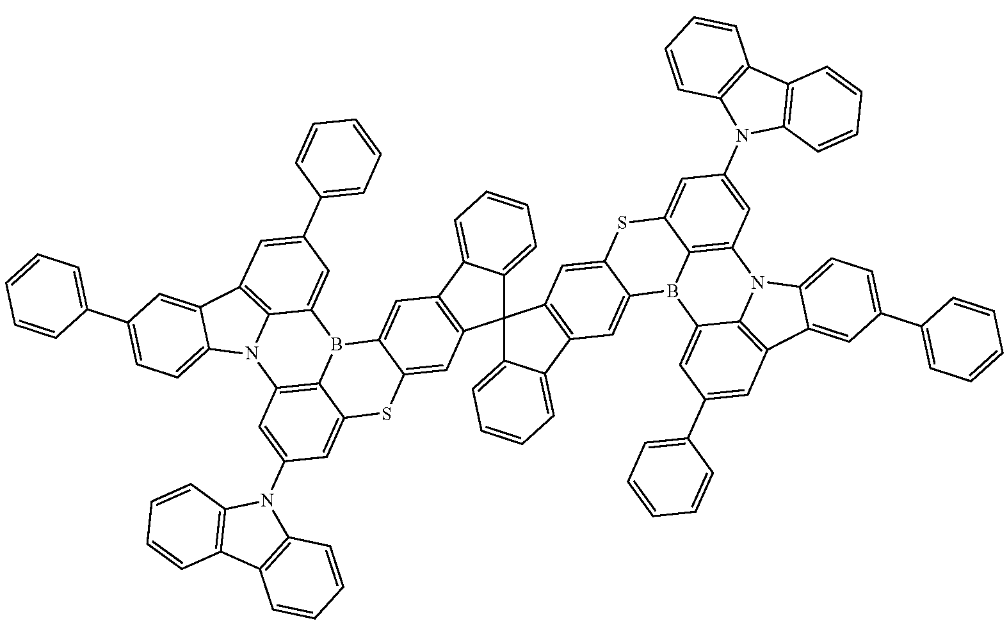

-continued
72
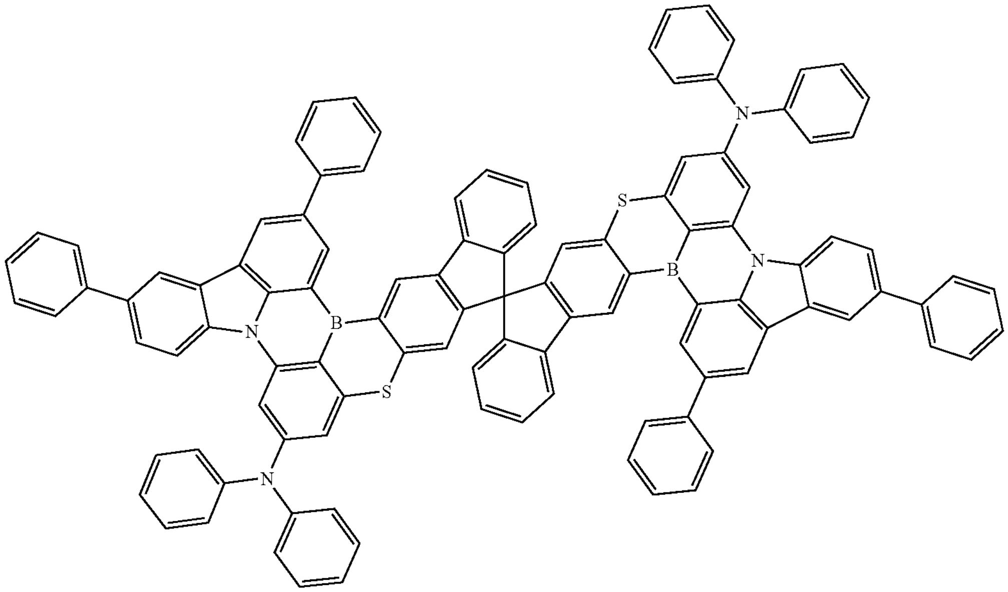
73
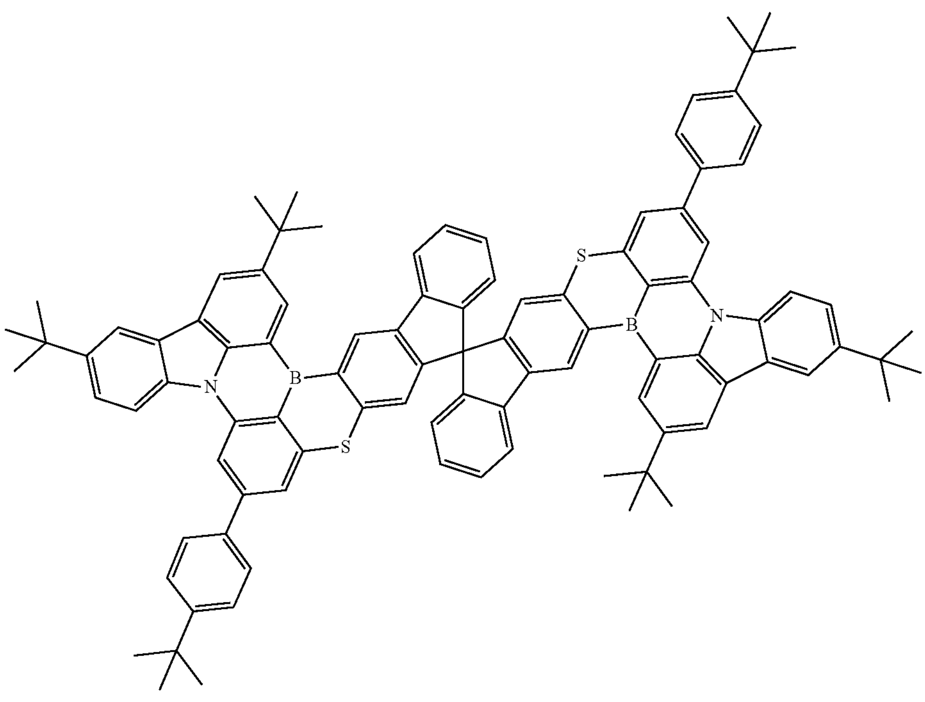

-continued
74
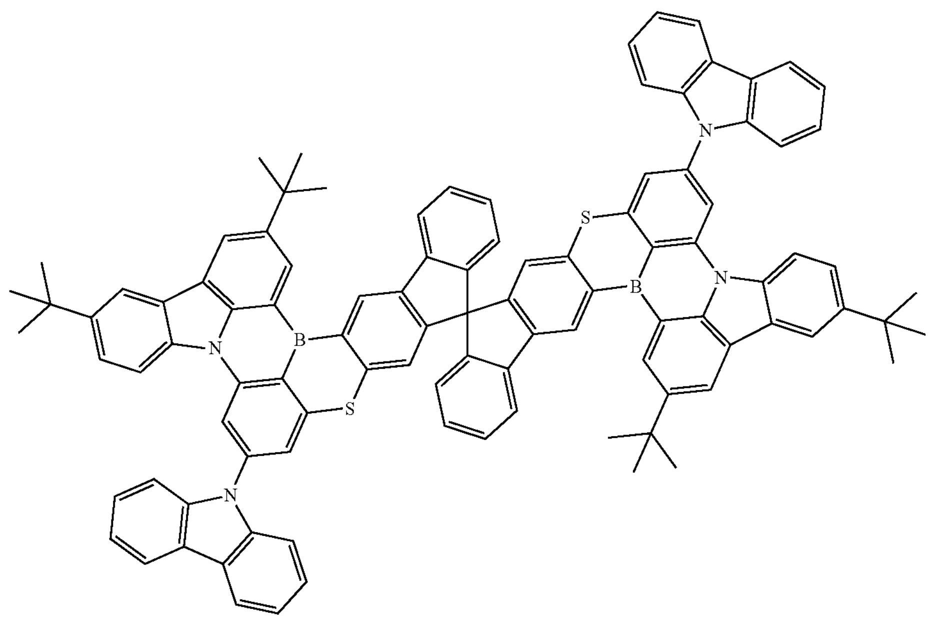
75
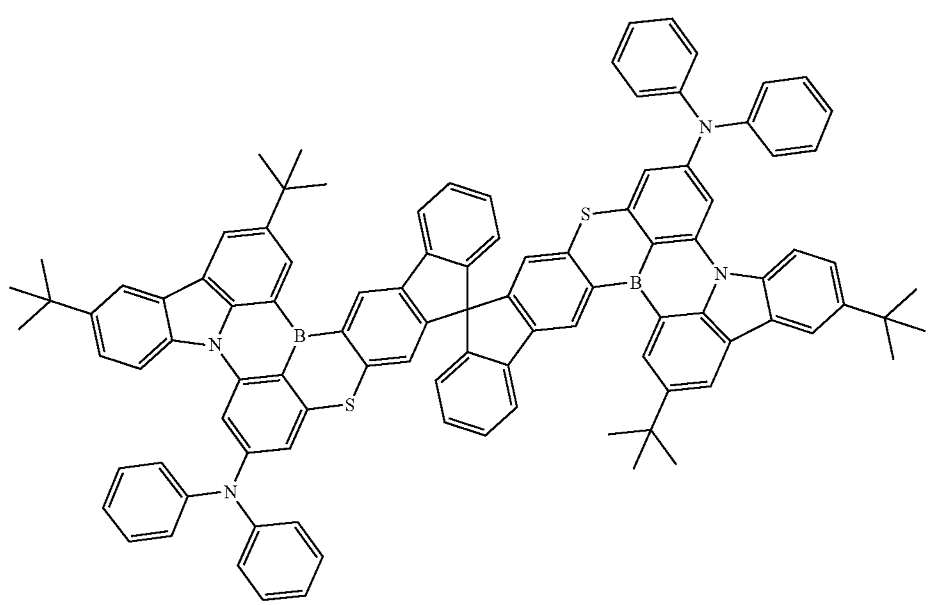

-continued
76
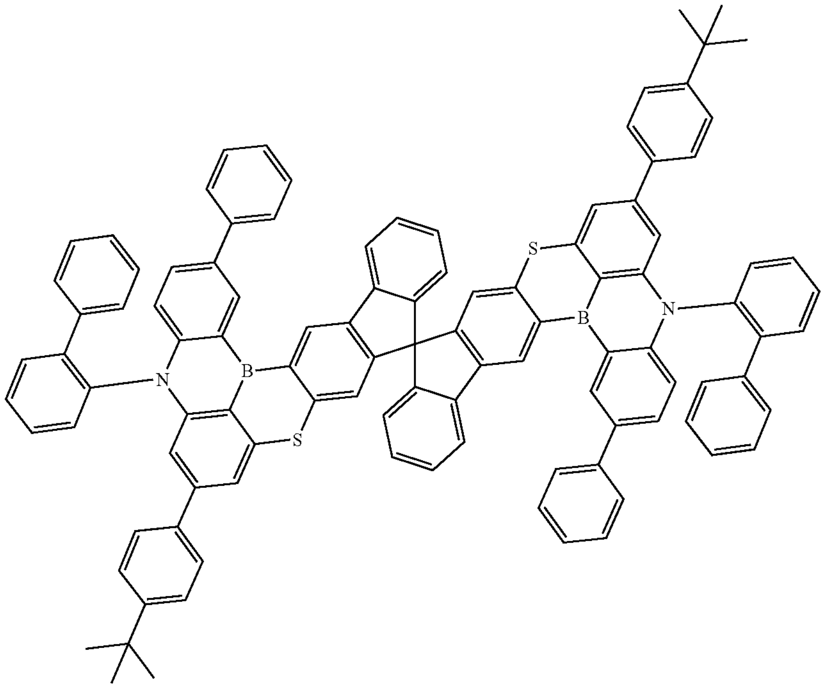
77
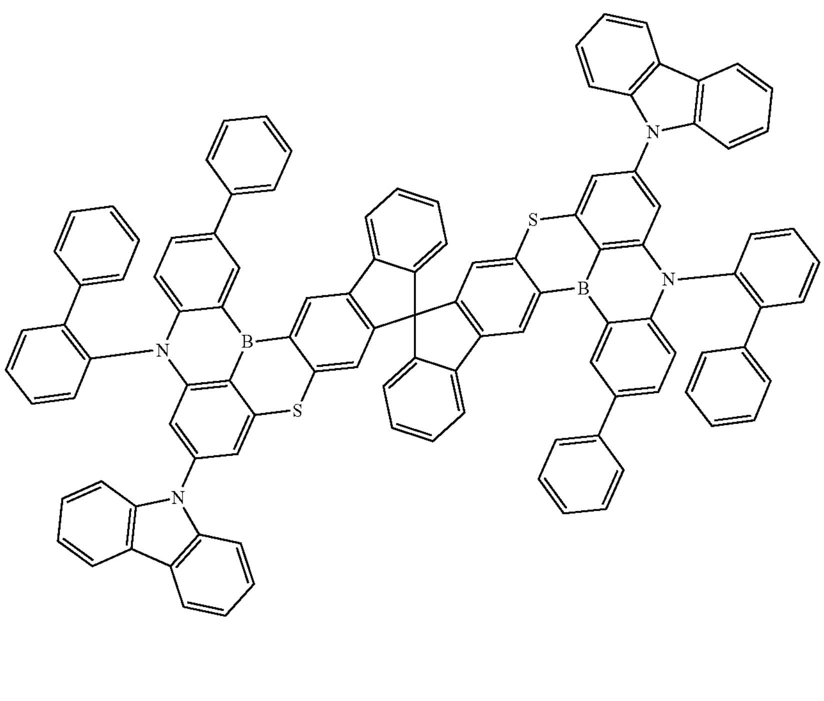

-continued
78
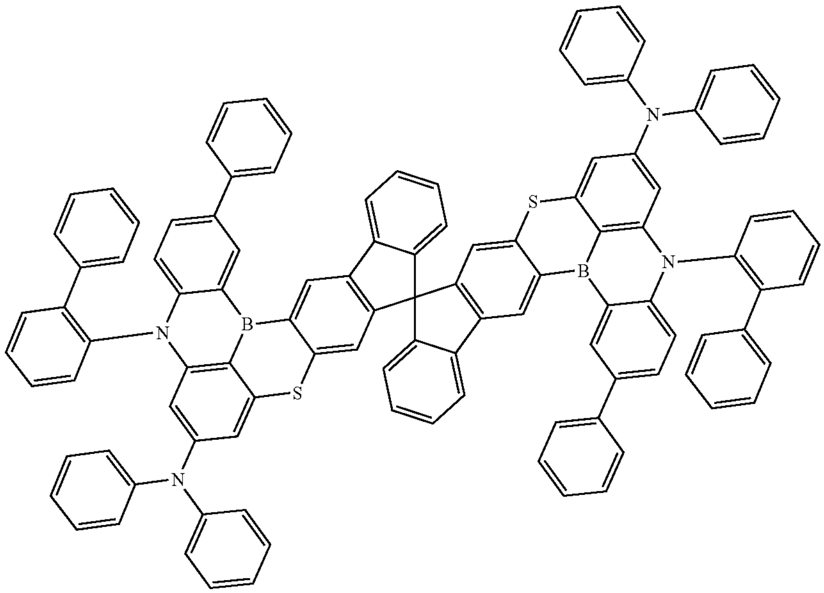
79
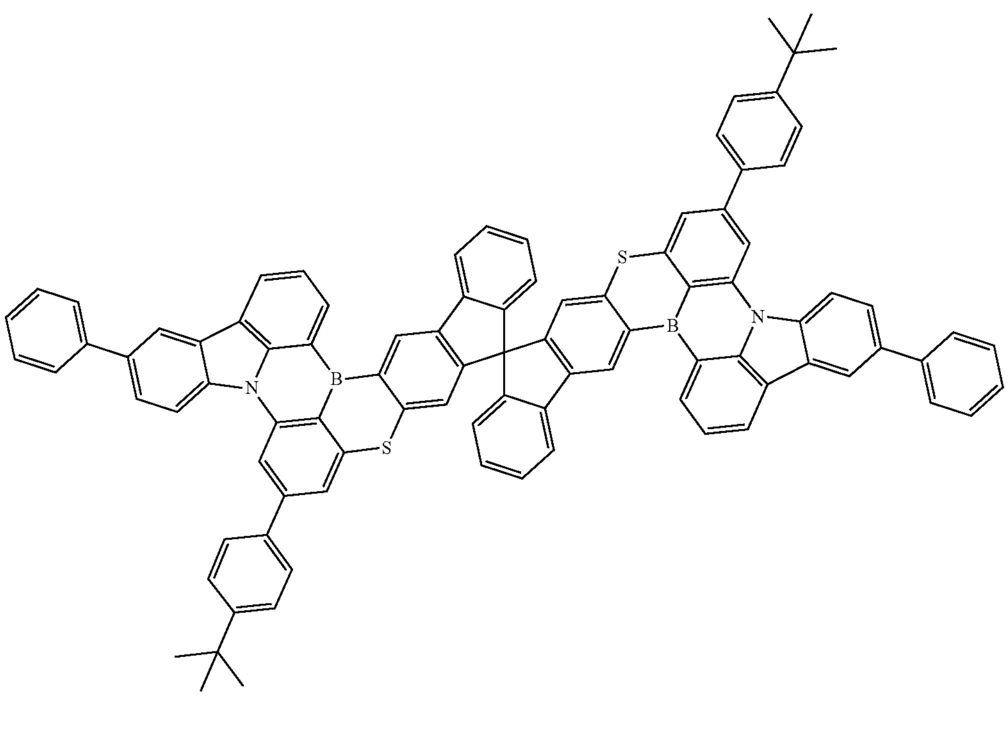

-continued
80
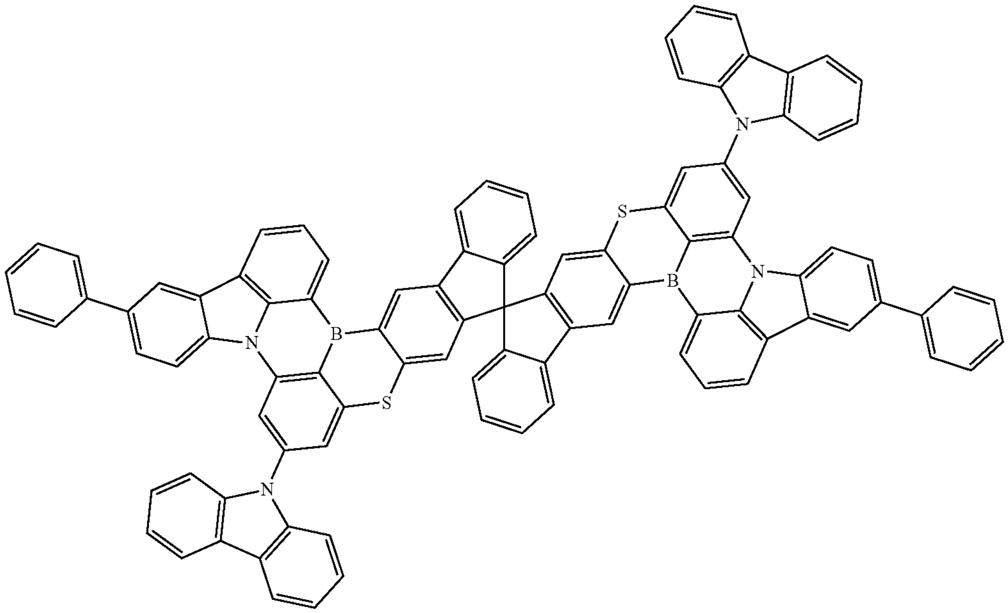
81
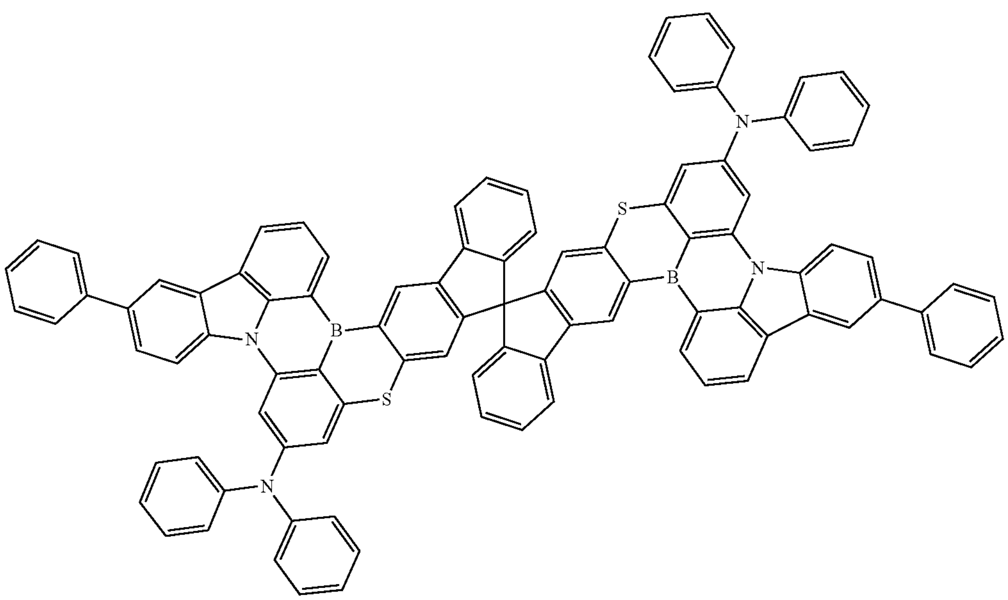

-continued
82
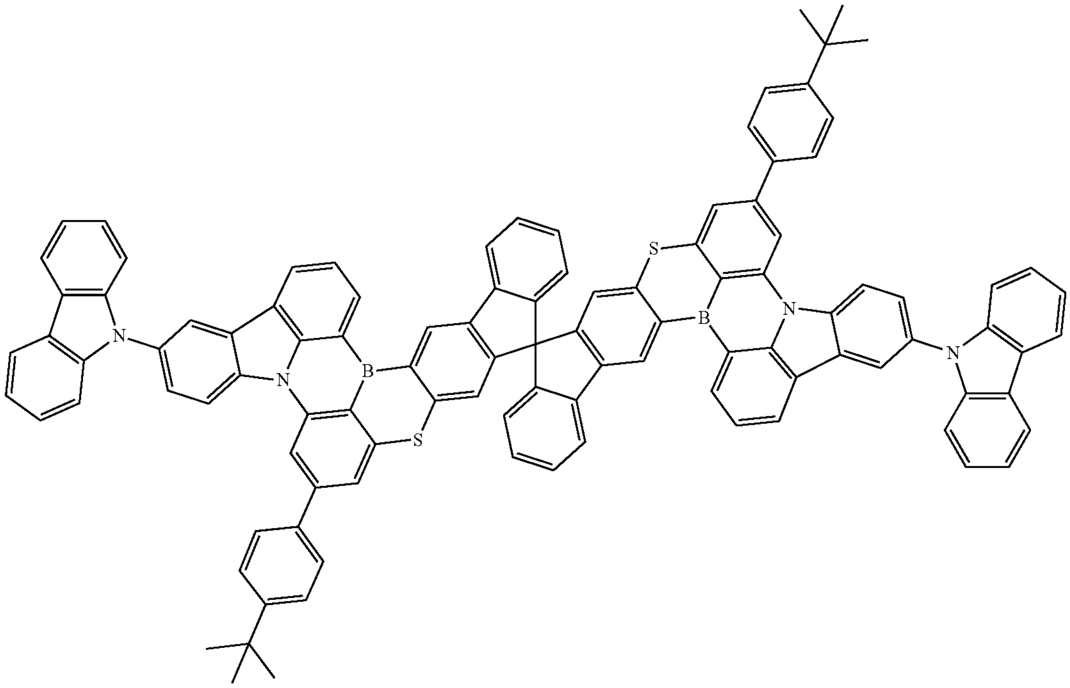
83
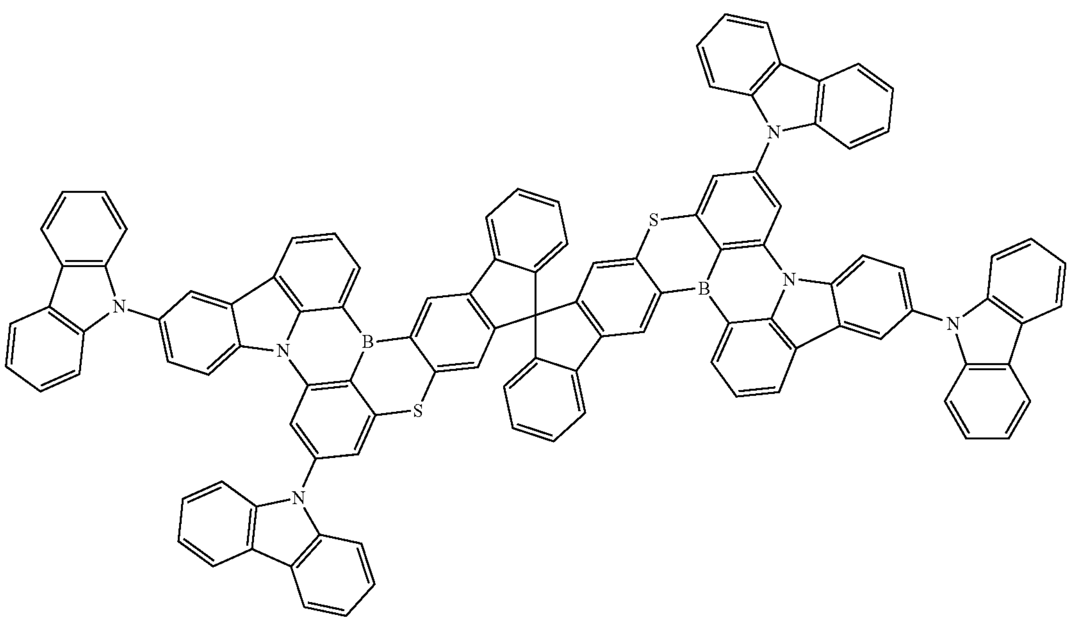

-continued
84
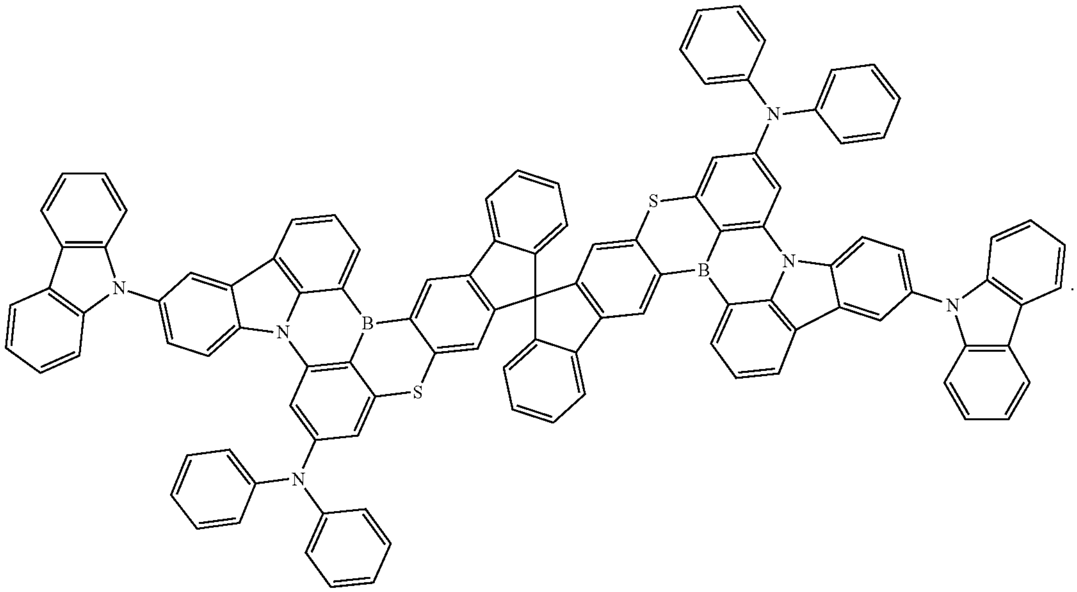
* * * * *